United States Patent
Santarone et al.

(10) Patent No.: US 11,809,787 B2
(45) Date of Patent: *Nov. 7, 2023

(54) ARCHITECTURAL DRAWING ASPECT BASED EXCHANGE OF GEOSPATIAL RELATED DIGITAL CONTENT

(71) Applicant: MIDDLE CHART, LLC, Jacksonville, FL (US)

(72) Inventors: Michael S. Santarone, Jacksonville, FL (US); Michael Wodrich, Jacksonville, FL (US); Jason E. Duff, Jacksonville, FL (US); Joseph P. Kincart, Jacksonville, FL (US)

(73) Assignee: MIDDLE CHART, LLC, Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/141,414

(22) Filed: Apr. 29, 2023

(65) Prior Publication Data

US 2023/0267241 A1     Aug. 24, 2023

Related U.S. Application Data

(63) Continuation of application No. 17/902,824, filed on Sep. 3, 2022, now Pat. No. 11,640,486, which is a
(Continued)

(51) Int. Cl.
*G06F 30/13* (2020.01)
*G06T 19/00* (2011.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC .......... G06F 30/13; G01S 19/48; G01S 19/01; G06Q 99/00; G06T 17/05; G06T 19/006
See application file for complete search history.

(56) References Cited

U.S. PATENT DOCUMENTS

| | | |
|---|---|---|
| 5,884,202 A | 3/1999 | Arjomand |
| 5,933,479 A | 8/1999 | Michael et al. |

(Continued)

FOREIGN PATENT DOCUMENTS

| | | |
|---|---|---|
| CN | 102147597 A | 8/2011 |
| EP | 2042885 B1 | 10/2009 |

(Continued)

OTHER PUBLICATIONS

Azeez et al., "Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).

(Continued)

*Primary Examiner* — Brandon J Miller
(74) *Attorney, Agent, or Firm* — TRACNIK LAW PLLC; Joseph P. Kincart

(57) ABSTRACT

Apparatus and methods of artificial intelligent based provision of digital content where and when the digital content is needed based upon where an agent is located and a purpose for accessing the content. A location of a user seeking to access the digital content may be used that enables access to the content. Persistent digital content is linked to location coordinates. A physical onsite location may be linked with digital content to enable provision of a user interface with augmented reality that combines aspects of the physical area with location specific digital content. In addition, access to digital content may be limited to users in defined access areas.

20 Claims, 58 Drawing Sheets

Related U.S. Application Data continuation-in-part of application No. 17/669,333, filed on Feb. 10, 2022, now Pat. No. 11,436,389, which is a continuation of application No. 17/535,853, filed on Nov. 26, 2021.

(60) Provisional application No. 63/307,545, filed on Feb. 7, 2022, provisional application No. 63/277,334, filed on Nov. 9, 2021, provisional application No. 63/223,575, filed on Jul. 20, 2021, provisional application No. 63/213,782, filed on Jun. 23, 2021, provisional application No. 63/155,109, filed on Mar. 1, 2021.

(51) Int. Cl.
  *G06Q 99/00* (2006.01)
  *G01S 19/48* (2010.01)
  *G06T 17/05* (2011.01)
  *G01S 19/01* (2010.01)

(56) References Cited

U.S. PATENT DOCUMENTS

| | | |
|---|---|---|
| 6,006,021 A | 12/1999 | Tognazzini |
| 6,292,108 B1 | 9/2001 | Straser et al. |
| 6,321,158 B1 | 11/2001 | Delorme et al. |
| 6,853,958 B1 | 2/2005 | Turin et al. |
| 6,963,282 B1 | 11/2005 | Yeates et al. |
| 7,057,557 B2 | 6/2006 | Lee |
| 8,280,404 B1 | 10/2012 | Roskind |
| 8,818,758 B1 | 8/2014 | Singh et al. |
| 8,843,350 B2 | 9/2014 | Jacobi et al. |
| 8,862,415 B1 | 10/2014 | Adams |
| 8,996,156 B2 | 3/2015 | Melzer-Jokisch et al. |
| 9,037,124 B1 | 5/2015 | Ledet |
| 9,064,219 B2 | 6/2015 | Hall et al. |
| 9,107,043 B2 | 8/2015 | Gupta |
| 9,342,928 B2 | 5/2016 | Rasane et al. |
| 9,668,106 B2 | 5/2017 | Lin et al. |
| 9,703,517 B2 | 7/2017 | Andolina |
| 9,772,396 B2 | 9/2017 | Liao et al. |
| 9,792,020 B1 | 10/2017 | Kelley et al. |
| 9,952,569 B2 | 4/2018 | Brissman |
| 10,054,914 B2 | 8/2018 | Vartiainen et al. |
| 10,130,285 B1 | 11/2018 | Singamsetty et al. |
| 10,149,141 B1 | 12/2018 | Stamatakis et al. |
| 10,210,353 B1 | 2/2019 | Li et al. |
| 10,222,301 B2 | 3/2019 | Silva et al. |
| 10,278,016 B2 | 4/2019 | Bitra et al. |
| 10,295,647 B1 | 5/2019 | Hulvey |
| 10,355,351 B2 | 7/2019 | Cummings et al. |
| 10,444,324 B2 | 10/2019 | Dackefjord et al. |
| 10,824,774 B2 | 11/2020 | Santarone et al. |
| 10,825,247 B1 | 11/2020 | Vincent et al. |
| 10,872,179 B2 | 12/2020 | Wodrich et al. |
| 11,080,439 B2 | 8/2021 | Wodrich et al. |
| 11,087,039 B2 | 8/2021 | Duff et al. |
| 11,096,025 B1 | 8/2021 | Thompson |
| 11,100,260 B2 | 8/2021 | Wodrich et al. |
| 11,194,938 B2 | 12/2021 | Kincart et al. |
| 11,429,761 B2 | 8/2022 | Wodrich et al. |
| 11,436,388 B2 | 9/2022 | Santarone et al. |
| 11,468,209 B2 | 10/2022 | Wodrich et al. |
| 11,640,486 B2 * | 5/2023 | Santarone ............... G01S 19/48 711/108 |
| 2002/0095269 A1 | 7/2002 | Natalini et al. |
| 2002/0181405 A1 | 12/2002 | Ying |
| 2003/0110001 A1 | 6/2003 | Chassin et al. |
| 2003/0135324 A1 | 7/2003 | Navab |
| 2003/0163440 A1 | 8/2003 | Tonack |
| 2003/0195008 A1 | 10/2003 | Mohi et al. |
| 2004/0002786 A1 | 1/2004 | Sasaki |
| 2004/0119662 A1 | 6/2004 | Dempski |
| 2004/0122628 A1 | 6/2004 | Laurie |
| 2004/0162084 A1 | 8/2004 | Wang |
| 2005/0165576 A1 | 7/2005 | Jesmonth |
| 2005/0275525 A1 | 12/2005 | Ahmed |
| 2006/0028345 A1 | 2/2006 | Lee |
| 2006/0084436 A1 | 4/2006 | Green et al. |
| 2006/0084463 A1 | 4/2006 | Yoo et al. |
| 2006/0164382 A1 | 7/2006 | Kulas et al. |
| 2007/0004449 A1 | 1/2007 | Sham |
| 2008/0180246 A1 | 7/2008 | Malik |
| 2008/0246734 A1 | 10/2008 | Tsui et al. |
| 2009/0189810 A1 | 7/2009 | Murray |
| 2009/0216438 A1 | 8/2009 | Shafer |
| 2009/0293051 A1 | 11/2009 | Krywaniuk |
| 2010/0103036 A1 | 4/2010 | Malone et al. |
| 2010/0107635 A1 | 5/2010 | Tsubone |
| 2010/0271263 A1 | 10/2010 | Moshfeghi |
| 2010/0296075 A1 | 11/2010 | Hinderling et al. |
| 2010/0309044 A1 | 12/2010 | Ische et al. |
| 2011/0047516 A1 | 2/2011 | Pavan et al. |
| 2011/0068906 A1 | 3/2011 | Shafer et al. |
| 2011/0075835 A1 | 3/2011 | Hill |
| 2011/0115816 A1 | 5/2011 | Brackney |
| 2011/0182202 A1 | 7/2011 | Olofsson et al. |
| 2011/0199479 A1 | 8/2011 | Waldman |
| 2011/0251787 A1 | 10/2011 | Gupta et al. |
| 2012/0087212 A1 | 4/2012 | Vartanian et al. |
| 2012/0127306 A1 | 5/2012 | Oh et al. |
| 2012/0127976 A1 | 5/2012 | Lin et al. |
| 2012/0173456 A1 | 7/2012 | Hirl |
| 2012/0188847 A1 | 7/2012 | Miyamoto et al. |
| 2012/0204646 A1 | 8/2012 | Lee et al. |
| 2012/0214507 A1 | 8/2012 | Vartanian et al. |
| 2012/0240077 A1 | 9/2012 | Vaittinen et al. |
| 2012/0296610 A1 | 11/2012 | Hailemariam et al. |
| 2013/0010103 A1 | 1/2013 | Ihara et al. |
| 2013/0033158 A1 | 2/2013 | Schmidt et al. |
| 2013/0120630 A1 | 5/2013 | Kim et al. |
| 2013/0169801 A1 | 7/2013 | Martin et al. |
| 2013/0197685 A1 | 8/2013 | Matsunaga et al. |
| 2013/0278635 A1 | 10/2013 | Maggiore |
| 2013/0283529 A1 | 10/2013 | Hayes et al. |
| 2013/0288719 A1 | 10/2013 | Alonzo |
| 2013/0297555 A1 | 11/2013 | Fadell et al. |
| 2013/0335528 A1 | 12/2013 | Vishwanath et al. |
| 2013/0345975 A1 | 12/2013 | Vulcano et al. |
| 2014/0058572 A1 | 2/2014 | Stein et al. |
| 2014/0084909 A1 | 3/2014 | Pagani |
| 2014/0107828 A1 | 4/2014 | Zhu et al. |
| 2014/0129599 A1 | 5/2014 | Boccon-Gibod |
| 2014/0156455 A1 | 6/2014 | Atwood et al. |
| 2014/0188394 A1 | 7/2014 | Febonio et al. |
| 2014/0225814 A1 | 8/2014 | English et al. |
| 2014/0244160 A1 | 8/2014 | Cragun et al. |
| 2014/0266755 A1 | 9/2014 | Arensmeier et al. |
| 2014/0267420 A1 | 9/2014 | Schowengerdt et al. |
| 2014/0274151 A1 | 9/2014 | Pattabiraman et al. |
| 2014/0277594 A1 | 9/2014 | Nixon et al. |
| 2014/0278065 A1 | 9/2014 | Ren |
| 2014/0368373 A1 | 12/2014 | Crain et al. |
| 2015/0005903 A1 | 1/2015 | Worek et al. |
| 2015/0109338 A1 | 4/2015 | Mckinnon et al. |
| 2015/0116132 A1 | 4/2015 | Nohra et al. |
| 2015/0121222 A1 | 4/2015 | Lacaze et al. |
| 2015/0137967 A1 | 5/2015 | Wedig et al. |
| 2015/0156423 A1 | 6/2015 | Lundberg |
| 2015/0168154 A1 | 6/2015 | Boerger |
| 2015/0177718 A1 | 6/2015 | Vartiainen et al. |
| 2015/0178633 A1 | 6/2015 | Elbsat et al. |
| 2015/0192656 A1 | 7/2015 | Werner et al. |
| 2015/0206348 A1 | 7/2015 | Koreeda et al. |
| 2015/0227123 A1 | 8/2015 | Laycock et al. |
| 2015/0262421 A1 | 9/2015 | Bell et al. |
| 2015/0287318 A1 | 10/2015 | Nair et al. |
| 2015/0294506 A1 | 10/2015 | Bare et al. |
| 2015/0327010 A1 | 11/2015 | Gottschalk et al. |
| 2015/0347854 A1 | 12/2015 | Bare et al. |
| 2015/0356786 A1 | 12/2015 | Bare et al. |
| 2015/0382145 A1 | 12/2015 | Smith et al. |
| 2016/0004805 A1 | 1/2016 | Drees et al. |

(56) References Cited

U.S. PATENT DOCUMENTS

| | | |
|---|---|---|
| 2016/0019721 A1 | 1/2016 | Bare et al. |
| 2016/0026253 A1 | 1/2016 | Bradski et al. |
| 2016/0026729 A1 | 1/2016 | Gil et al. |
| 2016/0048200 A1 | 2/2016 | Kim et al. |
| 2016/0066068 A1 | 3/2016 | Schultz et al. |
| 2016/0071196 A1 | 3/2016 | Joshi et al. |
| 2016/0077532 A1 | 3/2016 | Lagerstedt et al. |
| 2016/0084936 A1 | 3/2016 | Smith et al. |
| 2016/0091217 A1 | 3/2016 | Verberkt et al. |
| 2016/0095188 A1 | 3/2016 | Verberkt et al. |
| 2016/0132046 A1 | 5/2016 | Beoughter et al. |
| 2016/0135006 A1 | 5/2016 | Fjeldsoe-Nielsen |
| 2016/0202678 A1 | 7/2016 | Aggarwal et al. |
| 2016/0216879 A1 | 7/2016 | Park et al. |
| 2016/0258760 A1 | 9/2016 | Beaumont et al. |
| 2016/0284075 A1 | 9/2016 | Phan et al. |
| 2016/0285416 A1 | 9/2016 | Tiwari et al. |
| 2016/0323149 A1 | 11/2016 | Hu et al. |
| 2016/0335731 A1 | 11/2016 | Hall |
| 2016/0343093 A1 | 11/2016 | Riland et al. |
| 2016/0343243 A1 | 11/2016 | Rabb et al. |
| 2016/0345137 A1 | 11/2016 | Ruiz |
| 2016/0356593 A1 | 12/2016 | Huang et al. |
| 2016/0358189 A1 | 12/2016 | Furry et al. |
| 2016/0360429 A1 | 12/2016 | Li et al. |
| 2016/0379083 A1 | 12/2016 | Sala et al. |
| 2017/0006487 A1 | 1/2017 | Baldwin et al. |
| 2017/0023659 A1 | 1/2017 | Bruemmer et al. |
| 2017/0055126 A1 | 2/2017 | O'Keeffe |
| 2017/0079001 A1 | 3/2017 | Lewis |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0212668 A1 | 7/2017 | Shah et al. |
| 2017/0230930 A1 | 8/2017 | Frey |
| 2017/0234962 A1 | 8/2017 | Yang et al. |
| 2017/0235290 A1 | 8/2017 | Weber et al. |
| 2017/0237892 A1 | 8/2017 | Sakai |
| 2017/0255450 A1 | 9/2017 | Mullins et al. |
| 2017/0286568 A1 | 10/2017 | Dean et al. |
| 2017/0363504 A1 | 12/2017 | Winant et al. |
| 2018/0031618 A1 | 2/2018 | Friedlander et al. |
| 2018/0035263 A1 | 2/2018 | Titus et al. |
| 2018/0075168 A1 | 3/2018 | Tiwari et al. |
| 2018/0084623 A1 | 3/2018 | Joppi et al. |
| 2018/0101803 A1 | 4/2018 | Tiwari et al. |
| 2018/0102858 A1 | 4/2018 | Tiwari et al. |
| 2018/0113506 A1 | 4/2018 | Hall |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0206096 A1 | 7/2018 | Sharma et al. |
| 2018/0242907 A1 | 8/2018 | Bonomi |
| 2018/0285482 A1 | 10/2018 | Santos et al. |
| 2018/0316885 A1 | 11/2018 | Reis et al. |
| 2018/0328753 A1 | 11/2018 | Stenning et al. |
| 2018/0357823 A1 | 12/2018 | Koniki et al. |
| 2018/0357907 A1 | 12/2018 | Reiley et al. |
| 2018/0374269 A1 | 12/2018 | Smith |
| 2019/0025905 A1 | 1/2019 | Godina et al. |
| 2019/0041972 A1 | 2/2019 | Bae |
| 2019/0057169 A1 | 2/2019 | Santarone et al. |
| 2019/0069263 A1 | 2/2019 | Ylamurto et al. |
| 2019/0096232 A1 | 3/2019 | Wedig et al. |
| 2019/0145648 A1 | 5/2019 | Sinha et al. |
| 2019/0216333 A1 | 7/2019 | Lai et al. |
| 2019/0228370 A1 | 7/2019 | Lien |
| 2019/0268062 A1 | 8/2019 | Josefiak |
| 2019/0281573 A1 | 9/2019 | Tyagi et al. |
| 2019/0294834 A1 | 9/2019 | Mountz |
| 2019/0355177 A1 | 11/2019 | Manickam et al. |
| 2019/0392640 A1 | 12/2019 | Qian et al. |
| 2020/0053096 A1 | 2/2020 | Bendersky et al. |
| 2020/0057825 A1 | 2/2020 | Motahar |
| 2020/0072538 A1 | 3/2020 | Woolf et al. |
| 2020/0108926 A1 | 4/2020 | Smith et al. |
| 2020/0151450 A1 | 5/2020 | Hishinuma et al. |
| 2020/0286300 A1 | 9/2020 | Shih |
| 2021/0334863 A1 | 10/2021 | Hirata et al. |
| 2022/0066405 A1 | 3/2022 | Harvey |
| 2023/0056305 A1 | 2/2023 | Karri et al. |

FOREIGN PATENT DOCUMENTS

| | | |
|---|---|---|
| EP | 2726817 B1 | 9/2018 |
| GB | 2498177 A | 7/2013 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Brainergiser, "Large holographic projector—a real use case". Sep. 19, 2015, https://www.youtube.com/watch?v=JwnS-EKTW2A&feature=youtu.be.

Carmelo Scuro et al., IoT for Structural Health Monitoring, Dec. 2018, IEEE Instrumentation & Measurement Magazine, pp. 4-14.

Edwards, Luke, "Holograms are finally here: Plasma lasers used to create images in mid-air." Pocket-Lint.com, Nov. 5, 2014, https://www.pocket-lint.com/gadgets/news/131622-holograms-are-finally-here-plasma-lasers-used-to-create-images-in-mid-air.

Gifford, Matthew, "Indoor Positioning with Ultrasonic/Ultrasound", Oct. 19, 2018, 7 pages, https://www.leverege.com/blogpost/ultrasonic-indoor-positioning.

Hexamite, "HX19V2 RFID Ultrasonic Positioning System", 1999, https://www.hexamite.com/hx19.htm.

Hu. Wi-Fi Based Indoor Positioning System Using Smartphones. Nov. 2013. [retrieved on Apr. 23, 2018]. Retrieved from the Internet: (91 pages total).

Zou et al., "SmartScanner: Know More in Walls with Your Smartphone!" IEEE Transactions on Mobile Computing, vol. 15, No. 11, Nov. 2016, pp. 2865-2877 (Year: 2016).

Zhihua Wang et al., A Review of Wearable Technologies for Elderly Care that Can Accurately Track Indoor Position, Recognize Physical Activities and Monitor Vital Signs in Real Time, Feb. 10, 2017, Sensors (Basel), 17(2), 341, p. 1-36; doi: 10.3390/s 17020341 (Year: 2017).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000—Business & Economics, pp. 40-41.

Qi, J.; Liu, G .—P. A Robust High-Accuracy Ultrasound Indoor Positioning System Based on a Wireless Sensor Network. Sensors 2017, 17, 2554.

Wang et al. Performance Evaluation of Automatically Generated BIM from Laser Scanner Data for Sustainability Analyses. 2015. [retrieved on Apr. 23, 2018]. Retrieved from the Internet: .(8 pages total).

Yang et al, "Wi Fi-Based Indoor Positioning", 2015, pp. 150-157 downloaded from the internet I Eee.com databases. (Year: 2015).

Extended European Search Report dated Jun. 23, 2023 in correlated application, EP20837285.

* cited by examiner

Scaling according to defined scale or items of known dimensions
Also distance determination based upon UWB or other wireless and general location.

```
┌─────────────────────────────────────────────────────────────────┐
│  RECEIVE WIRELESS ENERGY OF A FIRST WAVELENGTH INTO A WIRELESS RECEIVER │
│                                                            1001 │
└─────────────────────────────────────────────────────────────────┘
                                  │
┌─────────────────────────────────────────────────────────────────┐
│  GENERATE A PATTERN OF DIGITAL VALUES BASED UPON RECEIPT OF WIRELESS │
│               ENERGY INTO THE WIRELESS RECEIVER                 │
│                                                            1002 │
└─────────────────────────────────────────────────────────────────┘
                                  │
┌─────────────────────────────────────────────────────────────────┐
│  OPTIONALLY RECEIVE THE WIRELESS ENERGY FROM THE RECEIVER AS AN ANALOG │
│                            SIGNAL                          1003 │
└─────────────────────────────────────────────────────────────────┘
                                  │
┌─────────────────────────────────────────────────────────────────┐
│  COORDINATES REPRESENTATIVE OF A WIRELESS NODE MAY BE DETERMINED │
│                    RELATIVE TO A BASE NODE                      │
│                                                            1004 │
└─────────────────────────────────────────────────────────────────┘
                                  │
┌─────────────────────────────────────────────────────────────────┐
│  DETERMINE THE POSITION OF THE BASE NODE RELATIVE TO THE DEFINED PHYSICAL │
│                             AREA                                │
│                                                            1005 │
└─────────────────────────────────────────────────────────────────┘
                                  │
┌─────────────────────────────────────────────────────────────────┐
│   GENERATE A TARGET AREA WITHIN A CONTROLLER OF THE SMART DEVICE │
│                                                            1006 │
└─────────────────────────────────────────────────────────────────┘
                                  │
┌─────────────────────────────────────────────────────────────────┐
│  RESPECTIVE POSITIONS OF ONE OR MORE WIRELESS NODES WITHIN THE TARGET │
│                      AREA ARE DETERMINED                        │
│                                                            1007 │
└─────────────────────────────────────────────────────────────────┘
                                  │
┌─────────────────────────────────────────────────────────────────┐
│  A USER INTERFACE MAY BE GENERATED ON THE SMART DEVICE BASED UPON THE │
│        PATTERN OF DIGITAL VALUES GENERATED AT STEP 1002         │
│                                                            1008 │
└─────────────────────────────────────────────────────────────────┘
                                  │
┌─────────────────────────────────────────────────────────────────┐
│            ICON IS GENERATED IN THE USER INTERFACE              │
│                                                            1009 │
└─────────────────────────────────────────────────────────────────┘
                                  │
                                  ▼
```

FIG. 10A

| Coordinates | Permissions | ActionType | ActionAttributes | Notes |
|---|---|---|---|---|
| (1,1,1) | All | Information | "Store hours are 9:00-18:00" | Store hours |
| (1,1,1) | UserID = 333 | Message | "Hi Jennifer!" | Message from store owner |
| (0,0,0) | RequestPassword() | Action | InitiateAlarm() | Emergency alarm |
| (2,2,2) | All | Directions | GreenArrows() | Display arrows leading to next destination |

```
┌─────────────────────────────────────────────────────────────────────┐
│ RECEIVE WIRELESS ENERGY OF A FIRST WAVELENGTH INTO A WIRELESS RECEIVER │
│                                                               2401  │
└─────────────────────────────────────────────────────────────────────┘
                                 │
┌─────────────────────────────────────────────────────────────────────┐
│ GENERATE A PATTERN OF DIGITAL VALUES BASED UPON RECEIPT OF WIRELESS │
│ ENERGY INTO THE WIRELESS RECEIVER                             2402  │
└─────────────────────────────────────────────────────────────────────┘
                                 │
┌─────────────────────────────────────────────────────────────────────┐
│ OPTIONALLY RECEIVE THE WIRELESS ENERGY FROM THE RECEIVER AS AN ANALOG│
│ SIGNAL                                                        2403  │
└─────────────────────────────────────────────────────────────────────┘
                                 │
┌─────────────────────────────────────────────────────────────────────┐
│ COORDINATES REPRESENTATIVE OF A WIRELESS NODE MAY BE DETERMINED     │
│ RELATIVE TO A BASE NODE                                       2404  │
└─────────────────────────────────────────────────────────────────────┘
                                 │
┌─────────────────────────────────────────────────────────────────────┐
│ DETERMINE THE POSITION OF THE BASE NODE RELATIVE TO THE DEFINED PHYSICAL│
│ AREA                                                          2405  │
└─────────────────────────────────────────────────────────────────────┘
                                 │
┌─────────────────────────────────────────────────────────────────────┐
│ GENERATE A TARGET AREA WITHIN A CONTROLLER OF THE SMART DEVICE 2406 │
└─────────────────────────────────────────────────────────────────────┘
                                 │
┌─────────────────────────────────────────────────────────────────────┐
│ RESPECTIVE POSITIONS OF ONE OR MORE WIRELESS NODES WITHIN THE TARGET│
│ AREA ARE DETERMINED                                           2407  │
└─────────────────────────────────────────────────────────────────────┘
                                 │
┌─────────────────────────────────────────────────────────────────────┐
│ A USER INTERFACE MAY BE GENERATED ON THE SMART DEVICE BASED UPON THE│
│ PATTERN OF DIGITAL VALUES GENERATED AT STEP 1002              2408  │
└─────────────────────────────────────────────────────────────────────┘
                                 │
┌─────────────────────────────────────────────────────────────────────┐
│ ICON IS GENERATED IN THE USER INTERFACE                       2409  │
└─────────────────────────────────────────────────────────────────────┘
                                 │
                                 ▼
```

FIG. 24A ized by reference. This application references the Non Provisional patent application Ser. No. 15/887,637, filed Feb. 2, 2018; and entitled BUILDING MODEL WITH CAPTURE OF AS BUILT FEATURES AND EXPERIENTIAL DATA, the entire contents of which are hereby incorporated by reference. This application references the Non Provisional patent application Ser. No. 15/716,133, filed Sep. 26, 2017, and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 15/703,310, filed Sep. 13, 2017; and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non Provisional patent application Ser. No. 16/528,104, filed Jul. 31, 2019; and entitled SMART CONSTRUCTION WITH AUTOMATED DETECTION OF ADVERSE STRUCTURE CONDITIONS AND REMEDIATION, the entire contents of which are hereby incorporated by reference. This application references the Non-Provisional U.S. patent application Ser. No. 16/657,660, filed Oct. 18, 2019, and entitled METHOD AND APPARATUS FOR CONSTRUCTION AND OPERATION OF CONNECTED INFRASTRUCTURE, the entire contents of which are hereby incorporated by reference. This application references the Non-Provisional U.S. patent application Ser. No. 16/721,906, filed Dec. 19, 2019; and entitled METHOD AND APPARATUS FOR WIRELESS DETERMINATION OF POSITION AND ORIENTATION OF A SMART DEVICE, the entire contents of which are hereby incorporated by reference. This application references the Non Provisional patent application Ser. No. 16/549,503, filed Aug. 23, 2019, and entitled METHOD AND APPARATUS FOR AUGMENTED VIRTUAL MODELS AND ORIENTEERING, the entire contents of which are hereby incorporated by reference. This application references the Non Provisional patent application Ser. No. 16/775,223, filed Jan. 28, 2020; and entitled SPATIAL SELF-VERIFYING ARRAY OF NODES, the entire contents of which are hereby incorporated by reference.

FIELD OF THE INVENTION

The present invention relates to the exchange of digital content based upon artificial intelligence applied to a set of circumstances including a physical location. More specifically, the present invention links an interactive interface providing digital content to a physical area and a purpose for accessing the physical area. An augmented reality combines aspects of the physical area with location specific digital content. Digital content remains persistent with a location over a period of time.

BACKGROUND OF THE INVENTION

The twenty first century has rapidly generated enormous amounts of digital data. Some estimates indicate that on average, each person generates 1.7 MB of data every second. Currently it is estimated that mankind has generated and stored more than 44 zetabytes (sextillion bytes or $10^{21}$ (1,000,000,000,000,000,000,000) bytes) of digital information, and it is estimated that the amount of digital data generated and stored by 2025 will exceed 200 zetabytes.

A problem arises pertaining to which information is most useful to a user who is located in a particular location, at a particular time, and for a particular purpose. Human beings are simply not capable of organizing and accessing the increasingly larger amounts of data available in a timeframe meaningful to accomplish a particular purpose.

This problem is particularly acute as it relates to buildings and real estate properties in general. Information related to properties is stored in multiple different environments, with most users unaware of where or how to access the information. The problem is further exasperated by each data storage environment requiring different skill sets and credentials to access. Most people involved in building construction and maintenance may be highly skilled in their particular field, but will not be skilled in using the complex digital tools, such as building information modeling ("BIM") or smart building infrastructure, or even sort through the tremendous amount of portable document format ("pdf") information typically associated with a building or other structure on a property.

The need to automatically have information segregated and presented to users is growing as workers tasked with constructing and maintaining buildings exit the workforce or move to other areas or buildings. The knowledge that workers have accumulated about a particular property moves with those workers or is lost to retirement. However, currently, it is difficult, if not impossible, to automatically receive information pertinent to a designated area of a building based upon existing systems and processes. It is especially difficult to receive information related to a subject area when a user does not know what to ask for, or what type of information may be available to the user.

In addition to making information available where and when it is needed there is also a need to limit access to information to only those people who are entitled to access it. In essence, as the world grows in an amount of information available, systems for accessing the information need to become more robust.

SUMMARY OF THE INVENTION

Accordingly, the present invention includes methods and apparatus for using a controller to provide the right information, and the right time, to the right person, at the right location, for the right reason. A controller transceives digital content descriptive of physical attributes of a building or other structure (which may be referred to herein collectively as a building), actions taken by an Agent that are associated with the building, and data provided by electronic sensors quantifying conditions present in the building.

The present invention is based upon a premise that if you cannot find it, you may as well not have it, and includes methods and apparatus for providing digital content in an Agent interface based upon the Agent's purpose for accessing a physical location at a particular time. The present invention uses artificial intelligence (AI) to perform the task of selecting and presenting pertinent information in an Agent interface based upon a geospatial designation and a need associated with accessing the information. The pertinent information will be selected from a larger body of information preferably stored on a computer server, such as a cloud server, or on a smart device.

In some respects, the present invention uses a controller running AI to accomplish a disciplined pursuit of providing less, more focused information, based upon a given set of circumstances. The circumstances will include a physical location and a designation of what is important at a point in time to a particular Agent. Similarly, the present invention provides increased security by only allowing specific in formation to be accessed by an Agent that is positioned at an area designated for receipt of the specific information.

For example, AI may be deployed to ascertain that a plumber that is on a third floor of a building to repair a plumbing fixture only needs information related to the relevant plumbing fixture on the third floor, and not other building information, such as electrical, HVAC or architectural information, or even information relating to plumbing on a different floor in another area of the same floor of the building. Similarly, an HVAC technician may need to know an airflow quantified by an airflow sensor in a particular location, and whether the amount quantified is within a specified range (and what the specified range is), where a rooftop unit "RTU") associated with the airflow is, service records for the RTU, equipment type, and other data related to HVAC, hut not data related to architectural features. The present invention ascertains a relevant physical area, such as for example where an Agent is located in relation to the sensor and presents digital content appropriate for a given set of circumstances and purpose to be served. In general, some embodiments of the present invention recognize that in order for information to be valuable to a given set of circumstances, it must be tied to a goal and made available. Accordingly, a controller uses AI to apply a version of the Pareto principal and exclude a trivial majority of information available (e.g., 80% or more) and include the vital minority of information (e.g., 20% or less) that is helpful for accomplishing a goal.

In another aspect, the present invention persistently associates information with geospatial area such that if a position within the area is specified, the information may be made available to one or more of: an Agent; a vendor, an owner, data aggregator or other designated recipient of the information, based upon reference to the position within the area.

In still another aspect, a position of an Agent may be electronically tracked, and AI may determine information relevant to a physical area based upon the physical location of the Agent. An Agent interface may also indicate where a position of information, or physical item, is located in relation to the position of the Agent.

A location of information may be associated with positioning coordinates and/or an offset from a known position. A location of an Agent may also be associated with positioning coordinates and/or an offset from a known point.

The Agent interface may include graphical representation of an area at least partially defined by a geospatial position contemplated by the Agent interface. In some embodiments, an area defined by a geospatial position contemplated by an Agent is based upon a current position occupied by the Agent and a direction of interest provided by the Agent. In other embodiments, a geospatial position contemplated by the Agent interface may be designated on a two dimensional representation of an area encompassing the geospatial position. Therefore, digital content that is linked to a physical area may be provided to an Agent based upon an identification of the Agent, where the Agent is, and which direction the Agent is oriented towards, or orienting a smart device towards.

In still further aspects, some embodiments of the present invention provide an interactive user interface with content derived from an immediate environment the Agent is located in and virtual content. For example, the present invention enables a user to direct a Smart Device, such as a smart phone, towards an area of interest to the user and a user interface is presented on the user's smart device (and/or a remote smart device) the interface includes an augmented reality environment that combines a rendition of the physical environment present to the user and location specific information in the form of digital content.

In some examples, a transceiver may be co-located with a sensor and engage in wireless communication. Based upon the wireless communication, location coordinates indicating where the sensor is located. The sensor quantifies a condition at a specific location. When a user views the physical area containing the sensor with the Smart Device, the Smart Device displays a rendition of the area monitored by the sensor and with the conditions quantified by the sensor.

In some aspects, the present invention enables print and query access to information or other content relative to a Smart Device. The Smart Device may be used to generate an interface indicating what people, equipment, vehicles, or other items are viewable to the Smart Device and place those items into the context of the environment surrounding the Smart Device.

In general, the present invention may also associate digital content with Tags associated with location coordinates. A Tag may include one or more of a Physical Tag, a Virtual Tag, and a Hybrid Tag (as described in the Glossary below). Tags provide persistent access to specified digital content based upon the Tag's association of the content with a set of location coordinates and/or an area of positional coordinates including the location coordinates. For example, a set of positional coordinates may be located near an architectural aspect of a structure, such as a point of intersection of two beams. A Tag may be associated with the set of positional coordinates. An Area of digital content interaction (e.g., retrieval of digital content and/or placement of digital content for subsequent retrieval) may include the set of positional coordinates and also include an area comprising additional sets of positional coordinates, surrounding the set of positional coordinates, adjacent to the set of positional coordinates, and/or proximate to the set of positional coordinates.

This functionality is accomplished by establishing a target area and determining which tags are present within the target area. Tags may be virtual; in which case the virtual tags are associated with positional coordinates and viewable whenever a target area is designated to encompass the coordinates the virtual tag.

Alternatively, the tags may be physical, such as a small disk adhered to an item of equipment, vehicle, or a person's employee badge. Tracking of a position and content associated with a physical tag may be updated in real time or on a periodic basis. Physical tags may be moved into a target area, or the target area may be moved to encompass the physical tag. The present invention will automatically generate an interface indicating which tags are contained in the interface, what those tags are associated with and where a tag is in relation to the Smart Device. It will also access any information that has been stored and associated with the tag and present in/on the Smart Device.

By aligning real world and virtual world content, a real world site experience is enriched with content from a geospatially linked virtual world. The virtual world content is made available to an Agent based upon a position and a direction of a Radio Target Area ("TRA") specified by a Smart Device supported by the Agent. A geospatial position and direction of interest that is contained within the RTA is generated using wireless communication with reference point transmitters. Wireless communication capabilities of the Reference Point Transmitters determine parameters associated with a Wireless Communication Area ("WCA"). The RTA is a subset of the WCA.

In some embodiments, access to protected digital content requires the presence of an Agent in a defined geospatial area and corresponding location coordinates. The A/R interface incorporates interactive icons representative of the Virtual Tags at the locations specified by the location coordinates within the defined geospatial area. For example, an authorized geospatial area may include a physical structure; such as an office; a manufacturing facility; a warehouse or other storage facility; a military base; an airport; a construction worksite; an energy substation; a cellular tower site; a distribution center; a residential facility; an infrastructure, such as a bridge or tunnel; or other definable area.

Digital content linked to a physical area is provided to an Agent based upon an identification of the Agent, where the Agent is, and which direction the Agent is oriented towards. In some embodiments, the present invention provides an interactive user interface with content derived from an immediate environment the Agent is located in and virtual content. For example, the present invention enables a user to direct a Smart Device, such as a smart phone, towards an area of interest to the user and a user interface is presented on the user's smart device (and/or a remote smart device) the interface includes an augmented reality environment that combines a rendition of the physical environment present to the user and location specific information in the form of digital content.

A Virtual Tag infrastructure (VTI) provides a cryptographic technique that enables secure access to digital content via one or both of: secure networks; and an insecure public networks, such as the Internet. Virtual Tag cryptography reliably verifies an authorized request for access to digital content by a user or other Agent. In various embodiments, location coordinates are used to verify an authorized request to access protected digital content. The location coordinates correspond with one or more of: a location of a Virtual Tag; a location of a Physical Tag; a location of a smart device; and a location of another type of Node.

In another aspect, Virtual Tag cryptography may be based upon location coordinates of designated areas of access to rise digital content. Still further aspects may rely upon location coordinates of a Virtual Tag, a Physical Tag a smart device and/or a Node at intervals over a defined period of time prior to a request to access the digital content.

The VTI includes a system for the creation, storage, and distribution of digital content based upon presentation of authorizing credentials based, at least in part, upon location coordinates. The location coordinates may relate to a first security factor based upon one or both of a location of a Virtual Tag; and a Physical Tag; and a second factor based upon a location or sequence of locations of an Agent seeking to access the digital content to retrieve, modify, or deposit digital content.

In some embodiments, authorizing credentials may include an improved version of a PKI infrastructure, wherein the PKI public certificate is a value based upon location coordinates of at least one of a Virtual Tag, Physical Tag, Smart Device, or other Node. The public certificate may be used to verify that a particular Virtual Tag is accessible to an entity requesting access. The VTI creates digital certificates that map Virtual Tags to locations, and maps authorized access areas to users requesting access (or who may request access). In this manner, the public key includes positional coordinates, or may be derived from positional coordinates. For example, derivation may be accomplished via an algorithmic processing of location coordinate values. Location coordinate values may be those determined at a time interval during a request to access the digital content, and/or during a time interval prior to a request to access digital content.

A VTI may include one or mote of: a VTI certificate authority that stores, issues and processes digital certificates based upon location coordinates and time interval values; a central directory providing a secure location in which location values associated with Virtual Tags digital content are stored and indexed; and a Virtual Tag management system managing positional coordinates and associated digital content.

The present invention may include multifactor authentication for protecting access to digital content that includes a mathematical scheme for verifying the authenticity of a request for access to the digital content and authenticity of a provider of digital content. Essentially, a valid digital signature or login credentials based upon location coordinate values, personal knowledge and possession of a known hardware device provides the VTI with extremely strong evidence to determine that an access request was submitted by a known sender, resulting in a location/user based authentication, and confidence in the integrity of the digital content.

In some embodiments, the present invention enables point, touch, and query; and point, touch, and deposit; access to information or other digital content proximate to a Smart Device. The Smart Device may be used to generate an interface indicating what people, equipment, vehicles, or other items are viewable to the Smart Device and place those items into the context of the environment surrounding the Smart Device.

The details of one or more examples of the invention are set forth in the accompanying drawings and the description below. The accompanying drawings that are incorporated in and constitute a part of this specification illustrate several examples of the invention and, together with the description, serve to explain the principles of the invention; other features, objects, and advantages of the invention will be apparent from the description, drawings, and claims herein.

DESCRIPTION OF THE DRAWINGS

The accompanying drawings, which are incorporated in and constitute a part of this specification, illustrate several embodiments of the invention and, together with the description, serve to explain the principles of the invention:

FIGS. 10A-10B illustrate an exemplary method for generating an augmented-reality Radio Target Area for a Smart Device.

FIG. 11 illustrates an exemplary database structure according to the instant specification.

FIGS. 24A-24B illustrate an exemplary method for generating an augmented-reality Radio Target Area for a Smart Device.

DETAILED DESCRIPTION

Figure 1:
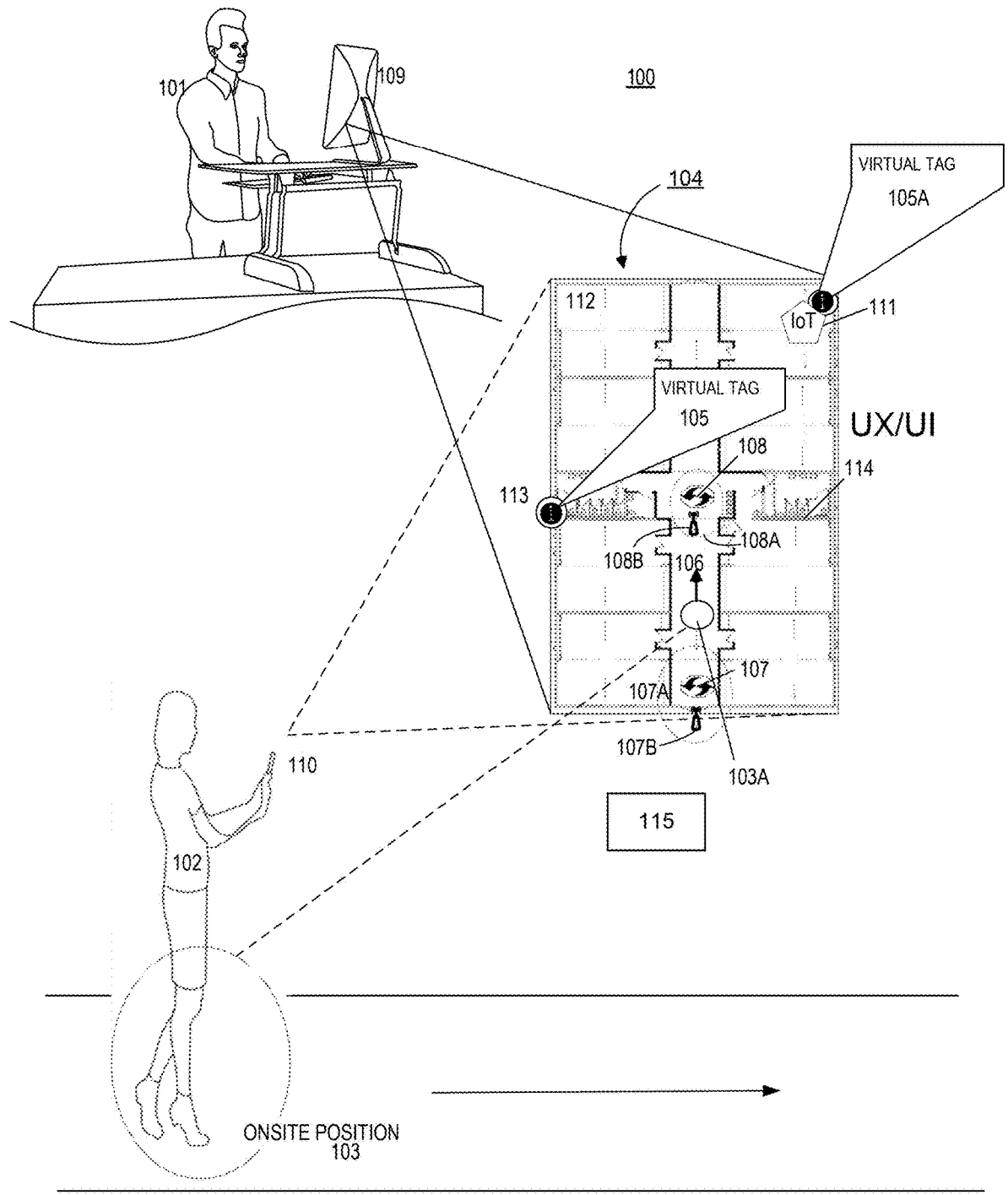
FIG. 1 illustrates a block diagram of a remote user and an onsite user accessing an interactive user interface ("UI") with AI driven digital data geospatially located.

The present invention relates to the use of artificial intelligence to provide digital content to an Agent based a geospatial location linked to the digital content and a purpose for the Agent to have access to the digital content. In addition, the present invention provides for both an onsite Agent and a remote Agent to geospatially locate digital content for subsequent use in AI processes and provision to Agents.

In some embodiments, an onsite Agent may collocate digital content with the onsite Agent geospatial position and/or provide an offset from the User's geospatial position. AI processes access a larger body of data and determine, which digital content is appropriate for a particular circumstances associated with a specific Agent accessing the digital content at a particular time and the geospatial position of the onsite Agent. In some embodiments, an Agent (either onsite or remote) may override an AI selection process and cause specific digital content to be made available to an Agent.

According to the present invention, positions of one or more known points are designated as respective geospatial locations in a physical world environment. A user interface (sometimes referred to as a "UI") may indicate where known points are located. Location coordinates relative to the known points may be used to geolocate digital content via Virtual Tags that are used to direct the Agent to the digital content. Other methods of geolocating Virtual tags may also be used, such as, by way of non-limiting example: colocation of the Virtual Tag with a transceiver image tagging; cloud point tagging; inertial movement dimensions from a known point; and magnetic field direction and distance.

A User Interface for an onsite User may be based upon an Agent's geospatial position in the physical world and purpose for being in the geospatial position. Digital content is placed in a real world context and presented to an Agent interface based upon the Agent's position and in some embodiments, position combined with an indicated direction of interest.

Some embodiments include methods and apparatus for determining virtual world digital content linked to positional coordinates; and displaying real-world energy levels integrated with and aligned with the virtual-world digital content. Such embodiments enable digital content to be persistently accessible via identification of a geospatial a location even if visual aspects of the location change.

In some examples, a Reference Node may be located at a known position. The Reference Node may receive and/or transmit signals in a radio frequency band of the electromagnetic spectrum. An Agent Smart Device may communicate with the Reference Node and determine a location of the Smart Device based upon the Smart Device communication with the Reference Node.

In a simple form, a Node may broadcast a radio frequency wireless communication. Nodes may also be capable of receiving a radio frequency on a same radio frequency and/or a different radio frequency as a received radio frequency. Frequencies utilized for wireless communication may include those within the electromagnetic spectrum radio frequencies used in one or more of: UWB, Wi-Fi, and Bluetooth modalities (including BLE), as well as IR, visible and UV light as examples of transmission modalities.

In the following sections, detailed descriptions of examples and methods of the invention will be given. The description of both preferred and alternative examples though thorough are exemplary only, and it is understood that, to those skilled in the art, variations, modifications, and alterations may be apparent. It is therefore to be understood that the examples do not limit the broadness of the aspects of the underlying invention as defined by the claims.

Referring now to FIG. 1, an interactive user interface 104 is illustrated with at least one Virtual Tag 105. The Virtual Tag 105 is linked to a geospatial position 113. The geospatial position may be integrated into a reference image 112. Integration of the Virtual Tag 105 into a reference image 112 helps a user orient an onsite Agent 102 located at an onsite Agent position 103, with a User Interface 104 containing an onsite user virtual position 103A. In some embodiments, the reference image 102 may include, by way of non-limiting example, a two dimensional floorplan illustrating architectural aspects such as walls, doors, and fixtures and/or other features that may be recognizable by an Agent, or other aspects of a design plan or architectural drawing that may or may not be recognizable to an onsite Agent 102. Other reference images may include an orthographic view, perspective view, or other view from an angle, such as a doll house view of a building or other structure or area of land, such as a job site, storage area, utility area, airport, government facility, or other defined space.

In this disclosure the Agent position 103 may be considered dynamic as the Agent moves about a physical site, but considered static at a given instance of time. The user interface 104 may illustrate the onsite Agent virtual position 103A relative to the reference image 112 at an instance of time, and/or over a period of time.

Onsite Agent 102 movement may be tracked, for example, by acknowledging the Agent position 103 aligning with a known point 107-108 and using inertial movement sensors and processes to register movement away from the known point 107-108 in a direction and for a distance (direction/distance 106). In some non-limiting embodiments, the inertial movement sensors and processes may be incorporated into a Smart Device 110 supported by the onsite Agent 102. In another aspect, in some embodiments, a direction/distance 106 from a last known point 107 may be noted on a user interface 104.

According to the present invention, multiple known points 107-108 will be located at a physical onsite area, such as a building site. A controller may register that the Agent is aligned with a first known point 107 and onsite Agent movement away from the known point 107 may be determined as the onsite Agent 102 moves about the physical site. An Agent position may be described via generation of positional coordinates (as described herein) and Agent movement may include, for example a direction and distance moved, a change in positional coordinates, or other quantifier of relative position. In some embodiments, onsite Agent movement may be presented via a user interface direction/distance indicator 106.

As onsite Agent 102 relocates away from the first known point 107, Onsite Agent movement during relocation may be determined via physical conditions quantified by sensors and/or other electronic devices incorporated into a Smart Device 110 supported by the onsite Agent 102. Electronic devices in the Smart Device 102 that are involved in motion detection may be broadly referred to as an Inertial movement unit ("IMU") and operative with software executed by the Smart Device 110 (and/or on a remote server) to track physical movement of the onsite Agent 102. Onsite Agent 102 movement may be calculated based upon values of variables quantified by the IMU in the Smart Device 110 as the onsite Agent relocates, until the onsite Agent 102 aligns with a second known point 108.

The user interface 104 may include an indicator of an onsite Agent position 103 presented as an onsite agent virtual position 103A. The onsite agent virtual position 103A may be viewable by one or both of a remote user 101 accessing a remote computing device (e.g., workstation; tablet; smart phone; or other controller) and an onsite agent 102 accessing a Smart Device 110, or other person or automation accessing the user interface 104 via a controller.

A Virtual Tag 105 may be located at a geospatial position 113 on the User Interface 104 that correlates with a physical world location. The User Interface 104 may also include graphical artifacts 114 descriptive of, or otherwise indicative of, items that are present in the onsite physical world and may be recognizable to the onsite Agent 102. Items that are present in the physical world may be limited to those items within a designated area including the geospatial position. The designated area may be designated for example, via a radius surrounding the geospatial position 113 (or other curvilinear shape or polygon size that includes the geospatial position 113). Items may include, by way of non-limiting example, one or more of equipment items, architectural aspects, and fixtures. An onsite agent virtual position 103A and the Virtual Tag 105 geospatial position 113 may also be included in the user interface 104.

Movement of the onsite Agent 102 may be displayed in the UI 104 and synchronized to the graphical artifacts 114 and VT 105 geospatial position 113 based upon a distance and direction 106 travelled by the onsite Agent 102 from a known point 107-108 and a scale of graphical artifacts 114 included in the UI 104. For example, if a UI 104 includes reference image 112 that includes a floorplan based upon an architectural design or CAD drawing or the like, the floorplan may be associated with a known scale, however, in the event that the scale is not known, AI may be used to recognize the graphical artifacts 114 and assign a standard measurement to the graphical artifact 114. For example, a doorway may be recognized by AI and assigned a width of three feet (or other industry standard measurement), other graphical artifacts 114 may be associated with other standard measurements. Travel measured by an IMU in a Smart Device 110 may be quantified as onsite Agent 102 movement and onsite agent virtual position 103A may be changed in the UI 104 based upon the onsite Agent 102 movement. The onsite agent virtual position 103A may be changed according to a calculated scale associated with the reference image 112 and thereby allow the onsite agent virtual position 103A to be accurately positioned amongst the graphical artifacts 114.

For example, in some embodiments, as an onsite Agent 102 enters into an area associated with a known point 107-108, the onsite Agent virtual position 103A may be adjusted in the UI 104 to align with graphical artifacts 114 that represent physical items in the physical world proximate to the onsite Agent 102 (such as, for example, those within visible and/or audible range of onsite Agent). As the onsite Agent 102 relocates, the IMU may register values for variables quantified by electronic devices in the Smart Device 110 that indicate movement of the Agent 102 in a direction and for a distance calculated by the IMU. The onsite agent virtual position 103A in the UI 104 may be modified to correlate with the direction and magnitude of movement of the Agent 102 from the last known point 107-108 the onsite Agent 102 aligned with. The direction/distance 106 travelled by the Agent 102 may be scaled according to one or both of: a specified scale; and a controller determined scale based upon a size of features in the reference image 112.

As discussed further herein, some embodiments may include calculation of an Agent onsite position 103 based upon wireless communications, such as UWB, WiFi, Bluetooth, sonic; and/or ultrasonic communications. Wireless communications may be referenced alone or in combination with IMU measurements. In some embodiments, wireless communications may increase the accuracy of position determination by calculating a distance from a wireless transceiver. IMU measurements may indicate a direction and the distance from the transceiver may indicate a distance. In some embodiments, AI processes may adjust an onsite Agent 102 to avoid placing the onsite Agent virtual position 103A in a location occupied by an item in the reference image 112. For example, a distance calculated by a wireless communication and a direction generated by an IMU may provide multiple possible onsite Agent virtual position 103A in the UI 104. AI may be used to remove any virtual positions occupied by an item in the reference image, such as a column or piece of machinery.

In another aspect, the UI 104 allows one or both of, the remote User 101 and the onsite Agent 102, to place a VT 105 at a designated geospatial position 113 that is the same as the onsite agent virtual position 103A, or offset to the onsite agent virtual position 103A. The VT 105 appears at a location on the reference image 112 specified by the onsite Agent 102. For example, an offset may include a direction and distance from the onsite Agent position 103. The location on the reference image 112 correlates with an onsite geospatial position 113 in the physical world. In some embodiments, AI may present a selection of distances from an onsite Agent 102 in a given direction. For example, if an IMU unit is used to determine a direction that a Smart Device 110 is pointing, then AI may provide a selection of likely distances from the onsite Agent virtual position based upon a distance to an artifact, equipment item, wall, doorway, window, or other aspect identified by the AI as an item that may be desirable to the Agent 102 to place a Virtual Tag 105 on.

In another aspect, one or both of, the remote User 101 and the onsite Agent 102, may activate an interactive user device 115 to create a Virtual Tag 165 with a geospatial location at the location of the onsite Agent 102. In other embodiments the Virtual Tag may be offset from the geospatial position 112 of the onsite Agent 102 by a specified distance in a specified direction.

In this manner, an onsite Agent 102 or the remote User 101 may view the UI 104 to ascertain the onsite Agent's 102 position relative to the physical world around the onsite Agent 102 as depicted by the graphical artifacts 114. The UI 104 may include a geospatial position 113 of a VT 105 at a relative distance and direction to a current position 103a of the onsite Agent 102.

As the onsite Agent 102 traverses through a known point 107-108 in the physical world, the current virtual position 103A of the onsite Agent 102 may be synchronized with the geospatial position of the known point 107-108, IMU/or wireless position tracking may be restarted from the most recent known point 107-108 that the onsite Agent 102 aligned with and the onsite Agent virtual position 103A may be updated, as needed, to accurately represent the Agent position 103 following the restart of the IMU from the most recent known point 107-108. Accordingly, in general, the Onsite user position 102 will equate to the most recent known point 107-108 traversed and an aggregate of distances and directions traveled following the onsite Agent 102 traversing a last known point 107-108.

Figure 5:
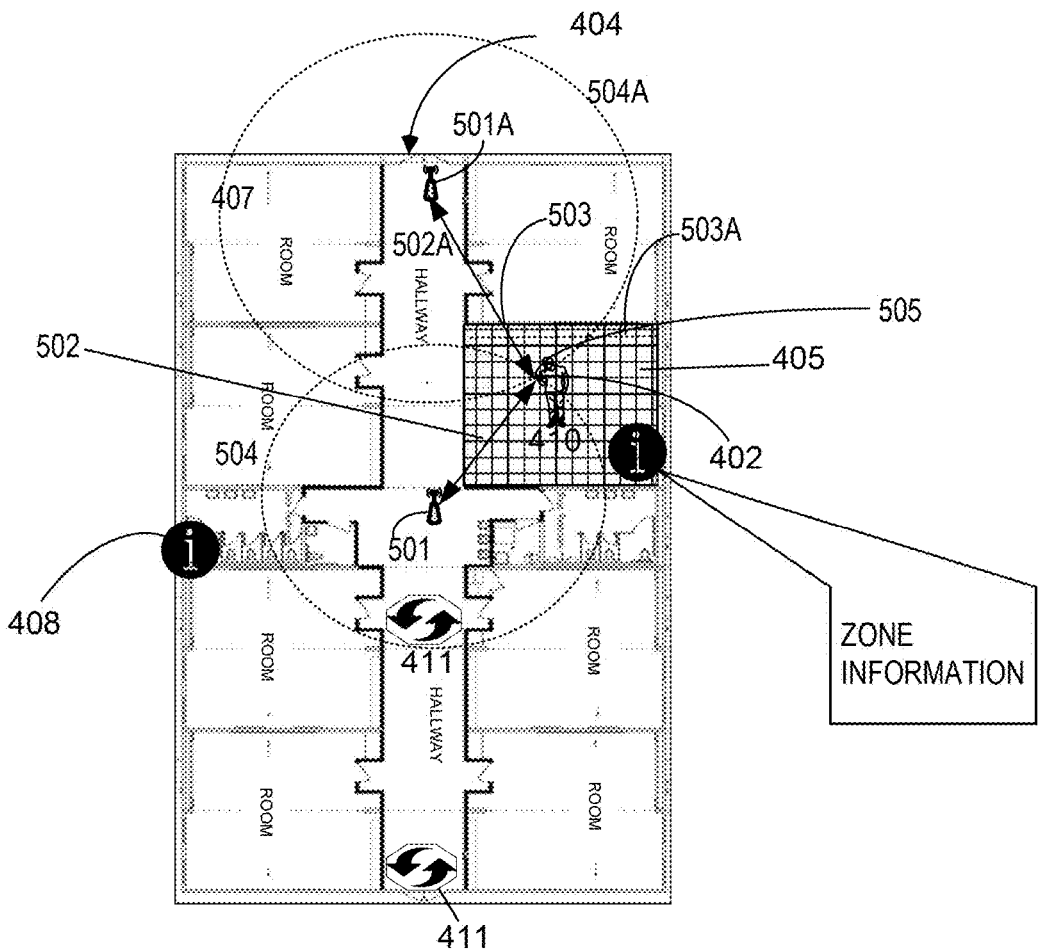
FIG. 5 illustrates a smart device position determination based upon inertial movement and a wireless communication.

The present invention may track an onsite Agent 102 traversing a known point 107-108 using one or more of: a BLE area, NFC, ANT, Hash barcode, triangulation, distance, and direction (e.g., FIG. 5 distance based upon TDOA or TOA of a wireless communication, and direction of travel is IMU).

Traversing a known point may include, by way of non-limiting example, a determination that the Smart Device 110 is located within an area including the known point (known point area 107A) may be accomplished via communication with a reference point transceiver 107B (such as, for example, an iBeacon™ or other BLE transceiver, UWB transceiver, WiFi transceiver, or other wireless modality transceiver). The wireless communication may be used to determine that the Smart Device 110 is within an ascertainable distance to the iBeacon or other reference point transceiver 107B, such as for example within 0.3 to 2.0 meters (and preferably within about 1.0 meter). Some preferred embodiments include using an iBeacon or other reference point transceiver 107B to register when an onsite Agent 102 passes through a doorway, point in a hallway, such as passing an item of equipment or other ascertainable position that way be registered as a known point 107-108. In such embodiments, an iBeacon or other reference point transceiver 107B may be placed, for example, above a doorway or in a in a sill. As the onsite agent 102 passes through the doorway, the onsite agent will be within a meter of the iBeacon or other reference point transceiver 107B. The IMU may synchronize with the first known point 107 and begin tracking movement of the onsite Agent 102 supporting the Small Device 110. When the onsite agent 102 carries the smart device 110 to the second known point 108 a second reference point transceiver 108B may indicate that the onsite agent 102 is passing through a second area including a second known point 108A.

According to the present invention, AI may be used to enhance an onsite Agent's 102 and/or a remote User's 101 interaction with a physical area occupied by an onsite Agent 102. One enhancement of an onsite Agent's 102 and/or a remote User's 101 interaction may include one or both of an onsite Agent 102 and an offsite User 101 to make Directional Query. The Directional Query may include, by way of non-limiting example, position of a Smart Device 110 and a query that includes a direction from the Smart Device 110. In some embodiments, the direction from the Smart Device 110 may be based upon one or more of: a value of a directional variable generated by a Smart Device supported by an onsite Agent 102, and wireless communications entered into by a transceiver integrated into the Smart Device 110 or collocated with the Smart Device 110. A controller may use AI or other automated processes to reference an onsite Agent position 102 and a direction indicated by a Smart Device 110 supported by the Agent 102 and generate a response to the Directional Query.

For example, a Directional Query may include an item of equipment located in a direction indicated by pointing a Smart Device 110 in a direction and touching the Smart Device 110 screen to activate a user interactive interface. A response may include answers to the query based upon AI ascertaining that an item of equipment is within a certain distance from the Smart Device 110, such as a vector value, or within a defined proximity to the Smart Device 110, such as, in a same room and/or defined area as the Smart Device 110, or within a defined zone or region as the Smart Device 110. A zone or region may be defined according to position coordinates and/or a distance and direction from the Smart Device 110. Various embodiments may include each of the preceding query parameters being generated from the onsite Agent 102 and/or the Smart Device 110.

As used herein, AI processes will include automated processors and controllers that are able to perform tasks normally requiring human intelligence, such as visual perception, decision making, pattern recognition and the like. The AI may be trained to use one or both of unstructured and structured queries, and be capable of processing unstructured data into useful information.

In another aspect, in some embodiments, AI may be used to determine a room or other area, zone, or region in which the Smart Device is located. An area, zone, and/or region (discussed further herein), may be any subsection of a building or other structure that is logical for a set of circumstances. Examples of areas, zone, and regions may include, for example, one or more of a hallway; a stairwell; a wing of a building; a floor of a building; a portion of a complex or campus; a portion of a manufacturing and/or processing plant; a neighborhood, a government delineation of land; or other defined geospatial area. AI processes may be used to identify Virtual Tags 105, or other information.

With the enormity of data available in current times, a need arises to differentiate between useful information and extraneous information for a given set of circumstances involving a particular location and particular Agent. The present invention implements the theory that less is often better when it comes to an amount of data to provide in a given set of circumstances. Accordingly, the present invention provides for AI to determine which data to present to one or both of: an onsite Agent 102 and an offsite user 101 based upon one or more of: a position a Virtual Tag; a position of an onsite Agent 102; a direction the Agent 102 indicates; a direction of travel of the Agent 102 within a building; credentials associated with the Agent 102; a purpose for the Agent 102 to be in the building; a security clearance for the Agent; results of a security challenge to the Agent 102; a length of time that the Agent 102 is within the building; concurrent conditions and/or circumstances during the time the Agent 102 is within the building; a query submitted by one or both of the Agent 102 and the offsite user 101; IoT sensor readings; an objective associated with the building, such as production or inhabitation; and AI perceived observations, such as results of an unstructured query and/or trend observed by machine processes.

In still another aspect, in some embodiments, AI may be used to ascertain travel of an onsite Agent 102 and keep the onsite Agent 102 within portions of a floorplan included in the reference image 112 that an onsite Agent 102 would be able to traverse under normal circumstances. For example, AI may ascertain where walls, equipment, fixtures, or other architectural aspects or obstacles to onsite Agent 102 travel are located and understand that the onsite Agent 102 will not walk through a wall or other obstacle and keep the onsite Agent at a prescribed distance from the wall or other obstacle. A prescribed distance may be preprogrammed into the AI (such as, for example, about 20 centimeters from a wall). Additional embodiments may include a distance being determined by AI based upon what is included in a surrounding area. For example, if an obstacle to walking (such as, for example, a water fountain in a hallway) is present, AI may keep the onsite Agent position 103 away from the water fountain, but perhaps closer to the water fountain than to a wall.

While examples of the above AI variables are too numerous to delineate comprehensively. The present invention provides that conditions relating to: who, w at, where, why, and how, may be applied to AI processes to best ascertain what information to provide one or both of an offsite User 101 and an onsite Agent 102. Security may also be enhanced via four to five factor security protocols and/or creation of a virtual machine that is in existence only for a length of time optimal to perform a data transaction and then removed to prevent infiltration to the virtual machine.

In some embodiments, a Virtual Tag 105 may include one or more of: routines, checklists, procedures, or other actions to be performed by an Agent 102 at a particular onsite agent position 103. The onsite agent position 103 will correspond with a geospatial location in the physical world and may be illustrated in the user interface 104 as an onsite agent virtual position 103A. A Virtual Tag 105 may also include one or more of alphanumeric data, documentation, image files, video files, biometric data, IoT sensor data, other electronic and/or analog device data, URLs, communication links, or other logical and/or digital content. In some embodiments, the Virtual Tag 105 contents may verify completion of an action at a particular geospatial location.

In another aspect, in some embodiments, a Virtual Tag 105A may include data generated by an onsite sensor, such as an IoT sensor 111. The IoT sensor 111 may quantify a condition present on site. The user interface 104 may include a graphical representation of architectural aspects included in the reference image 112 and descriptive of a building or other structure. The user interface 104 may include a graphical representation of a location of an IoT sensor 111, in some embodiments, an indication of one or more conditions present onsite that are quantified by the IoT sensor 111. A Virtual Tag 105 may include information about the IoT sensor, such as type of sensor, when deployed, how deployed, parameters set in the IoT sensor 111, who deployed the IoT sensor 111, and data generated by the IoT sensor 111. Data generated by the IoT sensor 111 may be real time (e.g., without artificial delay) and/or historical data.

In some embodiments, executable programmable code may be executed by a controller and operative to ascertain whether a condition quantified by the IoT sensor 111 is within a normal operating range, and in the event that the condition quantified by the IoT sensor 111 is outside the normal operating range, an alert may be sent to one or both of the User 101 and the onsite Agent 102 and a Virtual Tag 105A may be placed on the user interface 104 indicative of a location of the IoT sensor 111 reporting an out of normal condition, as well as the onsite Agent position 103 and a pathway that the onsite Agent 102 may travel in order to arrive in an area conducive to respond to the out of normal condition quantified.

Figure 1A:
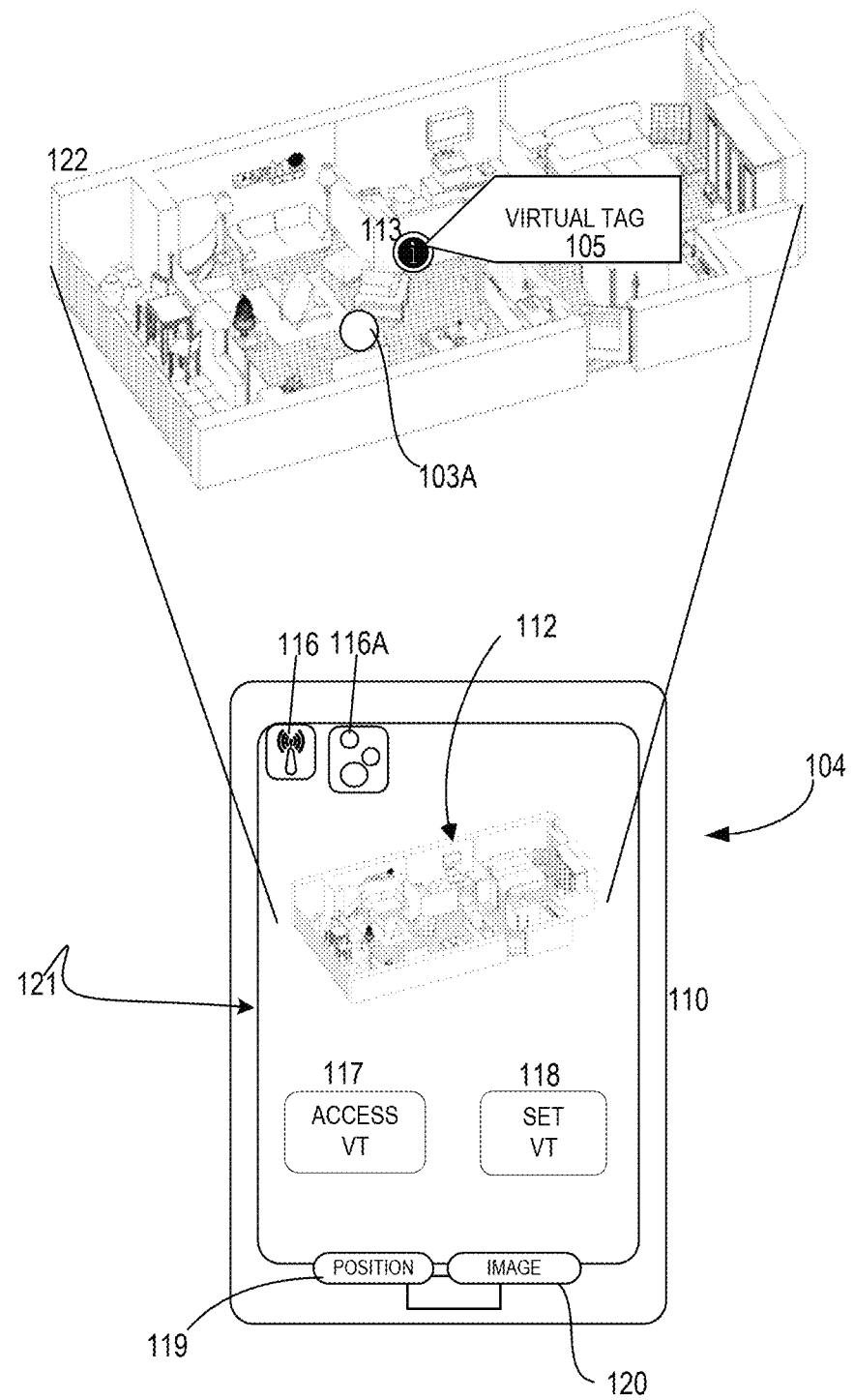
FIG. 1A illustrates a user interface on a smart device with a doll house view of a floorplan.

Referring now to FIG. 1A, a Smart Device 110 is illustrated with a user interface 104 and a 3D perspective (sometimes referred to as a "Dollhouse") view of a floorplan reference 122 (dollhouse view 122). A blow up of the dollhouse view 122 illustrates a virtual tag 105 at a defined geospatial position 113 integrated into the user interface 104. The onsite agent virtual position 103A is also indicated on the user interface 104. User interactive devices 117-120, may include areas of a touchscreen 121 on the smart device 110. As illustrated, the user interactive areas enable an Agent 102 to touch the touchscreen 121 and access a virtual tag 117 and/or set a virtual tag 118. Setting a virtual tag may include, determining a geospatial position 103 a Smart Device 110 and setting the Virtual Tag 105 at the same geospatial position 113 as the Smart Device 110 or at a geospatial position 113 that is offset from the position of the Smart Device 110.

Additional functionality that may be implemented via activation of a user interactive device 117-120 includes user initiated position determination. As discussed herein, a position of a Smart Device 110 may be accomplished via triangulation based upon wireless communications, calculating distance and direction of movement with internal IMU devices, such as accelerometers, magnetometers, gimbals, MEMs, or other electronic devices; image recognition, LiDAR, and/or other automated processes via automation.

In some embodiments, data captured by a Smart Device 110 via activation of a user interactive device 120, may include data generated by any electronic device incorporated into the Smart Device 110 or in logical communication with the Smart Device 110. One particular device internal to the Smart Device 110 may include a CCD device 116A capturing image data that may be included in a Virtual Tag 105 that is positioned at a geospatial position 113 indicative of an area providing energy captured by the CCD. Another device internal to the Smart Device may include a wireless transceiver, such as a transceiver capable of transceiving in a UWB, Bluetooth, or other wireless modality.

Figure 2:
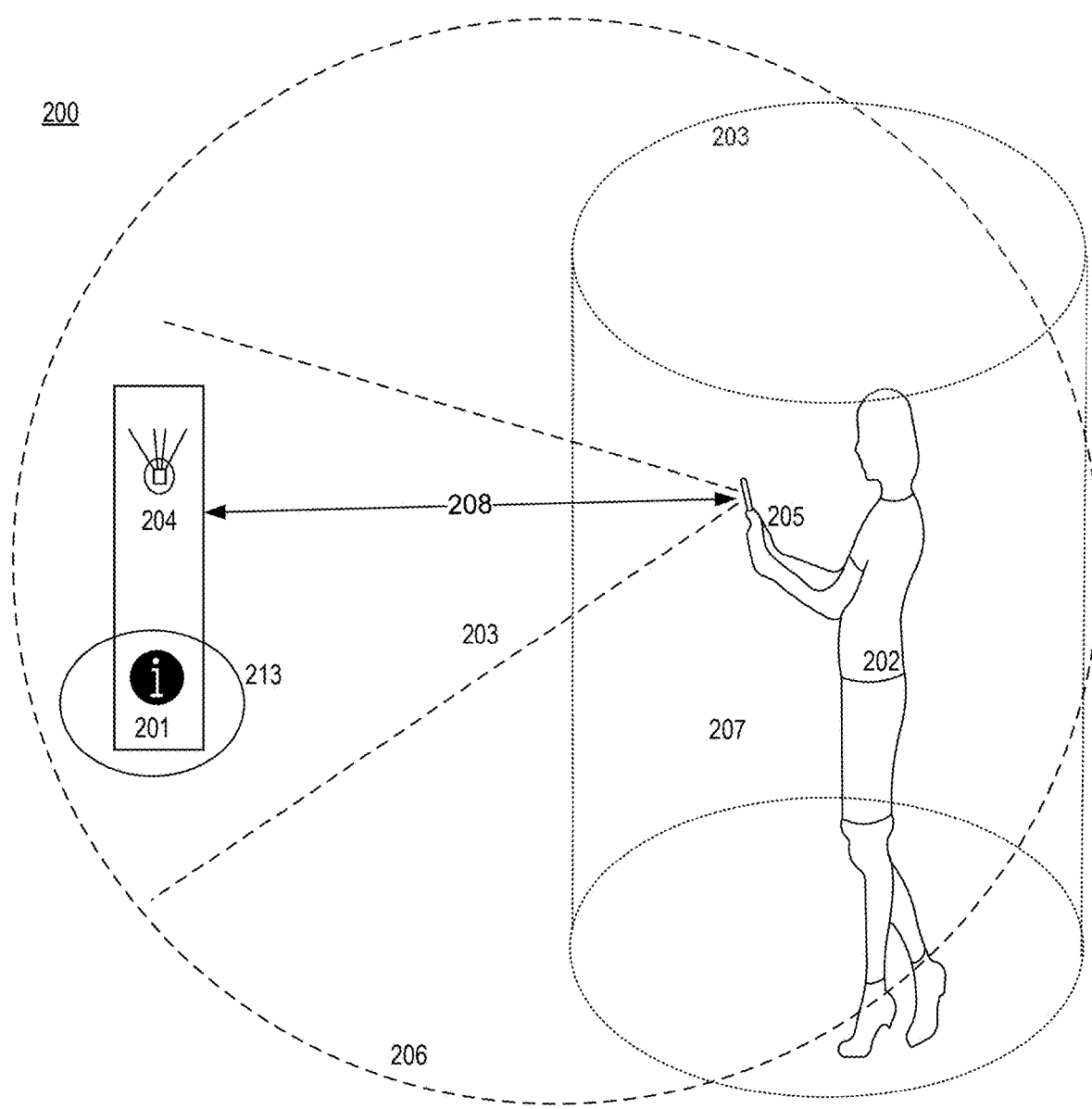
FIG. 2 illustrates a block diagram of an onsite Agent at an onsite Agent position accessing a Virtual Tag.

Referring now to FIG. 2, in some embodiments, access to a Virtual Tag 201 may be accomplished via a secure transaction system 200 that includes apparatus and methods for accessing a Virtual Tag 201. The secure transaction system 200 employs multifactor security that includes verification of the Smart Device position area 207.

In FIG. 2, a Smart Device 205 is illustrated proximate to a Virtual Tag 201. In this particular illustration, the term "proximate to" may infer by way of non-limiting example, that the Smart Device 205 is within visual and/or audio range of the Virtual Tag 201 by an Agent 202 supporting the Smart Device 205, in other embodiments, "proximate to" may infer that the Virtual Tag is within wireless communication range of a transceiver operable by the Smart Device 205.

In some embodiments, access to the VT 201 may be restricted to a SD 205 located within an Authorized Transaction Area (ATA) 203. AI processes may be used to determine whether the Smart Device 205 is located within ATA 203. The ATA 203 may be almost any definable area feasible for a SD 205 to be located in, such as, by way of nonlimiting example: an area within a specified distance 206 of a VT 201. The distance may be calculated based upon the methods described herein for determining a position of the Smart Device 205 in relation to a virtual tag geospatial position 213, such as, for example, a distance based upon tracking inertial movement from a known position, relative timing of wireless communications, angle of transmission and receiving wireless transmissions, LiDAR, image recognition, or other modality for determining a Smart Device geospatial position 213.

In some embodiments, the distance calculation may also take into account a margin of accuracy for a technology modality used to determine a position, (including, for example, environmental interference with wireless communication); or other variable. Accordingly, if a secure transaction specifies that a SD 205 is 3.2 meters from a VT geospatial position 213, and location determination modality has a margin of error of 0.8 meters, then a Smart Device position 207 determined to be within 4.0 meters of the VT geospatial position 213 may be allowed to access the Virtual Tag 201.

In some embodiments, an ATA 203 may be a defined area that is offsite from a site for the VT 201, such as, for example, a remote ATA 203 may be in an office space area that is at a different geolocation than a Virtual Tag 205. In such embodiments, an ATA 205 may be a secure location with physical security features, such as challenged entry points, security guards, and the like.

Accordingly, one or more VTs 201 may be associated with an ATA 203 from which a Smart Device 205 is authorized to perform transactions involving the Virtual Tag 201. In some embodiments, an ATA 203 may be exclusive to a particular Virtual Tag 201, such as, for example, an ATA 203 the includes an area surrounding, adjacent to, or proximate to, a Virtual Tag 201. Embodiments may also include an ATA 203 that includes an area associated with a particular workstation; dispensing apparatus; building delivery area; utility station; point of sale device; and construction site under management, whether or not those areas are surrounding, adjacent to, or proximate to, the Virtual Tag 201.

Inclusion of a Smart Device 205 within an ATA 203 may be determined according to any of the methods and apparatus discussed herein for determining a geospatial position of the SD 205, in addition a Transceiver 204 may be positioned with the Virtual Tag 201 (such as, co-located with, or incorporated into the Virtual Tag 201) and a position of the transceiver may be used to indicate a position of the VT 201. The Transceiver 204 may include a relatively shorter range and more accurate location modality than GPS, such as one or more of: UWB, Bluetooth, Wi-Fi, ANT, Zigbee, BLE, Z Wave, 6LoWPAN, Thread, Wi-Fi, Wi-Fi-ah, NFC (near field communications), Dash 7, and/or Wireless HART transmissions. The Transceiver 204 may engage in logical transmission of sufficient data to calculate a Smart Device distance 208 indicative of how far the Smart Device is located from the VT 201 and/or the virtual tag transceiver 204.

In some embodiments, a directional aspect may be included to determine whether a SD 205 is within an ATA 203, a virtual tag access distance 206 may not be enough to determine that the Smart Device at the location of transceiver 105 is located within a virtual tag 201 since a radio distance is often a radius. Therefore, the present invention provides for a Transceiver 204 to provide directional transmissions. For example, a directional transmission may be limited to transmission from a front side of the virtual tag 201 in a forward direction (as indicated by the arrow).

In addition, one or more Reference Point Transceivers (as described below) may engage in wireless communications with the Smart Device 205. A distance between the respective reference point transceivers and the Smart Device 205 may be calculated. A distance from a reference point transceivers may correlate with a general location of a SD 205 so that a determination made be made as to whether a SD 205 is within an ATA 203. The general location of the SD 205 may be made via available modalities, such as, WiFi, UWB, GPS, image recognition, etc.

Once it has been verified that a Smart Device 205 is positioned within an ATA 203, a transaction may be entered into and completed. A number of factors may be ascertained before a transaction with the virtual tag 201 is executed. In some preferred embodiments, the completion of the transaction with the virtual tag 201 will include one or more of: a) designating a user via a unique user identification; b) exchange of a user password, private key, synchronous dynamic password or other security code; c) location verification, which may include determination that the Smart Device at the location of transceiver 105 is within a ATA 203; d) identifying a virtual tag 201; e) present virtual tag 201 credentials to a transaction process; f) designate actions to be completed during transaction execution; g) execute the actions; h) generation of an augmented reality icon viewable from the ATA 203; and i) interaction wish the A/R icon.

According to the present invention, presentation of credentials from one or both of the virtual tag 201 and Agent 100 may only be made once location determinations indicate that the Agent 100 with the User Smart Device at the location of transceiver 105 is within the ATA 203.

In addition, in some embodiments, credentials may be withheld until a Virtual Tag 201 icon has been generated and made available to a unique identifier identifying an Agent 202 seeking access to the Virtual Tag 201. The Virtual Tag icon will be located in virtual space at a geospatial position that is viewable via a user interface. In some embodiments, the user interface may be generated with input from geospatial indicators generated by the Smart Device 205.

A viewable area in the user interface may include a Radio Target Area for an energy receiving device in (or attached to) the Smart device. Geospatial indicators may include, for example, one or both of location coordinates for the Smart Device and a distance and direction from a known point. Generation of a Virtual Tag 201 icon in a virtual space that is aligned with a specific location creates a deterrent to unauthorized access to the Transaction Apparatus since a person that is not present to the TA will not be able to view the Virtual Tag icon and therefore not be able to interact with the icon in order to complete a process for gaining access to the secure transaction.

Figure 2A:
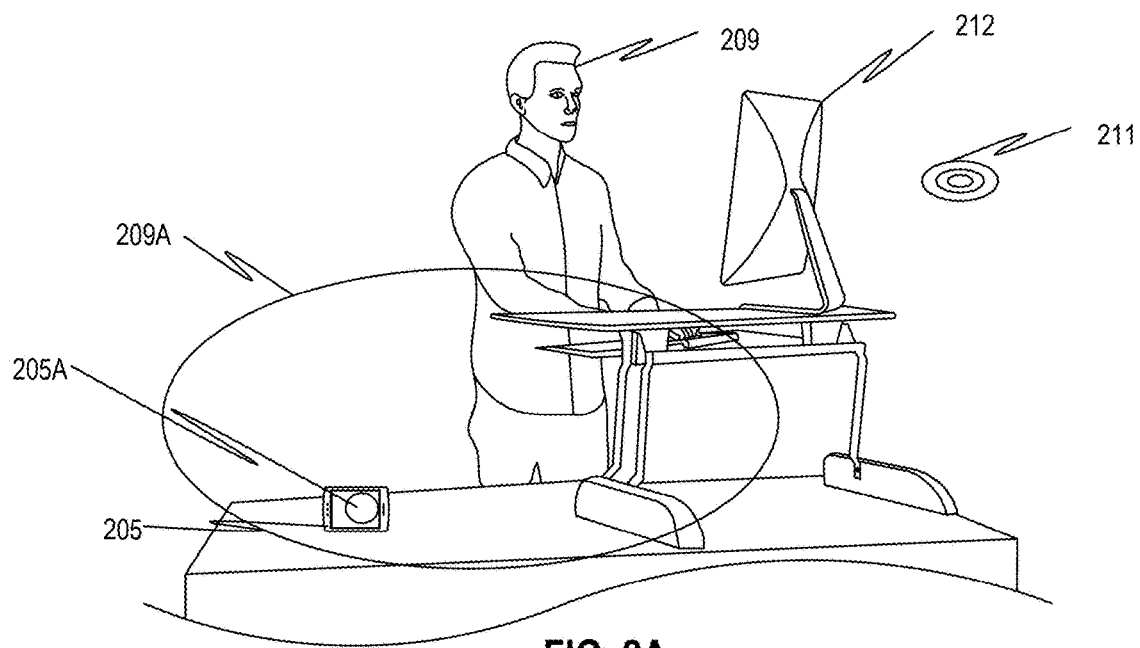
FIG. 2A illustrates a remote user and an authorized access area.
Figure 2B:
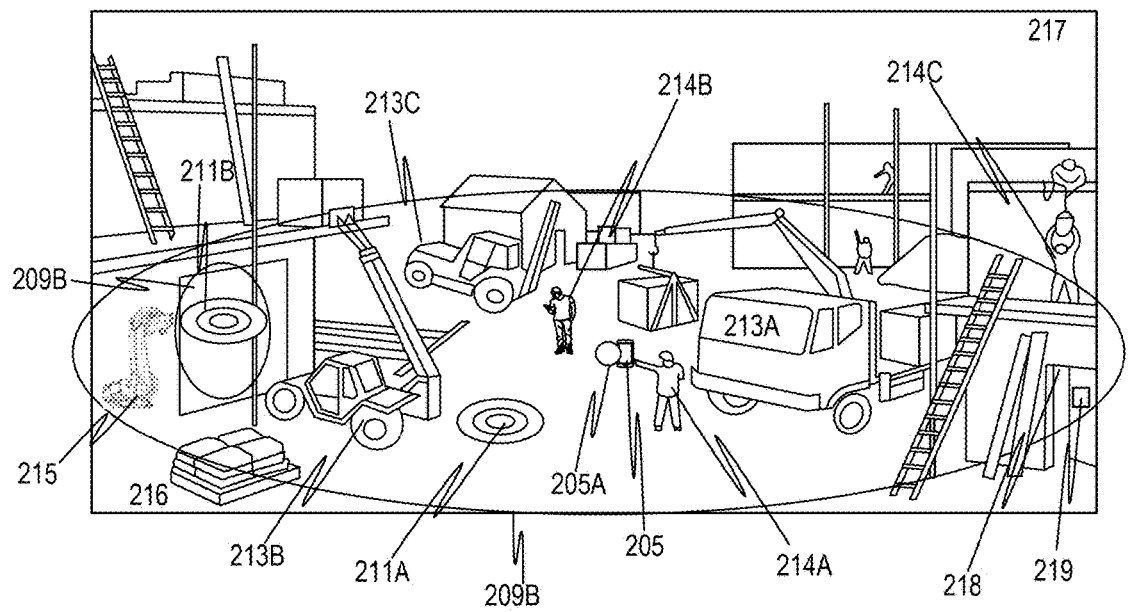
FIG. 2B illustrates an exemplary onsite workplace with Virtual Tags and authorized access areas.

Referring now to FIGS. 2A-2B exemplary embodiments of apparatus and methods that may be involved in various embodiments involving Virtual Tags 211, 211A-211B according to the present invention are illustrated. These illustrations are non-limiting and depict only some specific examples of how the present invention may be implemented to provide enhanced security and data sources to memorializing events and/or for analysis by machine learning apparatus, such as via those apparatus capable of artificial intelligence processes.

Referring now to FIG. 2A, a remote user 209 operating a remote workstation 212 is illustrated as a Transaction Apparatus for which a geospatial component is required to login to the workstation 212 or to otherwise operate the workstation. For example, a Smart Device 205 at the location of transceiver 205 may be required to be within an ATA 209A located in an area proximate to the workstation 212. (The transceiver 205A may be incorporated into the SD 205 or collocated with the SD 205, such as, for example in a case attached to the SD 205). In this scenario, the term "proximate to" may be a defined radius distance from the workstation, such as for example, within 5 feet, 6 feet, 12 feet, or other defined distance. "Proximate to" may also include a directional component, such as, for example, in front of the workstation 212 in order for an Agent 100 to login to the workstation 212 and operate the workstation. An ATA 203A may also be a larger area such as an area within a structure in which the workstation 212 resides, or a property in which the workstation 212 resides.

In some embodiments, a presence of the Smart Device at the location of transceiver 205A within an ATA 203A permits an Agent 100 to enter User credentials. In other embodiments, the locating of the Smart Device at the location of transceiver 105 within the ATA 203A causes a first controller (such as a CPU in a workstation 212) to execute a security related process that presents User credentials associated with the Smart Device at the location of transceiver 105 to a related login process. Presentation of credentials may also be a part of other various secure transactions that require different credentials to be presented. In addition, credentials from one or both of a TA, such as the workstation 212, and an Agent 100 may be presented to a process that will transacted.

In some embodiments, a Virtual Tag 211A is presented at location coordinates within an RTA (not illustrated). The Virtual Tag 211A is preferably viewable from within the ATA 203A with the Smart Device at the location of transceiver 105, while the Smart Device at the location of transceiver 105 is supported by the Agent 100.

Referring now to FIG. 2B, an exemplary worksite is illustrated with various items of equipment 213A-213C, personnel 214A-214C, robotic Agents 215, materials 216, authorized areas of work 217, and locations of architectural aspects 218, such as a building, walkway, stairs etc.

According to the present invention, a personnel, which in some embodiments may also be a User 214A may locate a Smart Device 205 at the location of transceiver 205A with an ATA 203B and interact with an App (or other executable code executed by a controller) that identifies a particular authorized area of work 217 which may also represent a TA based upon the Smart Device at the location of transceiver 205A being located in the ATA 203B. The App may present Agent credentials for a controller, software, automation, or other provider of access to Virtual Tag(s) 211, 211A-211B.

The App may also present payor credentials for the User 214A (or other entity that authorizes payment for sale of materials, energy, services, or other saleable item or quantity to the User 214A or an entity associated with the User 214A).

In some preferred embodiments, the credentials are virtually presented to a known payment processor, such as a bank, a credit card company, online payment company (e.g., Venmo, PayPal, Zelle etc.) via a secure Internet connection or device specific app, thereby adding further security features. In this manner, the present invention provides for a payee for a transaction from within a specific TA for one or more of: a) a finite list of potential purchases; b) a finite list of potential vendors to purchase from; c) a capped amount of purchase contingent upon the Agent identification and the TA the Agent is in; d) unlimited purchase conditions with each purchase associated with the particular project or other accounting designation, wherein the accounting designation is associated with a particular TA; and f) unlimited purchase conditions and/or accounting variables based upon the TA and Agent credentials.

For example, a User 214A in an ATA 203B may execute an app that provides a user interface with user interactive devices enabling one or more of: the purchase, shipping, supply, lease and rental of one or more of: materials; services; utilities; equipment; supplies; food; space; real estate; or other purchasable item and have the purchase linked with a jobsite associated with one or more of: an ATA 203B; an architectural aspect 218; and a User 214A-214B. No card swipe, chip scan, near field communication or other locally interceptable transfer of data takes place; and the point of sale may be anywhere within an ATA 203B.

In some embodiments, an additional step may be included in a secure transaction according to the present invention. The additional step may include generation of a Virtual Tag 211 in RTA viewable from the ATA 203B. Use of the Virtual Tag 211B verification requires that a User be able to see the Virtual Tag 211B and interact with the Virtual Tag 211B. In some embodiments, a Virtual Tag 211B may occupy a congruent space in a user interface as an item in a visual representation (e.g., image data reproducing a physical area). The item may be, by way of non-limiting example, an item of equipment 213A-213C; personnel 214A-C; robotic agent 215; materials 216, authorized area 216-219; or other ascertainable item in a visual representation included in a user interface presented on a Smart Device 205 at the location of transceiver 205A.

A remote hacker or a hacker that was not in or very close to the ATA 203B would not be able to view and interact with the Virtual Tag 211B since the Virtual Tag 211B is assigned to a set of location coordinates that are unpublished to the User 214A except as an icon in an A/R interface. Similar processes may be utilized in other secure transactions that may, for example, involve access to protected digital content and submission of protected digital content.

In some embodiments, an action taken, or quantification of a condition on the worksite may be accomplished via a robotic Agent 215, such as an UAV or UGV, in such embodiments an alternate ATA 203D may be designated as an area for a specific action and an icon may be locatable by the robotic Agent 215, as well as by a User 214A overseeing the robotic Agent 215. The icon may include digital content related to an action to be performed by the robotic device 215 at a particular location. For example, the icon may include a type of material to be used; a fastener type; parameters of installation, time of installation; sequence of installation; values for variables related to installation (e.g., force, pressure, torque, thickness of material, rate of process used, etc.).

In another aspect, in some embodiments, a secure transaction may include one or more of: operation of various items of equipment 213A-213C; operation of a device 219, such as an automated lock that provides entry into a designated area or structure (such as a delivery area, equipment corral, commercial building, garage, parking area, recreation facility or fenced in area); association of digital content with a position of a design model, site plan, floorplan or other AVM; and access to a utility area. Utility areas may include, for example, an electrical power substation, a gas line control area, water supply area, wastewater area, Internet or other distributed network area, watershed area, or other utility area. A secure transaction may include a delivery, or simple access to the area via an ATA 203B. As with other secure transactions according to the present invention, a Virtual Tag Icon may be generated proximate to the ATA 203B (in this case viewable from the ATA 203B) such that User 214A interaction with the generated icon may be used to further verify an authorized User 214A is present at the designated area allocated as the ATA 203B. A utility area may also be equipped with an ATA 203C accessible via UAV and/or UGV.

While a construction site is illustrated, other outdoor, or combined outdoor and structure interior environments are within the scope of the present invention. Accordingly, a definable geospatial area, such as a recreation area; hunt club area; private land; Federal Bureau Land Management area, National Park, State, or local park, including land areas and/or water body areas may be designated to contain one or more ATA's 209B. One or more ATA's 209B may be associated with one or more Virtual Tag Icons to verify a User 214A and a location that may be referenced in an automated process for authorizing a transaction, which may include authorization to be present on the land included as a managed area, a delivery, a movement of items within the area, or other action. Areas that contain wildlife and/or human activity may also require authorization for activities monitoring movement of the wildlife and/or humans and/or equipment.

Figure 3:
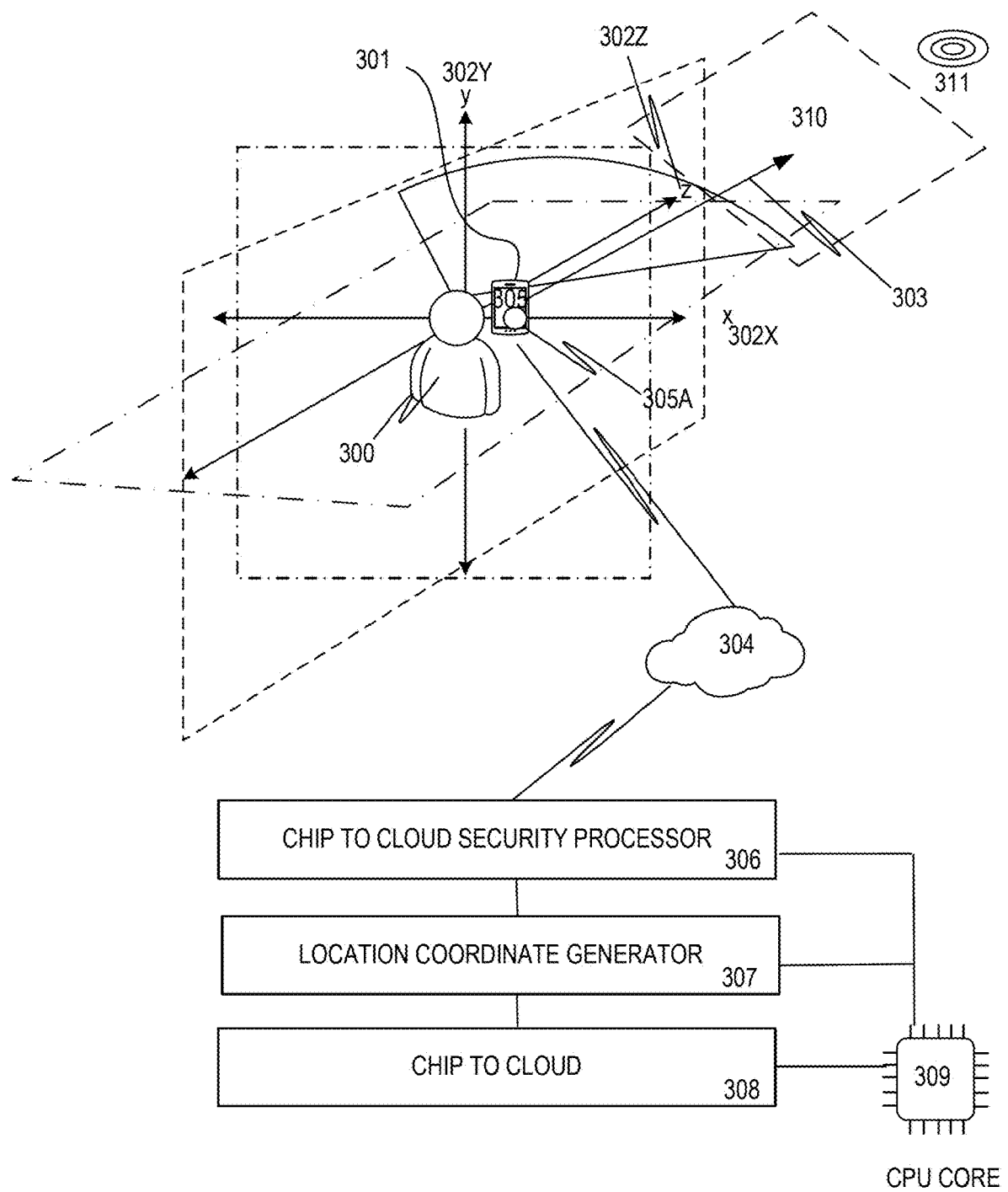
FIG. 3 illustrates aspects of location verification according to some embodiments of the present invention.

Referring now to FIG 3, in some embodiments, aspects of location determination and verification may be integrated into other security mechanisms that may include processes that involve security specific protocols and hardware which may involve communications with cloud storage 304. For example, one or more of the wireless communications described herein may also involve the use of a security processor, such as a chip to cloud security processor 306 and associated software and processes. According to the present invention, the chip to cloud security processor 306 and one or more additional apparatus involving chip to cloud technology may interact with a location coordinate generator 307 to further ascertain that a requested process involving digital content is being requested by an authorized Agent 300, from an authorized geospatial area and for an authorized purpose.

In some embodiments, an Agent 300 may position a smart device 305 including one or more transceivers and antenna arrays in a first position 301 proximate to a portion in a space of interest 310. The first position 301 of the Smart Device 305 may be determined and recorded, for example in terms of cartesian coordinates X, Y and Z, representative of three planes 302X, 302Y, 302Z. The Agent 300 may orient the smart device 305 in a general direction of the portion in space of interest 310. Positional coordinates may also include other known coordinate values, such as: polar coordinates and/or cylindrical coordinates.

A controller in an external system or in the smart device 305 may generate a directional indicator 303 (e.g., one or both of a ray and a vector). The directional indicator 303 may be directed towards a portion of a space of interest in which the Agent 300 would like to execute a secure transaction, such as interaction with a Virtual Tag 311 (e.g.: generation of a new virtual tag; modification an existing virtual tag; or receipt of digital content included in an existing virtual tag). Interaction with a Virtual Tag 311 may include one or more of receipt of digital content associated with the Virtual Tag 311; associating digital content with the Virtual Tag 311; and conditions for access of the Virtual Tag 311.

In some embodiments, the vector may have a length determined by a controller that is based upon a distance to a feature of interest in space as represented in a model on the controller in the direction of the generated vector. The vector may represent a distance from the second position to the space of interest 310 along the axis defined by a line between the first position 301 and the second position. In contrast, a ray may include just a starting point and a direction.

In still other embodiments, a device with a controller and an accelerometer, such as mobile phone, tablet or other Smart Device 305 that includes or is associated with a Transceiver 305A, may include a user display that allows a direction to be indicated via a magnetometer and pointing the Smart Device 305 in a direction of interest. A process of determination of a position 305A based upon inertial movement from a known point, and/or wireless communication with the reference point transceivers may be accomplished, for example via executable software interacting with a controller in the Smart Device 305, such as, for example by running an app on the Smart Device 305.

An array of antennas positioned at a user reference point may allow for the accurate receipt of orientation information from a transmitter. As discussed earlier, a combination devices with arrays of antennas may be used to calculate a position. A single Node with an array of antennas can be used for orienteering and determining a direction of interest. Each of the antennas in such an array receiving a signal from a source may have different phase aspects of the received signal at the antennas due to different distances that the emitted signal passes through. The phase differences can be turned into a computed angle that the source makes with the antenna array.

In some embodiments, aspects of location determination and verification may be integrated with other security mechanisms 306-300 that may implement processes that involve security specific protocols and hardware. For example, any of the wireless communications may also involve the use of a security processor, such as a cloud security processor 306 and associated software and processes. According to the present invention, the security processor 306 and other chip to cloud technology 308 may interact with a location coordinate generator 307 to further ascertain that a requested process involving digital content is being requested by an authorized Agent 300, from an authorized geospatial area and for an authorized purpose.

In some embodiments, the vector indicating a direction of interest may have a length determined by a controller that is based upon a distance to a feature of interest in space as represented in a model on the controller in the direction of the generated vector. The vector may represent a distance from the second position to the space of interest 310 along the axis defined by a line between the first position 301 and the second position. In contrast, a ray may include just a starting point and a direction. In various embodiments, a vector may be referenced to define a volume of space that has a perimeter of a defined shape, such as a rectangle, circle, oval, square or other perimeter shape with a volume defined by the perimeter being extended through space in a direction and for a distance indicated by the vector.

In still other embodiments, a device with a controller and an accelerometer, such as mobile phone, tablet or other Smart Device 305 that includes or is associated with a Transceiver 305A, may include a user display that allows a direction to be indicated by movement of the device from a determined location acting as a base position towards a point in a direction of interest or representing a center of an RTA of the device. The movement may occur to a second location in an extended position. In some implementations, the Smart Device determines a first position 301 based open triangulation with the reference points. The process of determination of a position based upon one or more of: inertial movement from a known point, image recognition, LiDAR, and triangulation with the reference points, may be accomplished, for example via executable software interacting with a controller in the Smart Device, such as, for example by running an app on the Smart Device 305.

An array of antennas positioned at a user reference point may allow for the accurate receipt of orientation information from a transmitter. As discussed earlier, a combination devices with arrays of antennas may be used to calculate a position. A single Node with an array of antennas can be used for orienteering and determining a direction of interest. Each of the antennas in such an array receiving a signal from a source may have different phase aspects of the received signal at the antennas due to different distances that the emitted signal passes through. The phase differences can be turned into a computed angle that the source makes with the antenna array.

In some embodiments, a sonic Transceiver may transmit a sonic transmission and determine a location based upon receiving an echo back from an Agent-supported device. Walls may also generate reflected sonic emanations.

In some examples, as may be used in orienteering herein, an Agent-supported smart device may support receivers, transmitters or transceivers that interact with ultrasonic transceivers fixedly secured to a reference point position, such as via mechanical mounting within a room environment. An ultrasonic positioning system may have indoor positioning accuracy at centimeter, millimeter, and even sub-millimeter accuracy. Multiple ultrasonic Transceivers may transceive from an Agent-supported device to communicate with fixed reference point transceivers may transmit signals. Arrival of the sound transmissions may be accurately timed and converted to distances. In some embodiments, distance determinations may be improved with knowledge of temperatures in the environment containing the sound transceiving. For example, temperature may be measured at one or more of: an Agent-supported Smart Device, a Reference Point position, and an ambient environment.

In some embodiments, synced timing apparatus is able to generate a location of a stationary Agent to within centimeter accuracy using sonic wave transmissions and reception and preferably within several millimeters of accuracy. In addition, in some embodiments sensors are able to detect frequency shifts within the sonic emanations which may add information about the relative rate of movement of the Agent, which may then in turn allow for correction to the timing signals.

Further, in some embodiments, a combination of radio frequency emissions and ultrasonic emissions may be used, for example, a complement of radio frequency emissions/receptions and ultrasonic of radio frequency emissions and ultrasonic emissions may be reconciled to generate more accurate location determination. In another aspect, a radio frequency signal may be used to transmit syncing signals that establish a time that ultrasonic signals are transmitted. Since the electromagnetic transmissions may be orders of magnitude faster than sound transmissions, the electromagnetic transmissions relatively small time of travel from the Transceivers to the Agent may be negligible and therefore used as "zero-time" setpoints as received at the Agent-supported Transceiver. In such embodiments, a controller determining a location may use not only relative arrival times, but also a delta time between a radiofrequency transmission and ultrasonic transmission to determine a distance from a transmitting Transceiver. An array of such ultrasonic and/or radiofrequency transceivers provide increased accuracy in triangulating a location of the Agent.

In still further examples, RT communications may not only transmit a syncing pulse, but also transmit digital data about various aspects of a defined area, such as the defined area's identification, its relative and/or absolute location in space and other refinements. In some examples, data related to improved distance calculation may also be transmitted by RF communication such as temperature of the environment, humidity and the like which may influence the speed of sound in the environment as a non-limiting example. In some examples, such a system may result in millimeter level accuracy of position determination.

In some examples, the process may be iterated to refine the direction of each of the ultrasonic transmitters and maximize signal levels of the transmission which may provide additional information in the calculation of a position. RF and Wi-Fi transmissions may be used for data communications and synchronizing as have been described. In other examples, as an Agent-supported device 314A is moving, an iterative process may be used to track the Agent-supported device 314A moves through space. Stationary Agents may be tracked with submillimeter accuracy in some embodiments.

A direction dimension may be based upon multiple transceivers included in a Smart Device or a Smart Receptacle or via a movement of a Smart Device or Smart Receptacle while an Agent supporting the Smart Device or Smart Receptacle remains in a stationary position in relation to reference, such as a ground plane position. For example, a device with a controller and an accelerometer, such as mobile Smart Device, may include a user display that allows a direction to be indicated by movement of the device from a determined location acting as a base position towards a feature in the intended direction where the movement results in an extended position. In some implementations, the Smart Device may first determine a first position based upon triangulation with the reference points and a second position (extended position) also based upon triangulation with the reference points.

As described above, facing a mobile device towards an area in a Structure and movement of the mobile device in a particular pattern may be used to ascertain a specific area in space to be interpreted by various methods. In some examples, the leading edge of a smart device, or the top portion of the user screen (in either portrait or landscape mode of display) may be the reference for the direction pointed in by the user. If the smart device is held at an angle relative to the ground, in some examples, the angle formed by the perpendicular to the top portion of the user screen may be projected upon the ground and thru projection taken as the indication of direction.

Some exemplary devices that may be used as a transceiving Node to engage in wireless communications useful to determine a Smart Device location may function as a Node and may include matrices (or arrays) of antennas that communicate wirelessly, such as via exemplary UWB, Sonic, Bluetooth, a Wi-Fi, or other modality. Linear antenna arrays, rectangular antenna; circular antenna arrays or other shapes for arrays are within the scope of the invention. In addition, an antenna array may be omni-directional or directional.

In some embodiments, a Smart Device may include one or more Nodes internal to the Smart Device or fixedly attached or removably attached to the Smart Device. Each Node may include antenna arrays combined with a power source and circuitry to form complete self-contained devices. The Nodes or a controller may determine an RTT, time of arrival, AoA and/or AoD or other related angular determinations based upon values for variables involved in wireless communications. For example, a composite device may be formed when a Node with a configuration of antennas, such as the illustrated exemplary circular configuration of antennas, is attached to a Smart Device. The Node attached to the Smart Device may communicate information from and to the Smart Device including calculated results received from or about another Node, such as a Node fixed as a Reference Point Transceiver or a Node with dynamic locations, wherein the wireless communications are conducive to generation of data useful for determination of a position (e.g., timing data, angles of departure and/or arrival, amplitude, strength, phase change, etc.). A combination of angles from multiple fixed reference points to the antenna array can allow for a location of a user in space. However, with even a single wireless source able to communicate with the antenna array, it may be possible to determine a direction of interest or a device related field of view.

An array of antennas positioned at a reference point may allow for the accurate receipt of orientation information from a transmitter. As discussed earlier, a combination devices with arrays of antennas may be used to calculate a position. A single Node with an array of antennas can be used for orienteering and determining a direction of interest. Each of the antennas in such an array receiving a signal from a source will have different phase aspects of the received signal at the antennas due to different distances that the emitted signal passes through. The phase differences can be turned into a computed angle that the source makes with the antenna array.

In some embodiments, one or both of a Smart Device and a Smart Receptacle may incorporate multiple Transceivers and a direction of interest may be ascertained by generating a vector passing through a respective position of each of at least two of the transceivers. The respective positions of each of the transceivers supported by the Smart Device and/or Smart Receptacle may be ascertained according to the methods presented herein, including for example via triangulation, trilateration, signal strength analysis, RTT, AoD, AoA, topography recognition, and the like. Reference point transceivers may be fixed in a certain location.

A vector may be generated at an angle that is zero degrees with a plane of a display screen or perpendicular or some other designated angle in relation to the smart device and an associated display screen. In some embodiments, an angle in relation to the smart device is perpendicular to a display screen and thereby viewable via a forward-looking sensor (or other CCD or LIDAR device) on the smart device. In addition, a mirror or other angle-altering device may be used in conjunction with a CCD, LIDAR or other energy receiving device.

A user may position the smart device such that an object in a direction of interest is within in the CCD view. The smart device may then be moved to reposition one or more of the transceivers from a first position to a second position and thereby capture the direction of interest via a generation of a vector in the direction of interest.

In some embodiments, a value may be generated based upon a magnetic force detection device, such as a magnetometer included in the Smart Device and/or Smart Receptacle. Registration of a magnetic force may be determined in relation to a particular direction of interest and a determination of magnetic force referenced or provide a subsequent orientation of the Smart Device or Smart Receptacle. In some embodiments therefore, multiple modalities of wireless input may be used to determine a position of a Smart Device and direction of interest.

For example, a first wireless modality may be used to determine a structure in which a Smart Device is located. Accordingly, the first modality may include a cellular transmission or GPS signals. A second modality of wireless communication may be used to determine a position within the structure. Appropriate second modalities may therefore include one or more of UWB, Bluetooth, sonic, ultrasonic, LiDAR, or infrared modalities (or other modalities discussed herein). A third modality, such as a magnetic force, a movement of a device, a relative position of two or more antennas may be used to determine a direction of interest.

In some embodiments, the magnetic force detection device may be used to quantify a direction of interest to a user. Embodiments may include an electronic and/or magnetic sensor to indicate a direction of interest when a Smart Device and/or Smart Receptacle is aligned in a direction of interest. Alignment may include, for example, pointing a specified side of a Smart Device and/or Smart Receptacle, or pointing an arrow or other symbol displayed upon a user interface on the Smart Device towards a direction of interest.

A magnetic force detection device (sometimes referred to as a magnetic sensor) may detect a magnetic field particular to a setting that a Smart Device is located. For example, in some embodiments, a particular structure or other setting may have a magnetic force that is primarily subject to the earth's magnetic field or may be primarily subject to electromagnetic forces from equipment, power lines, or some other magnetic influence or disturbance. An initial quantification of a magnetic influence at a first instance in time may be completed and may be compared to a subsequent quantification of magnetic influence at a later instance in time. In this manner an initial direction of interest indicated by a position, orientation, pitch, and yaw of a Node, such as a Smart Device may be compared to a subsequent position, orientation, pitch, and yaw of the Smart Device.

In some embodiments, an initial position, pitch, and yaw of a Smart Device may be described as a relative angle to a presiding magnetic force. Examples of presiding magnetic forces include, magnetic influences of electrical charges, Earth's magnetic field, magnetized materials, permanent magnetic material, strong magnetic fields, ferromagnetism, ferrimagnetism, antiferromagnetism, paramagnetism, and diamagnetism, or electric fields that are generated at reference nodes at known positions which may be locally used to indicate a direction of interest.

Smart devices may include electronic magnetic sensors as part of their device infrastructure. The magnetic sensors may typically include sensing elements deployed along three axis. In some examples, the magnetic sensors may be supplemented with electronic accelerometers, such as MEMS accelerometers.

In some examples the magnetic sensor may include a Hall effect sensor that is operative to measure a sensed magnetic field perpendicular to the body of the sensor via operation of the Hall effect sensor. In some examples, a Hall effect sensor may be built into silicon to generate a relatively sensitive sensing capability for magnetic fields. In some Hall effect sensors, electrons and holes flowing in a region of the silicon may interact with the regional magnetic field and build up on the fringes of the conduction region, thus generating a measurable voltage potential. In other examples, anisotropic magnetoresistance sensors may sensitively detect the magnetic field at the device as a significant change in resistance of structure elements in the device.

In still further examples, the magnetic sensor may include one or more giant magnetoresistance (GMR) sensors, which may detect the magnetic field. In some of these examples, the GMR sensors may detect a magnetic field with a current-perpendicular-to-plane (CPP) GMR configuration. In other examples, a current-in-place (CIP) GMR sensor configuration may be used. The resulting three-axis magnetic sensors may perform a sensitive compass function to determine a direction of a specified portion of the Smart Device and/or an edge of the smart device relative to the local magnetic field environment. A specified portion of the Smart Device may be indicated via a user interface presented on a screen of the Smart Device.

A direction dimension may be based upon one or more of: a wireless position of two or more transceivers, a movement of a device, a magnetic force determination, a LIDAR transmission and receiving, CCD energy determinations and other assessments of an environment containing the Smart Device and/or Smart Receptacle. For example, a device with a controller and an accelerometer, such as a mobile Smart Device, may include a user display that allows a direction to be indicated by movement of the device from a determined location acting as a base position towards a feature in the intended direction where the movement results in an extended position. In some implementations, the Smart Device may first determine a first position based upon triangulation with the reference points and a second position (extended position) also based upon triangulation with the reference points.

As described above, facing a mobile device towards an area in a Structure may be used to ascertain a specific area in space to be interpreted by various methods to contain a Virtual Tag that may be accessed by an Agent.

An Agent 550 may also operate a stereoscopic sensor system to orient a direction of interest. The stereoscopic sensor systems may obtain two different images from different viewpoints which may be used to create topographical shape profiles algorithmically. A controller may obtain the image and topographic data and algorithmically compare them to previously stored images and topographic data in the general environment of the user. The resulting comparison of the imagery and topography may determine an orientation in space of the Agent and in some examples determine a device field of view. The controller may utilize this determined field of view for various functionality as described herein.

Figure 4:
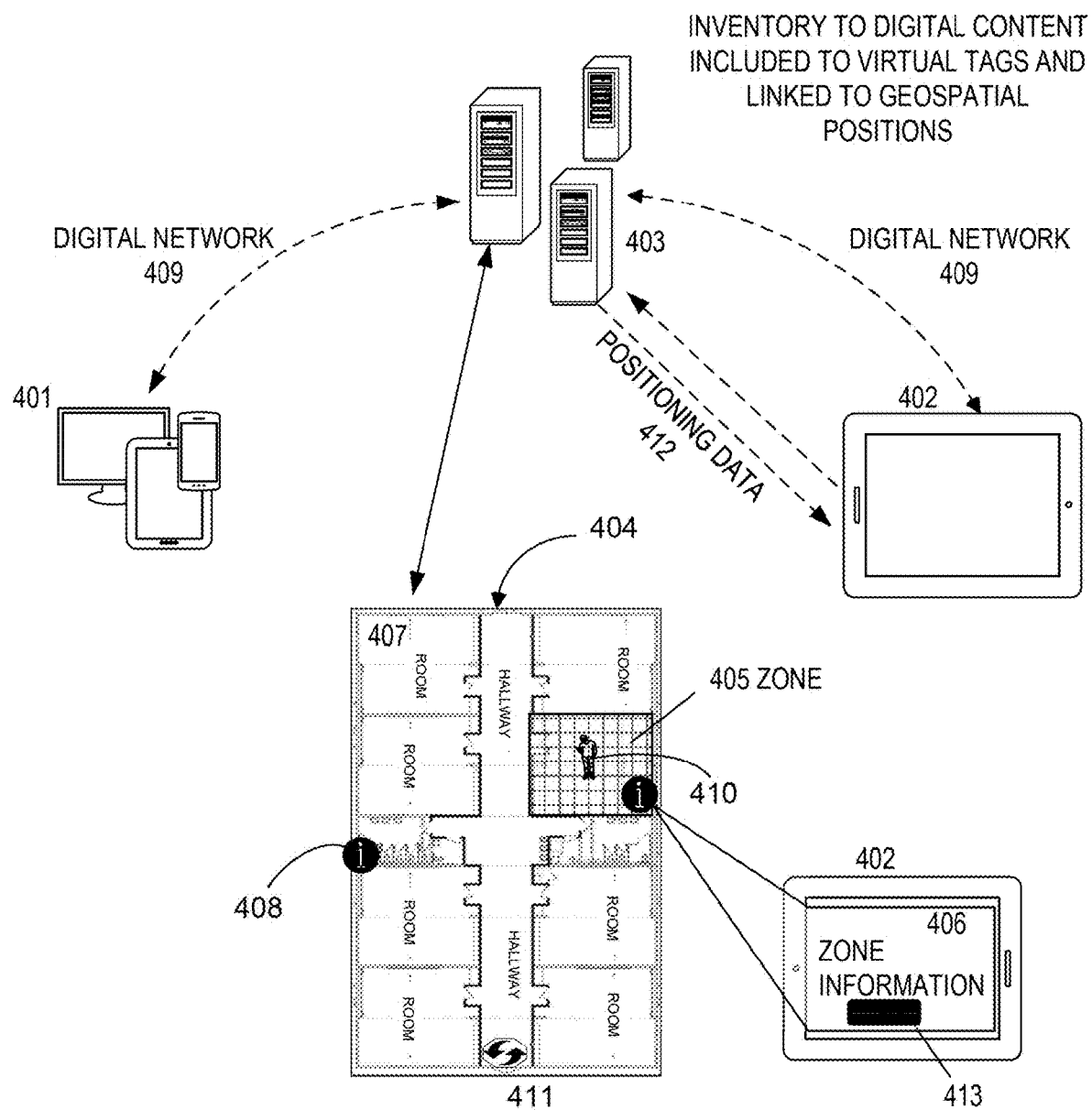
FIG. 4 illustrates a block diagram of exemplary components that may be involved in provision of a user interface according to the present invention.

Referring now to FIG. 4, a block diagram of a components that may be involved in the provision of a user interface 404 according to some embodiments of the present invention is illustrated. The user interface includes information, such as digital content, provided via selection of a Virtual Tag 408. The user interface 404 also includes a position of an onsite Agent 409. In some embodiments, AI may be used to determine whether the Agent 409 is present in a defined geospatial Zone 405. A cloud based controller 403 may be in logical communication with one or more remote workstations 401 and onsite Smart Device 402 to provide digital content included in the Virtual Tag 408 and/or Zone information 406 which includes digital content associated with the Zone 405.

For example, Smart Device 402 supported by an onsite Agent 410 may travel through a known point 411 and an IMU may synchronize a position of the onsite Smart Device 402 with the known point 411. As the onsite Agent travels through a building associated with the reference image 407 displayed on the user interface 404, the position of the onsite smart device 402 may be used to indicate a position of the onsite agent 410. As the onsite Smart Device 402 and Agent 410 enter a defined zone 405, the user interface 404 may indicate that position of the Agent 410 in the Zone. The user interface may also make available digital content associated with the Zone 405. A remote workstation may also view the digital content associated with the Zone 405.

As the Smart Device 402 is moved around the onsite location, positioning data 412 may be transceived with the cloud based controller 403. The positioning data may include one or more of: data derived from wireless communications; and IMU data; and data from synchronizing the smart device with a known point transceiver. The digital network 409 is used to transceive one or more of: the user interface 404; the positioning data 412; zone specific user interface 406; content included in the zone specific user interface 406; and virtual tag 406 related data.

The cloud based controller 403 may also store an inventory of digital data that is included in the zone specific user interface 406 and/or digital content included in one or more virtual tags 408. In some embodiments, digital content and/or other information included in a virtual tag 406 and the zone specific user interface 406 may be the same, such as, for example, if a Virtual Tag 408 is located within a defined Zone 405, the Virtual Tag 408 content may likely be a subset of the content included in response to a Zone 405 query.

In some embodiments, a Zone 405 query may execute automatically upon determination that a Smart Device is within the Zone 405. In another aspect, an onsite Agent 410 may activate a user interactive device 413 to create a Virtual Tag 408 associated with an onsite position that the Smart Device 410 is located at (or an offset position from the Smart Device 410) and/or generate, submit, link to, or otherwise associate digital content with the Zone 405 in which the Smart Device is located.

In another aspect, a remote workstation may be operative to create a Virtual Tag 408 that may be accessed onsite and/or associate digital content with a Zone 405 that will be made available to an onsite Smart Device 402 located in the Zone 405.

Referring now to FIG. 5, in some embodiments (as described above) onsite movement may be calculated via an IMU included in a Smart Device 402, which may be supported by an onsite Agent 410. Smart Device 402 location may also be calculated based upon triangulation procedures using wireless communications. According to the present invention, a position of a Smart Device 402 may be calculated based upon IMU calculations augmented via a wireless communication, such as a wireless communication using a UWB, Bluetooth (including BLE), WiFi, ultrasonic, infrared, or other modality. For example, an IMU based position calculation may be accurate enough to place a Smart Device 402 supported by an Agent 410 within a particular Zone 405 within about 1.0 meter accuracy (or better) and a wireless communication between a reference point transceiver 501 and the Smart Device 402 may provide a distance 502 from the reference point transceiver 501 to the smart device 402 within about 10 cm accuracy (or better, and in some embodiments, 1.0 cm or better).

Still further, in some embodiments, an IMU based smart device 402 position may augmented, and made even more accurate based upon wireless communications between the smart device 402 and a first reference point transceiver 501 and a second reference point transceiver 501A. Essentially, a transmission distance 502 based upon timing of a wireless communication between the first reference point transceiver 501 and the smart device 402 may form a first radius 504 around the first reference point transceiver 501 and a transmission distance 502A based upon timing of a wireless communication between the second reference point transceiver 501A and the smart device 402 may form a second radius 504A around the second reference point transceiver 501A. The smart device location 505 will be the point where the first radius and the second radius intersect in the zone 405 the IMU position calculation indicates that the smart device 402 is located in. Combining IMU position based calculations for a smart device 402 with a distance to the smart device 402 from a first reference point transceiver 501 and/or a second reference point transceiver 501A, may be used to significantly increase the accuracy of positioning. For example, in some embodiments, position determination of the Smart Device 402 may be increased a factor or 5 to 10 times (or greater) accuracy.

In another aspect, a smart device location may be calculated to maintain a set distance 503A from a known artifact, such as a wall 503.

Figure 6:
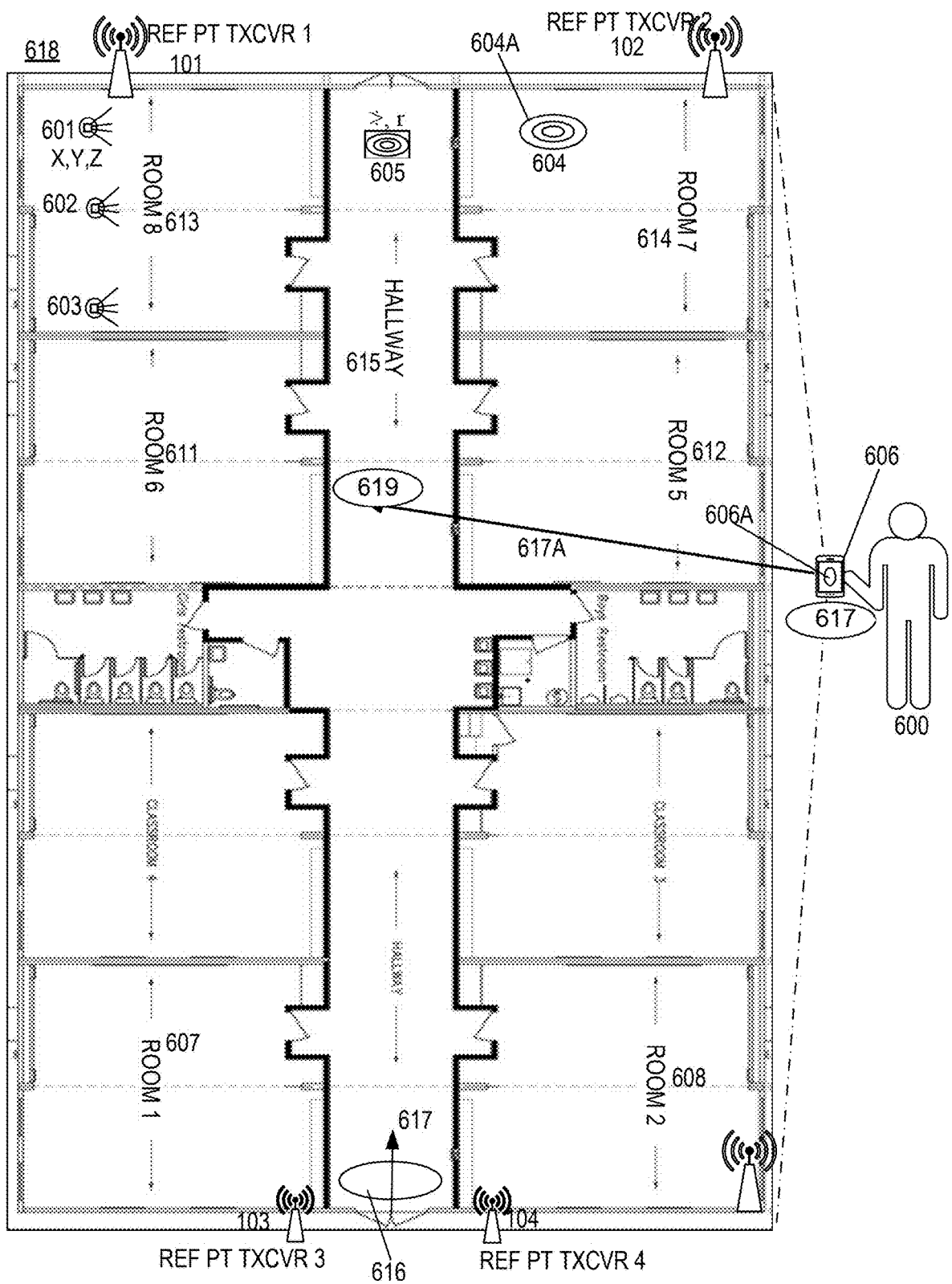
FIG. 6 illustrates a two dimensional reference that includes a floor plan view with Virtual Tags and IoT Tags.

Referring now to FIG. 6, an exemplary two dimensional (sometimes designated as "2D") representation of a structure 618 is illustrated as it may be generated in an user interface 606A on a Smart Device 606 operated by an Agent 600, such as a human user or an automation. As illustrated, the two dimensional representation of a structure 618 may include a floorplan, design plan, blueprint, CAD drawing or other representation of a building, bridge, tunnel, property site or other geospatial area.

The form of the interface may include any digital or electronic format that is able to be interpreted by an Agent. According to the present invention, a representation of a structure 618 may include digital content associated with one or more of IoT Tags 601-603; Virtual Tags 604, 607-615; and Hybrid Tags 605. A representation of a Virtual Tag 604 may include a Virtual Tag Icon 604A that symbolizes an interactive area on a user interface 606A that an Agent 600 may activate to access digital content associated with the Virtual Tag 604. Other Virtual Tags 607-615 may be integrated into image data presented in the user interface, as illustrated, such image data may include a 2D representation of a portion of a structure 618.

In some embodiments, a portion of the 2D representation will be displayed in a user interface 606A based upon a position 617 of the smart device 606 and a direction of interest 617A generated via wireless mechanisms and methodologies discussed herein. The wireless mechanisms and methodologies may include for example, one or more of: radio communications; magnetic readings (e.g., a compass reading); accelerometer readings; sonic readings; image recognition and the like.

In some embodiments, an Agent 600 may select one or both of: an area to be included in a user interface 606A; and a direction of interest via interaction with the user interface 606A. Interaction to indicate a direction of interest and/or an area to be included in a user interface display, may include, for example, dragging over an area of the user interface 606A; creation of a geometric shape, which may be a polygon or arcuate shape or combination of both; free hand movement; and selection of areas designation by a pattern of Virtual Tags 604 and/or IoT Tags 601-603 and/or Hybrid Tags 605.

In some embodiments, for example, one or both of a direction of interest 617A and an area or a representation of a structure 618 may be defined in whole or in part via a tag (virtual, hybrid and/or virtual) that define different zones, quadrants, rooms, architectural aspects, structure features, or even flood zones, seismic zones, animal sanctuaries, dangerous conditions, or other subject.

Digital content associated with one or more of IoT Tags 601-603, Virtual Tag 604, Hybrid Tag 605; may include almost any content representable via a digital value or pattern, such as, by way of non-limiting example, one or more of: narrative, text, video, image, audio, uniform resource locator, IP address alone or in combination with a port and/or socket; and ecommerce vehicle.

In some non-limiting examples that relate to construction site management, a worker may be on site and instead of having a series of physical documents that must be carried and updated and deciphered as to their meaning and revision level and applicability to a particular worker, the worker or other Agent 600 may simply carry a Smart Device 606 and based upon a position of the Smart Device and/or a direction of interest 617A, a user interface 606A may display information specific to the Agent 600 via one or more of IoT tags, Virtual Tags 604, 607-615, and Hybrid Tags 605.

For example, an interface 606A for an HAC worker may include data specific to HVAC systems present in a building in which the HVAC worker is present (or which the HVAC worker selects) the HVAC data specific to HVAC systems may include data generated by an IoT Tag 601-603 with an electronic sensor that provides readings on one or more of: heat, humidity, water presence, air flow and the like. A plumber, electrician and/or a sheet rock worker may or may not be shown similar or same data on a user interface presented to them.

A Hybrid Tag 605 may include a time and position of an IoT tag 601 at a time previous to a present time period and digital content generated by the IoT Tag 601 at that time and position. As discussed herein, a position of the IoT Tag 601 may include a set of Cartesian Coordinates (e.g., X, Y, Z) and/or polar coordinates or cylindrical coordinates (including ∌ angle and radius). A position of a tag, including for example, one or more of: an IoT Tag 601; Virtual Tag 607-615; and a hybrid tag 605 may also be determined via positioning techniques, such as position within a point cloud, visual recognition, position relative to a known orienteering point 616 using one or more of: inertial measurement mechanisms and software in a smart device 600; magnetometers, magnetic positioning, dead reckoning, optical, sonic, or other acoustic technologies.

In some embodiments, a smart device 600 may generate a known location via one or more of; triangulation, distance and angle determination, and proximity to or being located within a known location area 616. One or more of inertial movement tracking, augmented reality processing steps, magnetic positioning, Lidar, point cloud positioning, optical recognition positioning, received signal strength, sonic reckoning, acoustic reckoning, dead reckoning, or other tacking technology and method steps may be used to track movement of the smart device 600 as it traverses away from the known location area 616. In some embodiments, a trajectory 617 of a smart device 600 as it traverses through a known location area 616 may be tracked and the trajectory may be continued using the above techniques in order to further track a position of a smart device 600 in relation to a content tag, including one or more of: an IoT Tag 601; Virtual Tag 607-615; and a hybrid tag 605.

Accordingly, an augmented reality positional reference of a smart device 600 may be determined via one of, or a combination of multiple of: wireless communications, inertial measurement unit operation, magnetic position device operation, image location techniques, lidar, sonic device operation, laser location techniques in sequence or concurrent execution.

For example, in some embodiments, a smart device 600 may communicate wirelessly with one or more of a Bluetooth transceiver, a UWB transceiver, a RFID device or an optical or sonic transceiver as the smart device traverses a known location area 616 in order to reset a starting point for a device locating technology and method. In some embodiments, an Agent or other remote user may execute software that is operative with a controller to determine a location for the smart device 600 and thereby generate a known location for the smart device 600 which may act a start point for locating methodologies and mechanisms that do not rely upon triangulation based upon wireless communications or an angle of arrival and distance based upon wireless communications. Some embodiments may also include one or both of: periodic determination of a known location, and determination of a known location based upon an occurrence of a reset event. A reset event may include, by way of non-limiting example, an IMU reading, or other sensor measurement.

Some additional embodiments may include a known location via approach and traversing through a known orienteering area 616. An approach may be determined via any of the methodologies and devices described herein, and/or traversing a path enabling communication via a series of wireless transmissions, such as, by way of non-limiting example a sequence of RFID communications or Bluetooth, UWB or light based communications.

Similarly, an electrician may be shown wiring and electrical fixtures on the electricians User Interface 606A and a plumber may be shown piping and plumbing fixtures on the plumbers User Interface 606A. Accordingly, a user interface 606A may include content based upon an Agent that will interact with the user interface 606A and the position 617 and direction of interest 617A for the Smart Device 606.

In some embodiments, digital content included in a user interface 606A may be stored in a data storage (e.g., a cloud storage illustrated as item 403) and linked, such as, via a data file, relational database, index, ledger, block chain, or other data association mechanism enabling specific digital content to be associated with coordinates that indicate a particular location, which may be referred to as a Tag location. In addition, the specific digital content may be associated with one or more Agents 600.

A Smart Device 606 may also be associated with the Agent 600, and a position 617 and direction of interest 617A. An Area of Interest, and/or Radio Target Area may be based upon the position 617 and direction of interest 617A and an area shape and thereby include the location of the Tag. If the Area of Interest, and/or Radio Target Area does include the location of the Tag, then the digital content associated with the Agent may be included in a user interface 606A presented on the Smart Device 606.

Some embodiments include a user interface 606A that allows repositioning of a content tag, including one or more of: an IoT Tag 601; Virtual Tag 607-615; and a hybrid tag 605. Repositioning of an IoT Tag 601; Virtual Tag 607-615; and a hybrid tag 605 may be accomplished by selecting the tag 601, 605, 607-615 and dragging the tag 601, 605, 607-615 to a new position in the user interface 606A. The tags 601, 605, 607-615 may also be repositioned using keystrokes, stylus, user touch on a touch screen or other user control device that is capable of designating a new position for a selected tag(s) 601, 605, 607-615.

Figure 6A:
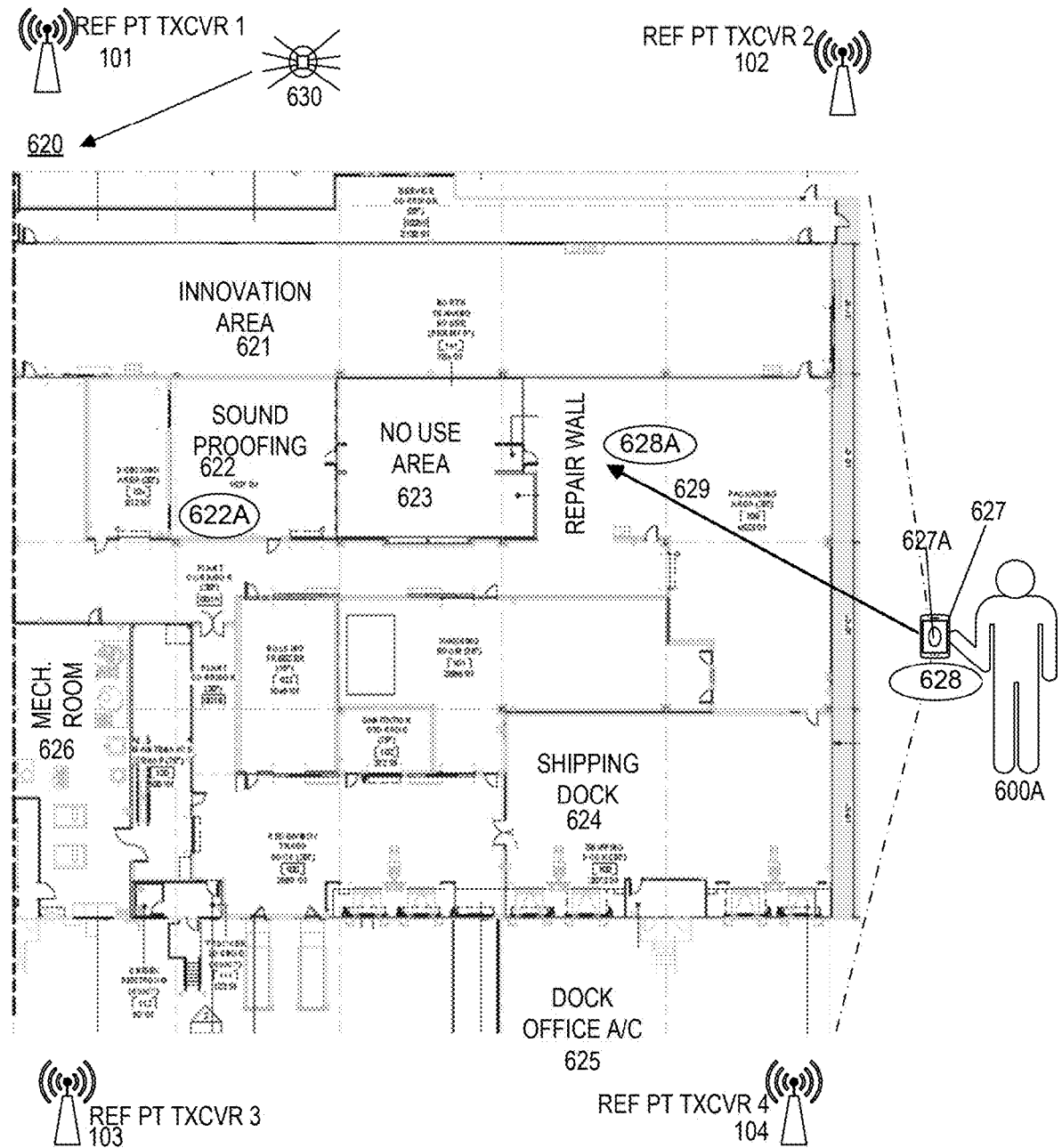
FIG. 6A illustrates a two dimensional reference that includes a floor plan view with digital content from Virtual Tags and IoT Tags displayed.

Referring now to FIG. 6A, a 2D user interface representation of a structure 620 is illustrated as it may be generated in a user interface 627A on a Smart Device 627 operated by an Agent 600A. Virtual Tags 621-626 are presented on the user interface at locations correlated with locations in the physical world that are represented via the 2D graphic, such as, in FIG. 6A, an illustration of a floor plan of a structure 620. As presented, the digital content includes narrative or text, such as innovation area 621, sound proofing 622B, no use area 623, shipping dock 624, dock office A/C 625, and mechanical room 626. Such text may also function as an interactive device that may be selected to link out to additional content, such as video, audio, ecommerce and/or a URL link.

In addition, in some embodiments, activation of an initial interactive area represented as a Virtual Tag 621-626 may bring a user from a first user interface 627B to a second or subsequent user interface. For example, a subsequent user interface may include information derived from a BIM model, AVM or other sophisticated resource normally requiring a proprietary interface.

In some specific embodiments, one or more of a Virtual Tag, IoT Tag and Hybrid Tag may be used to guide a robot or other unmanned vehicle (including, for example, one or both of an unmanned aerial vehicle and/or an unmanned ground vehicle or machine) to a location for performing an action; and/or confirm a location for performing an action. The action may be almost any procedure that the robot is capable of performing while deployed on a location. By way of illustration and non-limiting example, one or more of a Virtual Tag, IoT Tag and Hybrid Tag may be used to guide a robot or other unmanned vehicle may be guided to a person, such as a patient in an assisted living situation, rehabilitation, or medical care facility and assist the patient in a manner that the robot is designed. Wireless location and direction of interest as described herein may be combined with Virtual Tags and/or IoT Tag data to provide input to the robot as to a function to perform at a particular location for a particular patient.

In some embodiments, user interface representation of a structure 620 may additionally include an indicator 628A of a current location of a smart device 627. Preferably the indicator 628A of a current location of a smart device 627 will be relative to a position 622 of one or more Virtual Tags 622.

In another example, a construction site robot may be guided to a position 622A within a structure 620 that corresponds with a Virtual Tag 622 and be provided with an instruction for an action to be conducted at the Virtual Tag position 622A. The action may be an action achievable by a robot or other automation engaged to receive instruction from the Virtual Tag 622. As illustrated, the instruction may include, for example to install sound proofing on the walls, or some subset of the walls the robot may access form the indicated Virtual Tag position 622A.

In some embodiments, a Virtual Tag 622 may be created remotely by associating coordinates with digital content, or simply by selecting a position on a user interface and setting the virtual tag 622 at the selected position 619. Some embodiments include the ability for the selected position 619 of the virtual tag 622 to be repositioned, such as, for example, via drag and drop, key stroke controls, stylus movement, voice control, and/or other user control. On location, the Virtual Tag may be accessible as would any other tag based upon the location coordinates, such as via an interactive user interface.

According to the present invention, multiple modalities of wireless position determination may be utilized to provide an increasingly accurate location of the smart Device position 628 and direction of interest 629. For example, a satellite 630 communication modality, such as GPS may provide the smart Device position 628 determination accurate enough to determine an identification of a structure 620; IMU may provide travel through known points via traversing through an area accessing a BLE beacon, and a radio transceiving such as an UWB and/or Bluetooth modality may provide a Smart Device position 628 and direction of interest 629 and also a Virtual Tag position 622A. Image recognition, LiDAR, laser, sonic, ultrasonic or other highly accurate modality may further guide a precise location for an action to be performed. By way of non-limiting illustration, in the construction site example, a radio transceiving such as an UWB and/or Bluetooth modality may provide a Smart Device position 628 and direction of interest 629 may be used to indicate a particular wall to be worked on by a robot, and one or more of Image recognition, LiDAR, laser, sonic, ultrasonic may be used to specify a precise location of an action, such as where to drill a hole, or place a beam or board.

In some embodiments, the 2D user interface representation of a structure 620 may be generated in a user interface 627A on a Smart Device 627 operated by an Agent 600A and/or referenced to generate a dynamic two dimensional interface that includes a semblance of the floorplan and interactive areas at locations on the semblance of the floorplan. The links may be activated by a user to bring the user to one or more resources that make the digital content included in the Virtual Tag and/or IoT Tag and/or Hybrid Tag available to the user.

By way of non-limiting example, a dynamic two dimensional interface may include a PDF document, word processing document, image document, html document, a URL page or other website, touchscreen or other user interactive artifact that align interactive areas with locations designated by the coordinates of one or more Virtual Tags and/or IoT Tags and/or Hybrid Tags.

Figure 6B:
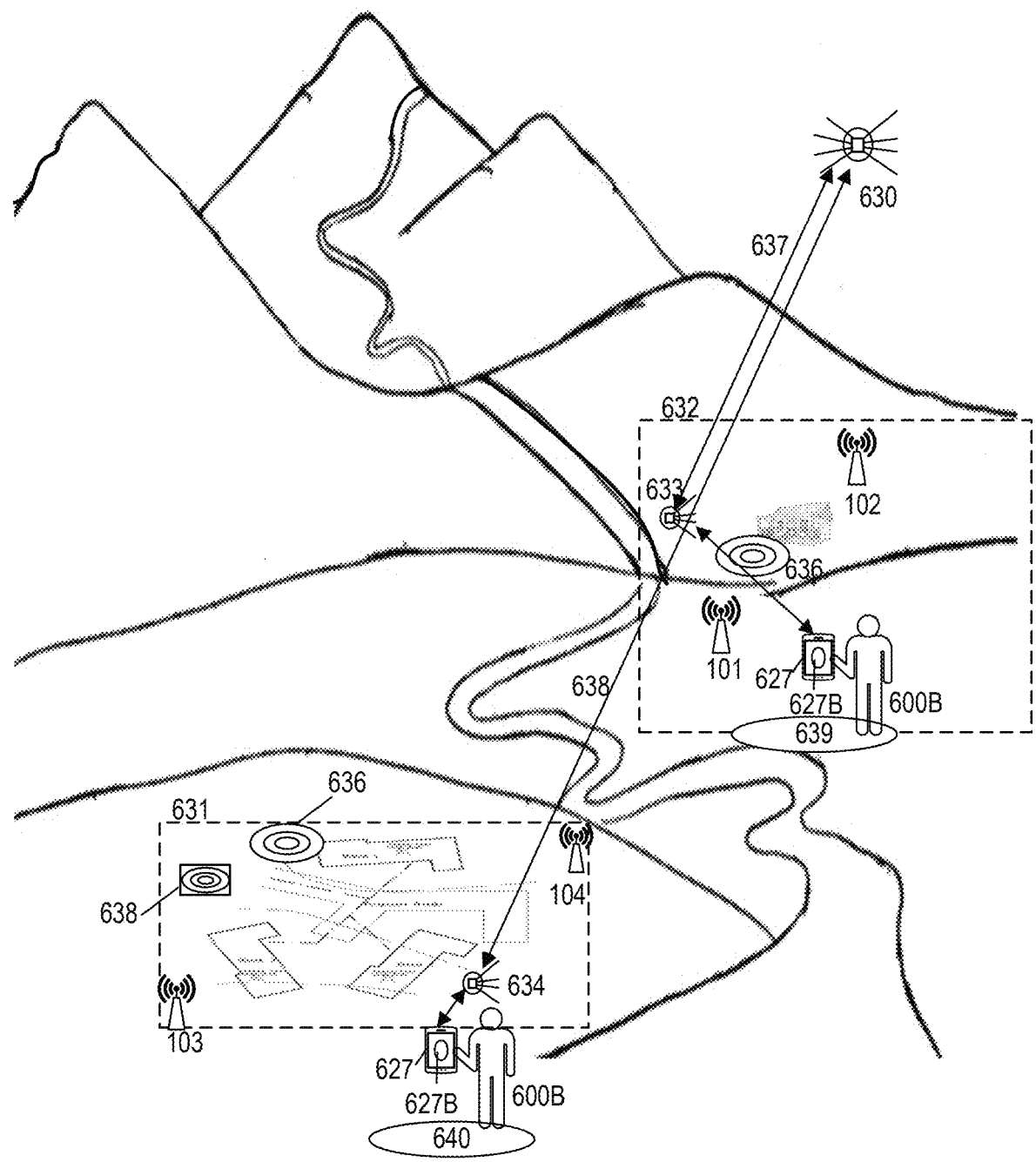
FIG. 6B illustrates exemplary aspects related to operations in external and remote locations.
Figure 6C:
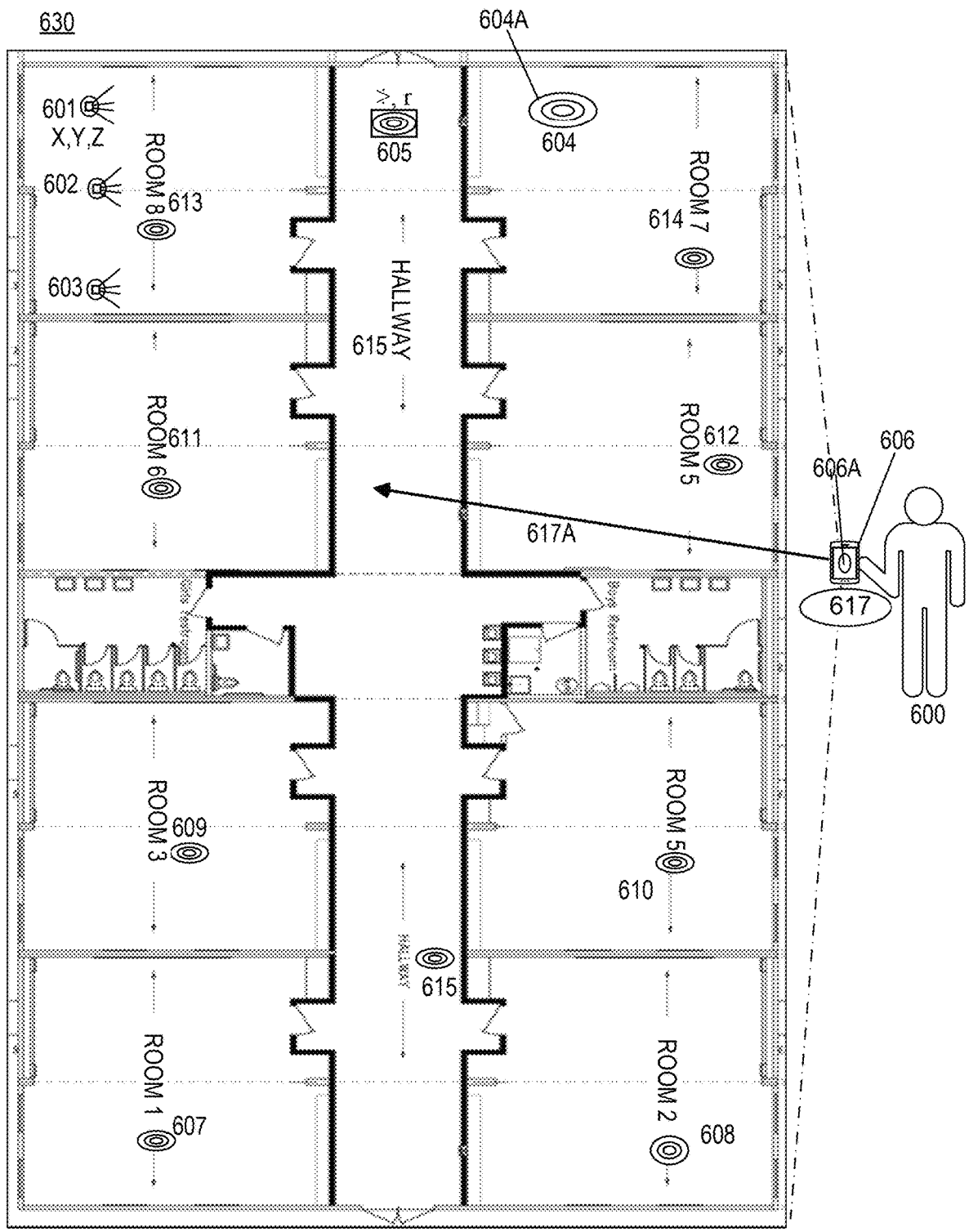
FIG. 6C illustrates a dynamic two dimensional interface according to some embodiments of the present invention.

Referring now to FIG. 6C, in some embodiments, the dynamic two dimensional interface 630 may be generated by capturing a screen image of the user interface at an instance in time and integrating into the captured image the user interactive areas with links to the digital content included in the one or more Virtual Tags and/or IoT Tags and/or Hybrid Tags. In some embodiments, the user interactive areas may be designated by an icon, highlight, boundary, color, pattern or other visual indicator, or portions of the image itself may be made interactive. For example, certain pixels included in an image may be interactive so that when selected they link the user to the digital content included in the one or more Virtual Tags and/or IoT Tags and/or Hybrid Tags.

In this manner, some embodiments may memorialize what one or more Virtual Tags and/or IoT Tags and or Hybrid Tags are available as being associated with a particular physical setting and/or area at a designated timeframe.

In addition, the dynamic two dimensional user interface may be communicated from a first user with access to apparatus and software normally used to access the one or more Virtual Tags and/or IoT Tags and/or Hybrid Tags, to second user who does not have access to a particular app or other apparatus and software normally used to access the one or more Virtual Tags and/or IoT Tags and/or Hybrid Tags. The first and second users may he remote or co-located.

In some embodiments, the dynamic two dimensional interface 630 may be customized for a particular user, and/or a particular purpose. For example, a punch list for a trades worker may include items to be repaired or constructed within a particular trade (electrician, plumber, carpenter, metal worker etc.). Another example includes a dynamic two dimensional interface 630 with path or other directions for travel through a structure represented by the dynamic two dimensional interface 630 to bring a user to a particular destination. Accordingly, the dynamic two dimensional interface 630 may include a representation of a structure with additional content to support the functions described herein and in the related patent documents to which this specification claims priority to and incorporates by reference.

Referring now to FIG. 6B, in remote location areas, such as, for example, a remote construction site 631 and/or a remote wilderness location 632; continuous communications with a distributed network, such as the Internet or a VPN may be difficult. In such scenarios, a long distance communication, such as a transceiving communication 637-638 involving a satellite 630 and a physical Node, such as an IoT Tag 633-634, may be conducted on a periodic basis. In this manner, costs associated with such communications with remote locations may be controlled based upon a frequency of communications on a periodic basis.

In some embodiments, digital content may be transceived to an IoT Tag 633-634 and stored. Subsequently, an Agent 600B may transceive between a Smart Device 627 and the IoT Tag 633-634 to retrieve the information stored in the IoT Tag 633-634 that was downloaded from the satellite 630.

In another aspect, digital content generated on sites of remote locations 631-632 may be stored in a Node such as an IoT Tag 633-634 and transceived via a satellite uplink communication and from the satellite 630 conveyed to a distributed network, such as the Internet and/or a virtual private network.

Embodiments illustrated in FIG. 6B enable digital content to be generated and transceived and be waiting for an Agent 600B to receive the digital content when the Agent 600B and associated Smart device 627 are within transceiving proximity to a Node, such as an IoT Tag 633-634.

As with other settings, an Agent 600B in a remote wilderness location 632 may generate a Virtual Tag 636 by placing a Smart device 627 at a location 636-640 and associating a set of location coordinates with the location 636-640 of the Smart Device 627. The agent 600B may interact with a user interface 627B on the Smart Device 627 to acknowledge the set of location coordinates and associate Agent specified digital content with the set of location coordinates. Similarly, an IoT Tag 633-634 may generate data, or other IoT Tag 633-634 digital content and associate the digital content with set of location coordinates.

In a case where the IoT Tag 633-634 subsequently changes its location, a hybrid tag 638 may be left as an artifact from the previous presence of the IoT Tag 633-634 at that location. While such a capability may be useful in many scenarios and locations, it may be particularly important at remote locations 631-632 to track a presence of an Agent 600B at the remote locations 631-632 and information in the form of digital content that the Agent may be able to input into a system utilizing one or more of location based: Virtual Tags, IoT Tags, and Hybrid Tags.

While a Smart Device 627 is within remote locations 631-632 or proximate to such area of remote locations 631-632 (within transceiving distance to Reference point transceivers located therein); an Agent 600B may transceive with Reference Point Transceivers 101-104 to generate location coordinates and perform the actions described herein, including accessing digital content via IoT tags 633-634, or virtual tags 636, and generating Virtual Tags 636, 638.

Figure 6D:
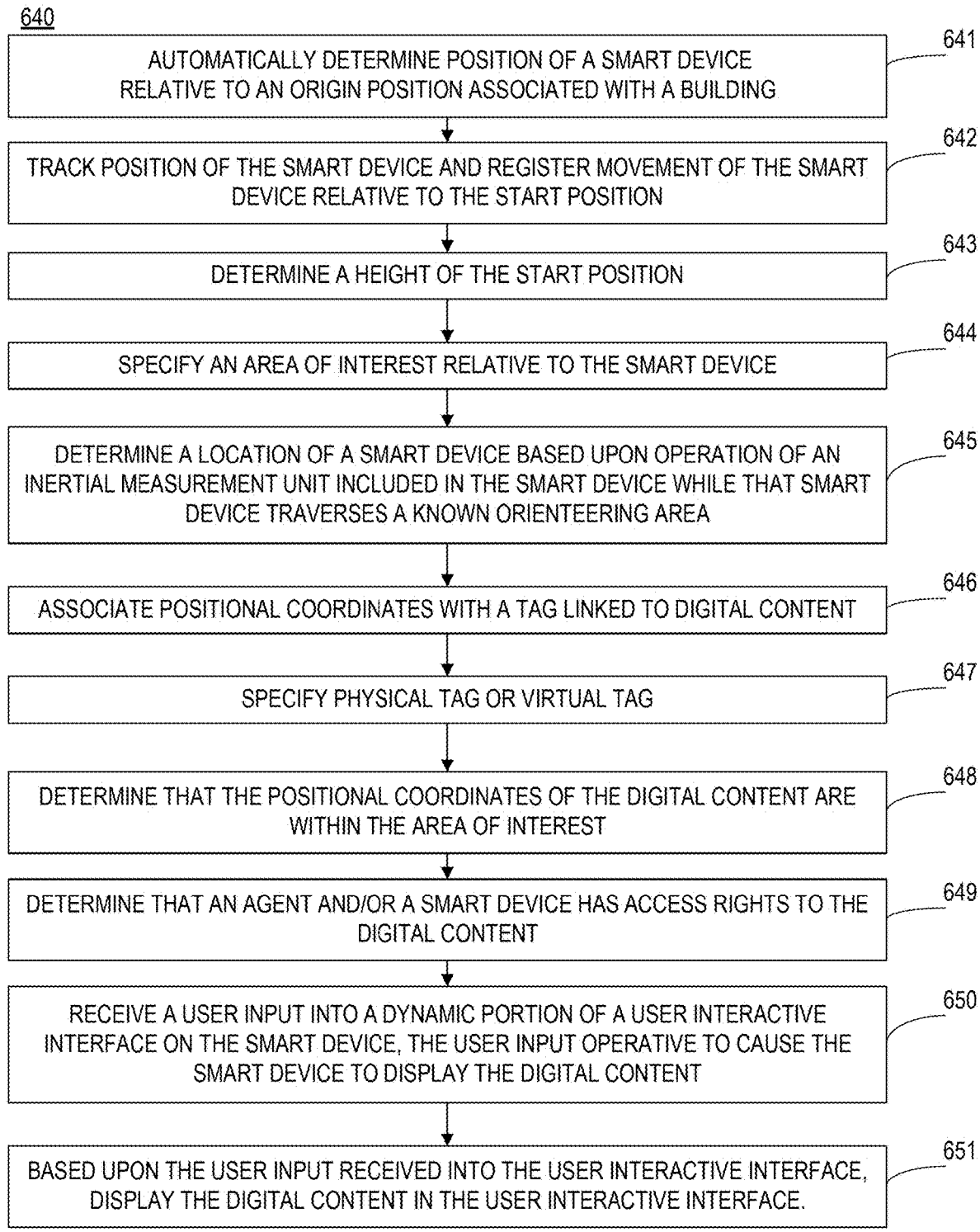
FIG. 6D illustrates method steps that may be performed in practicing some embodiments of the present invention.

Referring now to FIG. 6D, a method 640 is presented as method steps 641-651 that may be executed in some embodiments of the present invention. The steps listed are exemplary and any, or all, of the method steps may be completed and may be practiced in the sequence presented or any other sequence that is appropriate for a given circumstance.

At step 641, an initial position of a smart device may be automatically determined, or manually entered by an Agent. The smart device is preferably determined relative to one or both of a known point within a building, and an origin position associated with a building. For example, a position may be a Cartesian Coordinate relative to a coordinate of 0, 0, 0; or a position that is specified as a distance at an angle relative to an origin position. A known point may be any point that is identifiable by a smart device.

Identification of a known point may be accomplished, for example, via receiving a short distance communication, such as via BLE, NFC, ANT, or magnetic marker; image scan, image recognition of a known image at a known location, LiDAR, or other modality. An initial position may also be determined, for example via one or more of triangulation based upon multiple distance calculations based upon wireless communications (e.g. ultrawideband, Bluetooth, including Bluetooth Low Energy "BLE", WiFi, cellular or other communications); radio frequency (RFID) communication; near field communication (NFC); hash code; barcode; sonic or ultrasonic communication; infrared (or other light based) registration of a smart device and/or communication with a smart device.

For example, an Agent may enter an initiation area, such as passage through a doorway and a smart device may communicate via a wireless modality (including for example, one or more of: BT, UWB, RFID, sonic, or light transmission). The initiation area may be used as a start position for position tracking that is used to calculate a position relative to an origin position specified in building.

In some embodiments, an automated position determination process may execute an initial position determination. In other embodiments, an Agent may initiate an initial position determination via a user interface on the Smart Device.

At step 642, a position of the smart device may be tracked. Position tracking processes may be executed by the Smart Device commencing with the initial position determination. Some embodiments may also include an initial position determination be conducted on a periodic basis or called as a routine in the event of a smart device becoming disoriented and position tracking may resume following the determination of the new "initial" position. Disorientation may be determined, by way of non-limiting example, by incongruity between captured imagery and stored image based records of an environment.

For example, a point cloud, or other pattern record, may be associated with a location, A smart device software routine may access an internal IMU or other device to predict a location of the Smart Device. However, if captured image data from a Smart Device position is not validated by a point cloud associated with the IMU location, then a software routine may access a process to determine an initial position and begin position tracking again from the determined initial position. Image data may be placed along a predetermined path, located on one or more of equipment, fixtures, and architectural aspects; positioned in an aesthetically pleasing decorative item and/or artwork; and otherwise arranged in an area of travel.

Position tracking processes may include, for example, one or more indoor positioning routines that may access one or more of: inertial measurement unit (sometimes referred to as "IMU") sensor-based systems, accelerometers, magnetometers, LiDAR, image sensors (including smart device cameras); wireless communication systems employing time-difference of arrival (TDOA); frequency difference of arrival (FDOA), two way ranging (TWR); time of flight (TOF) or other combination of electronic devices and software processes.

At step 643, in some embodiments, one or both of an Agent and a smart device automated process may determine a height designation (e.g., a floor of a building, an elevation above sea level, a height above a ground level) of a start position. The height designation may be determined, by way of non-limiting example, one or more of: barometric pressure, wireless triangulation, angle and distance of arrival or departure of a wireless transmission; Agent input, RFID, NFC, bash mark, barcode, sonic, infrared registering movement of the smart device relative to the start position.

At step 644, an Agent may specify an area of interest relative to the smart device. For example, an area of interest may include an area in front of an Agent as the Agent traverses along a path. Other areas of interest may include an area at an angle to the Smart Device.

At step 645, a location of a smart device may be determined based upon operation of an inertial measurement unit (IMU) included in the smart device. Preferably, the IMU will be accessed to determine a position of the Smart Device while the Smart Device traverses a known orienteering area, such as, for example a floor of a building, a building campus, or craft.

At step 646, positional coordinates may be associated with a tag linked to digital content. Digital content may be active content, such as a link, code, video, or other content that leads to an action. An action may include, by way of non-limiting example, one or more of bringing a user interface to another resource or virtual location, execution of software code, ecommerce, or playing an audio or video segment.

Some specific examples of digital content associated with a building may include: Primary Systems such as:
Construction Site Data, such as, for example, one or more of:
  a. Gas;
  b. Electrical (switchgear, transformers, motors, etc.);
  c. Fire Protection (pumps, tanks, hydrants, PRVs, etc.); and
  d. Wastewater (pumps, tanks, equipment, etc.).
  Structural Data, such as, for example, one or more of:
  a. Footings/Foundations (location, size, depth, isolated foundations, equipment pads, etc.);
  b. Slab (thickness, etc.);
  c. X-bracing/Wind Girts (locution, size, etc.);
  d. Hardened Rooms (i.e., Tornado Shelter, etc.); and
  e. Cranes (location, type, rating, etc.).
  f. Architectural Data, such as, for example, one or more of: Doors (location, type, rating, size, hardware, etc.); Finishes (floor topping, curbs, wall type/color, ceiling type/color, etc.); and safety equipment (eye wash, emergency showers, fire extinguishers, rated walls, fire penetrations, etc.).
  Mechanical Data, such as, for example, one or more of:
  a. Plumbing (floor drains, door foamers, grease traps, neutralization pits, etc.)
  b. Fire Protection (risers, valves, etc.)

c. HVAC (RTUs, EFs, supply/returns, systems as a whole, etc.)
d. Utilities (boilers plus, air compressors plus, HW sets, valves, etc.)
e. Refrigeration (compressors plus, condensers plus, chilled water pumps, valves, etc.)
f. Safety (fire dampers, etc.)
g Electrical Data, such as, for example, one or more of: Electrical Rooms (MCCs, etc.); Lighting (fixtures, controls, breakers, etc.); motors; battery chargers; outlets (120V, 240V, Welding, equipment, etc.); safety (emergency lighting/wall packs, etc.).

Availability of digital content may be indicated on a user interface on a Smart Device via an icon, symbol, highlight, border, outline, change of color, or another Agent ascertainable indication.

Links to the digital content may be used to archive documentation related to equipment, architectural aspects, change orders, construction takeoffs or other material lists, change orders, as built versus design specification, manufacturer manuals or other documentation, warranty information, operation videos, service videos, maintenance videos, or other instructional videos, checklists, procedural checklists, maintenance and/or operation records, as built imagery, as built videos, as built audio record, records of proximity of an Agent (e.g. a particular Agent came within a particular distance to a location).

At step 647, in some embodiments, one or both of an Agent and software may specify whether a physical tag or virtual tag is associated with the digital content.

At step 648, in some embodiments, it may be determined that the positional coordinates of the digital content are within an area of interest. As discussed herein, an area of interest may be indicated via one or more of: interaction with a user interface; a position of a Smart Device; a position and direction of a Smart Device; and a record (e.g., a database) of digital content and positions associated with specific portions of the digital content.

At step 649, in some embodiments, it may be determined that an Agent and/or an associated Smart Device has access rights to the digital content. Access rights may include, by way of non-limiting example, multi-factor authorization, including whether an Agent is positioned within an area authorized for receipt of the digital content.

At step 650, a software routine may receive a user input via a dynamic portion of a user interactive interface on the Smart Device, the user input may cause a controller to be operative to cause the Smart Device to display the digital content.

At step 651, based upon the user input received into the dynamic portion of the user interactive interface display the digital content in the user interactive interface.

By way of non-limiting example, illustrative example, a process of designing and conveying information to onsite workers may be improved as compared to presently available methods by associating portions of a design with an onsite area in which the design is to be manifested as a constructed building. For example, details describing architectural aspects, such as walls, doorways, windows, archways, beams, trusses, electrical requirement, equipment, plumbing, fixtures, hardware, and the like may be quantified as digital content and associated with positional coordinates. Each positional coordinate will represent an onsite position. Design features associated with the position may be made available via one or more of: an onsite position of an Agent; an onsite position of a smart device; a position selected on a user interactive interface, such as a replication of a floorplan; or other area descriptor.

During construction a worker, such as a tradesperson, may provide as built records, such as one or more of: imagery, documentation, sensor readings, audio recordings, or other records indicating what was actually built, or what transpired during construction, who was present, who competed work, certification of operation, or other data quantifying events that occurred on site.

In installed available according to the position of the equipment. Documentation for the equipment may include one or more of: operators manual; technical documentation; warranty information, commissioning details, including time and date of placing equipment in operation; sensor information, such as, equipment sensors and/or IoT sensors.

Relatedly, sensor data, such as, equipment sensor data, and/or IoT sensor data may be made available based upon location of the sensors and/or an area or item of equipment monitored by the sensor.

A two dimensional user interface such as those illustrated in FIGS. 6A-6C may indicate the presence of available digital content and be available to one or both of an onsite Agent 600; and on remote or offsite Agent (not illustrated in FIGS. 6-6D). In this manner, the onsite Agent 600 and an offsite Agent may exchange digital content and also access historical records that are congruent. Work orders may be created and issued that are placed in positional context and accessed via that positional context or via traditional search queries. Likewise reporting and record keeping may be accessed in positional context and/or aggregated, summarized, tallied, and referenced in context of other dealings.

Accordingly, in some embodiments, digital content placed in positional context of a two dimensional reference, such as a design plan or floor plan may be accessed as a construction effort is being concluded and change orders that were completed during the course of the construction effort may be catalogued in the digital content such that each change order may show its positional context, which workers were involved, what timeframes the workers were involved, materials involved in the change orders, as built records of the change orders and any other relevant digital content involved in the change orders.

Additionally, some embodiments may include digital content that is associated with maintenance and operations. Work orders may be quantified in manners similar to change orders, with onsite personal and remote users accessing congruent data about the work order. Ecommerce may include links to consumables that are placed in positional context. For example, one or more of: filters; consumables; toners; inks; lights, lubricants; matching paints; matching floor coverings; matching wall coverings; matching hardware; matching building components; and/or complimentary items in similar or same categories may all be made available with links to vendors that sell the items.

In addition, in another aspect, qualitative indicators and/or ratings made be made available in positional context, such as, by way of non-limiting example, a consumable, such as a filter may be rated based upon user satisfaction, particulate size that is filtered, suggested filter life, environmental impact and the like, and/or simply rated via alphanumerical value or good, better best rating. Accordingly, a user may order a new filter via selecting a position of an equipment item and indicating that they want to order the best available filter from a selected vendor. The user will only need to indicate a position of the equipment item and not need to be aware of a make, model, year of manufacture, or other equipment details traditionally required to order replacement parts and/or consumables. A position may be as simple as one or more of: indicating that it is the equipment in a particular corner of a room portrayed on a floor print; or the equipment in front of a worker standing in the room on site.

Similarly, a user may access service records based upon a position on a floor plan, or via a position relative to an onsite Agent.

Figure 7:
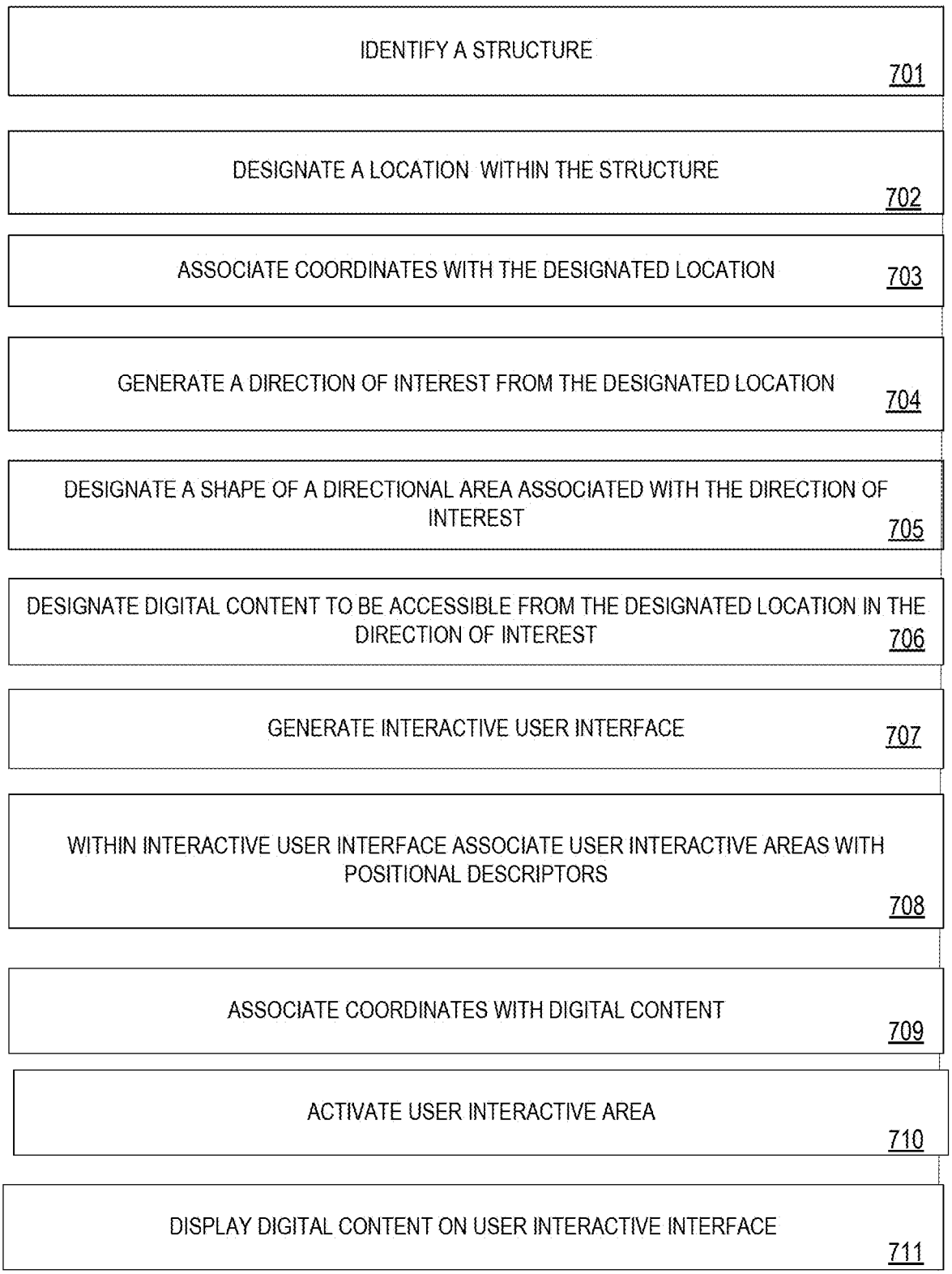
FIG. 7 illustrates an exemplary handheld device that may be used to implement aspects of the present disclosure including executable software.

Referring now to FIG. 7a, flowchart illustrates some exemplary process steps that may be executed according to the present invention. At step 701, a structure may be identified, such as, for example via triangulation using one or both of satellite and cell tower communications. Other methods of identifying a structure may include RFID as an Agent enters the structure or is within radio range of the RFID circuit. Still other methods of determining an identification are to establish a known location within the structure (see step 702) and thereby determine that the Agent is within the structure associated with the known location.

At step 702 a location is designated via the wireless processes and using the apparatus discussed herein.

At step 703, a set of coordinates is associated with the designated location. Coordinates may include any grouping of alphanumerical values that is capable of indicating within a required accuracy range a location of the Agent. A required accuracy range may be contingent upon a modality of wireless communication used to generate the coordinates.

At step 704, a direction of interest from the designated location is generated. The direction of interest may be generated, for example, via generation of a vector intersecting a position of a Smart Device supported by the Agent. Generation of the direction of interest may reference, by way of non-limiting example, locations of reference point transceiver, angle of arrival of radio spectrum energy; angle of departure of radio spectrum energy; values generated by a magnetic sensor, image data recognition processes, LiDAR, ultrasonic measurements, and the like.

At step 705, a shape of a directional area associated with the direction of interest may be designated. The shape of a directional area may include for example an area congruent with a radio, a target area, or other geometric area. Non-limiting examples of geometric areas may include areas definable as a frustum; conical area; an area with a square profile* an area with a rectangular profile, an area with another polygonal profile; an area with a circular profile, an area with an oval profile; and an area with a complex geometric shape profile, combining linear, arcuate and angular aspects.

At step 706, digital content is designated that is accessible form the designated location in the direction of interest, and in some embodiments within the area of interest.

At step 707, an interactive user interface is generated that is accessible via a smart device or other automated device having a controller and a display.

At step 708, user interactive areas within the interactive user interface are associated with positional descriptors. Positional descriptors may include, for example, one or more of: cartesian coordinates, polar coordinates, cylindrical coordinates, distance and direction from a known point; point cloud pattern; and unique identifiers.

At step 709, the coordinates are associated with specific digital content.

At step 710, live Agent will activate a user interactive area associated with specific coordinates such that at step 711, the digital content associated with the coordinates is presented om the user interface. Other actions may also be triggered by the Agents activation of an interactive area, such as control of an item of equipment, activation (or deactivation) of an alarms state, generation of an electronic message, or almost any action activatable via an electronic console.

Referring now to FIGS. 8A-8G, exemplary Wireless Communication Areas (WCA) and Radio Target Areas (RTAs) are illustrated. In general, a WCA is an area through which wireless communication may be completed. In some embodiments, one or both of: a Virtual Tag; and Zone digital content; may presented to a user in the context of a RTA.

A size of a WCA may be dependent upon a specified modality of wireless communication and an environment through which the wireless communication takes place. In this disclosure (and as illustrated), a WCA may be portrayed in a representative spherical shape; however, in a physical environment, a shape of a WCA may be amorphous or of changing shape and more resemble a cloud of thinning density around the edges.

In general, an RTA is an area from which an energy-receiving Sensor will receive energy of a type and bandwidth that may be quantified by the energy-receiving Sensor. The RTA shape and size may be affected by an environment through which the energy must be conveyed and further effected by obstructions.

Figure 8A:
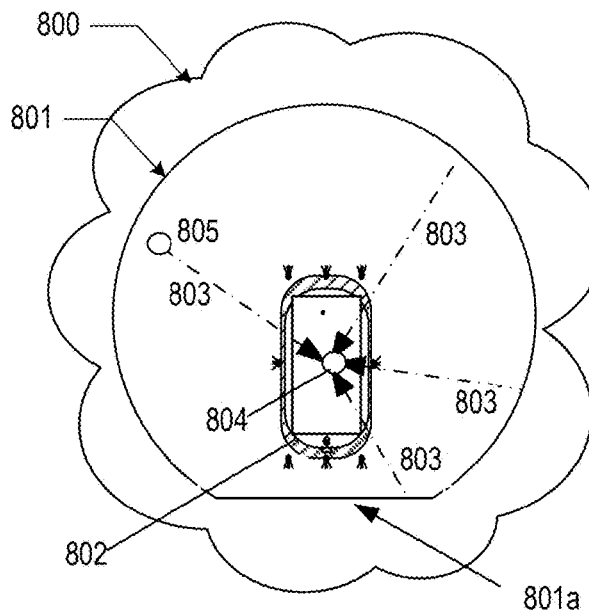
FIGS. 8A-8G illustrate aspects of the determination of directions of interest and Fields of View and information display.

Referring now to FIG. 8A, a side view illustrates a WCA 800 surrounding a Node, such as a Smart Device 802, Energy 803, which is illustrated as rays, is received by one or more energy-receiving Sensors 804 in the Smart Device 802 (energy-receiving Sensors may also be in a Smart Receptacle associated with the Smart Device, though this is not illustrated in FIG. 8A). An exemplary ray may proceed from a position 805 within RTA 801 boundary to the energy-receiving Sensor 804.

As illustrated, a portion of the RTA 801 may flatten out 801a in response to a ground plane, wall, partition, or other obstruction encountered. A Node 806 may be located on or within a surface that makes up a relevant obstruction and the Node 806 may appear to be along a perimeter of the RTA 801.

Similarly, one or both of: a Virtual Tag and zone digital consent, may be associated with location coordinates that appear on or within a floor, wall, partition, or other article acting as a radio frequency obstruction and thereby appear to be a part of the obstruction, however, since it is virtual, the Virtual Tag will not affect the physical properties of the obstruction. Essentially, a Virtual Tag may have location coordinates that correspond to anywhere in the physical real-world. In some examples, a software limit or setting may limit location coordinates of Virtual Tags to some distance from a base position or a distance from a designated position, such as a location of a designated Physical Tag, Reference Point Transceiver, or other definable position.

In addition to obstructions, a topography of an environment within an RTA 801 may also limit wireless conveyance of energy within an RTA 801 to an energy-receiving Sensor 804. Topography artifacts may include, for example, a terrain, buildings, infrastructure, machinery, shelving, or other items and/or other structures that may create impediments to the receipt of wireless energy.

Energy 803 received into the energy-receiving Sensor 804 may be used to create aspects of a user interface that is descriptive of the environment within the RTA 801. According to the present invention, environmental aspects, Nodes 806, Tags (both physical Tags and Virtual Tags) and the like may be combined with user interactive mechanisms, such as switches, or other control devices built into a user interactive device and included in a user interactive interface. For example, energy levels received into an energy-receiving Sensor 804 may be combined with location coordinates of Physical Tags and/or Virtual Tags and a user interactive device may be positioned in an interactive user interface at a position correlating with the position coordinates and be surrounded with a visual indicator or the received energy levels.

In this manner, a single user interface will include a static image representative of received energy levels at an instance in time, a visual representation of a location(s) of Physical and/or Virtual Tag(s), and devices with user interactive functionality. In some embodiments, the devices with user interactive functionality may be positioned at a location in the user interactive interface correlating with the position(s) of the Physical and/or Virtual Tag(s).

This disclosure will discuss RTAs 801 that are frustums of a generally conical shape, however, RTAs 801 of other volume shapes are within the scope of the invention. For example, if an energy-receiving Sensor 804 included a receiving surface that was a shape other than round, or had multiple receiving surfaces, each of a round or other shape, the RTA 801 associated with such an energy-receiving Sensor may have a shape other than a frustum of generally conical shape.

Figure 8B:
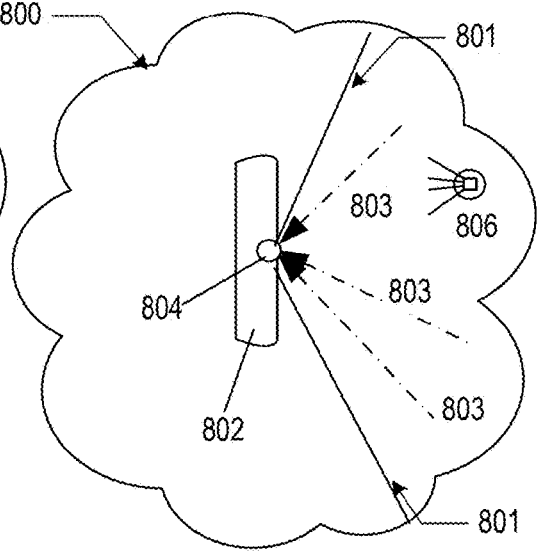

Referring now to FIG. 8B, a top-down view of an RTA 801 is depicted. An RTA 801 will include some portion of a WCA 800. As illustrated, the WCA 800 includes a space with irregular boundaries encompassing 360 degrees around the Smart Device 802. Aspects such as topography, strength of signals and atmospheric conditions (or other medium through which a wireless communication will travel) may affect and/or limit a perimeter of the WCA 800. A location of the RTA 801 may be referenced to determine which Tags (Physical and/or Virtual) such as Node 806 are included within an interactive user interface. Generally, preferred embodiments may only include Tags with location coordinates with the RTA 801 in the interactive user interface. However, embodiments may include Tags external to the RTA 801 in a particular interactive user interface.

Figure 8C:
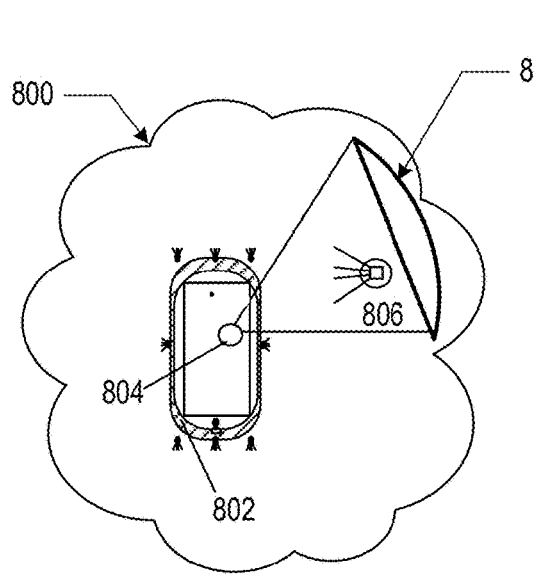

Referring now to FIG. 8C, a side view of a WCA 800 is presented where an energy-receiving Sensor 804 is capable of quantifying a particular form of energy, such as a particular bandwidth of energy received from a user selected RTA 807. A Smart Device 802 may incorporate or be in logical communication with multiple energy-receiving Sensors 804, each energy-receiving Sensor capable of quantifying a limited energy spectrum in an environment defined by the RTA 807 selected by the user.

Some embodiments include an RTA 807 that varies according to a type of energy-receiving Sensor 804 receiving a corresponding type of energy. For example, an energy-receiving Sensor 804 that receives energy in a lower bandwidth may have an RTA 807 that extends a greater distance than an energy-receiving Sensor 804 that receives energy in a higher bandwidth. Similarly, some energy-receiving Sensors 804 may be affected by forces outside of the RTA 807, such as a magnetometer which may be sensitive to signal interactions around all of the WCA 800, and an RTA 807 associated with a magnetometer may accordingly be the same as the WCA 800.

By way of non-limiting example, an RTA 807 for a CCD-type energy receiver may be represented as a frustum with an expansion angle of approximately 60 degrees in shape. Accordingly, the RTA 807 subtends only a portion of the universal WCA 800.

Figure 8D:
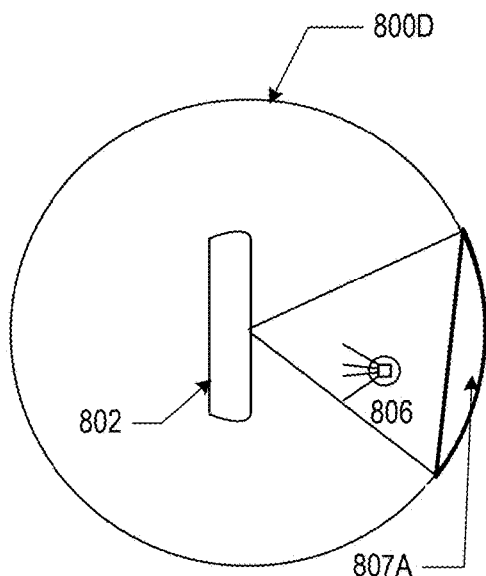

Referring now to FIG. 8D, a top view of a WCA 800D is illustrated with an RTA 807A comprising a frustum with an expansion angle of approximately 60 degrees. A Smart Device 802 with an energy receiver that quantifies a specified bandwidth of energy from the RTA 807A may generate a user interface with an image based upon energy quantified from RTA 807A.

In FIG. 8D, the WCA 800D is represented as a spherical area. A WCA 800D may be designated that is less than an entire area of possible radio communication using a specific designated wireless communication modality. For example, WCA 800D may be spherical and stay within boundaries of a modality based upon a UWB wireless communication protocol.

A user interface based upon quantified energy in an RTA 807A, may present a representation of energy within the respective RTA 807A as quantified by an energy-receiving Sensor in a Smart Device 802. Energy levels of other three-dimensional spaces within the WCA 800D may be quantified by energy receivers and presented in a user interface by directing energy from a selected three-dimensional space into the energy receivers and thereby defining a different RTA 807A. In this manner, energy levels may be quantified from essentially any area within the WCA 800D and represented as part of a user interface. Quantified energy levels may vary based upon a receiving Sensor. For example, a CCD Sensor may quantify visible light spectrum energy, and a LIDAR receiver a broad spectrum, an infrared receiver may quantify infrared energy levels, and energy-receiving Sensors. A particular feature present in a particular portion of the electromagnetic spectrum quantified by an energy-receiving Sensor may have a unique physical shape which characterizes it, and which may be associated with a corresponding virtual-world aspect and Tag associated with the location.

In some examples, as has been described, quantification of energy levels associated with aspects of the physical world may be for one or more of characterizing an RTA 807A by quantifying energy levels and patterns existing at an instance in time; determining a location and/or orientation of a Smart Device 802 or other Node, such as Node 806; and verifying a location and/or orientation of a Smart Device 802. Various embodiments include energy levels associated with aspects of the physical world may be communicated by the Smart Device 802 to a remote controller for further processing, and the remote controller may communicate information back to the Smart Device or to another user interface. Information communicated from the controller may include, for example: an orientation of physical and/or virtual aspects located within the universal RTA in relation to the Smart Device; and quantified energy indicating of or more of a topographical feature, a surface temperature, a vibration level, information associated with a Virtual Tag, information associated with a physical Tag, sensor data, or other information associated with the RTA 807A.

A view of an RTA 807A (Radio Target Area) may be a relatively small portion of the entire wireless communication area (WCA) that surrounds a Smart Device. An area of energy to be quantified by a sensor (sometimes referred to herein as the Radio Target Area) may be displayed surrounded by the WCA 800D.

Figure 8E:
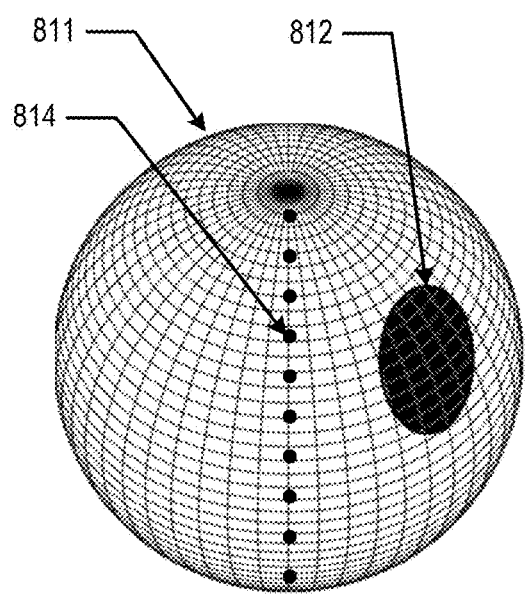

Referring now to FIG. 8E, an exemplary presentation of an RTA 812 superimposed upon a representation of a WCA 811 is illustrated. The WCA 811 is illustrated with a perspective view of a spheroid with an alignment feature 814 such as a spheroid dividing arc, or a line. A blackened ellipsoid feature is a representation of the RTA 812 associated with a particular Smart Device which would be located at a center of the spheroid WCA 811. If desired, one or more energy receiving devices associated with or incorporated into a Smart Device may be repositioned or have a changed orientation in space to ultimately scan all of the accessible universal Radio Target Area space.

Figure 8F:
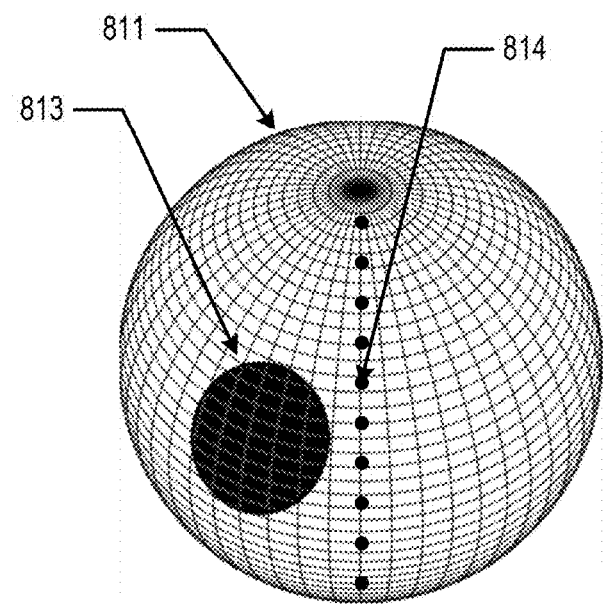

Referring to FIG. 8F, an illustration of how moving the one or more energy receiving devices around in space may alter an area defined as the RTA 813. The same orientation of the universal WCA 811 may be noted by a same location of the alignment feature 814. Relative movement of the ellipsoid feature illustrates a change in an area designated as RTA 813.

Figure 8G:
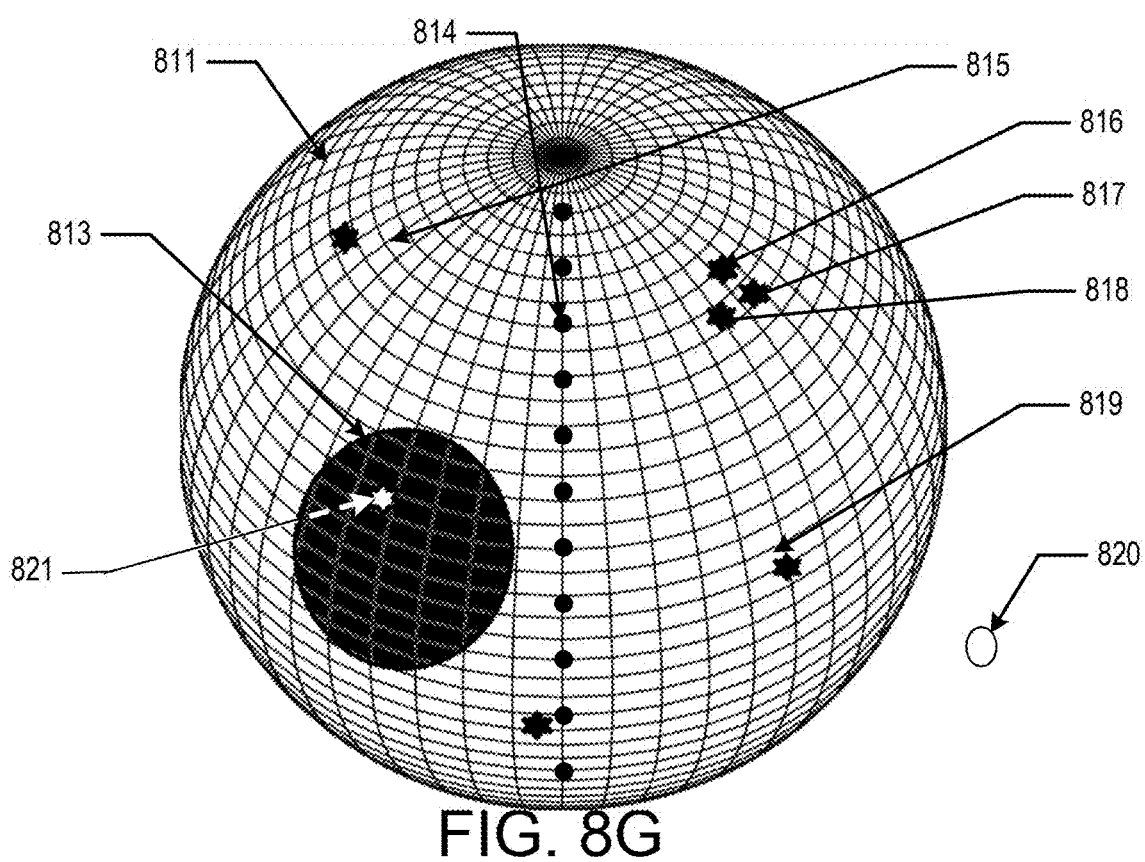

Referring to FIG. 8G, an illustration of adding Tag locations (which may be Physical Tags or Virtual Tap) to a mapping of the WCA 811 is provided. A Tag may be represented in the WCA, for example, as an icon (two- or three-dimensional) positioned in space according to a coordinate system, such as Cartesian coordinates, polar coordinates, spherical coordinates, or other mechanism for designating a position. Coordinates may specify one or both of physical real-world Tags and Virtual Tags.

A location of a real-world Tag or Virtual Tag may be in either RTA 813, the WCA 811 or external to both the RTA 813 and the WCA 811. Examples of Tags outside the RTA 813 and within the WCA 811 include Tags 815-819. An example of a Tag in the device RTA is Tag 820. A Tag located external to the WCA 811, and the RTA 813 includes Tag 821.

In some examples, a display on the user's Smart Device may illustrate image data captured via a CCD included in a Smart Device. Portions of the image data captured via a CCD may be removed and replaced with an icon at position correlating to a position in space within the RTA 813. The icon may indicate a Tag 821 located within the RTA 813, or at least the direction in the RTA 813 along which the Tag 821 may be located at an instance in time. In addition, an area of a user interface portraying the Icon may user interactive device such that when the device is activated, the Smart Device is operative to perform an action.

The actual positions of the Tags in real-world space (or the digital equivalent in the real-world space) may be stored and maintained in a database. Positions of physical Tags may be determined via techniques based upon wireless communication and be updated periodically. A period of update may be contingent upon variables including, user preference, Tag movement, change in environmental conditions, User query or other variable that may be convened into a programmable command. In another example of some embodiment, an Agent may interact with a user interface and understand the presence of Tags that are outside of the RTA 813 and adjust one or both of a position and direction that the Smart Device to cause the Smart Device to be positioned such that the RTA 813 encompasses a position of the Tag of interest.

Figure 9A:
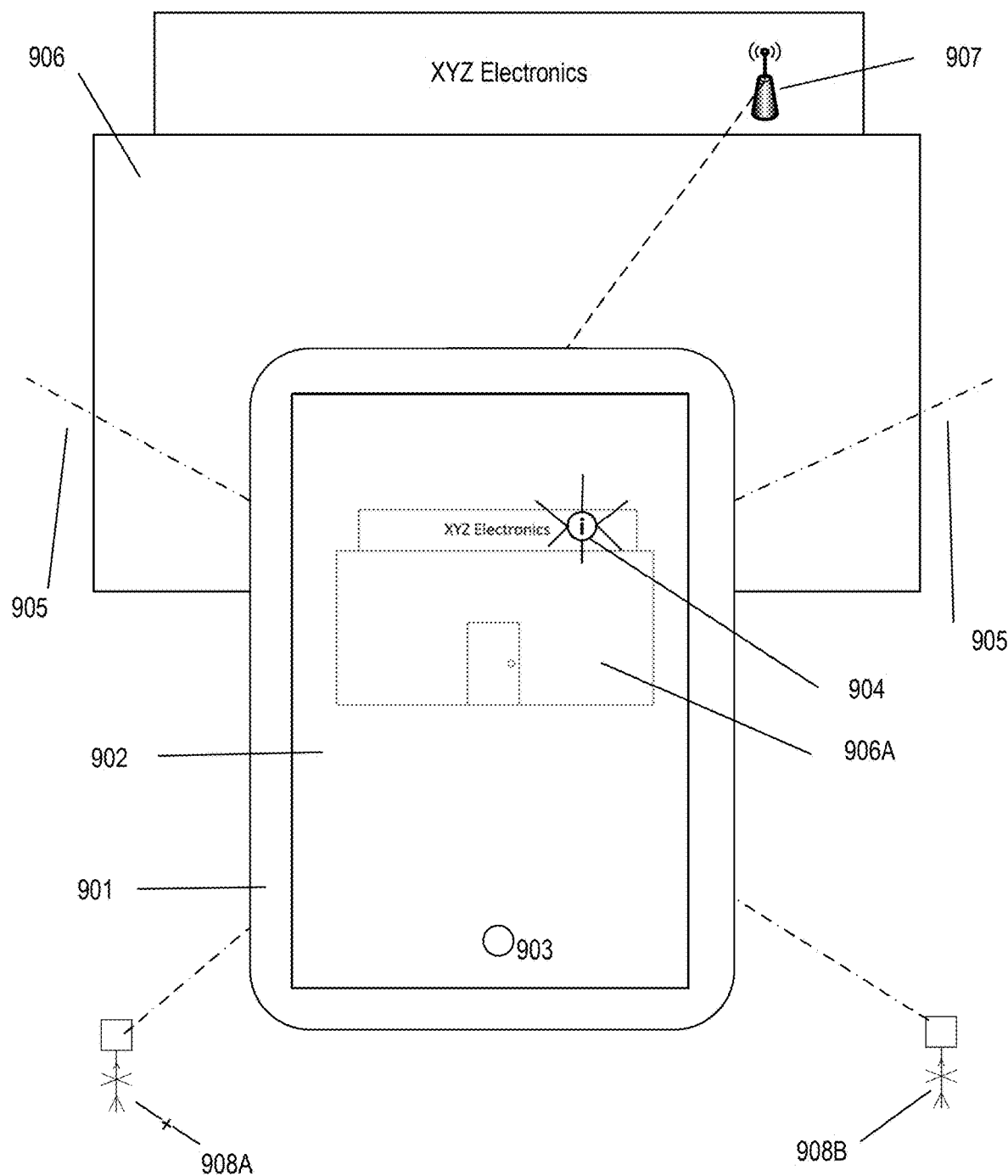
FIGS. 9A-9C illustrate additional aspects of information display.

Referring to illustration FIG. 9A, an exemplary apparatus for effectuating the methods described herein is shown, wherein Smart Device 901 has within its Radio Target Area 905 a Structure 906. Smart Device 901 may display a user interface 902 based upon data generated by an energy-receiving Sensor 903 incorporated into the Smart Device 901 or operative in conjunction with the Smart Device 901. The energy-receiving Sensor 903 may produce data representative of an area from which the energy-receiving Sensor 903 received energy. A user interface 902 may be generated that is based upon relative values of some or all of values for data variables produced by the energy-receiving Sensor 903.

Smart Device 901 may have its position and direction of orientation determined using the orienteering methods described herein, with reference to one or more Reference Point Transceivers 908A-B. The position may be determined relative to a Base Node, such as Reference Point Transceiver 908A. The Base Nod may operate as an origin in a coordinate system associated with Structure 906 and its surroundings. A position-determination process may be aided with reference to transmitter 907, which in some embodiments, may be a Reference Point Transceiver. In this example, transmitter 907 is positioned proximate to the Structure 906.

A receiver on Smart Device 901 may be operative to receive a wireless logical communication from transmitter 907. This communication may be in one of a variety of modalities, such as Bluetooth, ultra-wideband (UWB), radio frequency, infrared, ultrasound, etc. Based upon the signal, Smart Device 901 may transmit a database query based upon a determined set of coordinates of transmitter 907, a set of coordinates of the Smart Device 901, the RTA 905, or other position and direction relevant variable.

If the database contains an entry comprising a set of coordinates (as a data structure) and the set of coordinates define a point within displayable distance to the set of coordinates of transmitter 907, then the user interface 902 may display an interface that includes an interactive area 904 that manifests a Virtual Tag (such as an icon or other definable area) in context to a virtual structure 906A representative of the physical structure 906. In this way, a user of Smart Device 901 may be alerted to the presence of information associated with structure 906 in which the user may be interested.

In some embodiments, inclusion of an interactive area 904 on the user interface 902 may be contingent upon an Agent operating the Smart Device 901 presenting appropriate credentials and/or permissions to access digital content made accessible via the interactive area. Still further appropriate credentials and/or permission may be required to ascertain that an interactive area exists. For example, an image displayed on a user interface may include imagery descriptive of an item of equipment or a person. A user with proper credentials may be presented with a user interface that includes an interactive area 904 that manifests a Virtual Tag, such as an icon or outline of imagery descriptive of an item of equipment or a person; while a user who has not presented proper credentials may not be made aware of the existence of such an interactive area, nor the content included in the Virtual Tag associated with the interactive area 904.

In another aspect, in some embodiments, an interactive area 904 may only display if Smart Device 901 is in active communication with a specified Wi-Fi network, or if the Smart Device 901 his in communication with at least one of a specified Node or Nodes. Communication with a Node may include, for example, wireless communication via a wireless modality, such as, one or more of: UWB; Bluetooth, infrared, sonic, or other modality discussed In other embodiments, interactive area 904 may display on any user interface 902 (if the RTA 905 includes transmitter 907), but further functionality may be based upon successfully responding to a security challenge. A security challenge may include, for example, a biometric measurement, inputting a password, correctly input an answer to a question, a gesture made with the Smart Device, a gesture made in communication with a sensor integrated within or with a Smart Device (such as, for example, motion of hand(s) in front of a camera, or motion of a hand wearing a Smart Ring or a wrist wearing a Smart Wristband).

In some embodiments, the appearance of interactive area 904 may change based upon variables, such as, one or more of: the position of the Smart Device 901; the identity of user or Agent; if the interactive area 904 is related to a query and/or query response; if the interactive area 904 is within an RTA 905 or based upon some other dynamic. For example, if the user has a certain UUID, and the database includes a message specifically intended for a user with that UUID, then the interactive area 904 or an icon may flash to indicate the presence of a message. This message may be displayed textually, visually, audibly, or by a hologram. Similarly, the database may record one or more instances in which the Smart Device 901 is accessed via a query from a Smart Device. Access via a query may be associated with a time stamp. If data related to structure 906 has changed since a previous time stamp, then interactive area 904 may be presented in a highlighting color (such as, for example be presented in red or other color) to indicate that a change has been detected. In addition, digital content may be appended to any content already in the database, such as additional alphanumeric annotation, an audio file, an image file, a video file, or a story file.

In some embodiments, in response to activation of an interactive area 904 (such as a click, screen touch, voice command, gesture, etc.), additional functionality may be provided via the Smart Device 901 or other item of equipment. For example, selecting interactive area 904 may display digital content related to Structure 906. Alternatively, activating the interactive user device associated with interactive area 904 may generate a control panel, which may allow the user to control aspects relating to sensors or other electronics within structure 906. For example, upon confirmation that Smart Device 901 has the appropriate permissions, selecting interactive area 904 (or other activation of the interactive area 904) may allow the user to turn off the lights within structure 906. Still other embodiments allow for activation of an interactive area 904 to be a prerequisite to operation of equipment located within the RTA 905 or other defined area.

An interactive area 904 may be incorporated into a user interface in almost any manner conducive to a user activating the interactive area 904. For example, a user interface that recreates a visual of a physical area, such as, by way of non-limiting example, an image (or video) based upon a CCD sensor array; a two dimensional representation of a physical area (such as a floorplan, site plan or architectural drawing); and a three dimensional representation (such as a CAD model, AVM; or Augmented Reality model) may include interactive areas that include areas of the image data, integration of one or more of: an icon, an outlined image area, a highlighted image area, an image area with a changed appearance (e.g. change in hue or color), integration or overlay of an image (e.g. a logo, emoticon, or other device).

The Smart Device 901 may also display other functional buttons on its user interface 902. In some examples, one such function may be to show displays of the sensor in the context of the universal RTA 905 surrounding the user. By activating the functional button, the user may be presented with a set of options to display the universal RTA 905.

According to the present invention, an interactive area 904 may be used to retrieve digital content, and/or to store digital content for subsequent retrieval. Digital content may be associated with one or more sets of position coordinates (e.g., cartesian coordinates, polar coordinates, and/or cylindrical coordinates). A user interface 902, AVM and/or two dimensional representation of a structure or geospatial area may be produced that allows the digital content to be accessed based upon the associated coordinates. The retrieval of the digital content is persistent in the sense that it may be retrieved, and new digital content may be added for so long as an underlying infrastructure enabling determination of coordinates used to access and/or place digital content within a coordinate framework exists.

Figure 9B:
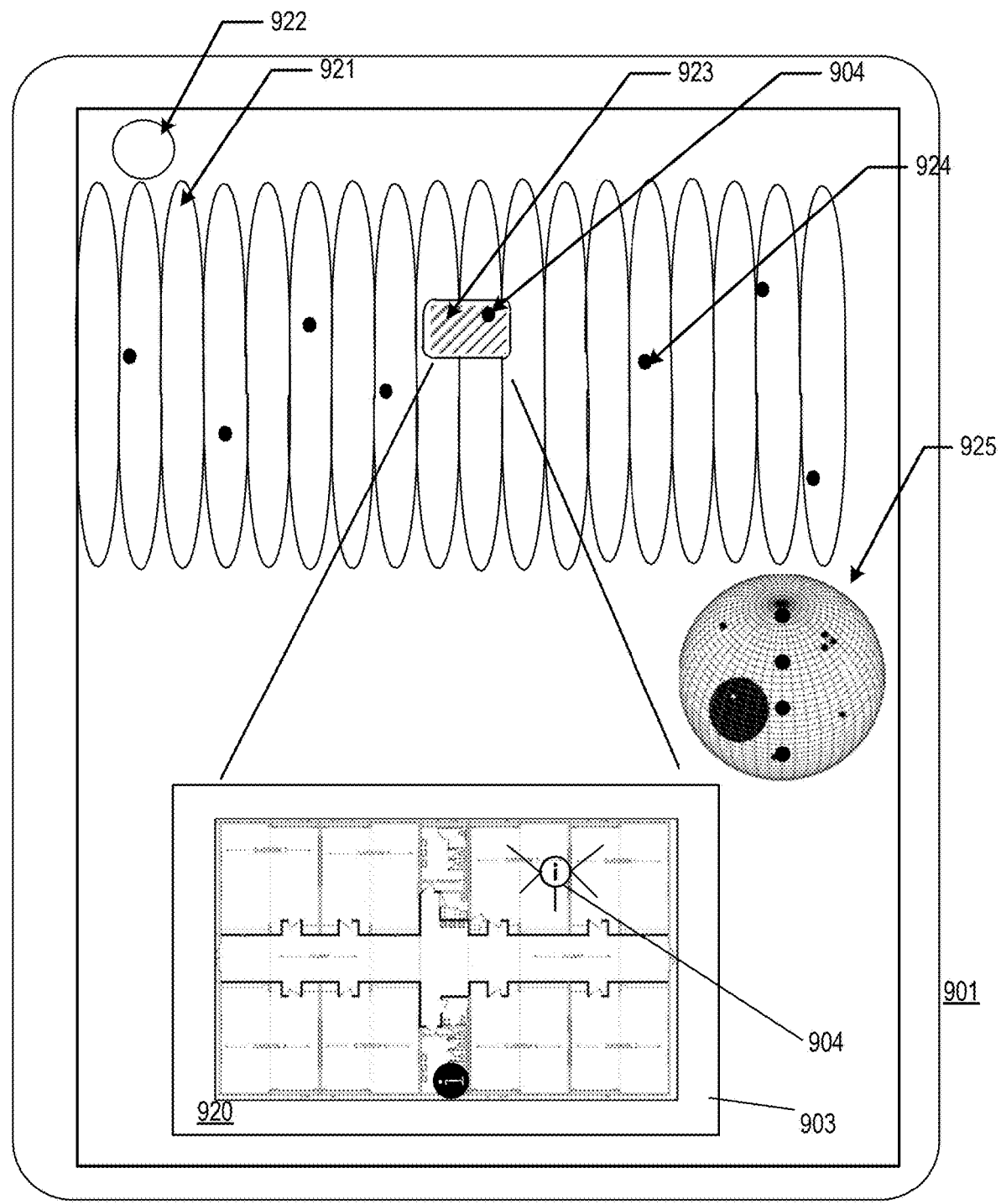

Referring to FIG. 9B, nonlimiting and exemplary apparatus and methods for presenting a user interface including an interactive area 904 is illustrated. The display screen of the Smart Device 901 may display a number of informational digital content components. In some embodiments, a similar illustration as FIG. 8G may be included as an inset 923 of the user interface 920. In addition, in some embodiments, a user interface 920 may include a representation of the interactive area 904 may be formed by flattening the surface of the illustrated sphere 925 into a flat depiction with surface regions flattened into a segment 921. The interactive area 904 may be illustrated on the flat segments. A user interactive area 920 (which may be an icon, highlighted area, outline, portion of an image, or other defined area) may be located within the user interface representing the interactive area 904 and structure 906A. The interactive area may also be included in the real time display of a representation of data generated by an energy-receiving Sensor 922. Tags may be located within or outside of the interactive area 904 such that an Agent may move the Smart Device 901 to redirect an interactive area 904 to align the interactive area 904 into a position that encompasses Tag 924 the Agent wishes to include.

Figure 9C:
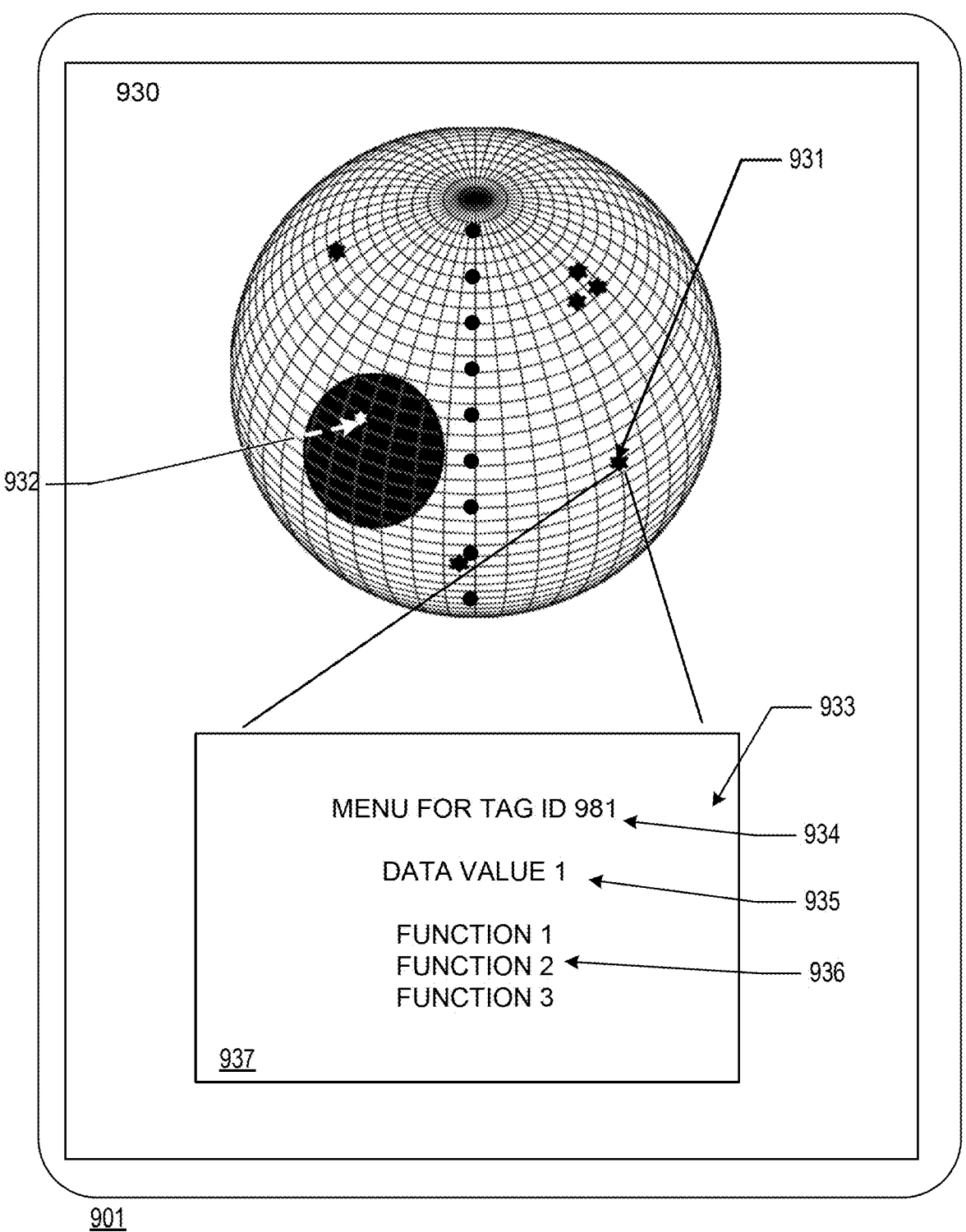

Referring to FIG. 9C, a nonlimiting exemplary user interface 937 generated on a display screen 930 for Smart Device 901 is illustrated. The user interface 937 may be displayed, for example, when a user selects an interactive area associated with a Tag 931-932.

The Tag 931-932 may be located at a physical location within or outside of the RTA 932 (is illustrated). Selection of the Tag (sometimes referred to activating the Tag 931-932), a menu 933 may display, Amongst the various information such as text, imagery, video content and the like that may be displayed an identification of the Tag 934, associated textual information and data 935 as well as functional buttons 936 may be displayed on the user interface and may be used by the user to activate additional function including new display layers, content integration and control function such as in a non-limiting sense a control to revert to a previous menu display.

In some examples, a Smart Device may function as a Tag. The Tag functionality may include providing location-related information as broadcasted digital content. In providing such broadcasted digital content, the Smart Device tab may employ numerous forms of security protocols for the protection of the information and authorization of its use which may include sign-in/password protocols, sharing of encryption keys and the like. In similar methods, a central server may provide content related so a Tag and may manage security protocols and the like where a Smart Device acting as a Tag may merely share an identification phrase that a user could use with applications running or connecting with the central server could use to be authorized for additional content. Location may be determined by the various means as described herein including wireless communication with position Nodes by GPS, Cellular, Wi-Fi, Ultrawideband, Bluetooth and the like. If the Smart Device is operating in a mesh Node, the mesh could communicate within Nodes relative and absolute location information which the Smart Device may share as its role as a Tag. In addition to location, other sensor data at the Smart Device such as temperature, vibration, sensor imagery, LiDAR scan imagery, sound sensing.

In addition to real-world data, the Smart Device Tag may also provide virtual content associated with itself and its connected environment. The Smart Device may provide content stored within its memory devices and may provide dynamically calculated results of processing on content stored in its memory devices. The virtual content may also correspond to a user interface of the Smart Device Tag that may be used to initiate or authorize functions of the Smart Device including real-world activities such a communication via internet protocol, text, phone, or video.

In some embodiments, an energy-receiving Sensor may receive energy associated with a LiDAR transmission and/or other functionality involved in LiDAR scanning which can be used to interrogate the local environment for physical shapes. In a Smart Device Tag function, the Smart Device may stream its video and scanning data directly or through a server model. Some Smart Devices may be configured to operate as a smart security monitoring systems and may provide the video, topographic, audio, and other sensor streams as Tag related content. There may be numerous manners that a Smart Device could function as a Tag in an environment.

A Smart Device with either a single- or multiple-sensor system may also have a LiDAR scanning capability or other three-dimensional scanning capability. The Smart Device may utilize a number of systems to refine and improve its accuracy in determining the location that it is at. In an example, a Smart Device may utilize a GPS or cellular system to get an approximate location of the device. In a next step, a user may initiate the Smart Device to take a series of image and scanning data acquisitions of its environment. For example, the user may move the phone by hand in different directions while maintaining their feet in a fixed location. The phone may use one of the orientation methods as have been discussed to determine its orientation as it is moved to different vantage points. The Smart Device may either process those images and compare them against a database in its memory, or it may communicate the data to a server to do the comparison. With an approximate location, the orientation information, and the streams of video and/or topographic information, a calculation may be performed to match the image/topographic information to a more exact positional location. In alternative examples, the device may use the image and/or topographic information to determine the orientation of the device itself.

In some examples, the Smart Device may function as a receiver of one or multiple types of wireless energy input. For example, the acquisition of data based upon a visual light spectrum (approximately 380 to 700 nm wavelength) may be modelled as spatially-characterized electromagnetic energy. Electromagnetic energy in the visible band may enter a focusing lens and be focused up an array of devices. The devices may be CMOS-active pixel sensors, CMOS back-illuminated sensors, or CCDs, as non-limiting examples, to receive the energy and convert it into spatially-arrayed pixel data.

In some examples, the Smart Device may have an energy-receiving Sensor incorporated or attached which may quantify energy levels for frequencies outside the visible spectrum. Any optics employed in such sensors may be different from the previously discussed CMOS and CCD Sensors since some of those energy receiving devices may have filters or lenses that absorb wavelengths outside of the visible spectrum. Sensors with infrared capabilities may have specialized optics and may use different materials for the CMOS and CCD elements—such as indium gallium arsenide-based sensors for wavelengths in the regime of 0.7-2.5 μm.

Alternatively, entirely different sensing elements, such as bolometers, which sense temperature differences of the incoming radiation, may be employed for longer wavelengths in the regime of 7-14 μm and may include filters that remove other wavelengths. A display of an infrared Sensor, which senses incoming energy in the infrared band, may be rendered on a typical visual display, but the colors of such displays may have no direct physical meaning. Instead, a color scheme may be instituted to represent different infrared wavelengths with different visible colors. Alternatively, the colors may be used to represent different intensities of infrared energy received across bands of infrared wavelengths.

In some examples, a Smart Device may both project and receive energy. For example, a Smart Device may scan the topography of its surroundings by use of LiDAR. In LiDAR, a laser may be used to emit energy into the environment. The energy may be emitted as pulses or continuous trains, and the light source may be scanned across the environment. Light emitted from the Smart Device may proceed into the environment until it is absorbed or reflected. When it is reflected and subsequently received at the Sensor, the transit time can be converted to distance measurements of the environment. Many different wavelengths of light may be used to scan an environment, but numerous factors may favor certain choices such as invisibility to human/animal eyes, safety, absorption by the airspace surrounding the user and the like. Atmospheric gases may absorb significant amounts of infrared transmissions at certain frequencies; therefore, for LiDAR to be effective in the infrared spectral region, certain bands of emitted frequencies may be favored. A standard LiDAR system may operate at a band from 900-1100 nm infrared wavelength or at a band centered at approximately 1550 nm. As discussed previously, select optic components and materials may be useful for these wavelengths and the detectors may have improved function based on materials such as "black" silicon, germanium, indium phosphide, gallium arsenide, and indium gallium arsenide as exemplary detector materials.

In an example, a laser light source may be rastered across a dimension of forward looking positions of a Smart Device, which may be represented by a conic section or Radio Target Area in front of the Smart Device. As the light is raster across the surface it can address, it may be pulsed on or off. As the light travels out along a collimated path, it may interact with a surface and a portion of the intensity may be reflected backwards.

A resulting reflected ray may come back to the Smart Device and be received by a Sensor in the device. Since the emitted light source may be orders of magnitude more intense than the surroundings, reflected light may dominate a background intensity and the signal detected may be compared with the time of the leading edge of the laser pulse. The repeated acquisition of the timing signals in the various directions can be used to form a point cloud that represents the distance to reflective features from the Smart Device.

As mentioned previously, sound may be reflected off of surfaces and the transit time may be used to characterize a distance between a focused ultrasonic transducer and a reflective surface. In similar manners, points or lines of focused sound emissions may be pulsed at the environment and a sensor or array of sensors may detect the reflected signals and feed the result to a controller which may calculate point cloud representation or other or topographic line representations of the measured surface topography. In some examples, ultrasonic focused and scanned soundwaves in the frequency range of hundreds of megahertz may result in small, focused sources whose reflections may be detected by magnetic or piezoelectric sound transducers as non-limiting examples.

A Smart Device may have numerous different types of energy-collection devices which may characterize data values with spatial relevance. As mentioned before, infrared imaging may be performed on some Smart Devices, and a user may desire to view a spatial representation of the infrared imaging that represents the data as it may appear if the user's eyes could perceive the energy. In some examples, data values for the wireless energy sensing of infrared energy may be assigned color values and displayed in an image format. For example, low levels of infrared energy, which may relate to colder temperatures in the imaged regions, may be assigned blue color values, and high levels of infrared energy, which may relate to warmer temperatures, may be assigned red color values. Other color assignments to data values may be used. A legend for the conversion of the color values to the data values may be provided.

In some examples, the data descriptive of spatially descriptive energy levels quantified by an energy-receiving Sensor data may be portrayed in a user interface. In some user interfaces, representations based upon spatially representative energy levels of different wavelengths may be aggregated or otherwise combined in one or more related user interfaces. Such a combination may allow a user to understand the regional nature of various quantified energy.

In some examples, a user interface may allow for display of the positional location image points. In some examples, a location of a pixel element chosen by a user may be converted to a real-world location within the RTA which may be represented in Cartesian coordinates (X, Y, Z) or in other coordinate systems such as polar coordinate systems involving angles and distances as discussed previously. In some examples, topographic data obtained by scanning an area with an RTA may be used to quantify topography within the RTA. A user interface based upon such quantified energy levels may include virtual presentations of the quantified energy levels from different perspectives and may allow for coordinate grids (Cartesian or other) to coordinate placement of facets of a user interface based upon combinations of energy level data, Tag locations and perspective relevance.

In some examples, distinct structures within the RTA may be highlighted and assigned positional coordinates. In some examples, this may occur by image processing directly, in other examples a user interface may allow for a user to pick items/regions of interest in an RTA presentation.

In other examples, real and virtual Tags may exist within the RTA. A physical Tag may include a position Node, another Smart Device, or any device with communication capability that can communicate with either a position Node or with the Smart Device of the user directly. Such physical Tags may be located in numerous manners. In some examples, the physical Tag may have a direct determination of its location either because it is stationary and has been programmed with its location or because it has the capability of determining its own position with the various methods as have been described herein. In other examples, a physical Tag may be able to communicate with Nodes such as Reference Point Transceivers and a location may be determined based upon an exchange of data, such as timing values, in the wireless communications. A Node may also be functional to determine, store and communicate a location of other Tags. The Smart Device of the user may gain access to the locations of Tags, either because they are publicly available or because the user has established rights digitally to obtain the information from some or all of these physical Tags.

There may also be virtual Tags that are associated with positional coordinates. The distinction of these Tags over physical Tags is that there may be no physical presence to the virtual Tag. It may be a digital or virtual-world entity that has an association with a real-world positional coordinate. Except for this distinction, a virtual Tag and a real-world Tag may behave similarly with respect to their association with a physical coordinate.

In these examples, an interactive user interface based upon energy levels and Tags located with an RTA may have icons associated with the placement of Tags. The user interface may include an icon positional designation and a graphic to indicate the presence of a Tag. It may be apparent that, in some cases, multiple Tags may lay along a single direction from a given Smart Device location and RTA, and thus multiple icons may be included within a user interface in close proximity. The user interface may indicate multiple Tag icons by color changes, blinking or other indicators. As an RTA is changed, Tags along a same perspective may resolve into different directions for Tags with different positional coordinates.

The Tag icon may indicate to the user a digital functionality associated with a real-world or virtual Tag. For example, the icon may allow a user to choose the functionality of the icon by moving a cursor over the icon and making a keystroke or mouse click or for touch screens by pressing the display location of the Tag icon. The choosing of the Tag icon may activate user interface dialogs to allow the user to control subsequent functionality. In cases of superimposed Tag icons on a same pixel location in a user display, a first functionality may allow the user to choose one of the multiple Tag icons to interact with. In some examples, a Tag icon may be displayed with an associated ID/name and a user may select the icon with voice commands rather than physically selecting the icon as described previously. Displays of these Tags may follow similar protocols as have been discussed in reference to FIGS. 9A-9C.

Referring now to FIG. 10A, a method for generating an augmented-reality Radio Target Area for a Smart Device is shown. At step 1001, wireless energy of a first wavelength is received into a wireless receiver. In exemplary embodiments, this step may include receiving image data based on visible light into a sensor of the Smart Device. The wireless energy may be dispersed over a one-, two-, or three-dimensional space in a defined physical area, and may be received into a one-, two-, or three-dimensional array in the receiver. The wireless energy may take the form of electromagnetic radiation, such as light in the human-visible light spectrum (generally having a wavelength between 380 nm-740 nm), ultraviolet light (generally having a wavelength between 10.0 nm-400 nm), or infrared light (generally having a wavelength between 740 nm-2.00 mm) as examples. The set of wireless energy available to the wireless receiver is the Smart Device's Radio Target Area.

The wireless receiver may be a Smart Device sensor, including a CMOS active pixel sensor, a CMOS back illuminated sensors, CCD, or a LIDAR apparatus, including a solid-state/MEMS-based LIDAR. The wireless receiver may comprise an array or other plurality of other wireless receivers. The wireless receiver may be operative to receive the wireless energy into an array of an appropriate dimension for subsequent display (possibly after processing) on the Smart Device. For example, where the wireless receiver is a Sensor, the Sensor may be operative to translate the wireless energy into a two-dimensional array.

At step 1002, a pattern of digital values is generated based upon receipt of wireless energy into the wireless receiver. This pattern of digital values may be based on one or more qualities of the received wireless energy, including its intensity, spatial dispersion, wavelength, or angle of arrival. The pattern may be placed into an appropriate array. For example, if the display of the Smart Device is a two-dimensional display, then the pattern of digital values may comprise a two-dimensional representation of the image data received. In some embodiments, the pattern of digital values may be based on an aggregated set of values from an array of receivers. For example, if the basis of the digital values is the intensity of the wireless energy received into the receiver, then the digital value assigned to a given entry in the array may be based on a weighted average of intensity of wireless energy received at a plurality of the receivers in the array. Optionally, at step 1003, the wireless receiver may receive the wireless energy as an analog signal (for example, if the wireless receiver is a black-and-white sensor or an unfiltered CCD), and convert the analog signal to digital values through filtration or other analog-to-digital conversion. The set of digital values within the Radio Target Area is the Digital Radio Target Area.

With the Smart Device wireless receiver's Radio Target Area determined, the Smart Device's position should be determined as well, along with the positions of any items of interest in a given space. Collectively, the Smart Device and the item of interest may comprise wireless Nodes. Accordingly, at step 1004, coordinates representative of a wireless Node may be determined relative to a base Node. These coordinates may be determined in any appropriate coordinate system (such as Cartesian, polar, spherical polar, or cylindrical polar) and may be determined via RTLS or the orienteering-triangulation methods with various wavelengths or modalities, such as ultra-wideband, Bluetooth, etc. Additionally, the coordinates may be determined using an angle of arrival or angle of departure of a signal to or from the base Node, along with the distance from the base Node. By way of non-limiting example, this could produce a dataset that correlates the coordinates of three elements with the identities of those elements: {(0,0,0), BaseNode; (1,1,1), Smart Device; (2,2,2), ItemOfInterest}. While this example may be used throughout the following discussion, it is understood to be non-limiting, as a given space may include a plurality of items of interest. Note that, in some embodiments, the Smart Device itself may become a dynamic database entry with a continuously (or periodically) updating set of coordinates. This may be useful in allowing a plurality of Smart Devices engaged with the system at the same time to interact with one another.

At step 1005, the position of the Base Node is determined relative to the defined physical area. In exemplary embodiments, this may include establishing the Base Node as an origin in the coordinate system and determining vectors from the Base Node to boundaries and items of interest (i.e., the distance from the Base Node and the direction from the Base Node to the boundaries and items of interest). In some examples, the Base Node may have an established reference relative to a global coordinate system established.

At step 1006, a Target Area is generated within a controller of the Smart Device. The Target Area may be the set of coordinates (relative to the Base Node) within the Radio Target Area of the wireless receiver. The Target Area may be limited by the physical boundaries of the given space, such as walls, floors, ceilings, occlusions, etc. The Target Area may also be limited by distances that various types of signals may travel. For example, a sensor of audio signals may not be able to practically pickup signals over a background noise level that originate more than 1000 feet from a user position, purely as an example. In such a case, the Target Area for such signal types may be limited to that dimension.

At step 1007, respective positions of one or more wireless Nodes within the Target Area are determined. These positions may be determined relative to the physical Target Area or the Radio Target Area. The determination may be made with reference to the dataset discussed at step 1005, or it may be made dynamically based upon one or more Base Nodes and/or the Radio Target Area. Moreover, the determination may additionally be based on receipt of a wireless signal into the Smart Device from the wireless Node. This signal may indicate a position using the orienteering methods described herein.

At step 1008, a user interface may be generated on the Smart Device based upon the pattern of digital values generated at step 1002. The user interface may comprise a plurality of pixels, wherein each pixel comprises a visible color based upon the pattern of digital values generated at step 1002. For example, if the digital values were based upon receipt of visible light into the wireless receiver (e.g., a sensor), then the display may reflect a reasonably accurate color photograph of the Radio Target Area of the wireless receiver. If the digital values were based upon an intensity of received light from, for example, LIDAR, then the display may reflect a scan of the Radio Target Area. In some embodiments, the pixel may include an intensity of energy received into the receiver. In this way, aspects of the Radio Target Area characterized by an intensity of energy may be emphasized. For example, this may produce a LIDAR relief of an area or a heatmap of an area.

At step 1009, an icon may be generated in the user interface. Preferably the icon will be placed at a position relative to data quantifying received energy levels. In some embodiments, the icon location in a user interface will be indicative of a position of a Tag (Virtual or Physical) and/or zone information. This position may be quantified via positional coordinates, such as Cartesian Coordinates, Polar Coordinates, Spherical Coordinates, direction, and distance from a known point 1401 and the like. The icon may be based upon an input from a user, stored data, quantified environmental conditions or other criteria related to an aspect of the Radio Target Area.

For example, an icon may indicate information about an item of interest located at a given set of coordinates within the Radio Target Area or Digital Radio Target Area. In another embodiment, the user may indicate on the display a position in which the user wishes to place an icon and add information about an item of interest (thus creating a new entry in the database, which may be populated with the coordinates of the indicated position). Moreover, the icon may change colors based upon the pattern of digital values. The icon may be overlaid on top of the display. The icon may resemble the letter "i", a question mark, a thumbnail, or any other suitable image from a library. In some embodiments, the icon may change depending on one or more attributes of its corresponding database entry. For example, if the icon located at (4,4,4) relates to a restaurant menu, then the icon may resemble the letter "i" or a thumbnail of a menu. On the other hand, if this database entry is modified so that the corresponding database entry is a message, then the icon may update to a picture of an envelope.

In some embodiments, the icon-generation step may be based upon an inquiry to a database that uses the Digital Radio Target Area as an input. For example, upon generation of the Digital Radio Target Area, an associated set of coordinates in one or more dimensions may be generated. This may then be submitted to a database. An associated display may be as illustrated in FIG. 9A. In some embodiments, the icon-generation step may be based upon an inquiry to a database that uses the user's position coordinates as an input. In these embodiments, both the Digital Radio Target Area based on an RTA as well as the universal Radio Target Area may be included in an inquiry submitted to the database. An associated display may be as illustrated in FIG. 9C. In some examples, the user may have an option to limit or filter the types of database entries that may be queried for, such as in a non-limiting sense, the existence of real-world Tags, virtual Tags, sensor data values and streams from a particular class of sensors and the like.

Continuing with the example from step 1004, the Digital Radio Target Area may comprise the set of coordinates, ([1.5,10], [1.5,10], [1.5,10]). In this example, the database may return information about the Item Of Interest, but not about the Base Node. The Digital Radio Target Area may update when the Smart Device position changes, or by user input, the Digital Radio Target Area may remain static after a certain instance in time.

Figure 10B:
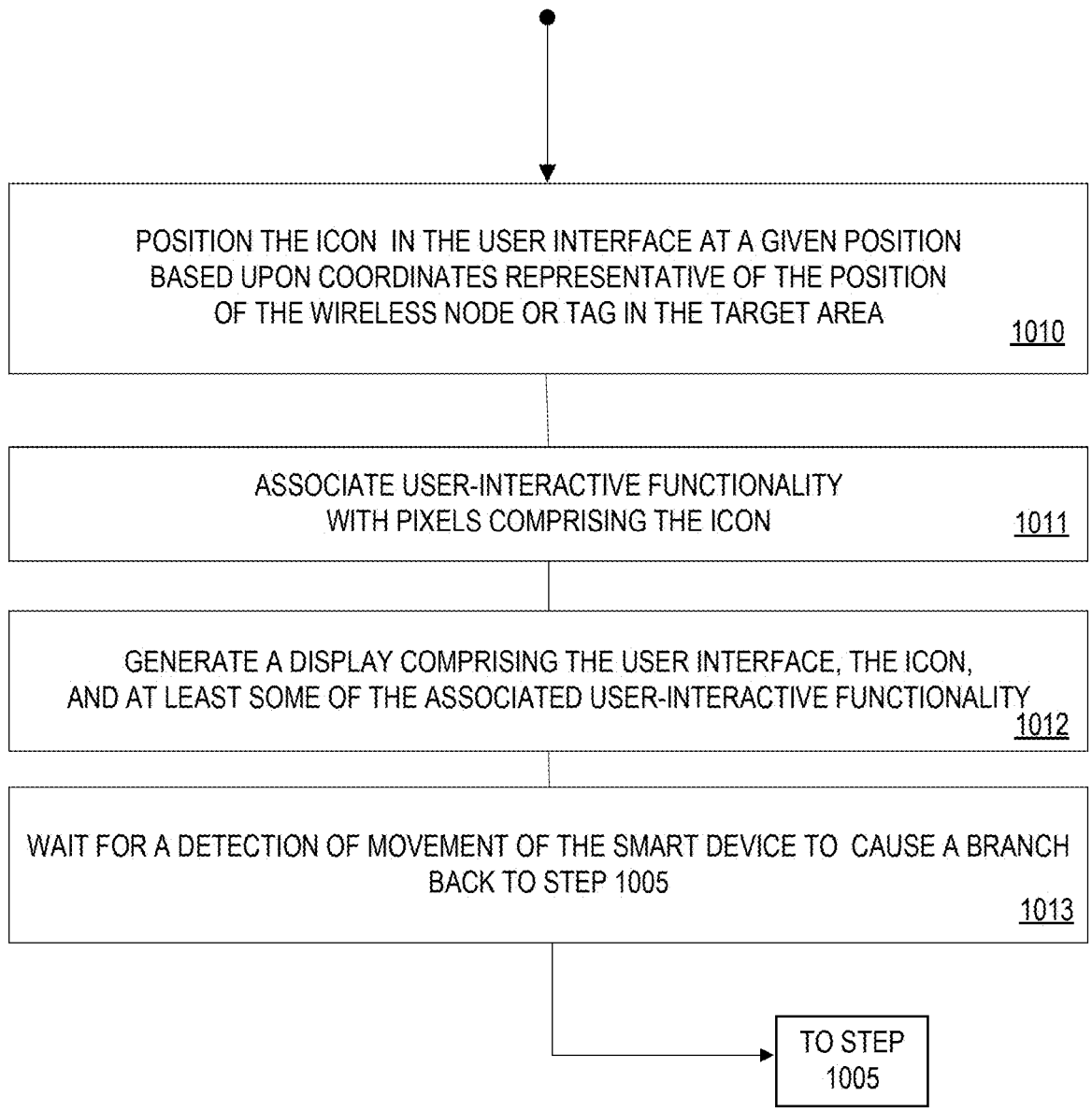

Continuing with FIG. 10B, at step 1010, the icon may be positioned in the user interface at a given position based upon coordinates representative of the position of the wireless Node or Tag in the Target Area. This may comprise a selection of a multitude of pixels related to the position of the wireless Node or Tag and changing those pixels from the digital values determined at step 1002 (check ref #) to a second set of pixels to indicate the presence of an icon. In some embodiments, the icon may be dynamically updated based upon movement of the Smart Device (and, accordingly, the wireless receiver). In some embodiments, the icon may be permanently associated with a set of coordinates. In such embodiments, the icon may be generated whenever a Smart Device with appropriate permissions includes in its Radio Target Area the set of coordinates of Nodes or Tags associated with the icon.

At step 1011, user-interactive functionality may be associated with the pixels comprising the icon. This may allow the user to "select" the icon by means of an input device (e.g., mouse, touchpad, keyboard), touchscreen, digital input, etc. Upon selection, the icon may be operative to interact with the user in one or more ways, including: displaying a message intended for the user (by text, audio, video, hologram, etc.); requesting credentials from the user to verify permissions (e.g., a password), displaying information about an item associated with the icon, prompting the user to update information about an item associated with the icon, etc. The user-interactive functionality may display static information (e.g., dimensions of the item), display dynamic information (e.g., an alarm state or sensor information relating to the item; for example, if the item is a refrigerator, internal temperature may be displayed), or produce a control panel that allows the user to issue control commands (e.g., remotely operating an automated apparatus by resetting an alarm state, taking remedial action based upon a sensor state as described herein, etc.) or to issue menu control commands such as to invoke a different user interface or screen of a user interface.

This may be useful in geospatial applications, or in procedurally generated activities. For example, a first user may generate a positional designation on a user interactive device, such as, for example, an augmented-reality display to leave a narrative, icon or other input associated with the first use. Additionally, the same or another user may log positional coordinates and upload an image that could be displayed submitting a database query including those coordinates. Entry of the coordinates and essential credentials may provide access to the content associated with the positional coordinates.

At step 1012, the preceding steps may be integrated by generating a display comprising the user interface, the icon, and at least some of the associated user-interactive functionality. In embodiments, in which a plurality of Smart Devices are themselves part of the database, this may allow various users to send messages, images, etc. to each other.

At step 1013, detection of movement of the Smart device may cause a branch back to step 1005. Based upon that movement of the Smart Device, a defined physical area from which wireless energy is received (i.e., the Radio Target Area based upon the Target Area) may be changed. The movement may be detected using input from wireless communications, magnetic field sensors, an accelerometer, feature-recognition software, or other similar apparatus and algorithms. In other examples, the position of the Smart Device may be dynamically obtained using any of the techniques of position determination, such as triangulation with reference nodes. Here, too, a change of position detected in this manner may cause a branch back to step 1005. The Target Area may be based upon the position of the Base Node, the relative positions of the wireless Nodes, and the Smart Device.

Referring now to FIG. 11, an exemplary database structure usable in conjunction with the present disclosure is shown. In this non-limiting example, the database has five sets of information: coordinates 1101 associated with an action, permissions 1102 associated with the action, the action type 1103, attributes 1104 for the action, and notes 1105. The example shown in FIG. 11 may suppose the following: the augmented-reality system is deployed in an enclosed space, definable by a coordinate system set relative to a Base Node having an origin point (0,0,0); the enclosed space spans, in that coordinate system, ([0, 10], [0, 10], [0, 10]) (using traditional set notation; in other words, each coordinate can take on any number between 0 and 10, inclusive); and the Radio Target Area ([1, 10], [1, 10], [1, 10]).

The bolded entries in the database shown in FIG. 11 represent the database responses to the query given by the Radio Target Area of the Smart Device, i.e., all entries having a Coordinate value within the Radio Target Area. In some embodiments, the database may sort through all coordinates within the Radio Target Area and then return any entries for which the Smart Device has appropriate permissions. In other embodiments, the database may sort through all entries for which the Smart Device has appropriate permissions and then return any entries with coordinates within the Radio Target Area. The latter approach may be beneficial in circumstances in which there are numerous database entries with varying permissions; for example, if a database has 10,000,000 entries, but a given user might only have access to five of those entries, sorting by permissions first may be more beneficial.

The ActionType variable may include any action for which interactivity with an icon may be desirable. In FIG. 11, the ActionType variables shown are Information, Message, Action, and Directions. Each of these represents functionalities within the scope of this disclosure. For example, Information may relate to information that the Smart Device user may find helpful. Continuing with the shop example from FIG. 9A (check Fig Ref #), Information may include store hours, discounts, reviews, etc. Similarly, Message may be a message to the general public (e.g., an announcement), or a message tailored to a specific user. In the latter case, permissions may operate to ensure that only the specific user (or set of users) may access the Message.

Action may relate to any action that a sensor, electronic device, or other apparatus connected to the database may take. For example, Action may include changing a temperature, measuring a temperature, turning off lights, activating an emergency sprinkler system, opening a door, etc. In some embodiments, prior to taking the Action, a password may be requested as part of the permission check.

Directions may show a user how to navigate (using, in exemplary embodiments, orienteering methods) from the current position to a desired position. For example, upon scanning an entry on a map, virtual arrows may be generated to guide the user to a chosen store.

The ActionAttributes may have attributes based on the ActionType. For example, if the ActionType is Information or Message, then the ActionAttributes may be a text string or a stored audiovisual file containing the message. Similarly, if the ActionType requires a sensor or other electronic device to take an Action, then the ActionAttributes may include a command or subroutine to a fleet such an Action. In the example shown here, the ActionType Directions comprises an ActionAttribute that includes a command to the Smart Device (i.e., show directions in the form of green arrows).

Figure 12:
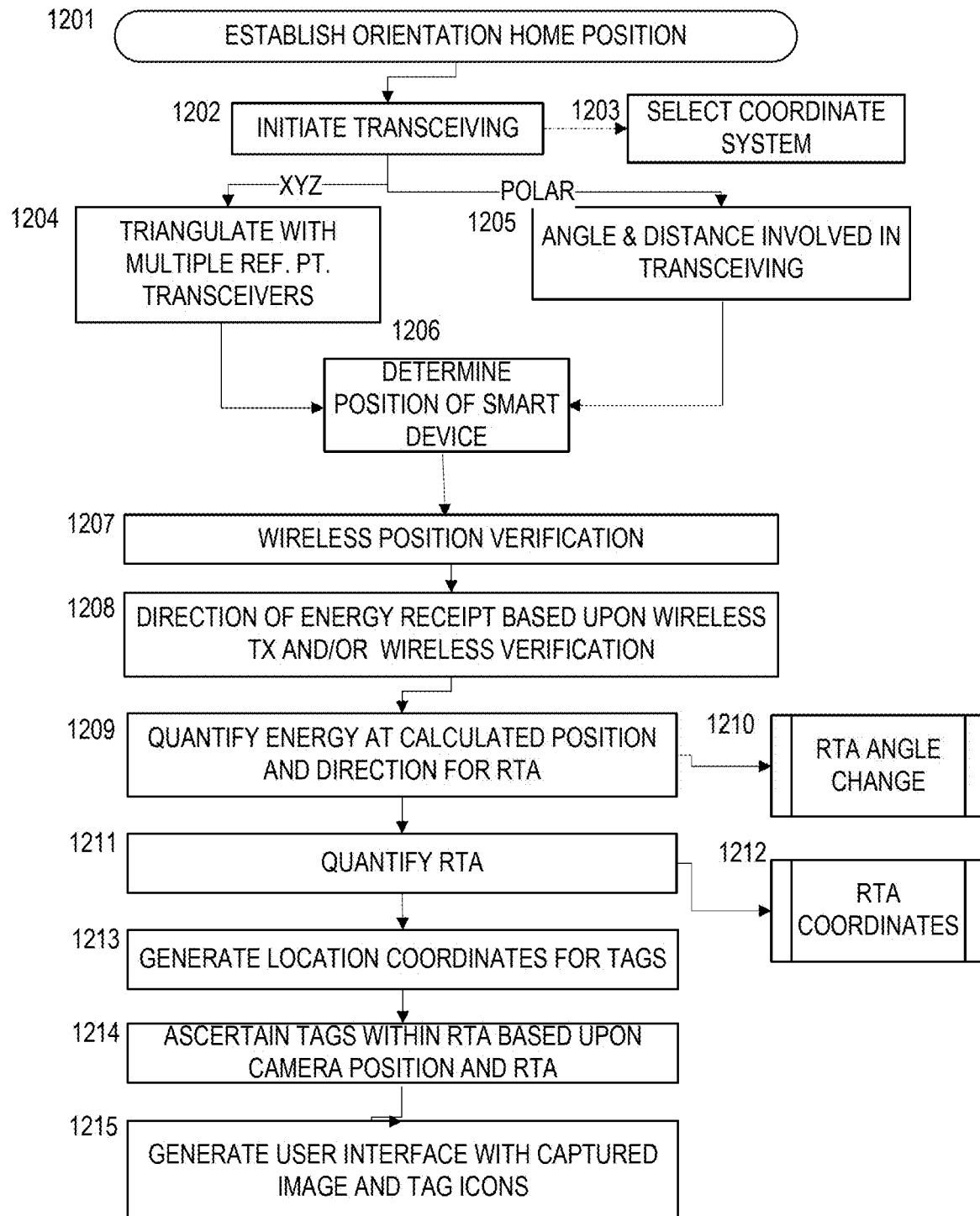
FIG. 12 illustrates an additional exemplary method for displaying Radio Target Areas with Smart Devices.

Referring to FIG. 12, an illustration of alternative methods for display of information relating to RTA is provided. At the beginning of the process, a system of components which may include a smart device with a user of the smart device may be established. Amongst the various components a Home Position may be established for all the components at step 1201. The system may proceed by establishing and initiating transceiving of data and information at step 1202.

In some examples, the user may be prompted to choose a desired coordinate system for the display at step 1203. In other examples, a user interface of the system may have a setpoint function which the user may invoke to gain access to user settable parameters which way include they type of coordinate system to use, such as for example Cartesian or spherical coordinates.

In still further examples, the system may decide to default to a particular coordinate system depending on the nature of the type of data its positional reference devices may be obtaining or providing.

At step 1204, if the coordinate system was chosen as Cartesian coordinates, the system may utilize triangulation amongst multiple reference point transceivers. Alternatively, at step 1205 if the coordinate system was chosen as polar coordinates, the system may utilize positioning systems that utilize angles and distances involved in transceiving and location. In either event, at step 1206, the position of a Sensor attached to the smart device of the user may be determined. In some examples, the system may have multiple and redundant location systems. A combination of such position determinations may result in superior accuracy of an aggregated position result. Accordingly, at optional step 1207, a wireless position determination may be performed with the smart device to establish a verification of the position of the Smart Device and the Sensor attached. Referring now to step 1208, a direction that the sensor is facing may be determined. Although there may be a number of different manners of determining orientation as have been described herein, in an example, the orientation may be determined based upon wireless transmission and/or wireless verification.

Referring now to step 1209, an energy-receiving Sensor included in the Smart Device or in logical communication with the Smart Device may be used to quantify energy levels perceivable at the position and in the direction of the Smart Device. The resulting quantification may depend on aspects of the Sensor device, but the resulting data will quantify a characteristic for the RTA.

In some embodiments, an optional step 1210 may be performed by an element of the system such as the smart device or a server in communication with the Smart Device. The element of the system may compare one or more of position information, orientation information and the image data itself to calculate an estimate of whether the RTA angle has changed for the sensing element.

In general, at step 1211, the RTA of the Sensor device used to capture the image in step 1209 may be quantified. In an optional step 1212, coordinates relating to the instant RTA of the image may be established. In some examples, this may relate to a range of three-dimensional coordinates that are addressed by the RTA of the Sensor element. In general, at step 1213, the system may look up, or in some cases generate, location coordinates for Tags that are determined to be within the quantified RTA. In some database systems that the system may have access to, real-world or virtual-world tags may be tracked in a coordinate system with a certain origin.

If the current origin established at step 1201 is offset from a particular database related origin, then one or both the coordinate system values may be converted to each other to align their respective origins. At step 1214, the Tags in an aligned coordinate system may have their positions compared to the current RTA and a selection for the set of Tags that are within the RTA may be made.

In some alternative examples, a display of all Tags that are authorized for access to the user regardless of whether they are in the RTA may be made using associated aligned coordinates as discussed in reference to step 1213.

Referring now to step 1215, for example, the Smart Device of the user may be used to generate and display a user interface to the user based upon the captured image and the associated tag icons within the RTA. These associated Tag icons may have at least the functionality as has been discussed in reference to FIGS. 10A and 10B.

Figure 13:
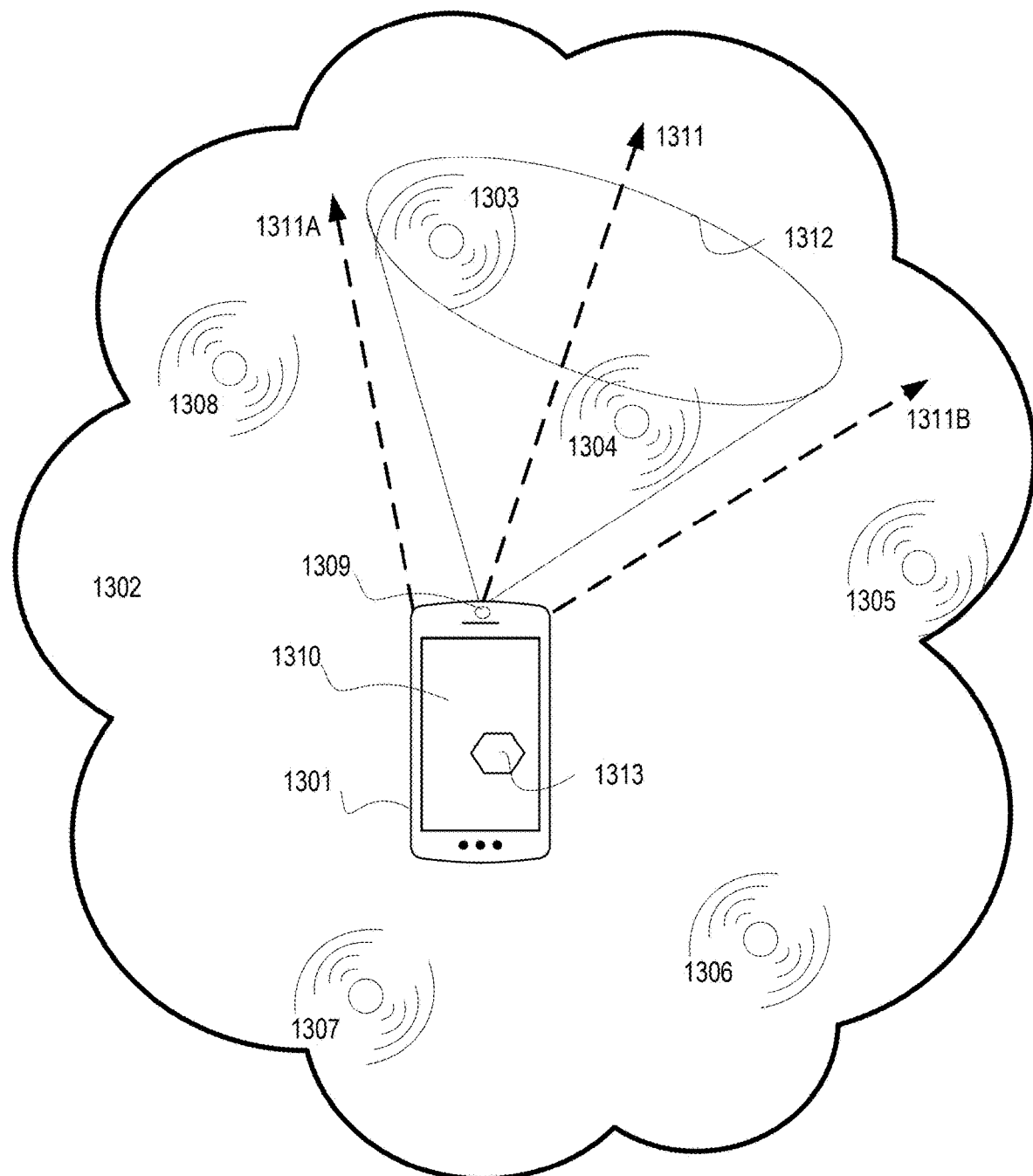
FIG. 13 illustrates exemplary aspects of Wireless Communication Areas in Radio Target Area display.

Referring now to FIG. 13, a Smart Device 1301 is illustrated within a wireless communication area (WCA) 1302. The extent of the particular WCA 1302 may be defined according to a select bandwidth and/or a particular modality of the wireless communication the Smart Device 1301 uses to transmit and receive information.

For example, bandwidths may include those associated wish UWB, Wi-Fi, Bluetooth, ANT, ultrasonic, infrared, and cellular modalities of communication. In general, unless otherwise constrained by physical modification such as the use of a directional antenna, or the presence of radio frequency interference from a physical object (such as objects with significant metallic content; objects with high water content; electrical fields; etc.), a WCA 1302 may include spherical area(s) emanating from one or more transceivers and/or transceiver antennas operated by the Smart Device 1301.

As discussed extensively herein, and in patent applications referenced by this application, the location of the Smart Device 1301 may be determined based upon wireless communication to and/or from the Smart Device 1301; and described via a coordinate system, such as via generation of Cartesian coordinates, or other coordinates such as: polar coordinates, spherical coordinates, and cylindrical coordinates. Modalities of wireless communications that may be referenced to generate location coordinates may include one or more of RTT (round trip time), time of flight, RSSI (received signal strength indicator), angle of arrival, angle of departure, and other methods, equipment and modalities as have been described herein.

With the location of the Smart Device 1301 determined, a location of the WCA 1302 may be extrapolated based upon the location of the Smart Device and a range or transceiving distance the Smart Device may be capable of.

According to the present invention, a portion of the WCA 1302 may be selected as a radio target area (RTA) 1312 from which the Smart Device 1301 may receive specific bandwidths of electromagnetic radiation. In preferred embodiments, the RTA 1312 may include a frustum expanding outward in a conical shape from one or more energy-receiving Sensors 1309 included in the Smart Device 1301. The frustum shaped RTA 1332 may overlap with a portion of the generally spherically shaped WCA 1302. Other shapes for an RTA 1312 are also within the scope of this specification.

In some embodiments, a shape of the RTA 1312 may be based upon receiving capabilities of the one or more energy-receiving Sensors 1309 incorporated into or in logical communication with the Smart Device 1301. For example, an energy-receiving Sensors 1309 with a charge coupled device (CCD) or complementary metal oxide semiconductor (CMOS) receiver may have a single plane receiving surface and be best matched with a frustum of a generally pyramidal or conical shape. Whereas an energy-receiving Sensors 1309 with multiple receiving surfaces (e.g., with multiple CCD and/or CMOS devices) may be arranged to enable a more complex shaped RTA 1312.

In some preferred embodiments, a direction of interest 1311 may intersect the RTA 1312. As discussed herein, the direction of interest 1311 may be represented by a ray or vector 1311A and 1311B. In addition, the direction of interest 1311 may be represented as a direction of interest area, such as a frustum defined by multiple rays or vectors, 1311A and 1311B. In various embodiments, the direction of interest 1311 area may encompass the RTA 1312 or be a subset of the RTA 1312.

A direction of interest 1311 may be determined for example via the methods and devices described herein and in referenced patent applications and may be associated with a direction based upon a ray or vector indicative of a direction of interest 1311, a direction based upon a magnetic field sensor, an accelerometer, a light beam, correlation between two Tags or Nodes, Agent gestures, or other Smart Device recognized apparatus and/or method.

One or more transceivers 1303-1305 (typically included within a Smart Device, Tag, or Node) may be located within an area defined by the RTA 1312. According to the present disclosure, a position of the transceiver 1303-1305 may be determined and a user interactive mechanism may be generated at a position of the transceiver 1303-1305 within a graphical user interface emulating aspects of the RTA 1312 on the Smart Device 1301 or another user interactive interface screen (not shown, and perhaps at a site remote to the RTA 1312).

According to the present disclosure, some portions of the RTA 1312 (which may include the entirety of the RTA 1312) may be portrayed on an Agent interface 1310, including, in some embodiments, a human-readable graphical user interface (GUI). The interface 1310 may include a representation 1313 of a particular level of electromagnetic energy received via the energy-receiving Sensors 1300 and associated with a particular area of the RTA 1312. For example, energy levels of an infrared wavelength that has emanated from or reflected off of an item in the RTA 1312 and received via an infrared receiver in the Smart Device 1301 may be used to generate a heat map type interface display. Similarly, energy that has emanated from or reflected off of an item in the RTA 1312 in the 400 nm to 700 nm range and been received via a charge-coupled/or CMOS image sensing device in the Smart Device 1301 may be portrayed as a human visible image of items in the area included in the RTA 1312.

Other embodiments may include a point cloud derived from electromagnetic energy bouncing off of or emanating from items included in the RTA 1312 or a series of polygons generated based upon a LIDAR receiver in the Smart Device 1301. An Agent interface 1310 may be presented in a modality understandable to an Agent type. For example, an interface presented to a UAV or UGV may include a digital pattern and an interface presented to a human Agent may include multiple pixels or voxels generating a pattern visible to a human being.

The wireless location methods and apparatus described herein may be deployed in conjunction with one or more Transceivers 1303-1305 or Tags and/or Nodes 1306-1308 located with the WCA 1302 to generate location coordinates for the one or more Transceivers 1303-1305 or Tags and/or Nodes 1306-1308. A controller or other device operating a processor may determine which one or more Transceivers 1303-1305 or Tags and/or Nodes 1306-1308 located within the three-dimensional space included in the RTA 1312 based upon a) the location of the one or more Transceivers 1303-1305 or Tags and/or Nodes 1306-1308; and b) the location of area included in the RTA 1312.

In another aspect of the present disclosure, in some embodiments, some energy levels may not be represented in the Agent interface 1310. For example, in some embodiments, energy levels reflected off of a particular item may not be included in the Agent interface 1310. Other embodiments may only represent energy levels that have reflected off of selected items within the RTA 1312 thereby emphasizing the presence of the selected items and ignoring the presence of other items within the RTA 1312.

As described above, some portion of the RTA 1312 may be portrayed on an Agent interface 1310, including, in some embodiments, a human readable graphical user interface (GUI), as a point cloud derived from electromagnetic energy bouncing off of or emanating from items included in the RTA 1312 or a series of polygons generated based upon a LIDAR receiver in the Smart Device 1301. An example of such a representation is shown in FIG. 14.

Figure 14:
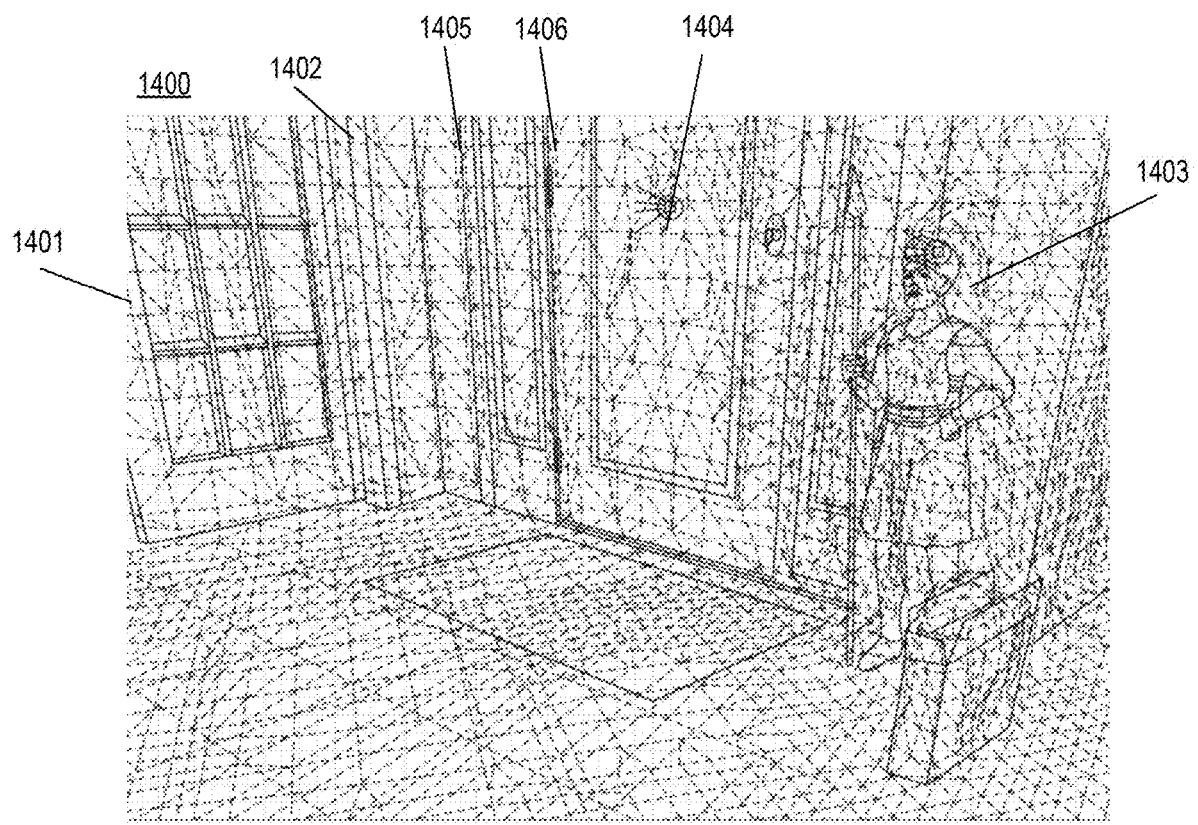
FIG. 14 illustrates a set of polygons generated via LIDAR that may be used for geospatial recognition.

Referring now to FIG. 14, an exemplary GUI includes a human visual image 1401 of an RTA 1400 overlaid with a series of polygons 1402 generated based upon a LIDAR receiver in the Smart Device. The LIDAR sensor illuminates the RTA 1400 with laser light and then measures the reflection with a sensor. The resulting polygons 1402 represent differences in laser return times, which provides a topographical representation of objects in the RTA 1400.

In this example, Virtual Tags 1403 and 1404 are creased by the Smart Device by methods described herein and icons may be present on the GUI to identify the position of the Virtual Tags 1403 and 1404. The Virtual Tags 1403 and 1404 may, for example, represent various locations of interest in the RTA 1400, such as an object of interest or an exit or entrance. The icons associated with the Virtual Tags 1403 and 1404 may be engaged or "clicked" or otherwise activated to be made operational; for the Smart Device to receive (e.g., retrieved from a database) additional information associated with the object or location of interest.

For example, if the object of interest is a statue, clicking on the icon associated with the Virtual Tag 1403 associated therewith may provide information regarding the statue, such as the history, origin, and the like. If, for example, the Virtual Tag 1404 is associated with an exit of the room, clicking the Virtual Tag may provide information on what is present in the adjacent room, or where the Smart Device is in relation to exiting the building, or any other desired information.

In some embodiments, mathematical data associated with a LIDAR rendering, such as parameters of triangles formed by various LIDAR points 1405-1406 within an associated RTA may be stored and a relative position of a smart device with the RTA 1400 may be determined based upon the recognition of similarities of the LIDAR point 1405-1406 patterns. A resolution of laser scanning involved in generation of data based upon LIDAR techniques may influence a number of date points within a selected RTA, but in general, pattern recognition and determination of an orientation of a smart device based upon LIDAR data may be much more efficient, than, for example image data based pattern recognition. In addition, the LIDAR based patterns may be formed in a "fingerprint" of an RTA, wherein it would be very rare, if not impossible to replicate the LIDAR point patterns at two disparate locations. Therefore, recognition of a point pattern may be used to identity a location of a particular RTA.

Figure 15:
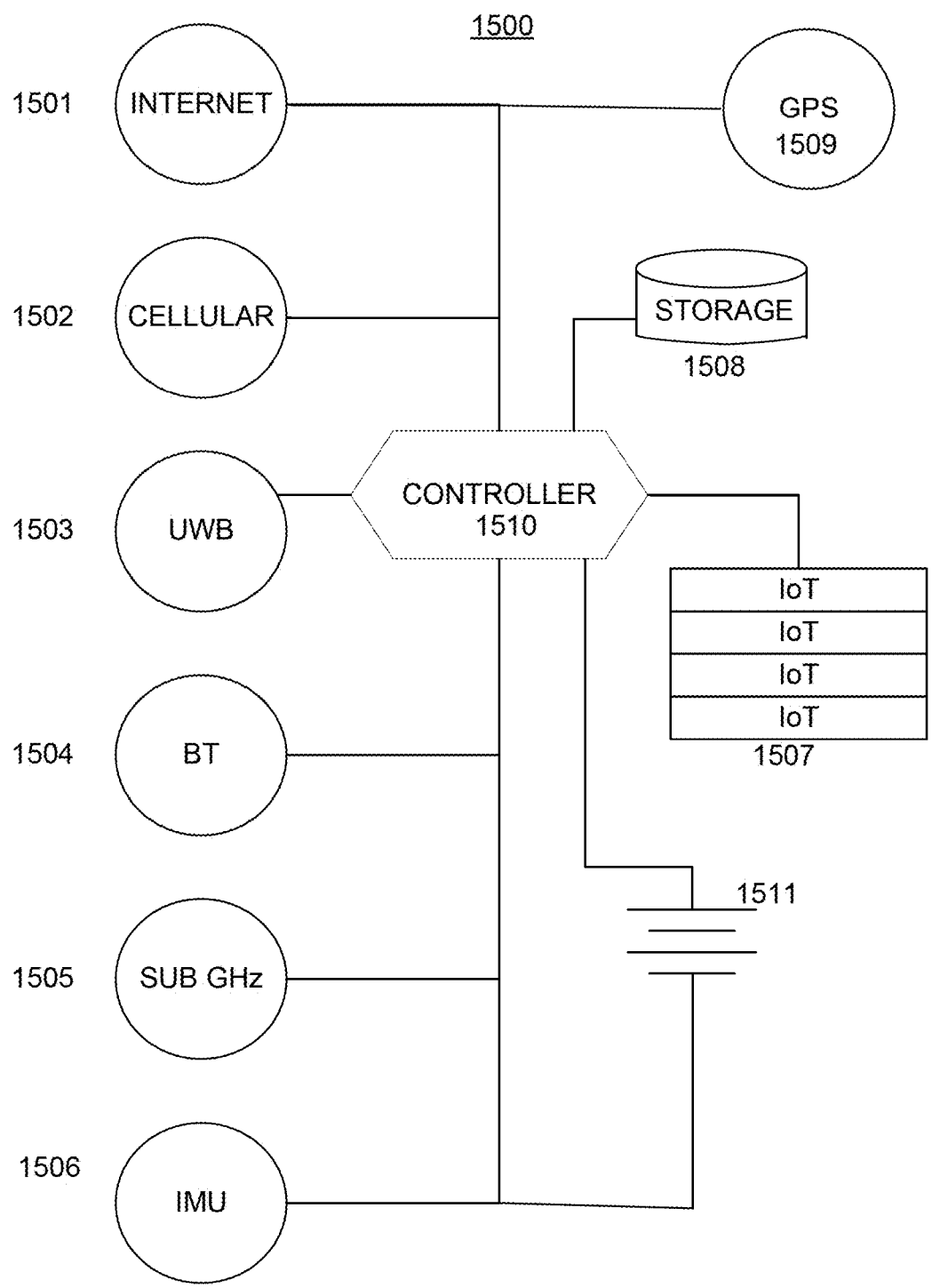
FIG. 15 illustrates a block diagram of a multi-modal tag according to some embodiments of the present invention.

Referring now to FIG. 15 components that may be included in some preferred embodiments of an integrated multi-mode tag (MMT) 1500 with multiple electronic sensors is illustrated. A MMT combines components for conducting wireless communication suitable for real time location service functionality such as transceivers 1501-1506, with components functional to quantify one or more environmental conditions as digital content (such as, for example, IoT sensors 1507), and with data aggregation functionality (such as, for example, onboard digital memory and/or cloud based data aggregation 1508), to enable improved levels of AI enhanced location based augmented reality.

The MMTS 1500 will include a processor, such as a processor in a controller 1510 that will in turn include storage for executable code and input/output communication means. The controller 1510 will have the ability for logical communication with multiple wireless communication transceivers 1501-1505, an inertial measurement unit 1506, and one or more electronic sensors 1507 (which may also be references and/or part of the IMU) and a storage device 1508 for storing digital data The controller 1510 may also manage power allocated to devices or components 1501-1509 included in the MMTS 1500. The power may be supplied via a power source 1511.

The controller may cause one or more transceivers 1501-1506 and/or a GPS receiver 1509 to be operational during a given time period. Operation of the one or more transceivers 1501-1506 and/or a GPS receiver 1500 may be based upon a function being undertaken, such as, for example a function being undertaken may include one or more of: communication to provide variables useful for real time location services or operation of a sensor to quantify a physical condition.

Figure 16:
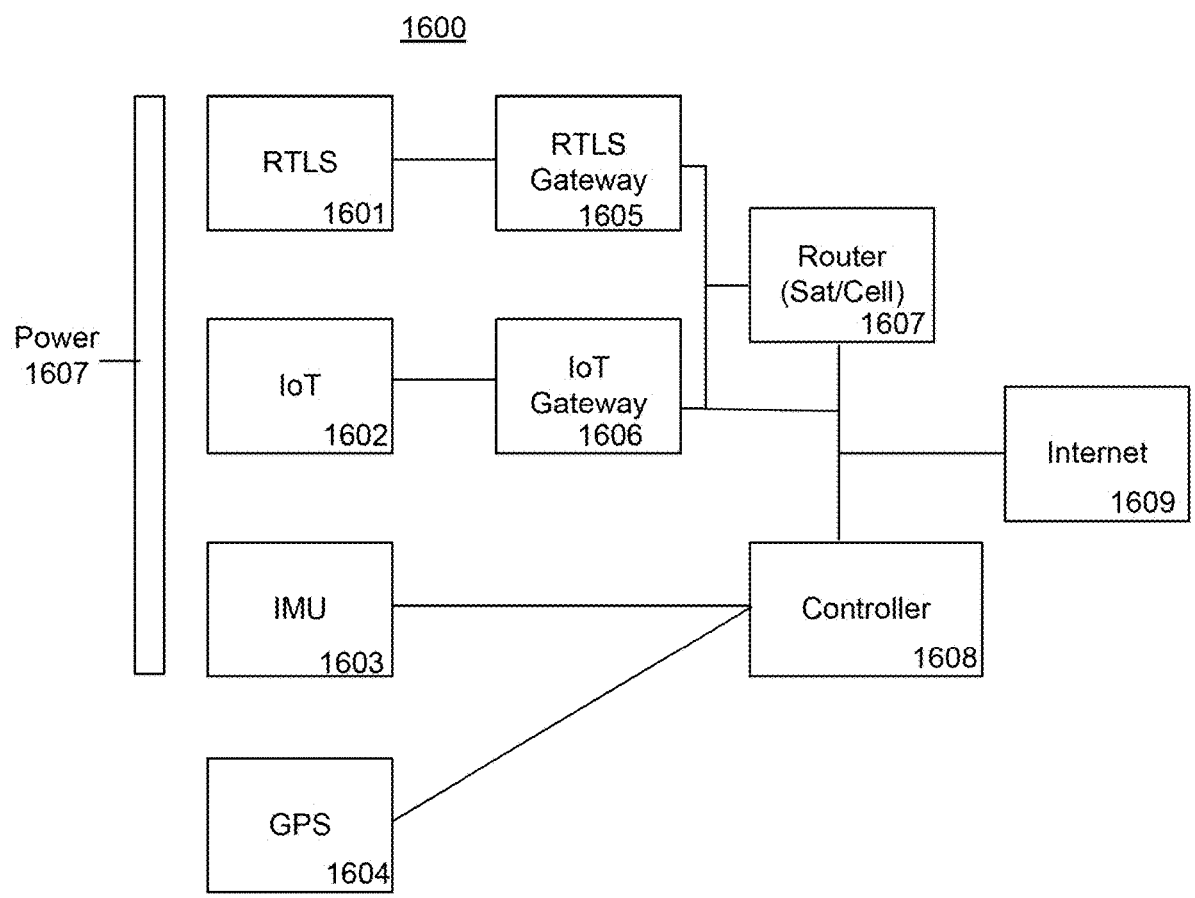
FIG. 16 illustrates RTLS components and IoT sensor components in various degrees of integration.

Referring now to FIG. 16, a block diagram illustrates components that may be included in some embodiments of a MMT 1600. The MMT 1600 may include real time location services (RTLS) capable electronic circuits 1601. The RTLS electronic circuit 1601 may enable wireless communications in one or more modalities, such as UWB, WiFi, Zigby, ANT, ultrasonic, Bluetooth, BLE and the like. The RTLS electronic circuits 1601 may communicate to the Internet 1609 via one or both of an RTLS gateway 1605 and a router 1607. The router 1607 may be hardwired or wireless and may include a satellite and/or cellular wireless router. An IoT sensor 1602 may communicate through an IoT Gateway 1606 to the Internet 1609 and may also optionally communicate via a router 1607. There may be a controller 1608.

IMU circuitry 1603 may be used to calculate movement magnitude and direction. Global positioning circuitry 1604 may be used to indicate outdoor position on a global scale. Power may be supplied to the various circuitry via a single or multiple disparate power sources 1607.

Figure 17A:
FIGS. 17A-17C illustrate flowchart of method steps that may be implemented in various embodiments of the present invention.
Figure 17B:
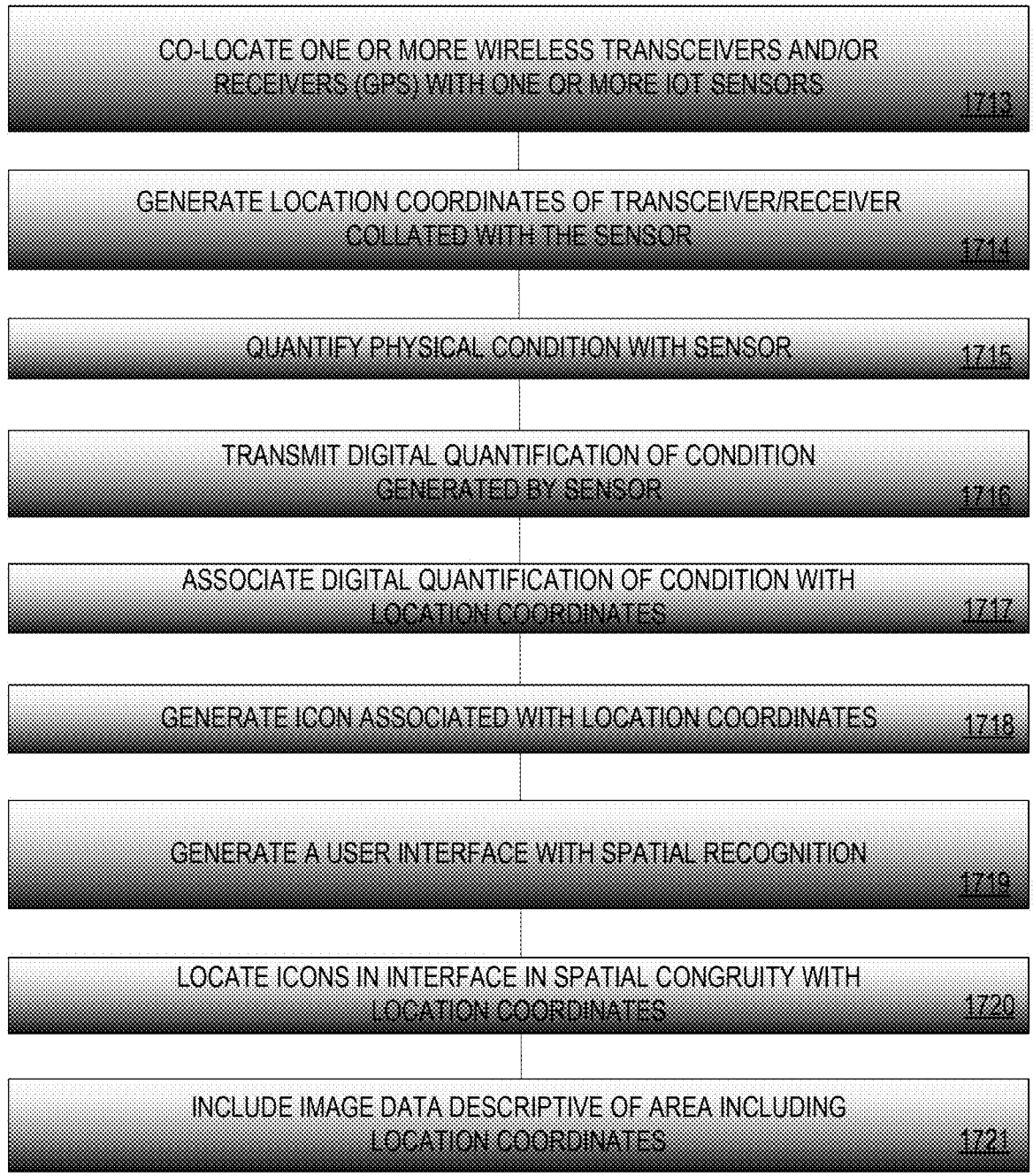
Figure 17C:
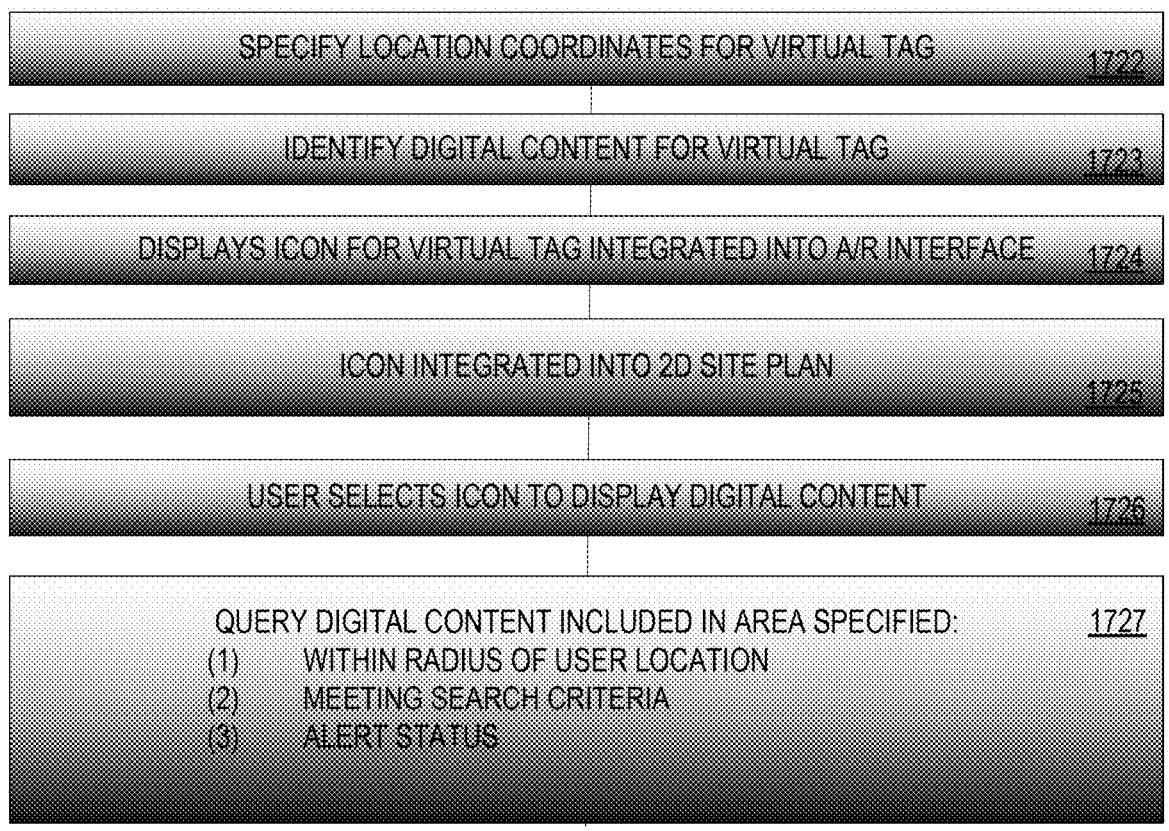

Referring now to FIGS. 17A-17C, method steps are illustrated that may be performed in some implementations of the present invention. During operation, executable software may be operative with the controller to cause the MMT to perform one or more of the following method steps, the order of the steps is not limited by the listing and may be performed in various sequences. In some or all of the steps may be performed and still be within the scope of the invention. By way of non-limiting example, an illustrative scenario of how an MMTS may be deployed includes:

1) An MMTS may be included with a shipment of items being assembled in a warehouse to be delivered to a work site. The MMTS power will be turned on. A power on mechanism may include a wireless communication, such as, via Bluetooth, Zigby, UWB, magnetic interaction, cellular or another wireless modality, or a mechanical and/or electronic switch.

2) A MMT may include a primary communication modality, such as a modality enabling relatively more accurate location services than a secondary modality. Examples of a primary modality may include: UWB, Bluetooth, Zigby, ANT, ultrasonic and other relatively shorter range bandwidth, and communication protocols. A secondary modality may include GPS, cell tower triangulation, subGHz and other relatively longer range bandwidths and communication protocols.

3) Power management for an MMT may follow a life cycle of an item being tracked. For example, an item of equipment to be included in a structure being constructed (or upgraded or maintained) at a worksite may have an onboard power supply, such as a battery that is powered on as the item is included in a bill of material (sometimes referred to as a "BOM"). The battery will power wireless communication receivers, transceivers, and transmitters prior to installation of the items at the worksite. In some embodiments, the battery may also provide power to sensors used to quantify conditions encountered by the item of equipment during shipment and storage before installation at the worksite. Upon installation of the item of equipment, the MMT may be connected to a more permanent power source, such as inhouse AC or DC power, power over ethernet, or other hardwired power connection.

4) The MMT may seek to communicate via a primary communication modality and for so long as the primary modality is operational and functioning, a secondary (or tertiary) form of wireless communication may remain powered off. This is in part based upon the secondary modality will be redundant and may not provide as accurate location determination.

5) As a primary communication modality fails, such as when an item is shipped out of a warehouse and beyond the range of a warehouse based UWB wireless communication, a secondary communication modality, such as GPS, may be engaged, including the provision of power. A GPS receiver may be provided with power to receive GPS signals from multiple satellites. So long as GPS communications are received, the GPS receiver may be provided with power on a constant or periodic basis. However, if an obstruction, such as an interior of a warehouse location blocks GPS reception, power to the GPS receiver may be discontinued until an "event" causes the power to be restored. An event may include, for example, one or more of an onboard accelerometer indicating movement of the MMTS; a cellular transceiver be involved in transceiving that indicated a change in position of the MMTS, such as a change in values for triangulation between cell towers and/or a transition of cell towers in communication, change in a time of travel from a cell tower or other change.

6) During storage, while en route, while located at a work site but not installed, and during an installed state, digital content may be associated with the MMTS and stored for tracking and historical purposes, as well as for AI analysis. In some embodiments, the digital content will additionally be associated with location coordinates of the MMTS at the time of association of the digital content or the generation of the digital content (such as, via a Virtual Tag and/or Hybrid Tag). In some embodiments, location coordinates and/or sensor data associated with other MMTSs within a specified distance of a primary MMTS (such as within wireless communication range, or within a distance indicative of an interior of a shipping box or other shipping container) may also be associated with the Primary MMTS and stored. In this manner, it may be determined whether a BOM is complete within a single shipping container or box or if other items are in additional boxes.

7) Upon occurrence of an event, such as arrival at a destination (e.g., within a geofence associated with a worksite) or a sensor reading that exceeds a threshold, a Virtual Tag and/or Hybrid Tag may be manually or automatically generated and associated with the MMTS thereby generating historical data of what an item associated with the MMTS has experienced. By way of non-limiting example, upon opening of a shipping box, a user may take a picture of the contents of the box and an environment in which the box was opened, and the pictures will become a part of a Virtual Tag that indicates that this box was opened at these RTLS coordinates, and this image captured the contents of the opened box. Sensor readings or other data, such as an audio message, a video or narrative may also be included in the Virtual Tag.

8) An icon may be generated for a Physical Tag, Virtual Tag and/or Hybrid Tag according to the teaching contained herein and related patent applications. In some embodiments, icons may indicate a communication modality referenced to determine the location coordinates associated with the icon. For example, an icon based upon coordinates generated by receipt of GPS communications may have a first visual appearance, and an icon based upon location coordinates generated via UWB communication may have a second visual appearance. In another aspect, selecting the icon may bring a use to an interface that lists one or more communication modalities involved in determining location coordinated associated with the icon. As such, a single communication modality or multiple communication modalities may be involved in generation of a set of location coordinates.

9) Power management may also reference the availability of a type of power source such that if the equipment is installed at the worksite and the MMTS is supplied with a hardwired power source, the MMTS may provide power to multiple communication modality modules and sensors and increase the frequency of communications and sensor readings.

10) Location coordinates of the MMTS may also be supplied to an A/R interface for generation of icons within the A/R interface.

Referring again to FIG. 17A exemplary method steps may include the following. At step 1701 a timing sequence may be registered. At step 1702 one or more sensors may have power supplied to it. Next, at step 1703 the apparatus may be used to quantify a condition present to the MMT as digital content. Continuing to step 1704 the apparatus may periodically repeat the quantification of a condition(s) present to the MMT. Proceeding to step 1705 a conditional processing may determine if an equipped GPS receiver is receiving GPS signals and then store the GPS signals that are received. At step 1706, a conditional processing may determine if the GPS is not receiving signals and if not then cease polling until an event occurs. At step 1707, if a local array receiver is receiving local array communications, then the system may receive and store local array data that has been transceived. Proceeding to step 1708, the step of receiving and storing local array communication data on a periodic basis may be repeated. At step 1709 a conditional processing may determine if internet communications are available, and if so, then transmit some or all of the stored data. At step 1710, the apparatus may operate a set of wireless transceivers to transmit and receive wireless communications. Next, at step 1711, the system may calculate a distance between two or more sets of transceivers. Continuing at step 1712, the system may generate a position of at least one of the transceivers relative to the other based upon the wireless communications.

The exemplary method may continue in FIG. 17B. At step 1713, a system may include apparatus and executable software and be set up to co-locate one or more wireless transceivers and/or receivers (GPS) with one or more IOT sensors. Proceeding to step 1714, the system may generate location coordinates of the transceiver/receiver collated with the sensor. At step 1715, the system may quantify physical condition with the sensor. At step 1716, the system may transmit digital quantification of condition generated by the sensor.

Furthermore, at step 1717, the system may associate digital quantification of the condition with a geospatial descriptor, such as location coordinates and/or a geospatial zone. At step 1718, the system may generate an icon associated with the geospatial coordinates.

At step 1710, the system may generate a user interface with spatial recognition.

At step 1720, the systems may locate icons in an interface in spatial congruity with the location coordinates. And at step 1721, the system may include image data descriptive of the area including location coordinates.

Exemplary method steps are further illustrated in FIG. 17C. At step 1722, the system may specify location coordinates for one or more virtual tags. Next, at step 1723, the system may identify digital content for the one or more virtual tags. At step 1724, the system may display an icon or icons for the one or more virtual tags integrated into an A/R interface. Further, at step 1725 the system may integrate the icon into a 2D site plan. At step 1726, the system may detect whether a user selects the icon to display digital content. At step 1727, the system may query digital content included in the area specified. The area specified may be within a given radius of the user's location. In some examples, the area specified may be chosen in meeting search criteria. In other examples, the area specified may be in response to an alert status.

Figure 18A:
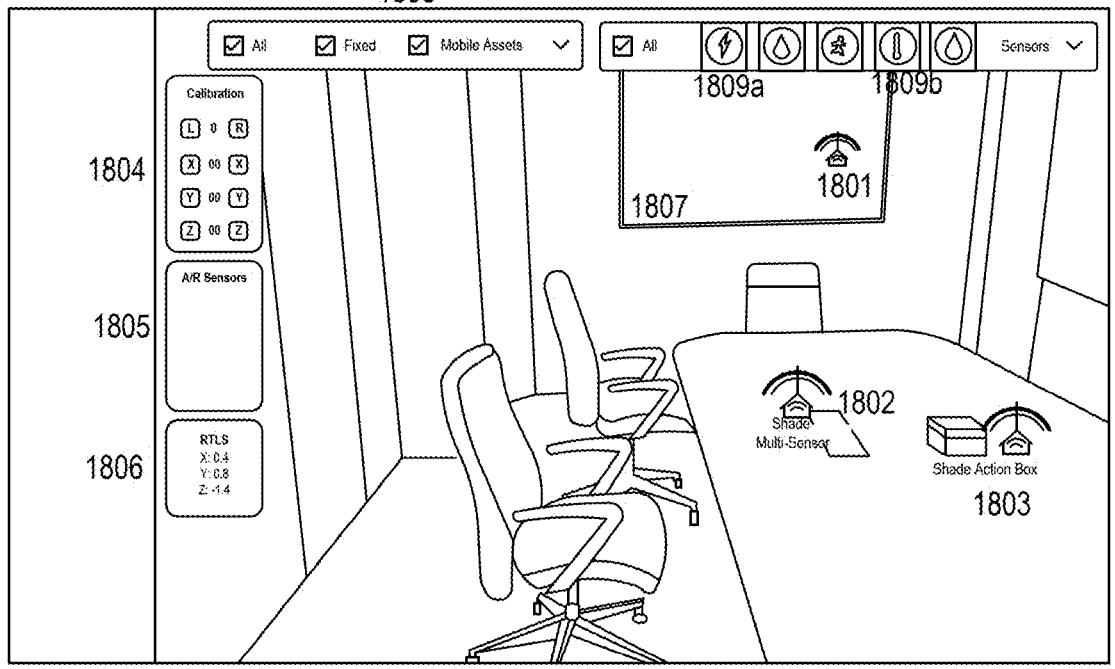
FIGS. 18A-B illustrate exemplary user interfaces.

Referring now to FIG. 18A, an exemplary user interactive interface 1800A is illustrated with features that are conducive to enabling the methods, processes and apparatus deployment described herein. The user interactive interface 1800A includes various user interactive areas 1801-1809. Each interactive area 1801-1809 may be activated to have an associated controller become operative to perform a function. The interactive areas 1801-1809 may be integrated into image data. Image data may be from a file, such as a two dimensional image of a site plan, floor design, or room layout, and/or energy levels received by a sensor in a smart device. For example, activation of an icon 1801 on a video conferencing screen may be integrated with image data of the video conferencing screen 1807 and allow a user to control functionality included in the video conferencing screen, such as, by way of example, powering on/off; connecting to a virtual meeting app; adjusting volume; adjust a display option; or other functionality. Similar user interactive areas are linked to control of other items of equipment and functionality appropriate for an associated item of equipment.

IoT sensors may be associated with transceivers and combined into a unit for quantifying conditions present at location, such as, for example a Shade™ Multi Sensor unit 1802 and/or a Shade Action Box 1803. A Shade Action Box 1803 will be associated with interactive controls linked to the user interface that allow for wireless of a structure aspect, such as a water turn off valve, a door lock, HVAC control, electrical on/off and the like.

Specific icons each associated with a disparate IoT sensor may be displayed with associated logos in a specified user interactive area 1809. Icons 1809a, 1809b may be associated with one or more of: fire, power, power surge, power outage, temperature, water, humidity, vibration and almost any condition quantifiable via an electronic or electromechanical sensor.

Interactive areas 1804-1806 may provide user control of aspects of the user interactive interface. For example, a calibration interactive area 1804 provides a user with control of functionality that allows the user to align A/R sensor data, such a visible light wave data and/or infrared image data to be aligned with an icon 1801-1803 or other designated user interactive area.

Another control area 1808 allows a user to which assets are displayed in the user interactive interface 1800A. The options illustrated include all assets, fixed assets, and mobile assets. Fixed assets may be associated with an IoT sensor that is not combined with a transceiver and/or a virtual tag 1802 with fixed coordinates. A mobile asset may include an IoT sensor combined with a transceiver.

Figure 18B:
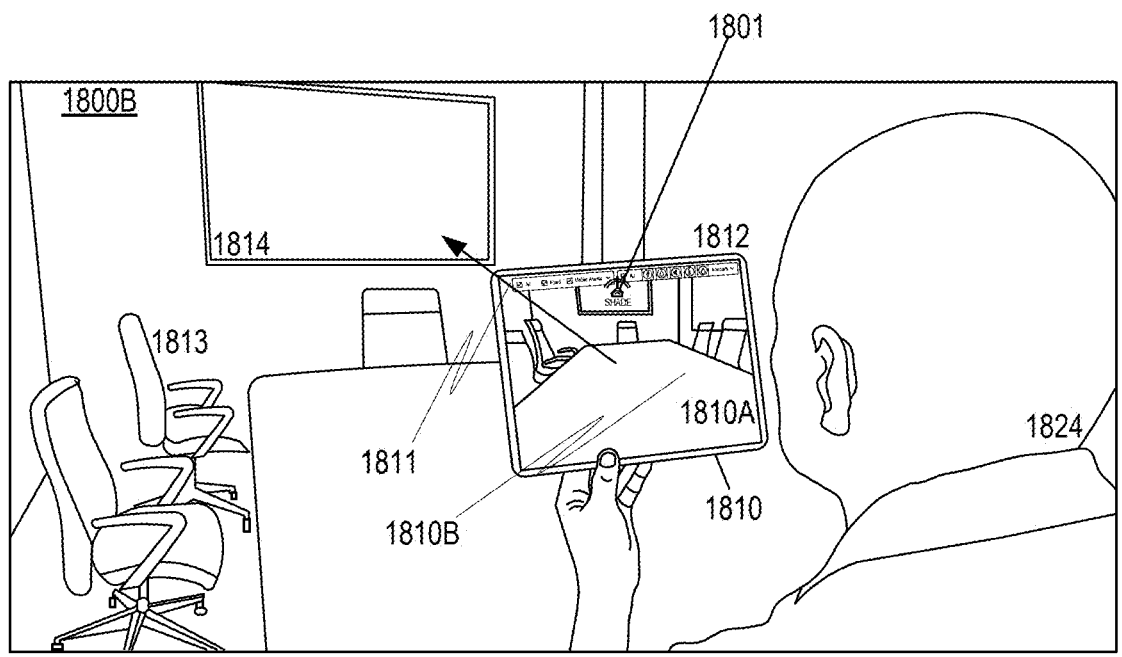

Referring now to FIG. 18B illustrates a user interface on smart device 1810 on a Smart Device 1812. The user interface includes image data 1810B representative of a physical environment 1800B in a direction of interest 1811 generated via the orientation of the smart device 1810 by the user 1824. The user interface 1810A also includes an icon 1801 associated with a physical asset in the area, as illustrated, the asset is a video screen 1814, other assets may be similarly associated with an icon. Some embodiments may also include an interactive area 1813 that is congruent with an area and/or inclusive of an area on the interactive interface of a physical environment 1800B that corresponds with an asset or other feature. As illustrated, the asset is shown as a chair and interactive area 1813 allows a user 1824 to select (e.g., click or touch a touch screen) the chair and activate presentation of digital data associated with the chair.

Similarly, the user may select the icon 1801 and activate presentation of digital data associated with the video screen 1814.

Figure 18C:
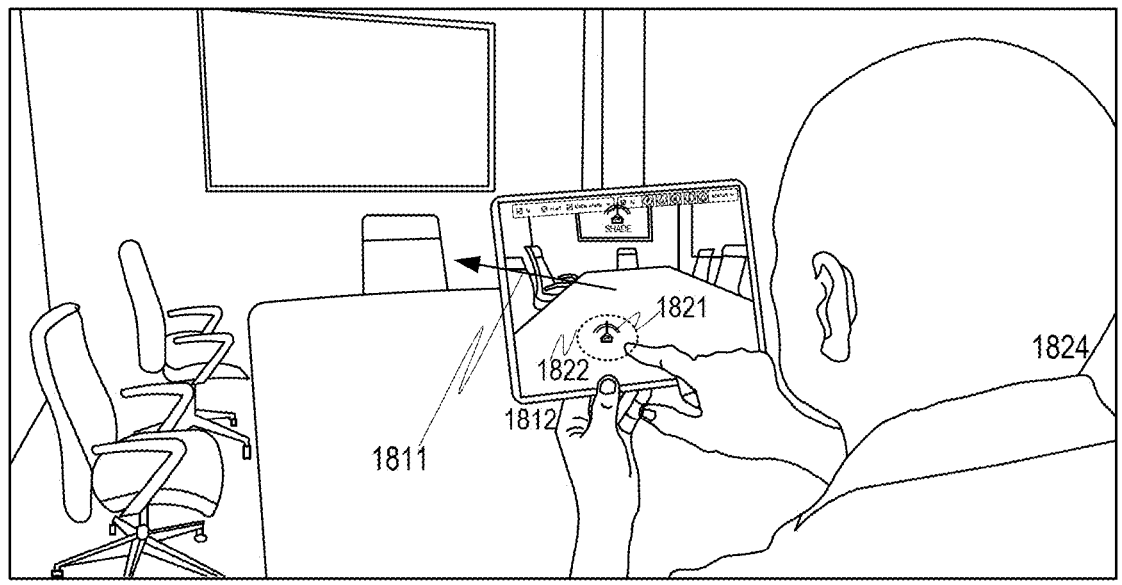
FIGS. 18C-D illustrate exemplary user interaction with user interfaces.

Referring now to FIG. 18C, the step of activating an icon 1821 via a user 1824 touch the interactive area 1822 including the icon 1821 is illustrated.

Figure 18D:
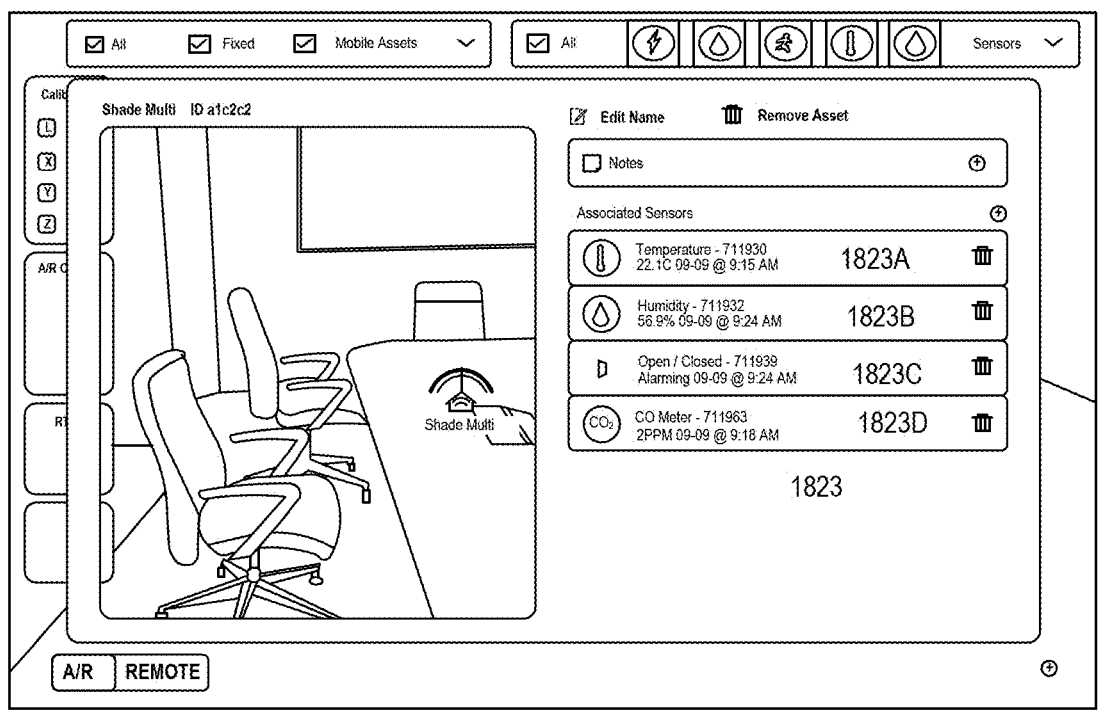

Referring now to FIG. 18D, an action screen 1823 that is generated in response to the user selecting the interactive area 1822 is illustrated. The action screen includes additional user interactive areas that are operative with the controller to monitor a temperature sensor 1823A, monitor humidity 1823B, open and/or close an alarm state 1823C, and/or monitor a CO2 meter 1823D.

Figure 19:
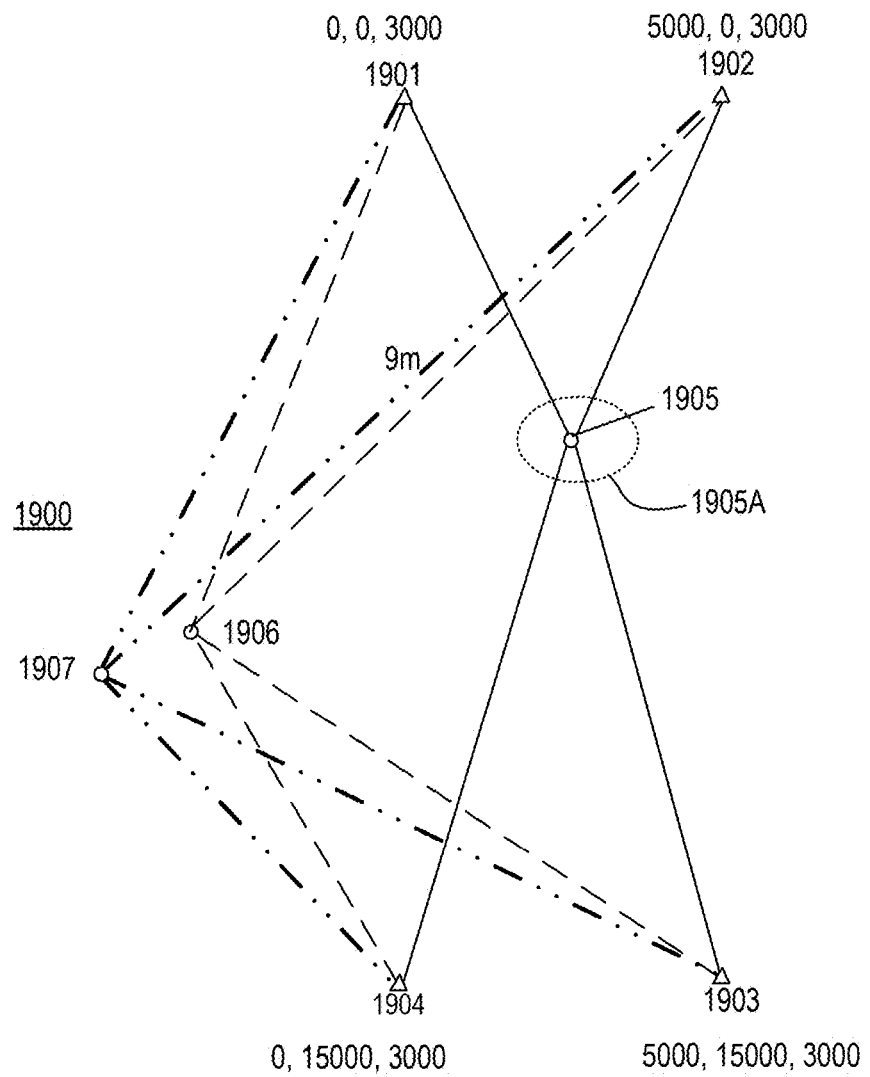
FIGS. 19, 19A illustrate examples of determining the location of a radio receiver in three dimensional space based on its interaction with multiple radio transceivers.

Referring now to FIG. 19, principles involved in determining a location of a transceiver 1905 in three dimensional space based on its interaction with reference transceivers 1901-1904 whose locations are known. Preferably determination of a location in three dimensional space is based upon wireless communication with transceivers 1901-1904 located at different locations. Triangulation may involve three or more reference pint transceivers 1901-1904, however, as described herein, a single reference point transceiver 1901-1904 may be used in conjunction with an IMU or other position calculation apparatus to accurately calculate a position 1905A of an Agent supported transceiver 1905.

Triangulation will involve communication between a three or more, it is possible to obtain improvements in operations by use of additional transceivers. For illustration purposes, four transceivers are included in the illustration of FIG. 19. A first reference point transceiver 1901 is illustrated as a "base position" with exemplary cartesian position coordinates of 0, 0, 3000. In an example, the home position of 0, 0 may be a relative position along a floor of a structure and as the transceiver may be located upon a ceiling of a structure, the height of 3000 mm may represent a 3 meter elevation of the first transceiver 1901. Other transceivers may also be located on a ceiling such as the second reference point transceiver 1902 at position 5000, 0, 3000. The third reference point transceiver 1903 may be located at position 5000, 15000, 3000 in an example. And a fourth reference point transceiver 1904 may be located at position 0, 15000, 3000. An Agent supported tag 1905 may be located at a first position location 1905A.

In some embodiments, the radio position tag 1905 may be associated with a particular Agent. The transceiver 1901-1904 are positioned in an area 2900 that may be authorized for access to specified digital content being protected. As illustrated, if an authorized area position 1900 is designated as being with a rectangular area formed by reference point transceiver 1901-1904, then an Agent supported tag 1905 will be in a position authorized to have access to the specified digital content being protected, and a request from an Agent that is at a position that is not within the authorized area 1900 will be denied if the request is to access digital content being protected.

There may be numerous techniques that the system of transceivers and a radio position tag may be used with to determine positions by triangulation. In some examples, a distance from a transceiver to the radio tag may be determined by the measurement of the strength of the signal which is related to the distance the signal has travelled. In other examples, timing signals may be used to determine the precise time it takes for a signal to transit the distance. In still further examples, the angles of arrival of signals from or to the transponder may be used in combination to determine a location. Thus, the first position location 1905 may be determined by making at least three determinations of distance or angles between a radio position tag at first position location 1905 and the four transceivers (1901-1904).

In some embodiments, four of the determinations may be made and can be used to calculate a position. In various real world environments, there may be a number of factors that lead to difficulties in obtaining a position or angle measurement with precision. In a first example, the positioning system may be installed in an interior location with walls, equipment, occupants, and other elements formed of materials that may interact with the radio signals (or other position signals such as infrared, laser, and ultrasonic signals as non-limiting examples. Scattered signals from walls may cause multiple signal paths which may cause confused signal determination. Depending on the location of the first position within the space of interest, one or more of the signal paths from the transceivers to the first position tag may experience signal degradation from one of the causes.

The positioning system may utilize all four of the signals to determine that one of the three signals could be omitted to improve the "goodness" of a position determination. Both the instantaneous signal path determination as well as the time progression of a signal path determination may factor into the rejection of a particular signal path measurement. Accuracy of position determination may be improved by sampling numerous times. In same examples, ultrawide band transmission protocols may be used to make position determination with relatively low energy consumption and good signal to noise aspects. Ultrawideband protocols may use extremely narrow (nanosecond) pulses which may allow for improved discrimination of multipath signal arrivals. Many different frequencies may be utilized for high degrees of sampling which can improve the accuracy.

Referring again to FIG. 19, a second position location may include an agent with two tags located at locations 1906 and 1907. The accuracy of determination of a second position may improve by the use of multiple tags at the different locations 1906 and 1907 whose aggregate position determination may be used to determine a second position location. As may be observed in the dashed lines and the complex dot dashed line there are individual signal paths from each of the four transceivers to the two tags. Here too the increased number of position signal paths allow for statistical improvement of an average location and also allow for the ability to statistically process signals to eliminate poor measurements or to average out poor measurements by acquiring collections of signals over time. In some examples, advantages may be obtained by establishing systems with larger numbers of transceivers.

Figure 19A:
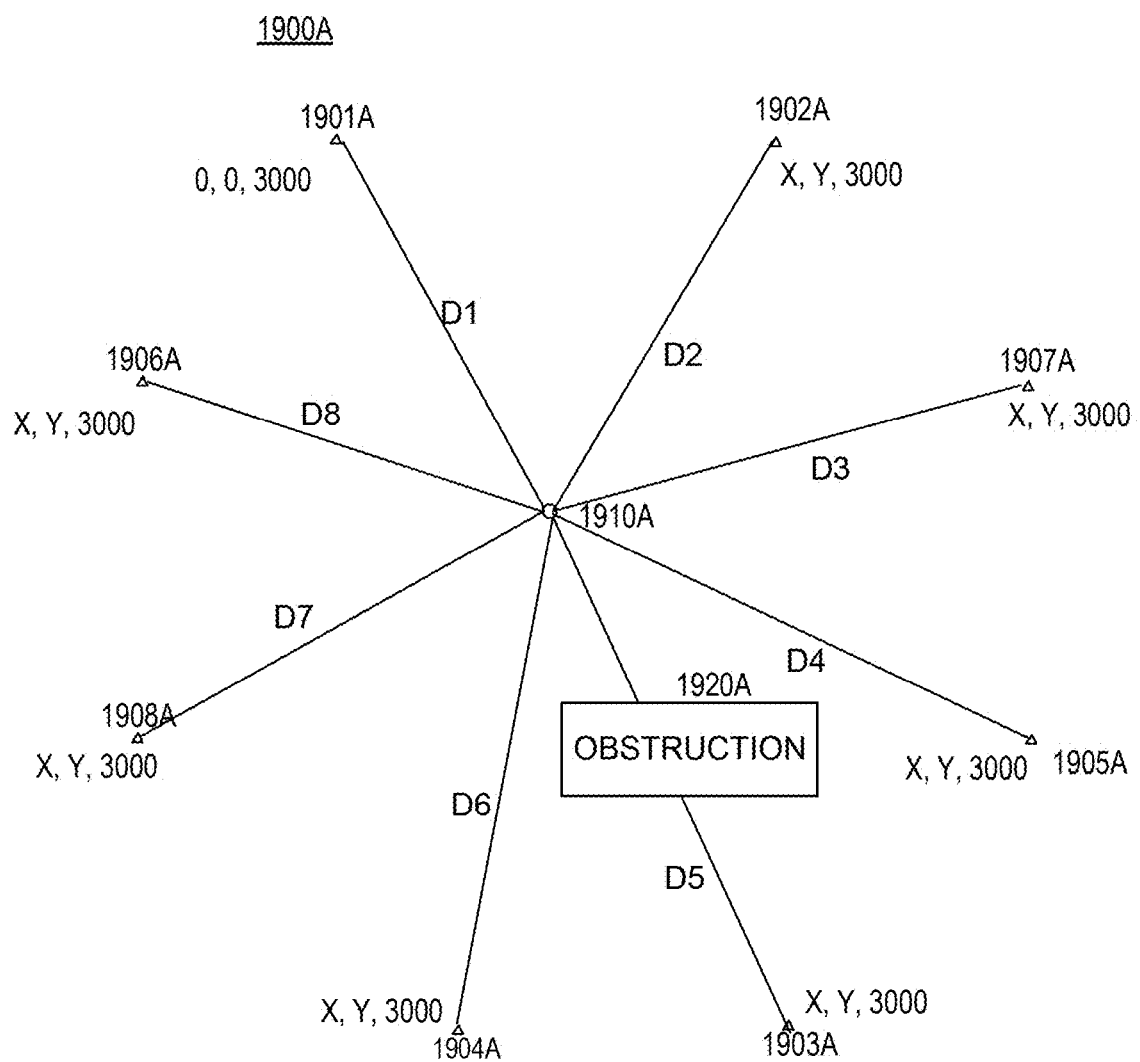

Referring now to FIG. 19A, an example 1900A including an assembly of eight reference point transceivers 1901A-1907A are operative to transceive in an area proximate to (within wireless communication distance to) a position tag 1910A. Each of the eight transceivers 1901A-1907A are located at respective discrete locations may again be at a height of 3000 mm such as a system mounted on a ceiling where a floor might be located at 0. A base coordinate location may be defined as the base position of reference point transceiver 1901A. The other reference point transceivers (1902A-1908A) may be located at other discrete locations also indicated at a height of 3000 mm for example, although disparate heights are also within the scope of the invention.

Position tag 1910A may transceive a wireless communication to and/or from the 8 transponders and each of these paths may be used to determine the location. The statistical combination of additional transponder paths will implicitly improve the accuracy of measurements. In some embodiments, a system including the reference point transceivers 1901A-1907A is trained with known positions from time to time or a set periodic basis to remove static or systematic errors such as may occur in the location of a given position reference point transceivers 1901A-1907A.

In some embodiments, dynamic aspects of an environment in which the reference point transceivers 1901A-1907A are located may affect performance and accuracy of transceiving of wireless communications, such as for example changing a timing aspect associated with such transceiving.

For example, a human occupant of a space or an object that is placed transiently into a location may create an obstruction 1920A to line of sight path measurements such as the illustrated obstruction 1920A. The location determination system may detect the presence of an obstruction by a number of means such as a reduced signal strength over historical levels relative to other signal strengths at other transceivers. In some examples, interference by an obstruction 1920A may result in a distance or angle determination of the signal path D5 that is entirely inconsistent with the determination of position from some or all of the other paths D1-D4 and D6-D8.

Figure 20:
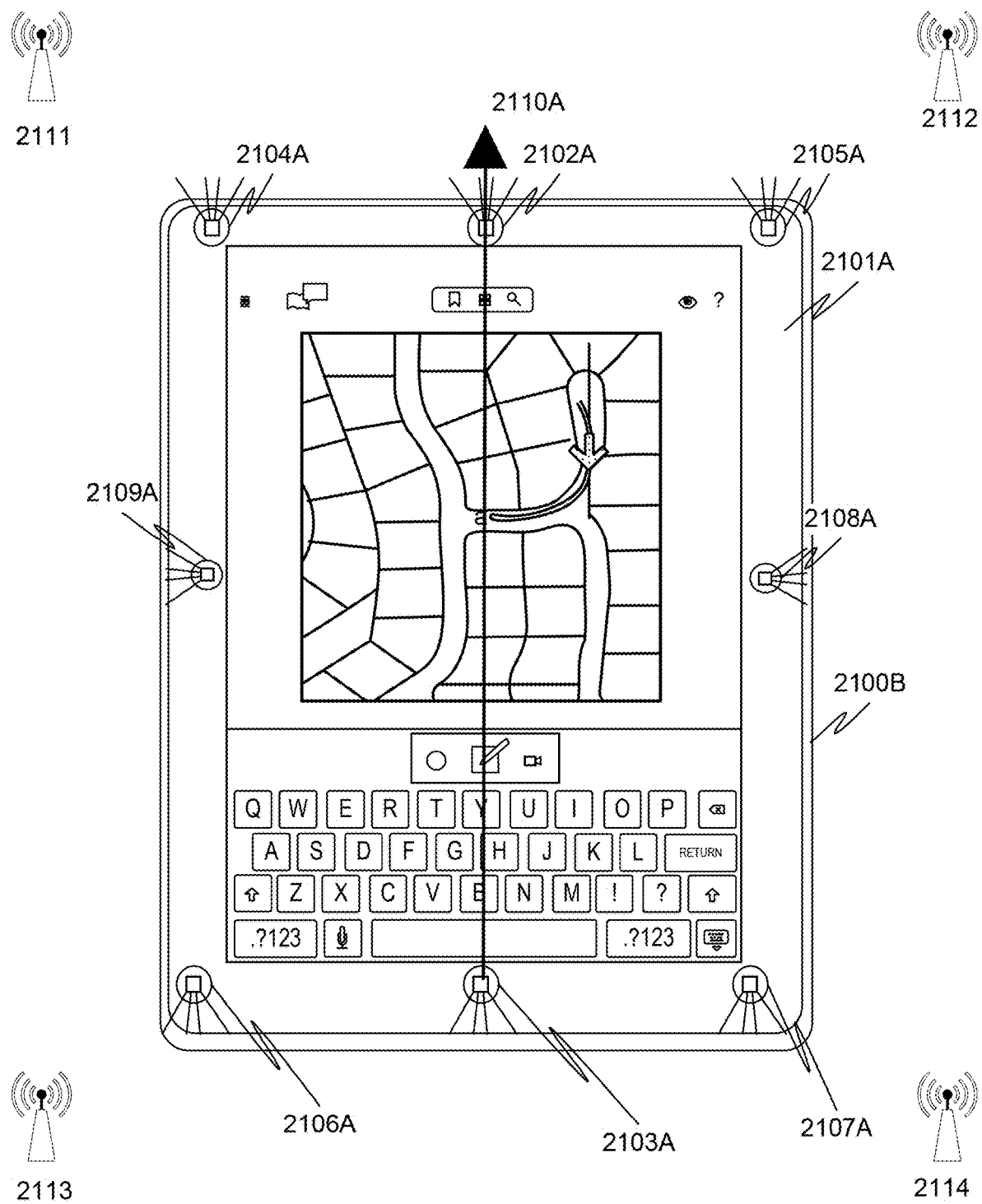
FIG. 20 illustrates an exemplary Smart Device with an array of antennas.

Referring now to FIG. 20, in some embodiments, wireless position devices 2102A-2109A may be incorporated into a smart device 2101A and not require a smart receptacle to house wireless position devices 2102A-2109A. Wireless position devices 2102A-2109A that are incorporated into a smart device, such as a smart phone or smart tablet, will include internal power and logic connections and therefore not require wireless communication between the controller in the smart device 2101A.

According to the present invention, a smart device 2101A may include integrated wireless position devices 2102A-2109A and/or wireless position devices 2102A-2109A in a smart receptacle 2100B may provide a directional indication, such as a directional vector 2110A, without needing to move the smart device 2101A from a first position to a second position since a directional vector may be determined from a relative position of a first wireless position devices 2102A-2109A and a second wireless positional device wireless position devices 2102A-2109A.

In preferred embodiments, a position of the Smart Device 2101A may be determined based upon wireless communication with one or more Reference point transceivers 2111-2114. As described herein, a position may be determined based upon timing of wireless transmissions, such as via TDOA methodologies understood in the industry, and/or a time involved in a wireless communication and an angle of arrival and/or angle of departure for the wireless transmissions.

In other exemplary embodiments, distances may be triangulated based on measurements of wireless strength at two or more points, such as a strength of a wireless WiFi transmission. In the case of a WiFi transmission, a wireless signal may propagate outward as a wave, ideally according to an inverse square law. Ultimately, the crucial feature of the present invention relies on measuring relative distances at two points. In light of the speed of WiFi waves and real-time computations involved in orienteering, these computations need to be as computationally simple as possible. Thus, depending upon the specific application and means for taking the measurements, various coordinate systems may be desirable. In particular, if the smart device moves only in a planar direction while the elevation is constant, or only at an angle relative to the ground, the computation will be simpler.

A position may be described in reference to coordinates descriptive of a location, one such an exemplary coordinate system includes a cartesian coordinate system including an X, Y, Z position and other embodiments, may include a polar coordinate system. One example of a three-dimensional polar coordinate system is a spherical coordinate system. A spherical coordinate system typically comprises three coordinates: a radial coordinate, a polar angle, and an azimuthal angle (r, θ, and φ, respectively, though a person of ordinary skill in the art will understand that θ and φ are occasionally swapped).

By way of non-limiting example, suppose Point 1 is considered the origin for a spherical coordinate system (i.e., the point (0, 0, 0)). Each WiFi emitter $e_1$, $e_2$, $e_3$ can be described as points $(r_1, \theta_1, \varphi_1)$, $(r_2, \theta_2, \varphi_2)$, and $(r_3, \theta_3, \varphi_3)$, respectively. Each of the $r_i$'s (1≤i≤3) represent the distance between the WiFi emitter and the WiFi receiver on the smart device.

In some embodiments, the orienteering occurs in a multi-story building, in which WiFi emitters may be located above and/or below the technician. In these embodiments, a cylindrical coordinate system may be more appropriate. A cylindrical coordinate system typically comprises three coordinates: a radial coordinate, an angular coordinate, and an elevation (r, θ, and z, respectively). A cylindrical coordinate system may be desirable where, for example, all WiFi emitters have she same elevation.

Figure 21:
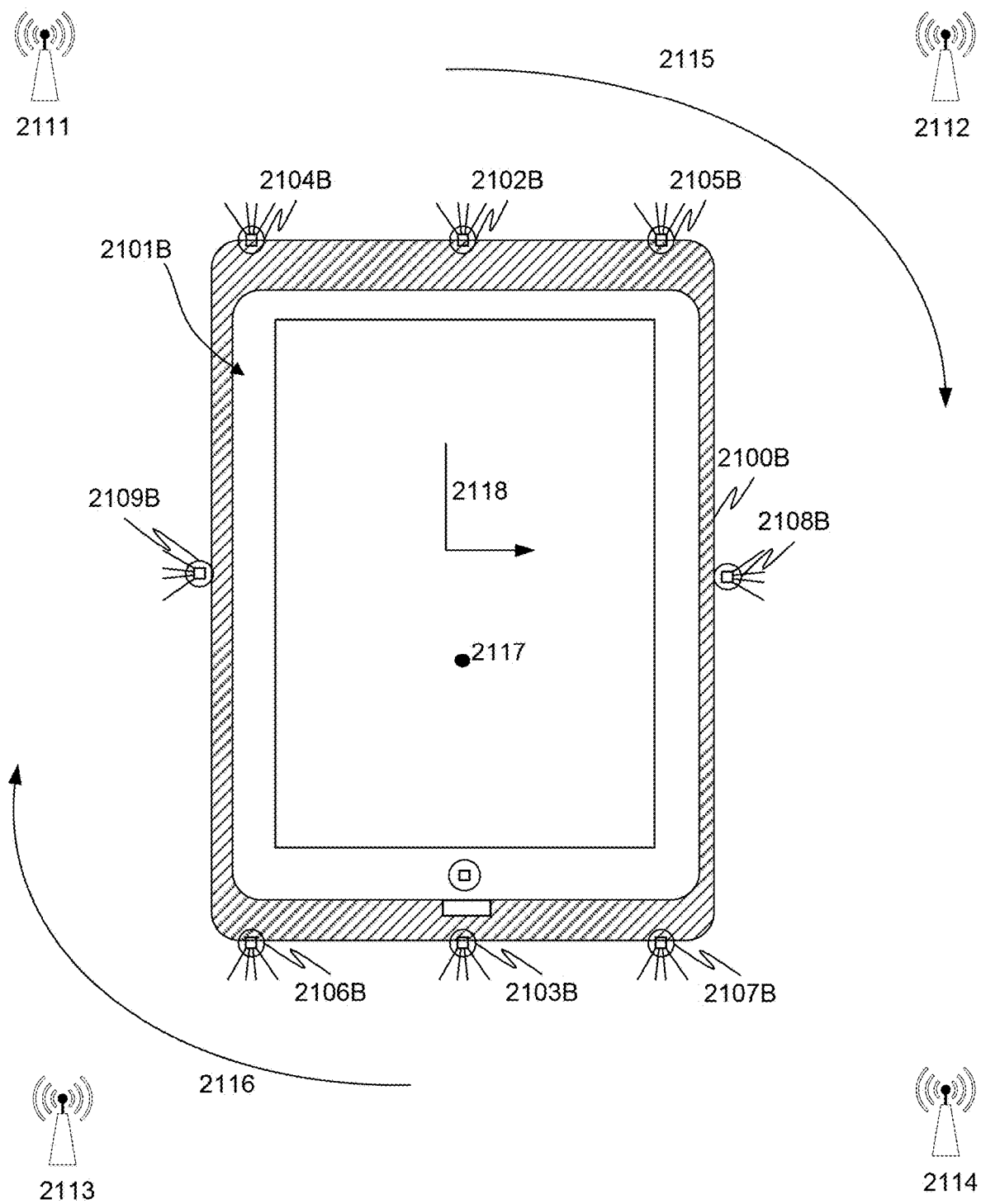
FIGS. 21 and 21A illustrate a device and vectors according to various embodiments of the present invention.

Referring now to FIG. 21, in some embodiments, one or both of a smart device 2101B and a smart receptacle 2100B may be rotated in a manner (such as, for example in a clockwise or counterclockwise movement 2115 2116 relative to a display screen) that repositions one or more wireless position devices 2102B-2109B from a first position to a second position relative to reference pint transceivers 2111-2114. A vector 2117 may be generated at an angle that is perpendicular 2118 or some other designated angle in relation to the smart device 2101B. In some embodiments, an angle in relation to the smart device 2101B is perpendicular 2118 and thereby viewable via a forward looking camera on the smart device 2101B.

A user may position the smart device 2101B such that an object in a direction of interest is within the camera view. The smart device 2101B may then be moved to reposition one or more of the wireless position devices 2102B-2109B from a first position to a second position and thereby capture the direction of interest via a generation of a vector in the direction of interest.

Figure 21A:
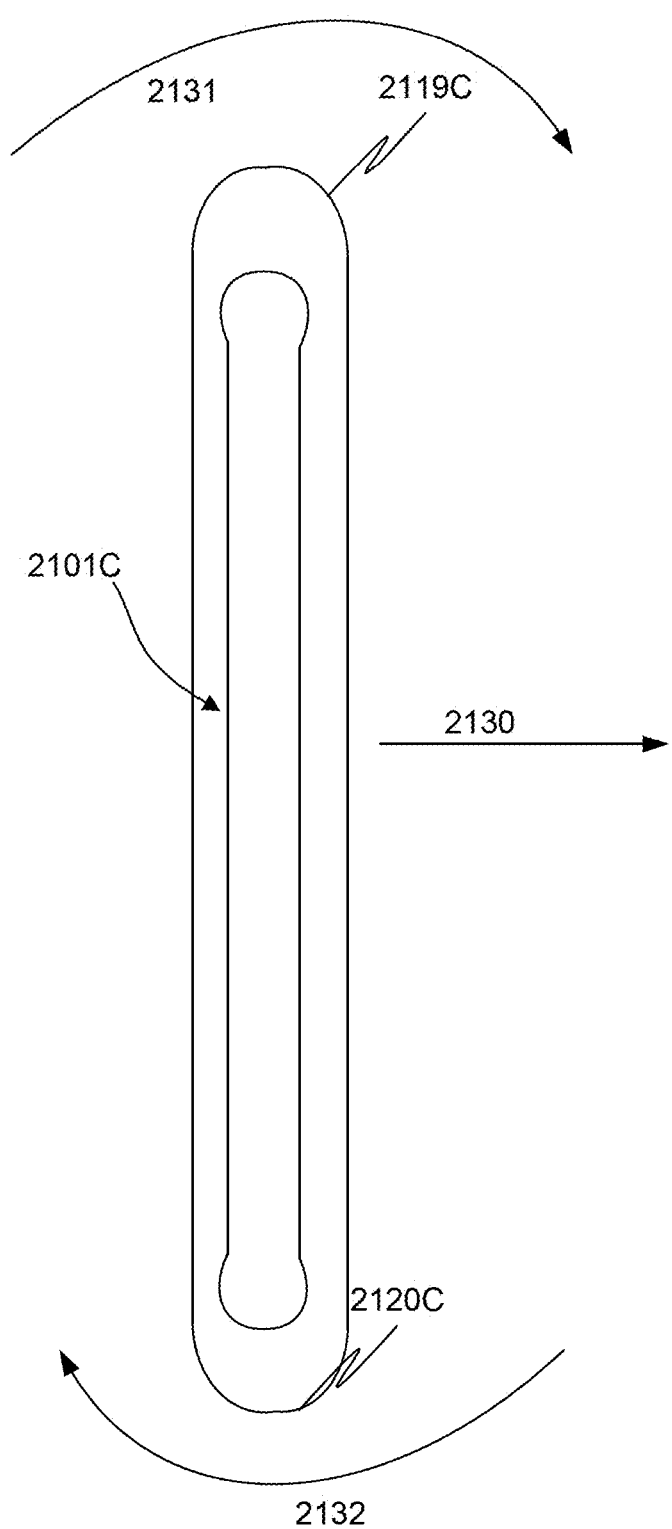

Referring now to FIG. 21A, as illustrated, a vector in a direction of interest 2130 may be based upon a rocking motion 2131-2132 of the smart device 2101C, such as a movement of an upper edge 2119C in a forward arcuate movement 2131. The lower edge 2120C may also be moved in a complementary arcuate movement 2132 or remain stationary. A required distance may be contingent upon a type of wireless transmission referenced to calculate the movement; for example, an infrared beam may require less distance than a WiFi signal, and a WiFi transmission may require less distance than a cell tower transmission which in turn may require less distance than a GPS signal.

Figure 22A:
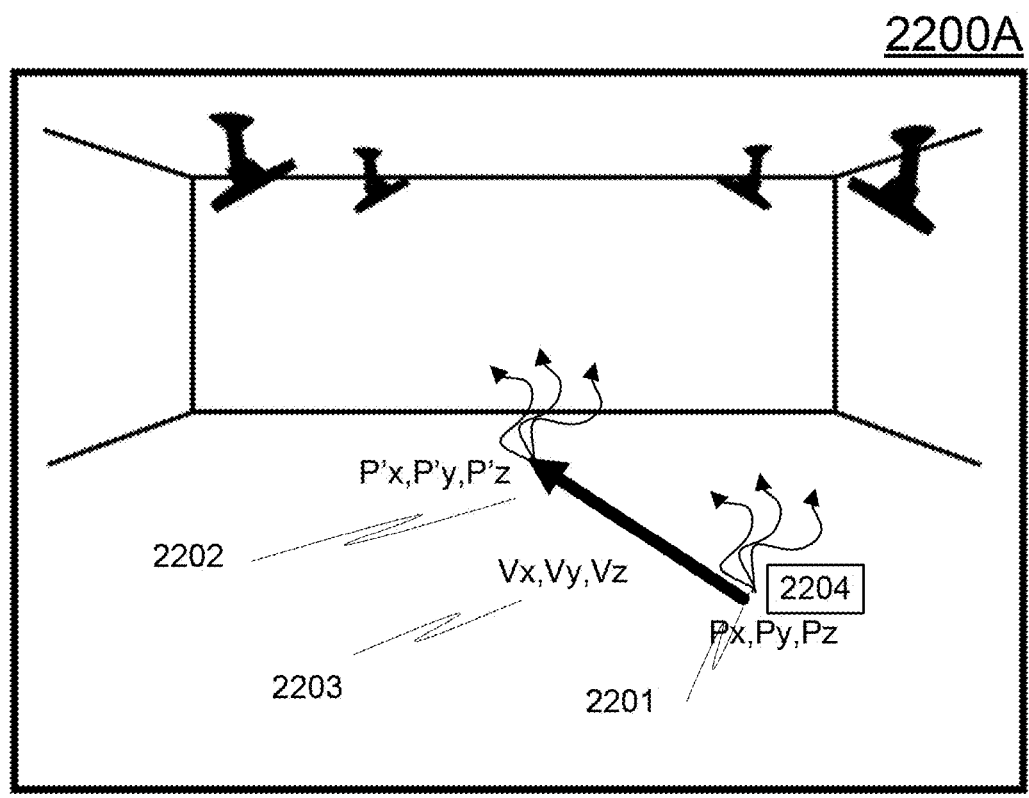
FIGS. 22A-22B illustrate a defined area with Transceivers.

Referring to FIG. 22A, an illustration of the six degrees of freedom is provided. In FIG. 22A, a set of sensing and/or transmitting devices within a defined area 2200A are illustrated at a first point 2201, and at a second point 2202. The positional coordinates of the first point 2201 may be represented in a Cartesian Coordinate system as $P'_x$, $P'_y$ and $P'_z$. Accordingly, the second point 2202 may be represented in a Cartesian Coordinate system $P'_x$, $P'_y$ and $P'_z$. A direction from the first point 2201 to the second point 2202 may be represented by a vector 2203 as $V_x$, $V_y$ and $V_z$. An Agent 2204 may be located as the first point 2201 in an example,. In representing the orientation and direction of an element of interest there may be a number of possible position references that may be associated with the element.

In some examples, a controller determining a position may default to either a first point 2201 or a second point 2202 (additional points may also be calculated and used according to the methods presented in this disclosure) or a mathematical combination of the first point, second point (and any additional points) locations. A vector 2203 may be generated and a direction of the vector may be used as an Agent 2204 defined direction of interest.

A hierarchy of the first point 2201 to the second point 2202 may be specified to generate a starling point of the vector (e.g., first point 2201) and an intersecting point (e.g., second point 2202), a magnitude may be generated based upon a model of a position of the Agent 2204. A generated direction may be inverted by swapping the hierarchy of the first point 2201 and the second point 2202.

One or more of radio frequency and sound frequency transmissions, emissions, reflections, absorption, and detections may be used as input into a controller for determining a location of the first point 2201 and the second point 2202 and generation of a direction of interest.

Figure 22B:
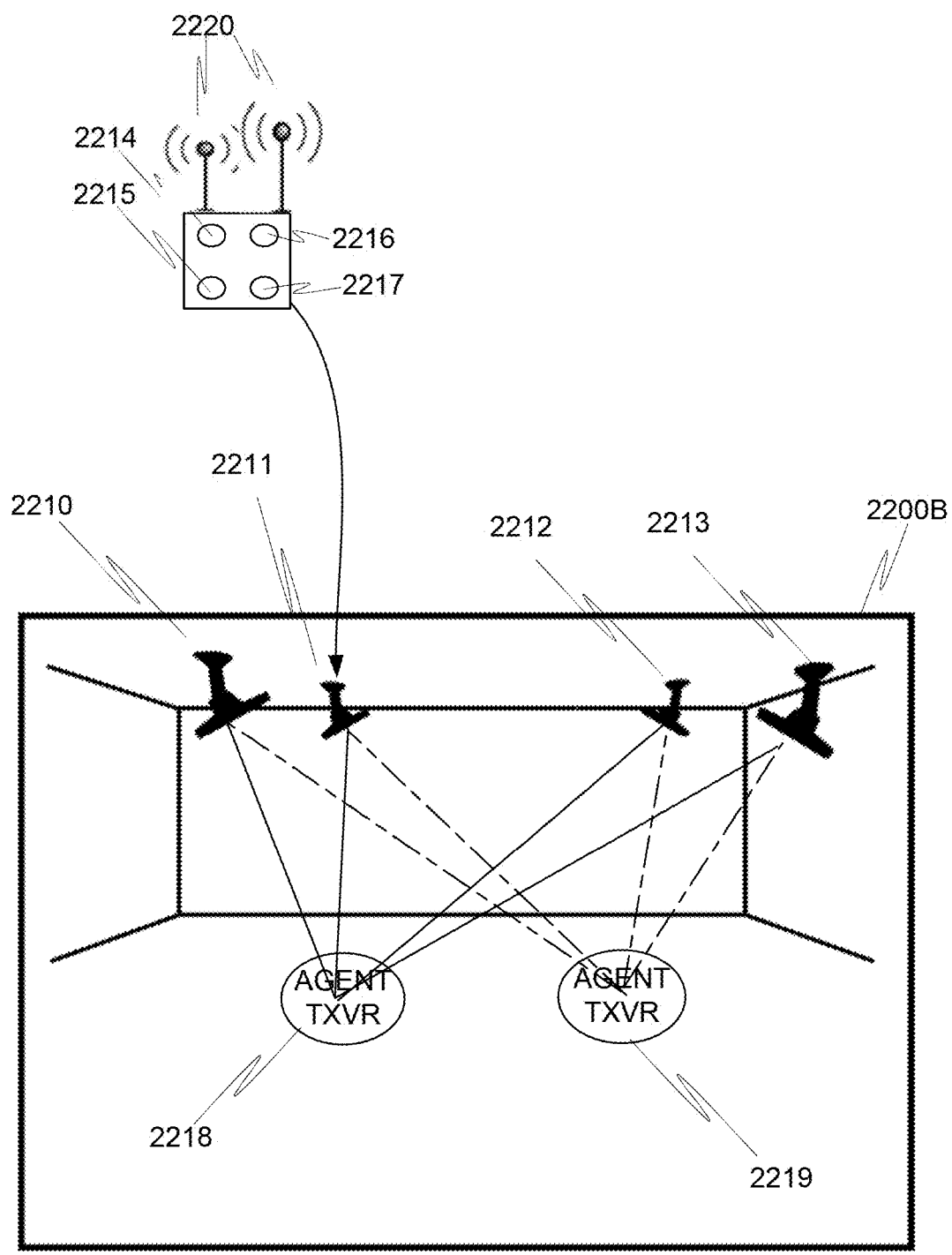

Referring now to FIG. 22B, a defined area 2200B may be equipped with fixed reference point transceivers 2210-2213, each transceiver capable of one or both of transmitting and receiving one or both of radiofrequency encoded data and soundwave encoded data. Numerous frequency bandwidths are within the scope of the invention, including radio waves that are sometimes referred to as Ultra-Wideband (UWB) technology which focusses radio wave emissions of low power consumption to achieve high bandwidth connections, WiFi bandwidths, including WiFi RTT and frequencies compliant with 802.11 specifications, ultrasonic bandwidths, infrared bandwidths, and Bluetooth bandwidths, including Bluetooth 5.1.

In some embodiments, each transceiver 2210-2213 may in turn include multiple transmitters and/or receivers 2214-2217. The multiple transmitters and receivers 2214-2217 may operate on a same or different frequencies. Different frequencies may be within a same bandwidth, such as for example UWB bandwidth, or the different frequencies may be across different bandwidths, such as, for example an UWB and a WiFi bandwidth. In some embodiments a single transceiver 2210-2213 may thereby operate on multiple different frequencies. In other embodiments, different transceivers 2210-2213 may operate on a same or different frequencies. The multiple transceivers 2210-2213 may be operative to implement simultaneous or sequenced transmitting and receiving.

In some embodiments, some, or all of the multiple transmitters and/or receivers 2214-2217 may be incorporated into a transceiver device. The multiple transmitters and/or receivers 2214-2217 may also include an antenna 2220 with a same or different physical characteristics. For example, different antenna may be tuned to a same or different frequencies. In some embodiments, tens, hundreds or more antennae may be incorporated into a device in order to enable redundant communications and improve quality of a wireless communication.

Wireless communication may be accomplished for example via bandwidths associated with one or more of: Bluetooth; UWB; WiFi (including RTT Wi-Fi); Ultrasonic; and infrared communications. Transceivers used in transceiving may include directional and/or omni-directional antennas 2220. Antennae 2220 may be tuned similarly or tuned differently. Transceiving may be accomplished simultaneously, in timed sequence and/or based upon occurrence of an even. For example, a sensor may transceive on a predetermined timed schedule and also transceive following the occurrence of an event, such as a sensor reding that exceeds a threshold.

As illustrated in FIG. 22B, at least three Reference Point Transceivers 2210-2213 are mounted in different reference locations within or proximate to the defined area 2200B. Preferably each Reference Point Transceivers 2210-2213 has a relatively clear line of sight to an Agent Transceiver 2218-2219 supported by an Agent (not shown in FIG. 22B) and the line of sight is conducive to successful wireless communications.

In some examples, mounting (either permanent or temporary) will include fixedly attaching a Reference Point Transceiver 2210-2213 to a position and may be made to one or more of: a ceiling within the defined area, a wall mount; a stand mount; a pole; or integrated into or otherwise connected to an electrical receptacle. In some examples, a reference transceiver 2210-2213 may be mounted at a calibrated location within the defined area 2200B and function as a coordinate reference location.

The Reference Point Transceivers 2210-2213 may be placed in logical communication with a controller (such as via a distributed communications system, wireless or hardwired), the controller may cyclically receive logical communication from one or more transceivers supported by an Agent located within the defined area 2200B while simultaneously monitoring the reference location. A Reference Point Transceiver 2210-2213 may be useful for calibrating various aspects of wireless communication between a Reference Point Transceiver 2210-2213 and an Agent supported Transceiver 2218-2219, aspects may include, for example variables in communication relating to one or more of: environmental condition such as humidity, temperature, and the like; as well as a variation in transceiver power levels, noise levels, amplification aspects and the like.

There may be numerous sources and causes of noise in a radiofrequency environment and/or a sound frequency environment (such as ultrasonic) that may come into play when using a Reference Point Transceivers 2210-2213 and an Agent supported Transceiver 2218-2219 that operate in one or more of: WiFi bandwidth; Bluetooth bandwidth; ultra-wide band; ultrasonic or similar technology. For example, in an indoor environment walls, structures, furniture, occupants, HVAC settings; particulate in the air (such as smoke or steam) human traffic; machinery movement; and the like may create a complex and dynamic environment where radiofrequency logical communications reflect and are absorbed. Reflections, particularly multiple reflections, may cause spurious logical communications where the time for the logical communication transmission may be inappropriately long.

Accordingly, in some embodiments, a controller may benefit from receiving many data from multiple closely sequenced logical communications included in transmissions/receptions between Reference Point Transceivers and Transceivers supported by an Agent. Examples of multiple logical communications include less than ten samples to billions of samples per second. A large number of logical communications may be averaged or otherwise mathematically processed to determine a localization. Mathematical processing may include less consideration (e.g., weight, or removal) of logical communications outside of an otherwise closely associated data set. Other mathematical processing may include a mean, an average and a median of data included in the logical communications.

Systems with Transceiver counts of as few as six and sampling frequencies in the hundreds of billions of samples per second have been demonstrated to localize Transceiver locations with sub-millimeter accuracy. High sampling rates may require specialized data acquisition capabilities including advanced filtering systems, ultrafast digital to analog converters and the like. Fundamentally, the more samples that are collected per unit of time a more accurate a position determination may be.

A wireless positioning system (such as, WiFi, UWB, Ultrasonic and Bluetooth) with high positioning accuracy may be used for determination of a direction of interest using transceivers sized to be unobtrusive in a defined area 2200B and/or to be able to be supported by a human Agent or an automation Agent capable of traversing the defined area 2200B.

Figure 22C:
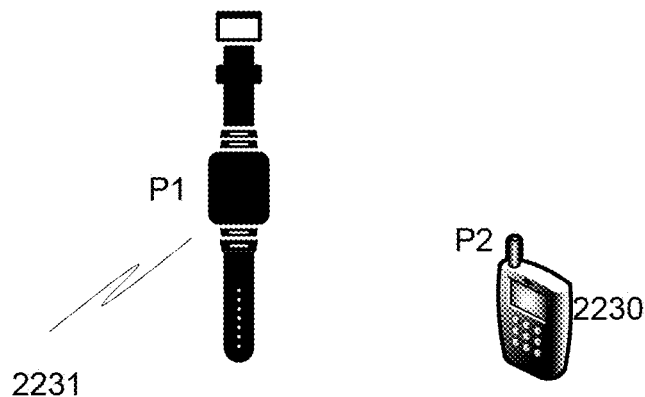
FIGS. 22C-22E illustrate devices that may include a Transceiver.
Figure 22D:
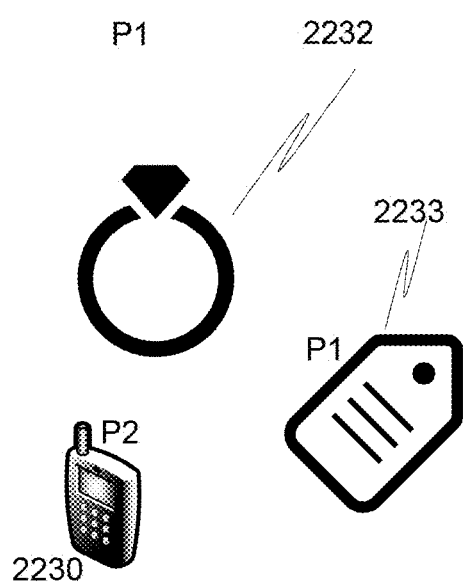
Figure 22E:
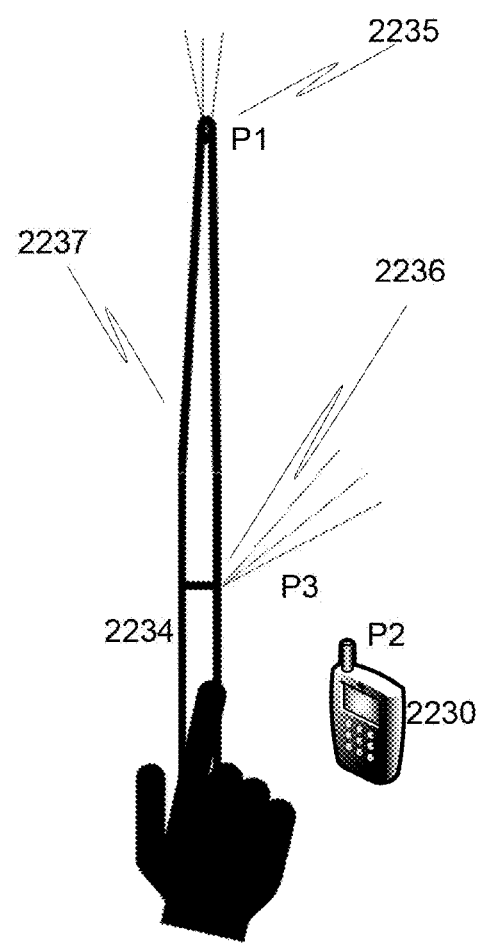

Referring now to FIGS. 22C-22E, an example of Agent supported Transceivers 2218-2219 (in FIG. 22B) may include a combination of an Agent's smart phone 2230 and an ancillary position determining device 2231, 2232-2233, 2234 linked to the smart phone 2230. An ancillary position determining device 2231, 2232-2233, 2234 may provide one location position, such as for example, a first location position (P1), and the smart phone 2230 may provide another location position, such as for example a second location position (P2). A vector may be generated based upon P1 and P2. For example, a generated vector may intersect P1 and P2, or the vector may be in a calculated direction, such as an angle, with reference to one or both of P1 and P2.

Linking between a smart device, such as a smart phone 2230, and an ancillary position determining device 2231, 2232-2233, 2234 may be accomplished, for example via a hardwire connection, such as a lightening port or USB, mini USB type connector, Bluetooth, ANT, near field communications and the like. A smart watch (ancillary position determining device 2231) that may be worn on an Agent's arm, a wand 2234 may be held in an Agent's hand, similarly, a ring 2232 may be worn on a finger and a tag 2233 may be incorporated into a badge, a button, on adhesive backed patch, a clip, or a wide variety of attachment mechanisms. Each ancillary position determining device 2231, 2232-2233, 2234 may include one or more Transceivers capable of communicating with a Reference Point Transceiver to generate logical communications from which a position may be calculated.

The Agent's smart phone 2230 and an ancillary position determining device 2231, 2232-2233, 2234, may each have one or more Transceivers and may be used with the methods and apparatus described herein to determine a first point and a second point. The first point and the second point may be used for generating a vector indicating a direction of interest (as discussed above). Other combinations of devices may be used, such as those illustrated in FIG. 22D where a smart ring 2232 and a smart tag 2233 may be used to determine the multiple position location samples.

Referring to FIG. 22E in some embodiments, a single an ancillary position determining device may be able to employ multiple transceivers 2235-2237 on its body. For example, a wand (ancillary position determining device 2234) may include a tip Transceiver 2235 and a base Transceiver 2236. A wand (ancillary position determining device 2234) may be used in conjunction with a smart device, such as a smart phone 2230, where the phone 2230 is in a first position in close proximity to an Agent (such as in a pocket or holster worn by the Agent). The wand (ancillary position determining device 2234) may be extended out from a handle portion of the wand.

The devices shown as examples may allow a single hand to be used to indicate position and direction. Various other devices that may include transceiver capability may be used in similar manners. A user may have one hand occupied holding a tool or sensor or may be otherwise occupied and can still indicate a desired direction of focus. In the example of a wand (ancillary position determining device 2234), the user may press a button, switch, or engage other activation mechanism, such as a capacitive discharge device on the wand to indicate that the orientation of the wand is at a desired input condition.

Transceiver devices may be operative to employ various methods to improve accuracy of location determination, including but not limited to varying a frequency of transmission and reception of logical communications; varying a pulse pattern transmission and reception of logical communications, and varying intensity of emissions used in transmitting a logical communication.

In some embodiments of the present invention, Agent supported Transceivers and ancillary position determining devices 2231, 2232-2233, 2234 may communicate bursts of logical communications that include timing information. A delay of logical communications between the transmitter and the receiver may be converted to a distance measurement and a combination of a number of such logical communications may be used to triangulate the position. In some examples, the smart phone 2230 and an ancillary position determining device 2231, 2232-2233, 2234 may transmit the timing logical communications which the mounted transceivers receive and process for a distance determination. In other examples, an ancillary position determining device 2231, 2232-2233, 2234 smart phone 2230 may receive logical communications and determine timing delays and associated distances. Results of distance determinations may be communicated to controller, such as processing devices located at a smart device. A suitable controller may be located at one or more of the Transceivers or at a location remote to the Transceivers and connected by a communication network.

There may be many physical properties that may be used to make localization measurements/determinations. In an example of another type of sensing system an Infrared based sensor and camera system may be used to determine localization and orientation.

Figure 23A:
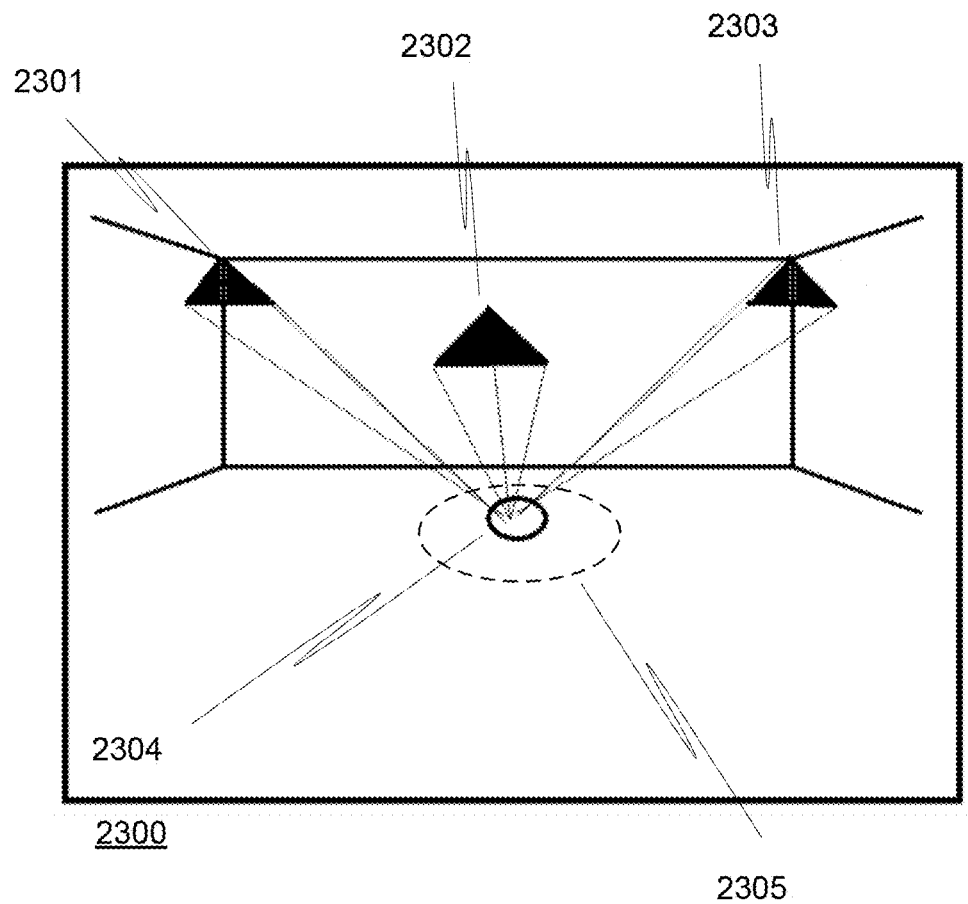
FIG. 23A illustrates wireless communication, including directional Transceivers.

Referring to FIG. 23A, in some embodiments, one or several wireless communications modalities may be operational during a same time period. For example, one or more of UWB; Bluetooth; WiFi; ultrasonic and infrared transmitters may be included in a system in a defined area. The system may include three Reference Point Transceivers 2301-2303 that are positioned to transmit to a portion of the defined area. Some Reference Point Transceivers operate without movement of the Reference Point Transceivers 2301-2303. Additional embodiments may include one or more of the Reference Point Transceivers 2301-2303 sweeping the defined area, or otherwise changing a field of view associated with the respective Reference Point Transceivers 2301-2303. For systems that include Reference Point Transceivers 2301-2303 that change a field of view, a timing sequence may be generated and used to correlate with a logical communication such that the logical communication is associated with both the Reference Point Transceivers 2301-2303 and a particular field of view.

Some particular embodiments will include Reference Point Transceivers 2301-2303 that include one or more infrared cameras, each camera will have a defined field of view. Other directional transceivers may operate similarly.

A Transceiver may be located at a position 2305 and wirelessly communicate with a multitude of the Reference Point Transceivers 2301-2303. As mentioned in reference to FIGS. 17A-17C a user may wear one or more Transceivers that include transmitters, such as infrared emitting LEDs, laser or lights that emanate logical communications; WiFi, UWB; Bluetooth and/or Ultrasonic Transceivers. One or more of the Reference Point Transceivers 2301-2303 receive logical communications transmitted via an Agent supported Transceiver. The infrared transmitters may change intensity, cycle on and off, and/or vary in patterns to enable logical communication, such as information that allows for the extraction of location information. In some examples, Transceivers that include infrared transmitters have calibrated maximum intensities, and the logical communication levels received may be used to determine additional confirming information related to location. Various smart devices and/or position determining devices described herein may include or be equipped with an infrared emission element that may serve as a Transceiver supported by an Agent and used to indicate position and direction orientation.

In some examples, the aspects of FIG. 23A may represent a virtual viewing environment that a user, such as an architect or engineer may be immersed in with a viewing apparatus, such as a Virtual Reality headset. The user may utilize localization and direction orientation aspects of the camera systems to drive the content of a virtual display view plane and a virtual location within a virtual model being displayed. In some examples, a user may be located at a building site configured with a camera system such as illustrated in FIG. 23A while an architect may be located in a separate room configured with a similar camera system as illustrated in FIG. 23A. In some of these examples, the architect may observe the view perspective of the user in the real-world location. In some other examples, the architect may occupy a virtual location and observe, through camera output of the real-world location, both the real-world location, the user in the real-world location and a display of the virtual model.

Figure 23B:
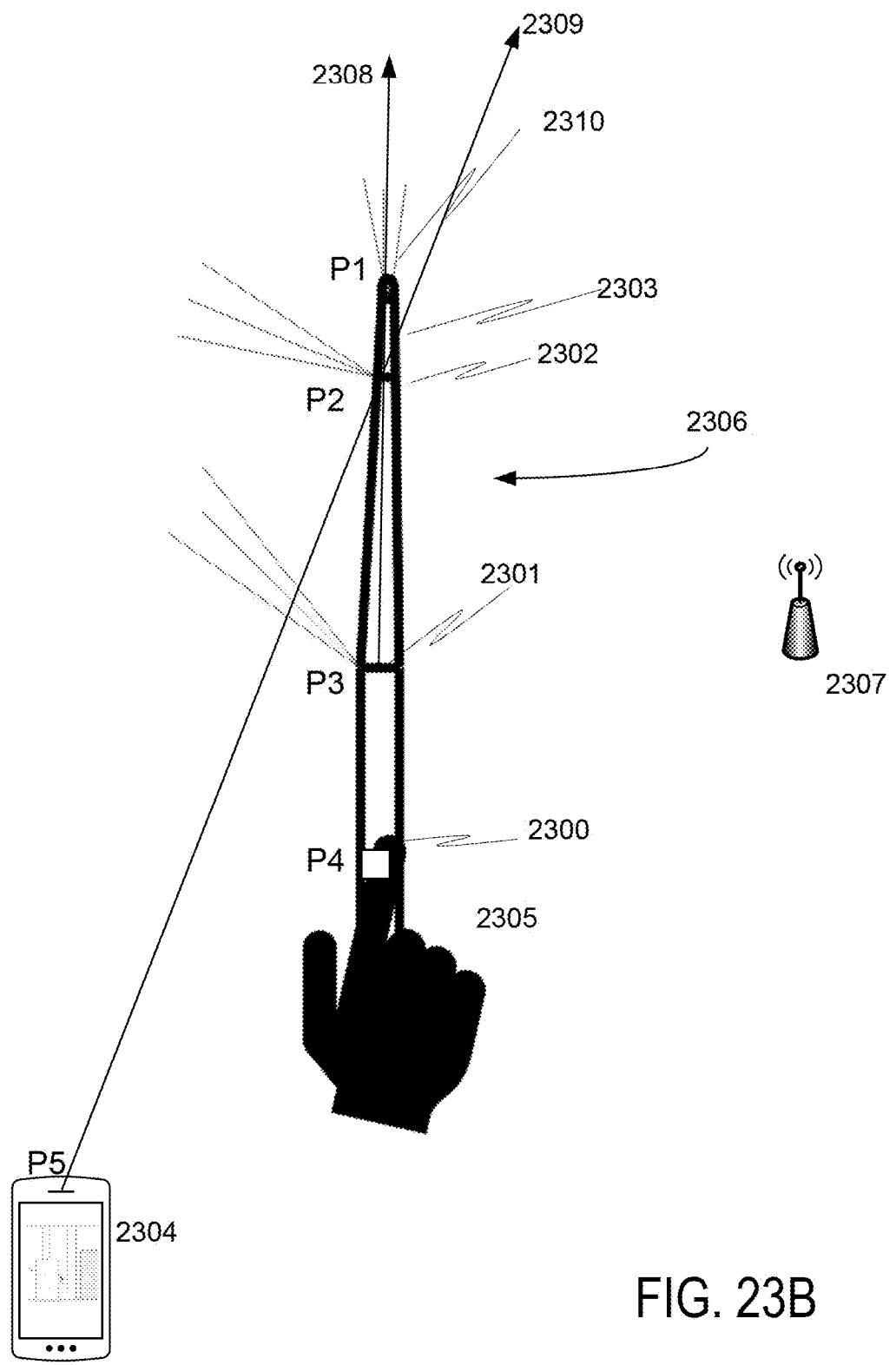
FIG. 23B illustrates an apparatus with Transceivers and generation of a vector.

Referring to FIG. 23B, in some specific embodiments, ancillary position determining devices may include an extension apparatus 2306 supported by an Agent. The extension apparatus 2306 may include, for example, a pointer 2300. The pointer 2300 may include a fixed length of rigid or semi-rigid material, or a telescopic combination of multiple lengths of rigid and/or semi-rigid materials. The pointer 2300 may be configured with areas of one or more wireless transceivers 2301-2303 at various distances from a first point 2310 of the pointer 2300. A location of the first point 2310 may essentially be the tip, or other convenient area.

A second area containing one or more transceivers 2301 and 2302 may be used as indicators that will be detected by directional apparatus, such as an infrared camera. A user may direct a pointer 2300 in a direction of interest and engage an activation mechanism, such as a switch, or engage in a motion to indicate the time to obtain the position and direction orientation. For example, an agent may activate a switch to activate a Transceiver 2301-2303 and partake in logical communication with a Reference Point Transceiver 2307. In some embodiments, the logical communication may be manifested as a pattern of light. A controller may be supplied with the pattern of light transmitted as well as Reference Position information and generate a direction of interest.

According to the methods of the present invention, position points P1-P4 may be generated based upon the logical communications between the Reference Point Transceiver 2307 and the Transceivers 2301-2303 supported by an Agent. A vector 2308 may be generated based upon the position points P1-P4. In addition, a smart device 2304 may also communicate with the Reference Point Transceiver 2307 and a position point P5 associated with the smart device 2304 may be generated.

In some embodiments, a vector 2309 may be generated based upon the position point P5 of the smart device 2304 and a position point P1-P4 generated based upon logical communications with Transceivers 2301-2303 located on or within the extension apparatus 2306.

Figure 23C:
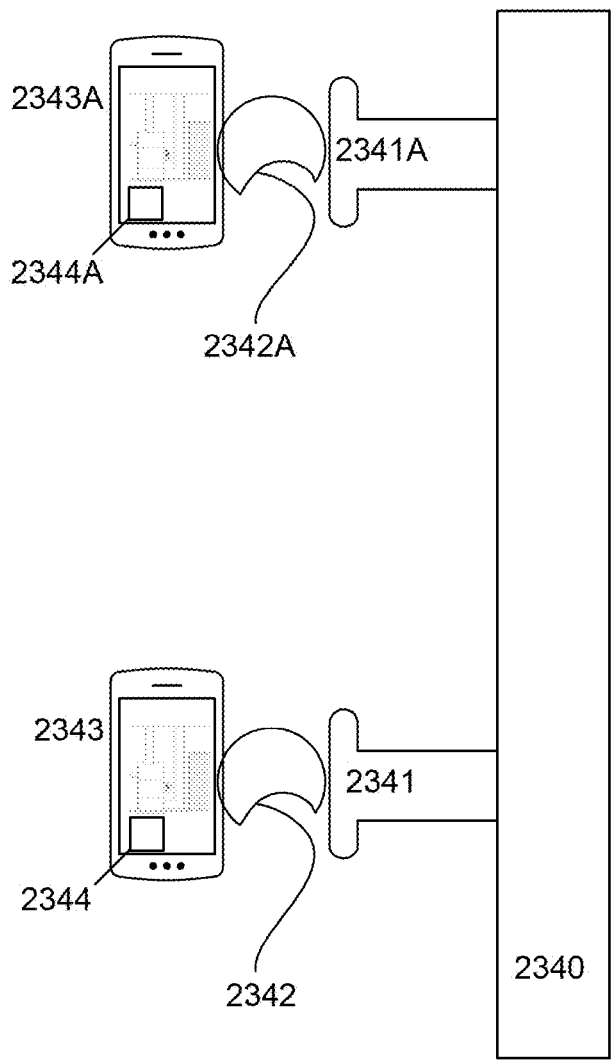
FIG. 23C illustrates an exemplary apparatus for attaching an exemplary accelerometer to a component of a Structure.

Referring now to FIG. 23C as discussed further herein, a sensor that includes a microelectromechanical system (MEMS) accelerometer may be used to track vibration patterns. In some embodiments, a MEMS accelerometer 2344 may be included within a smart device 2343, such as a tablet or a smart phone. Other embodiments include a sensor independent of a smart device. Still other embodiments include a sensor packaged with a controller for executing software specific to the sensor, such as the Fluke™ 3561 FC Vibration Sensor. A structural component 2340 of a structure for which conditions will be monitored with sensors may include a vibration integrator 2341 with an attachment fixture 2342 that establishes vibrational integrity between an accelerometer 2344 in a smart phone 2343 and the structural component 2340. The vibration integrator 2341 may be matched via its shape and material to accurately convey vibrations present in the structural component to the accelerometer 2344 in the smart device 2343. In some embodiments a vibration integrator may include a damper or filter to exclude certain frequencies that may be considered noise to some applications. A damper may be directional such that only vibration frequencies in a particular direction are excluded.

It is understood that an accelerometer 2344 does not need to be incorporated into a smart phone and may be directly fixed to an attachment fixture 2342 or fixed to a vibration integrator 2341 or fixed to a structural component 2340.

Vibrations present in the structural component may be indicative of a state of functioning of equipment included in the structure (not shown in FIG. 22C). For example, a first pattern of vibrations, which may include frequency and/or amplitude and variations of one or both of frequency and amplitude may indicate a proper functioning of a piece of equipment. Patterns of equipment installed in a setting in a structure may be recorded under proper operating conditions to set up an initial proper state of functioning. Patterns derived from a subsequent sensor reading, such as an accelerometer 2344 reading may indicate a variation from the initial pattern of sufficient magnitude to indicate a malfunction or wear present in the equipment.

In some embodiments, a user, such as a service technician, may install an accelerometer into the attachment fixture for the specific purpose of taking an accelerometer reading. A smart phone 2343 may run an app that records a time and place and vibration pattern received. The vibration pattern may be compared with a known set of vibration patterns and a condition of the structured may be ascertained from the comparison. The time date and vibration pattern may be transmitted to a server and aggregated with other sensor readings.

In another aspect, in some embodiments, a second accelerometer 2344A may be used to introduce a vibration pattern into the structural component 2340. The second device may include a second attachment fixture 2342A that establishes vibrational integrity between the second accelerometer 2344A in a second smart device 2343A and a second vibration integrator 2341A. The vibration pattern introduced may include a known frequency and amplitude. In some embodiments, the vibration pattern will include a sequence of frequencies and amplitudes, wherein different frequencies and amplitudes will be effective in diagnosing or otherwise indicating an underlying causation for a pattern of vibration. The second accelerometer 2344A and the first accelerometer 2344 may be synchronized via executable software such that the first accelerometer will detect the vibrations introduced by the second accelerometer 2344A. Any discrepancies between what was introduced by the first accelerometer 2344 and the first accelerometer 2344 may be indicative of a state of the structure.

For example, introduction of a frequency pattern into a beam that is sound may transmit well through the beam and be detected with minimal variations from the frequency pattern that was introduced. However, a beam that is cracked or has rot within it may not convey the frequency pattern to the first accelerometer or convey the frequency pattern with significant distortion and/or diminutions in amplitude.

A history of sensor readings associated with a particular structure and/or group of structures may be stored and referenced to assist in interpreting a cause for a particular vibration pattern.

Vibration sensors may be installed and recorded in as built data or added to a structure in a retrofit. Some commercial sensors (such as the Fluke 3561 FC Vibration Sensor) may be associated with vendor supplied software for ease of retrofit implementation.

According to the present invention, accelerometers or other vibration sensors are deployed in specific locations and tracked in a structure according to the respective sensor location. In addition, a relative position of a particular sensor position is tracked relative to other sensors (vibration sensors or sensors for monitoring different modalities of ambient conditions). The present system includes an AVM that may store and make available to a user and/or to AI applications which structural components are in vibrational communication with a particular sensor. Various sensors include underlying piezoelectric, accelerometers of other technologies.

Embodiments also include a sensor programmed to reside in a lower power states and to periodically "wake itself up" (enter a higher powered state) to take a reading and transmit the reading. Sensor readings may be correlated with different types of wear, damage, failure, or proper operation of components included in a structure. The AVM may track location and may rank a likelihood of a component responsible for a particular vibration pattern detected by a sensor. The ranking may be based upon proximity, mediums available for communicating the vibration pattern (such as a beam traversing a significant portion of a structure, but which provides excellent mechanical communication for the vibration).

Some embodiments also associate a sensor reading of vibration with a type of motion likely to cause such a reading. For example, some readings may include a linear component and a rotational component (such as operation of a washing machine during certain cycles). Patterns of normal and abnormal operation may be recorded and deciphered via programmable software on a controller.

In another aspect, a pattern of sensor data that denotes spikes of linear data may be associated with a human being walking. Overtime, a controller may track sensor reading patterns and associate a particular pattern with the walk of a particular person.

It is also within the scope of the invention to track and analyze a set of data associated with a primary signal and additional sets of data (secondary, tertiary etc.) tracking harmonies of the primary signal. The AVM may also track sets of data associated with simultaneous, and/or closely timed readings received from multiple sensors and associate an amplitude, sequence, delay, or other attribute of the data sets relative to each other to provide input as to a location of a source of the vibration. Additionally, vibration sensors may include an axis within the sensor. For example, two axis and three axis sensors may have a direction of each axis included in the AVM and used in analysis of a vibration pattern.

The present invention also provides simple and fast procedures for the provision of directions of a User or a sensor to a source of vibration based upon analysis of readings of one or more sensors via the X, Y and Z location determination and directional ray or vector generation methods described herein.

Disparate types of sensor may also provide disparate data types that are useful in combination to determine a source of sensor readings. For example, a vibration sensor reading indicating erratic motion may be combined with an increased temperature reading from a sensor proximate to an item of equipment. The combined sensor readings may assist in an analysis of a cause of the sensor readings.

In still another aspect, one or more sensor readings may be correlated to a life expectancy of an item of equipment, such as for example a heating Ventilation and Air Conditioning (HVAC) unit. By way of non-limiting example, an ammeter sensor reading measuring an electrical draw of an HVAC unit may be quantified upon deployment of the unit. The initial readings may function as a baseline of a unit in excellent operational condition. A similar baseline reading may be taken via an accelerometer measuring a vibration generated by the HVAC unit. Still other sensor readings may include airflow, temperature, humidity, or other conditions. Over time, a change in one or more senor reading values may indicate some wear and move the HVAC equipment item into a "normal wear but operational" status.

Still further along a time continuum, one or more sensor readings may indicate a pending failure. For example, a current required to run the unit may be measured by the ammeter sensor and indicate an increased draw in electrical current. Likewise, airflow may decrease, and temperature may increase, and other sensors may provide additional evidence of a pending failure. Finally, a failed unit may generate a very high temperature reading and ammeter readings may increase to a level of sufficient electrical current draw to trip an electrical breaker, thereby indicating a failure.

According to the present invention, any of the sensor readings (or all, or some subset of all sensor readings) may be referenced to generate an alert. Following the alert, remedial action may be taken.

Referring now to FIG. 24A, a method for generating an augmented-reality Radio Target Area for a Smart Device is shown. At step 2401, wireless energy of a first wavelength is received into a wireless receiver. In exemplary embodiments, this step may include receiving image data based on visible light into a sensor of the Smart Device. The wireless energy may be dispersed over a one-, two-, or three-dimensional space in a defined physical area, and may be received into a one-, two-, or three-dimensional array in the receiver. The wireless energy may take the form of electromagnetic radiation, such as light in the human-visible light spectrum (generally having a wavelength between 380 nm-740 nm), ultraviolet light (generally having a wavelength between 10.0 nm-400 nm), or infrared light (generally having a wavelength between 740 nm-2.00 mm) as examples. The set of wireless energy available to the wireless receiver is the Smart Device's Radio Target Area.

The wireless receiver may be a Smart Device sensor, including a CMOS active pixel sensor, a CMOS back illuminated sensors, CCD, or a LIDAR apparatus, including a solid-state/MEMS-based LIDAR. The wireless receiver may comprise an array or other plurality of other wireless receivers. The wireless receiver may be operative to receive the wireless energy into an array of an appropriate dimension for subsequent display (possibly after processing) on the Smart Device. For example, where the wireless receiver is a Sensor, the Sensor may be operative to translate the wireless energy into a two-dimensional array.

At step 2402, a pattern of digital values is generated based upon receipt of wireless energy into the wireless receiver. This pattern of digital values may be based on one or more qualities of the received wireless energy, including its intensity, spatial dispersion, wavelength, or angle of arrival. The pattern may be placed into an appropriate array. For example, if the display of the Smart Device is a two-dimensional display, then the pattern of digital values may comprise a two-dimensional representation of the image data received. In some embodiments, the pattern of digital values may be based on an aggregated set of values from an array of receivers. For example, if the basis of the digital values is the intensity of the wireless energy received into the receiver, then the digital value assigned to a given entry in the array may be based on a weighted average of intensity of wireless energy received at a plurality of the receivers in the array. Optionally, at step 2403, the wireless receiver may receive the wireless energy as an analog signal (for example, if the wireless receiver is a black-and-white sensor or an unfiltered CCD), and convert the analog signal to digital values through filtration or other analog-to-digital conversion. The set of digital values within the Radio Target Area is the Digital Radio Target Area.

With the Smart Device wireless receiver's Radio Target Area determined, the Smart Device's position should be determined as well, along with the positions of any items of interest in a given space. Collectively, the Smart Device and the item of interest may comprise wireless Nodes. Accordingly, at step 2404, coordinates representative of a wireless Node may be determined relative to a base Node. These coordinates way be determined in any appropriate coordinate system (such as Cartesian, polar, spherical polar, or cylindrical polar) and may be determined via RTLS or the orienteering-triangulation methods with various wavelengths or modalities, such as ultra-wideband, Bluetooth, etc. Additionally, the coordinates may be determined using an angle of arrival or angle of departure of a signal to or from the base Node, along with the distance from the base Node. By way of non-limiting example, this could produce a dataset that correlates the coordinates of three elements with the identities of those elements: {(0,0,0), BaseNode; (1,1,1), SmartDevice; (2,2,2), ItemOfInterest}. While this example may be used throughout the following discussion, it is understood to be non-limiting, as a given space may include a plurality of items of interest. Note that, in some embodiments, the Smart Device itself may become a dynamic database entry with a continuously (or periodically) updating set of coordinates. This may be useful in allowing a plurality of Smart Devices engaged with the system at the same time to interact with one another.

At step 2405, the position of the Base Node is determined relative to the defined physical area. In exemplary embodiments, this may include establishing the Base Node as an origin in the coordinate system and determining vectors from the Base Node to boundaries and items of interest (i.e., the distance from the Base Node and the direction from the Base Node to the boundaries and items of interest). In some examples, the Base Node may have an established reference relative to a global coordinate system established.

At step 2406, a Target Area is generated within a controller of the Smart Device. The Target Area may be the set of coordinates (relative to the Base Node) within the Radio Target Area of the wireless receiver. The Target Area may be limited by the physical boundaries of the given space, such as walls, floors, ceilings, occlusions, etc. The Target Area may also be limited by distances that various types of signals may travel. For example, a sensor of audio signals may not be able to practically pickup signals over a background noise level that originate more than 1000 feet from a user position, purely as an example. In such a case, the Target Area for such signal types may be limited to that dimension.

At step 2407, respective positions of one or more wireless Nodes within the Target Area are determined. These positions may be determined relative to the physical Target Area or the Radio Target Area. The determination may be made with reference to the dataset discussed at step 2405, or it may be made dynamically based upon one or more Base Nodes and/or the Radio Target Area. Moreover, the determination may additionally be based on receipt of a wireless signal into the Smart Device from the wireless Node. This signal may indicate a position using the orienteering methods described herein.

At step 2408, a user interface may be generated on the Smart Device based upon the pattern of digital values generated at step 2402. The user interface may comprise a plurality of pixels, wherein each pixel comprises a visible color based upon the pattern of digital values generated at step 2402. For example, if the digital values were based upon receipt of visible light into the wireless receiver (e.g., a sensor), then the display may reflect a reasonably accurate color photograph of the Radio Target Area of the wireless receiver. If the digital values were based upon an intensity of received light from, for example, LIDAR, then the display may reflect a scan of the Radio Target Area. In some embodiments, the pixel may include an intensity of energy received into the receiver. In this way, aspects of the Radio Target Area characterized by an intensity of energy may be emphasized. For example, this may produce a LIDAR relief of an area or a heatmap of an area.

At step 2400, an icon may be generated in the user interface. Preferably the icon will be placed at a position relative to data quantifying received energy levels. In some embodiments, the icon location in a user interface will be indicative of a position of a Tag (Virtual or Physical). This position may be quantified via positional coordinates, such as Cartesian Coordinates, Polar Coordinates, Spherical Coordinates, and the like. The icon may be based upon an input from a user, stored data, quantified environmental conditions or other criteria related to an aspect of the Radio Target Area.

For example, an icon may indicate information about an Item of Interest located at a given set of coordinates within the Radio Target Area or Digital Radio Target Area. In another embodiment, the user may indicate on the display a position in which the user wishes to place an icon and add information about an Item of Interest (thus creating a new entry in the database, which may be populated with the coordinates of the indicated position). Moreover, the icon may change colors based upon the pattern of digital values. The icon may be overlaid on top of the display. The icon may resemble the letter "i", a question mark, a thumbnail, or any other suitable image from a library. In some embodiments, the icon may change depending on one or more attributes of its corresponding database entry. For example, if the icon located at (4,4,4) relates to a restaurant menu, then the icon may resemble the letter "i" or a thumbnail of a menu. On the other hand, if this database entry is modified so that the corresponding database entry is a message, then the icon may update to a picture of an envelope.

In some embodiments, the icon-generation step may be based upon an inquiry to a database that uses the Digital Radio Target Area as an input. For example, upon generation of the Digital Radio Target Area, an associated set of coordinates in one or more dimensions may be generated. This may then be submitted to a database.

In some embodiments, an icon-generation step may be based upon an inquiry to a database that uses the user's position coordinates as an input. In these embodiments, both the Digital Radio Target Area based on an RTA as well as the universal Radio Target Area may be included in an inquiry submitted to the database.

In some examples, the user may have an option to limit or filter the types of database entries that may be queried for, such as in a non-limiting sense, the existence of real-world Tags, virtual Tags, sensor data values and streams from a particular class of sensors and the like.

Continuing with the example from step 2404, the Digital Radio Target Area may comprise the set of coordinates: ([1.5,10], [1.5,10], [1.5,10]). In this example, the database may return information about the Item Of Interest, but not about the Base Node. The Digital Radio Target Area may update when the Smart Device position changes, or by user input, the Digital Radio Target Area may remain static after a certain instance in time.

Figure 24B:
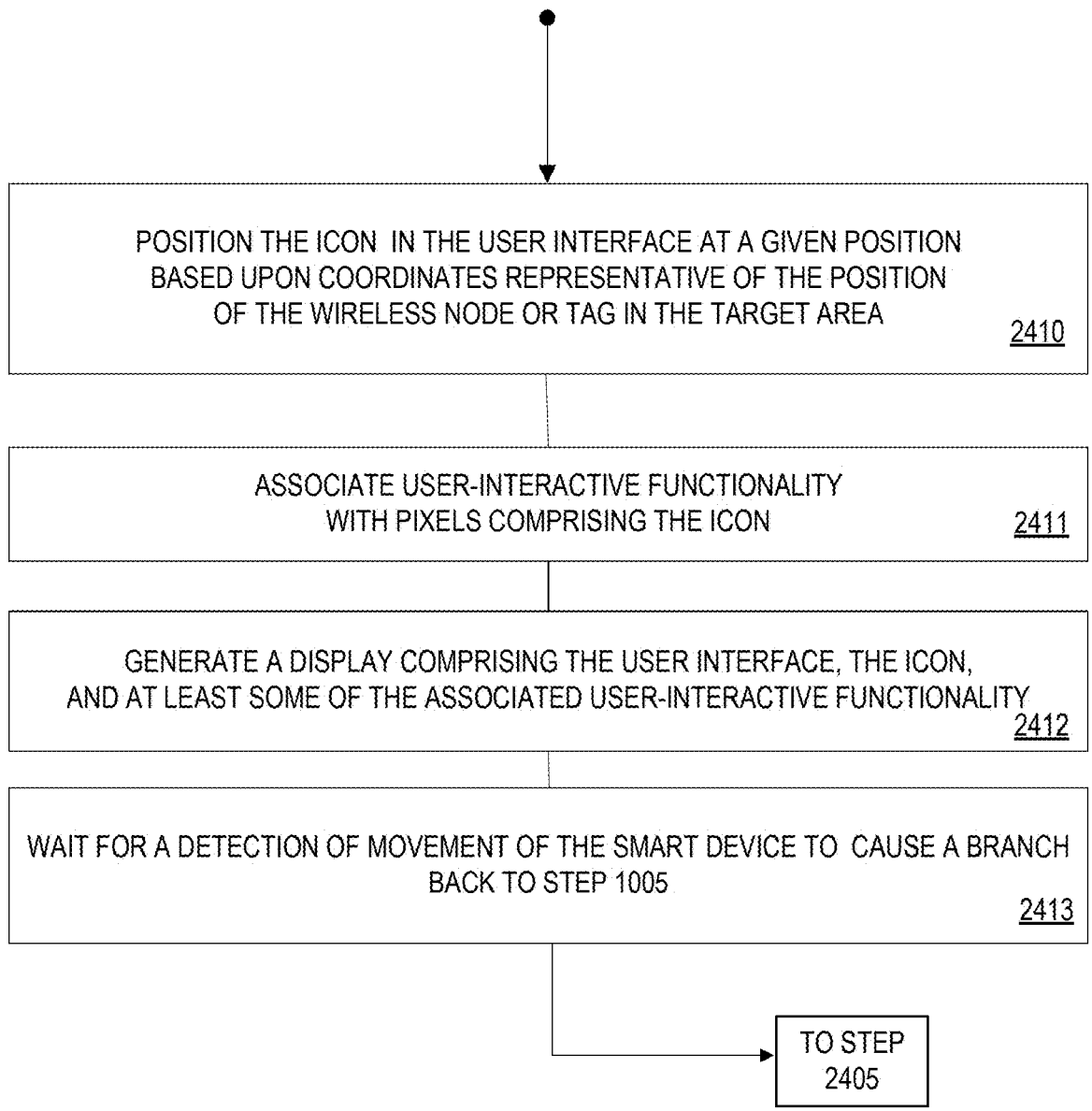

Continuing with FIG. 24B, at step 2410, the icon may be positioned in the user interface at a given position based upon coordinates representative of the position of the wireless Node or Tag in the Target Area. This may comprise a selection of a multitude of pixels related to the position of the wireless Node or Tag and changing those pixels from the digital values determined at step 2402 to a second set of pixels to indicate the presence of an icon. In some embodiments, the icon may be dynamically updated based upon movement of the Smart Device (and, accordingly, the wireless receiver). In some embodiments, the icon may be permanently associated with a set of coordinates. In such embodiments, the icon may be generated whenever a Smart Device with appropriate permissions includes in its Radio Target Area the set of coordinates of Nodes or Tags associated with the icon.

At step 2411, user-interactive functionality may be associated with the pixels comprising the icon. This may allow the user to "select" the icon by means of an input device (e.g., mouse, touchpad, keyboard), touchscreen, digital input, etc. Upon selection, the icon may be operative to interact with the user in one or more ways, including: displaying a message intended for the user (by text, audio, video, hologram, etc.); requesting credentials from the user to verify permissions (e.g., a password), displaying information about an item associated with the icon, prompting the user to update information about an item associated with the icon, etc. The user-interactive functionality may display static information (e.g., dimensions of the item), display dynamic information (e.g., an alarm state or sensor information relating to the item; for example, if the item is a refrigerator, internal temperature may be displayed), or produce a control panel that allows the user to issue control commands (e.g., remotely operating an automated apparatus by resetting an alarm state, taking remedial action based upon a sensor state as described herein, etc.) or to issue menu control commands such as to invoke a different user interface or screen of a user interface.

This may be useful in geospatial applications, or in procedurally generated activities. For example, a first user may generate a positional designation on a user interactive device, such as, for example, an augmented-reality display to leave a narrative, icon or other input associated with the first use. Additionally, the same or another user may log positional coordinates and upload an image that could be displayed submitting a database query including those coordinates. Entry of the coordinates and essential credentials may provide access to the content associated with the positional coordinates.

At step 2412, the preceding steps may be integrated by generating a display comprising the user interface, the icon, and at least some of the associated user-interactive functionality. In embodiments, in which a plurality of Smart Devices are themselves part of the database, this may allow various users to send messages, images, etc. to each other.

At step 2413, detection of movement of the Smart device may cause a branch back to step 2405. Based upon that movement of the Smart Device, a defined physical area from which wireless energy is received (i.e., the Radio Target Area based upon the Target Area) may be changed. The movement may be detected using input from wireless communications, magnetic field sensors, an accelerometer, feature-recognition software, or other similar apparatus and algorithms. In other examples, the position of the Smart Device may be dynamically obtained using any of the techniques of position determination, such as triangulation with reference nodes. Here, too, a change of position detected in this manner may cause a branch back to step 2405. The Target Area may be based upon the position of the Base Node, the relative positions of the wireless Nodes, and the Smart Device.

Figure 25:
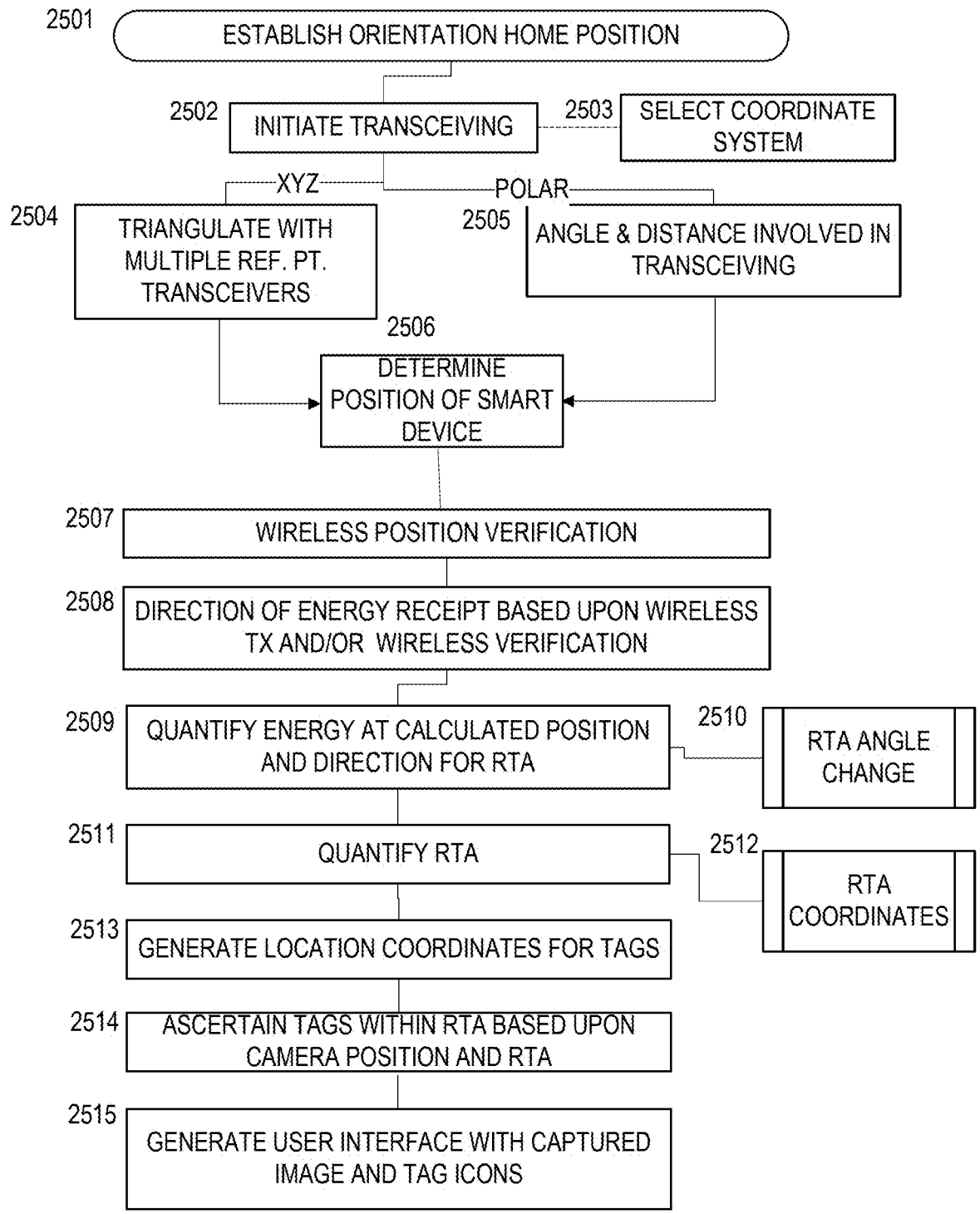
FIG. 25 illustrates an additional exemplary method for displaying Radio Target Areas with Smart Devices.

Referring to FIG. 25, an illustration of alternative methods for display of information relating to RTA is provided. At the beginning of the process, a system of components which may include a smart device with a user of the smart device may be established. Amongst the various components a Home Position may be established for all the components at step 2501. The system may proceed by establishing and initiating transceiving of data and information at step 2502.

In some examples, the user may be prompted to choose a desired coordinate system for the display at step 2503. In other examples, a user interface of the system may have a setpoint function which the user may invoke to gain access to user settable parameters which may include they type of coordinate system to use, such as for example Cartesian or spherical coordinates.

In still further examples, the system may decide to default to a particular coordinate system depending on the nature of the type of data its positional reference devices may be obtaining or providing.

At step 2504, if the coordinate system was chosen as Cartesian coordinates, the system may utilize triangulation amongst multiple reference point transceivers. Alternatively, if the coordinate system was chosen as polar coordinates, at step 2505, the system may be operative to execute software and reference positioning devices that utilize angles and distances involved in transceiving and location.

In either case, at step 2506, the position of a Sensor attached to the smart device of the user may be determined. In some examples, the system may have multiple and redundant location determination systems. A combination of such position determinations may result in superior accuracy of an aggregated position result. Accordingly, at optional step 2507, a wireless position determination may be performed with the smart device to establish a verification of the position of the Smart Device and the Sensor attached. Referring now to step 2508, a direction that the sensor is facing in may be determined. Although there may be a number of different manners of determining orientation as have been described herein, in an example, the orientation may be determined based upon wireless transmission and/or wireless verification.

Referring now to step 2509, an energy-receiving Sensor included in the Smart Device or in logical communication with the Smart Device may be used to quantify energy levels perceivable at the position and in the direction of the Smart Device. The resulting quantification may depend on aspects of the Sensor device, but the resulting data will quantify a characteristic for the RTA.

In some embodiments, an optional step 2510 may be performed by an element of the system such as the smart device or a server in communication with the Smart Device. The element of the system may compare one or more of position information, orientation information and the image data itself to calculate an estimate of whether the RTA angle has changed for the sensing element.

In general, at step 2511, the RTA of the Sensor device used to capture the image in step 1209 may be quantified. In an optional step 2512, coordinates relating to the instant RTA of the image may be established. In some examples, this may relate to a range of three-dimensional coordinates that are addressed by the RTA of the Sensor element. In general, at step 2513, the system may look up, or in some cases generate, location coordinates for Tags that are determined to be within the quantified RTA. In some database systems that the system may have access to, real-world or virtual-world tags may be tracked in a coordinate system with a certain origin.

If the current origin established at step 2501 is offset from a particular database related origin, then one or both the coordinate system values may be converted to each other to align their respective origins. At step 2514, the Tags in an aligned coordinate system may have their positions compared to the current RTA and a selection for the set of Tags that are within the RTA may be made.

In some alternative examples, a display of all Tags that are authorized for access to the user regardless of whether they are in the RTA may be made using associated aligned coordinates as discussed in reference to step 2513.

Referring now to step 2515, in an example, the Smart Device of the user may be used to generate and display a user interface to the user based upon the captured image and the associated tag icons within the RTA. These associated Tag icons may have at least the hardware and be operative to perform the functionality as has been discussed herein.

Figure 26A:
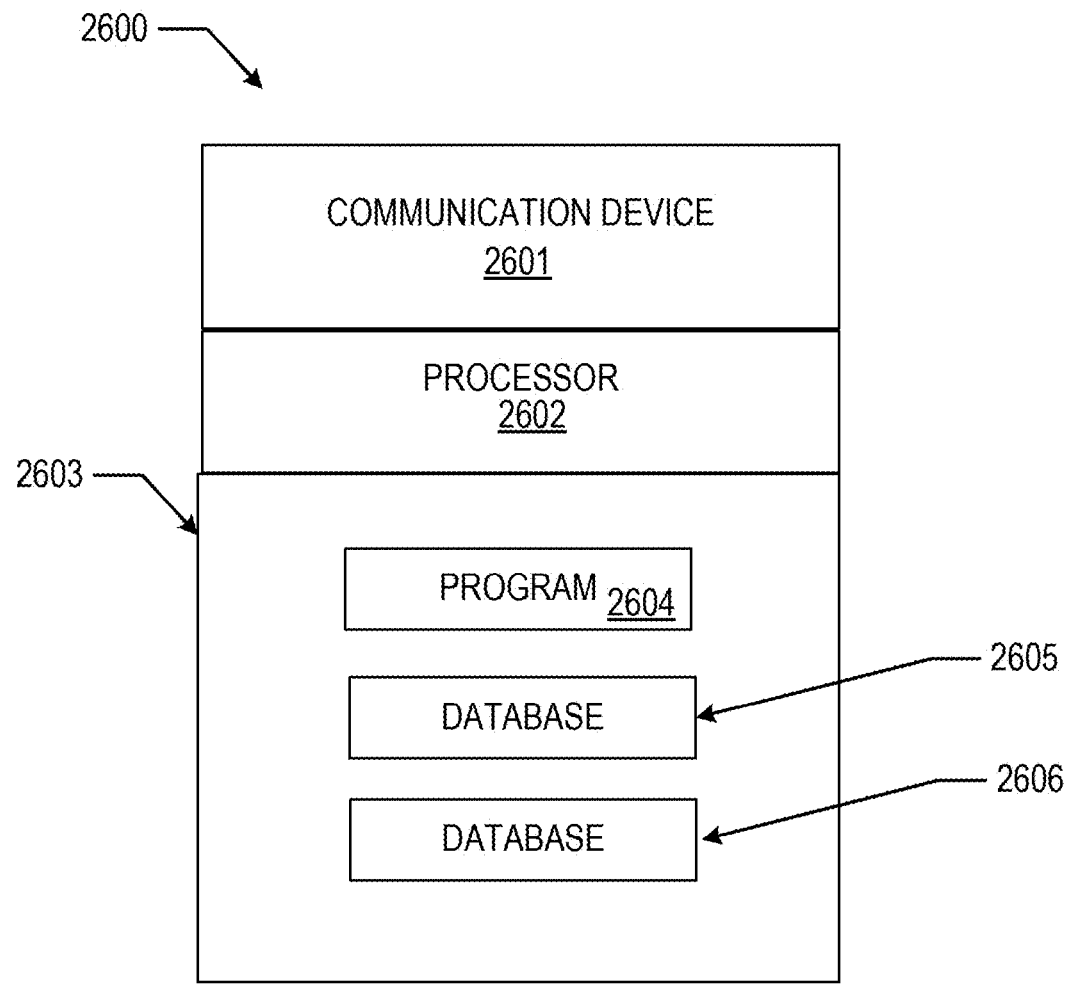
FIG. 26A illustrates apparatus that may be used to implement aspects of the present invention including executable software.

Referring now to FIG. 26A, an automated controller is illustrated that may be used to implement various aspects of the present invention in various embodiments, and for various aspects of the present invention. Controller 2600 may be included in one or more of: a wireless tablet or handheld smart device, a server, an integrated circuit incorporated into a Node, appliance, equipment item, machinery, or other automation. The controller 2600 includes a processor unit 2002, such as one or more semiconductor based processors, coupled to a communication device 2601 configured to communicate via a communication network (not shown in FIG. 26A). The communication device 2601 may be used to communicate, for example, with one or more online devices, such as a smart device, a Node, personal computer, laptop, or a handheld device.

The processor unit 2602 is also in communication with a storage device 2603. The storage device 2603 may comprise any appropriate information storage device, including combinations of digital storage devices (e.g., an SSD), optical storage devices, and/or semiconductor memory devices such as Random Access Memory (RAM) devices and Read Only Memory (ROM) devices.

The storage device 2603 can store a software program 2604 with executable logic for controlling the processor unit 2602. The processor unit 2602 performs instructions of the software program 2604, and thereby operates in accordance with the present invention. The processor unit 2602 may also cause the communication device 2601 to transmit information, including, in some instances, timing transmissions, digital data and control commands to operate apparatus to implement the processes described above. The storage device 2603 can additionally store related data in a database 2605 and database 2606, as needed.

Figure 26B:
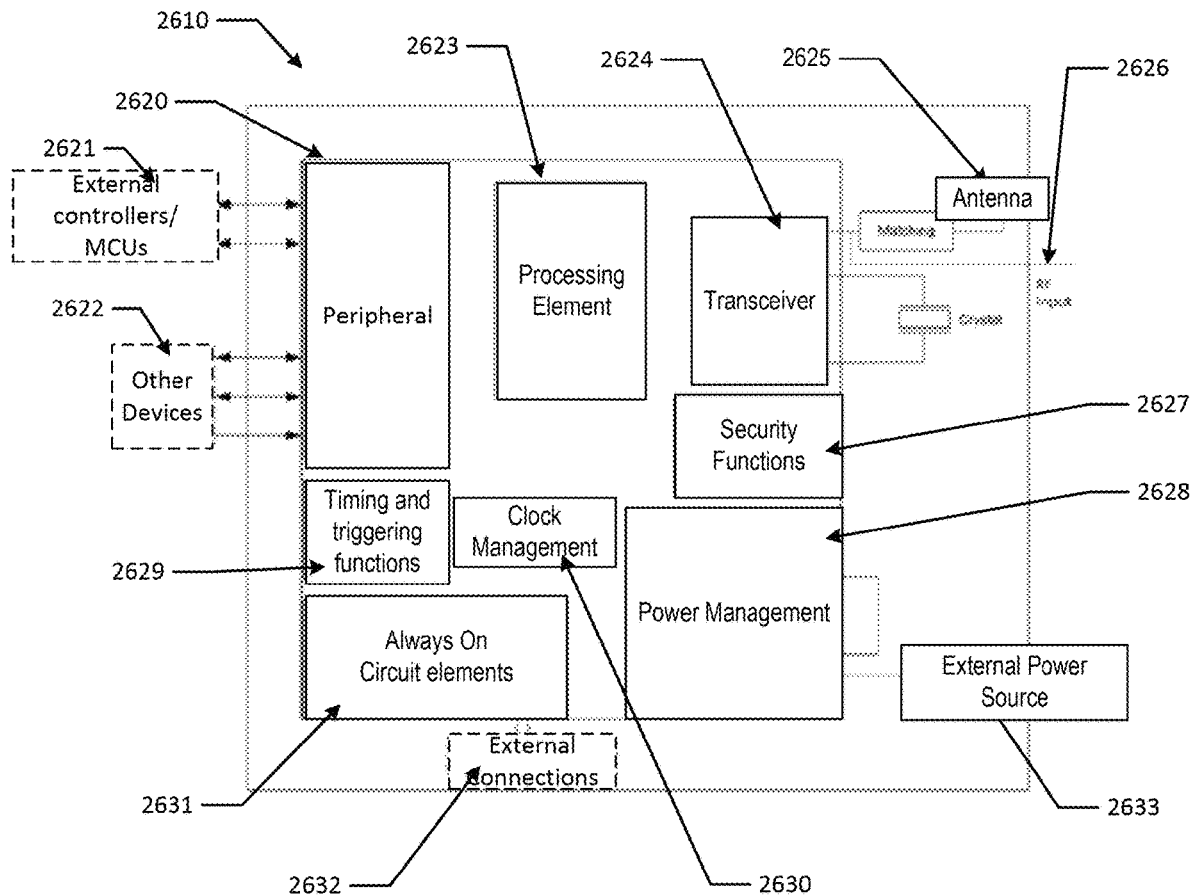
FIG. 26B illustrates an exemplary block diagram of a controller with angle of arrival and angle of departure functionality.

Referring now to FIG. 26B, an illustration of an exemplary wireless Node (transceiver module 2610) configured with a transceiver 2624 to wirelessly communicate via one or more wireless communication Modalities, including a bandwidth and protocol, such as the Bluetooth 5.1; BLE5.1; Wi-Fi RT and/or GPS standard is illustrated. As discussed, many different Modalities of wireless technology may be utilized with the content presented herein, but a BLE5.1 "radio" module is an interesting example since its standards provide for angle of arrival (AoA) capability as well as angle of departure (AoD) and a distance determination based upon a timing signal. With AoA/AoD a designed antenna array 2625 can be used by a transceiver 2624 to measure a phase shift amongst multiple antenna elements to estimate distance differences between the antennas and to extract an angle from the antenna array to the source of radiation. A BLE5.1-consistent multichip transceiver 2624 may include circuitry and software code to perform the acquisition of data and determine the angle of arrival in some examples. In other examples, a BLE5.1-consistent multichip transceiver 2024 may control the acquisition of data from an antenna array while streaming the data to off module processing capabilities. The BLE5.1-consistent Node 2610 may contain functional blocks of circuitry for peripheral 2620 control. The peripherals may include a connection to external host controllers/MCUs 2621. The peripheral 2620 control may also interact with peripheral and IoT Sensors and other devices 2622.

The BLE5.1-consistent Node 2610 may include a processing element 2624 which may have its own memory of different types as well as capabilities for encryption of data. The BLE5.1 consistent Node (transceiver module 2610) may also have Transceiver 2624. This circuitry may include Baseband and RF functions as well as control the AoA functions and the self-verifying array functions. The Bluetooth transceiver 2624 may receive signals through an on-module antenna 2625 or an external antenna or array of antennas may provide external RF input 2626. The BLE5.1-consistent Node 2610 may include functional circuitry blocks for control of Security functions 2627, crypto-generations, random number generation and the like. The BLE5.1-consistent Node 2610 may include functional blocks for power management 2628.

The BLE5.1-consistent Node 2610 may be operative for quantification of temperature aspects of the Node (transceiver module 2610), battery-control functions and power-conversion functions. An external power source 2633 may be included to provide electrical energy to a power management unit 2628 which, in some examples, may be from a battery unit, or a grid connected power supply source in other examples. The BLE5.1-consistent Node 2610 may include functions for control of timing and triggering 2629. In a related sense, the BLE5.1-consistent Node 2610 may include functions for clock management 2630 within the module. The BLE5.1-consistent Node 2610 may also include circuit elements that are always-on 2631 to allow external connections 2632 to interact with the device and perhaps awake it from a dormant state. There may also be other customized and/or generic functions that are included in a BLE5.1-consistent Node 2610 and/or multichip module.

In some embodiments, functionality performed by a Node (transceiver module 2610) may be executed via interaction with one or more external controller and/or MCU 2621.

Figure 26C:
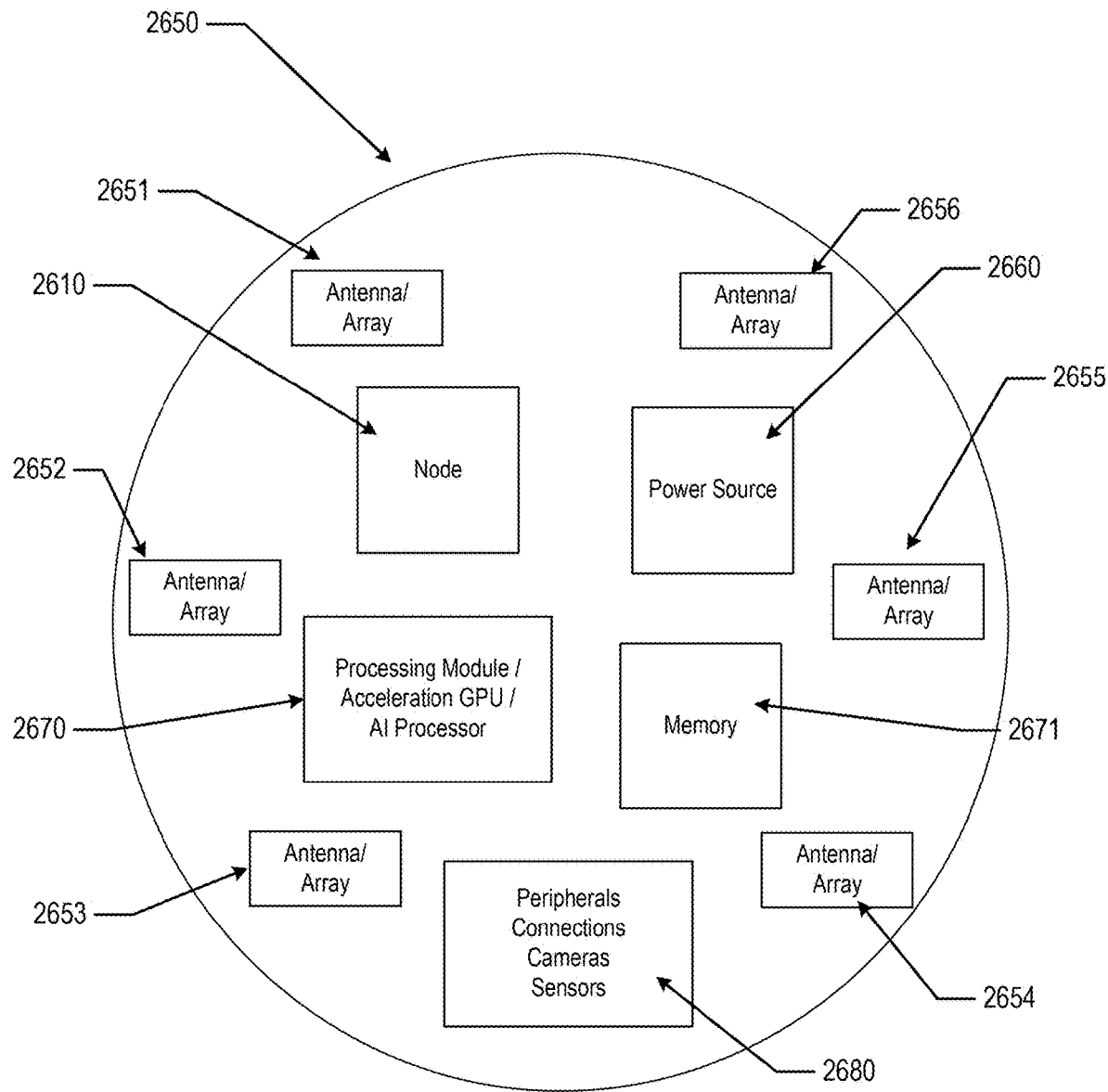
FIG. 26C illustrates exemplary block diagram of an assembly with multiple antenna arrays such as a "puck."

Referring now to FIG. 26C, a Node 2650 included in a higher order deployment assembly is illustrated. A deployment Node 2650 may be in logical communication with one or more of sensors, customized control commands, antenna array designs and the like.

A Node 2650 may include multiple antennas or antenna arrays 2651-2656. As described previously, the Node 2650 may include a transceiver module 2610, and in some examples, the transceiver module may include Bluetooth-adherent aspects. Communications received via an antenna 2651-2656 may be directly ported into the transceiver module 2610. Embodiments may also include routing particular antenna/antenna array outputs to the transceiver module 2610 in a controlled and timed sequence. A processing Module 2670 may coordinate a connection of the Node 2650 to external peripherals.

In some examples, circuitry 2680 to logically communicate with one or more of: a Peripheral, a data Connection, Cameras and Sensors controllers, and components to perform data and image acquisition of various kinds, or it may interface external components with the Node 2650.

The Node 2650 may also include its own power management unit 2660 which may take connected power or battery power or both and use it to prove the various power needs of the components of the assembly. The Node 2650 may have its own processing modules 2670 or collections of different types of processing functions which may have dedicated memory components 2671. In some examples, specialized processing chips of various kinds such as Graphical Processing Units and fast mathematics function calculators as well as dedicated artificial intelligence processing chips may be included to allow the Node 2650 to perform various computational functions including location determination of wirelessly connected devices amongst other functions. There may be numerous other functions to include in a Node 2650 and alternative types of devices to perform the functions presented herein.

Figure 26D:
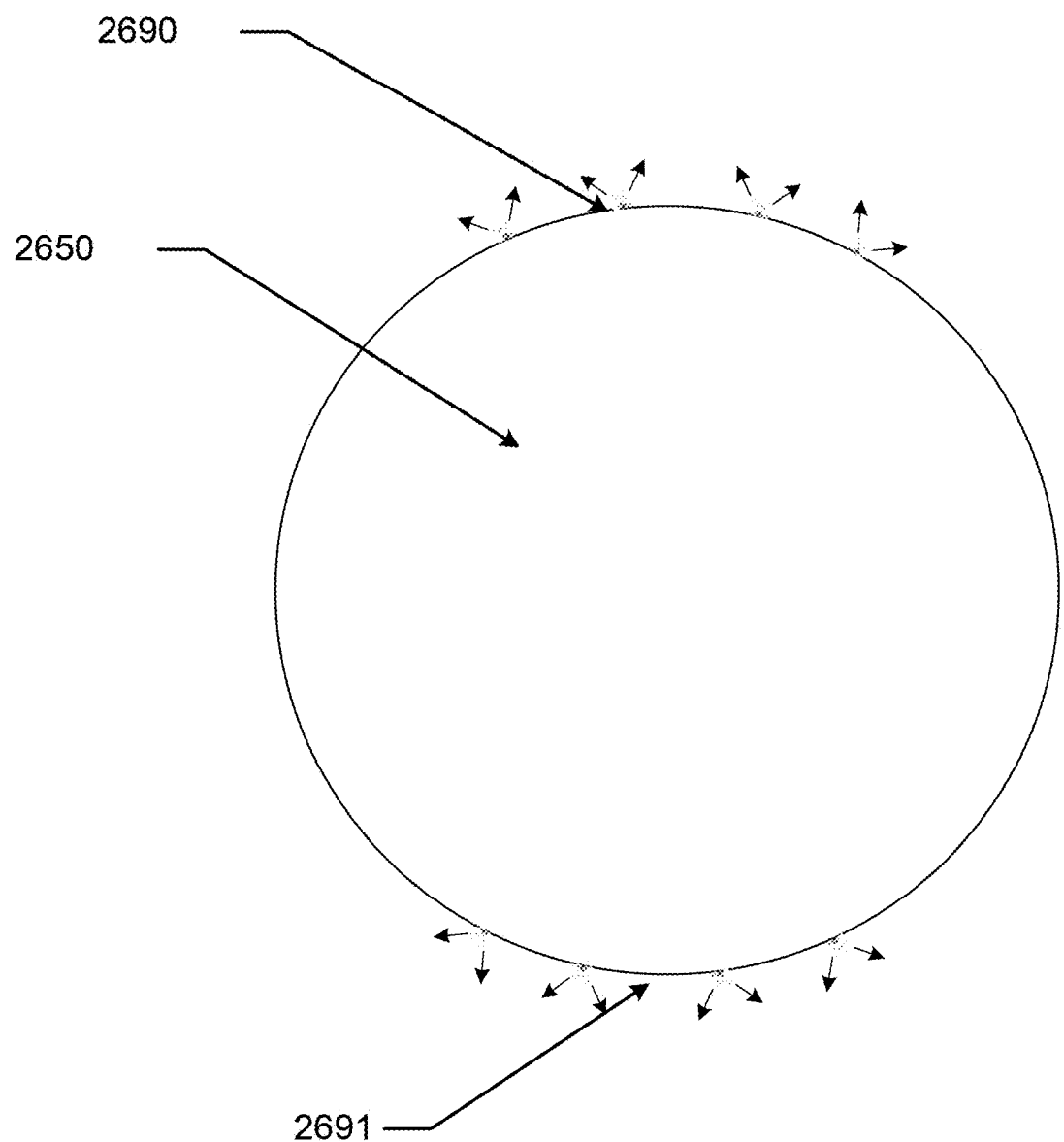
FIG. 26D illustrates another view of a puck with directional antenna arrays.

In some examples as illustrated in FIG. 26D antenna arrays 2690, 2691 may be assembled into a "Puck" shown as Node 2650 wherein the antenna arrays are configured with antenna designs which have directional aspects to them. Directional aspects may mean that the antennas may be sensitive to incident radiation coming from a certain direction but not sensitive to radiation coming from a different direction. Antenna arrays 2690, 2691 may include antennas that may have maximized signals for a particular incident waveform, the identification of which antenna may provide or supplement angle of incidence calculations.

A directional antenna may include, for example, an antenna with RF shielding over some portion of an antenna's circumference. For example, 270° (or some other subset of a 360° circumference of an antenna), or an antenna array may have RF shielding to block and/or reflect back an RF signal towards the antenna-receiving portion. Other directional antennas may include a shield blocking less than 360° of RF transmissions that rotates around a receiving portion of an antenna and only receives RF communications from a direction of an opening in the shield. Shielded antennas may provide improved determination of a direction from which a wireless transmission is being received from, since RF noise is blocked from a significant portion of a reception sphere.

Figure 27:
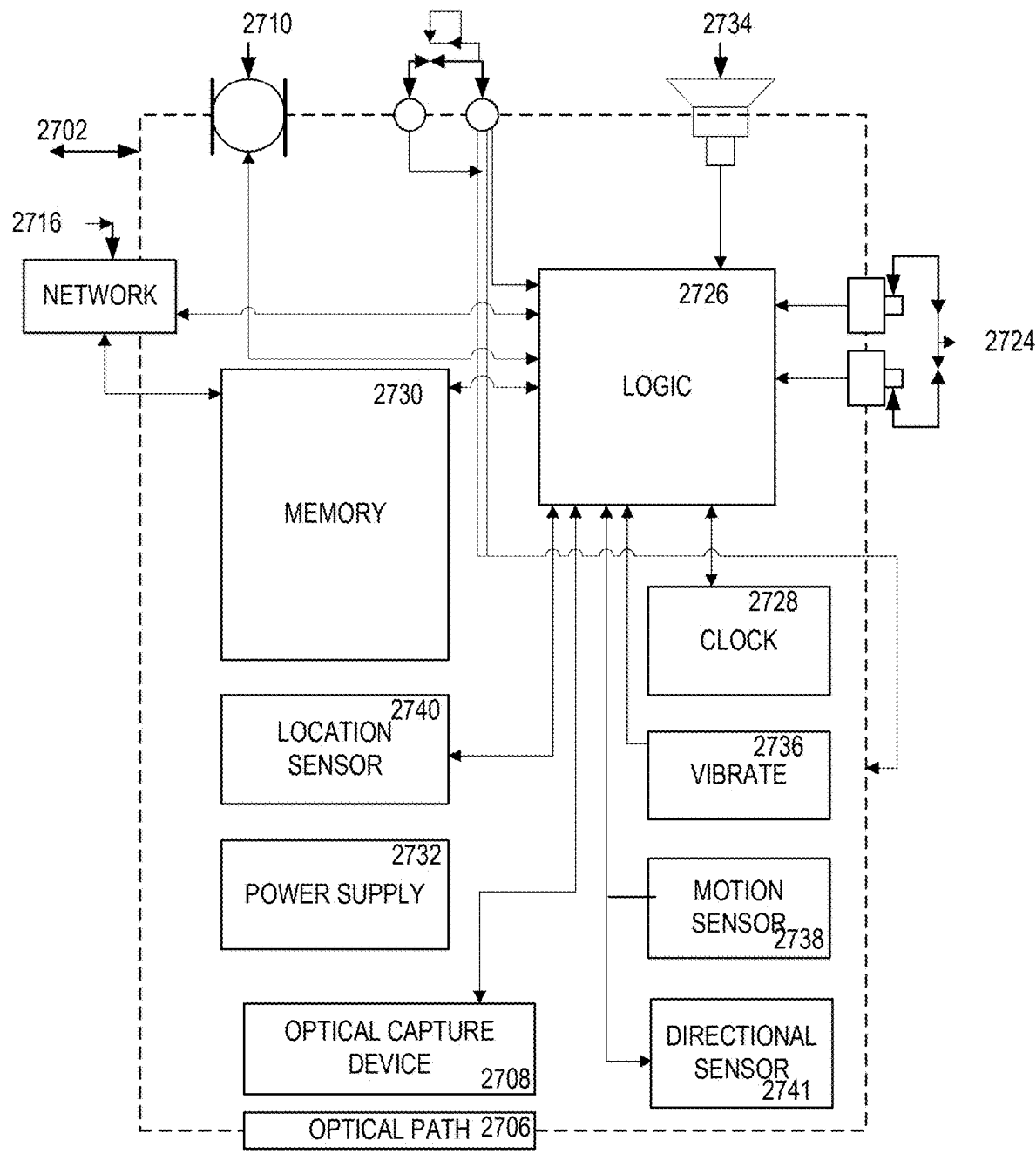
FIG. 27 illustrates an exemplary handheld device that may be used to implement aspects of the present disclosure including executable software.

Referring now to FIG. 27, a block diagram of an exemplary Smart Device 2702 is shown. Smart Device 2702 comprises an optical capture device 2708 to capture an image and convert it to machine-compatible data, and an optical path 2706, typically a lens, an aperture, or an image conduit to convey the image from the rendered document to the optical capture device 2708. The optical capture device 2708 may incorporate a CCD, a Complementary Metal Oxide Semiconductor (CMOS) imaging device, or an optical Sensor 2724 of another type.

A microphone 2710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 2734 may come from a loudspeaker or other audio transducer. Tactile feedback may come from a vibrate module 2736.

A magnetic force sensor 2737 such as a Hall Effect Sensor, solid state device, MEMS device or other silicon based or micro-electronic apparatus.

A motion Sensor 2738 and associated circuitry converts motion of the smart device 2702 into a digital value or other machine-compatible signals. The motion Sensor 2738 may comprise an accelerometer that may be used to sense measurable physical acceleration, orientation, vibration, and other movements. In some embodiments, motion Sensor 2738 may include a gyroscope or other device to sense different motions.

A location Sensor 2740 and associated circuitry may be used to determine the location of the device. The location Sensor 2740 may detect Global Position System (GPS) radio signals from satellites or may also use assisted GPS where the mobile device may use a cellular network to decrease the time necessary to determine location. In some embodiments, the location Sensor 2740 may use radio waves to determine the distance from known radio sources such as cellular towers to determine the location of the smart device 2702. In some embodiments these radio signals may be used in addition to GPS.

Smart Device 2702 comprises logic 2726 to interact with the various other components, possibly processing the received signals into different formats and/or interpretations. Logic 2726 may be operable to read and write data and program instructions stored in associated storage or memory 2730 such as RAM, ROM, flash, SSD, or other suitable memory. It may read a time signal from the clock unit 2728. In some embodiments, Smart Device 2702 may have an on-board power supply 2732. In other embodiments, Smart Device 2702 may be powered from a tethered connection to another device or power source.

Smart Device 2702 also includes a network interface 2716 to communicate data to a network and/or an associated computing device. Network interface 2710 may provide two-way data communication. For example, network interface 2716 may operate according to the internet protocol. As another example, network interface 2716 may be a local area network (LAN) card allowing a data communication connection to a compatible LAN. As another example, network interface 2716 may be a cellular antenna and associated circuitry which may allow the mobile device to communicate over standard wireless data communication networks. In some implementations, network interface 2716 may include a Universal Serial Bus (USB) to supply power or transmit data. In some embodiments, other wireless links may also be implemented.

As an example of one use of Smart Device 2702, a reader may scan some coded information from a location marker in a facility with Smart Device 2702. The coded information may include for example, a hash code, bar code, RFID, or other data storage device. In some embodiments, the scan may include a bit-mapped image via the optical capture device 2708. Logic 2726 causes the bit-mapped image to be stored in memory 2730 with an associated time-stamp read from the clock unit 2728. Logic 2726 may also perform optical character recognition (OCR) or other post-scan processing on the bit-mapped image to convert it to text. Logic 2726 may optionally extract a signature from the image, for example by performing a convolution-like process to locate repeating occurrences of characters, symbols, or objects, and determine the distance or number of other characters, symbols, or objects between these repeated elements. The reader may then upload the bit-mapped image (or text or other signature if post-scan processing has been performed by logic 2726) to an associated computer via network interface 2716.

As an example of another use of Smart Device 2702, a reader may recite words to create an audio file by using microphone 2710 as an acoustic capture port. Logic 2726 causes audio file to be stored in memory 2730. Logic 2726 may also perform voice recognition or other post-scan processing on the audio file to convert it to text. As above, the reader may then upload the audio file (or text produced by post-scan processing performed by logic 2726) to an associated computer via network interface 2716.

A directional sensor 2741 may also be incorporated into Smart Device 2702. The directional device may be a compass and be based upon a magnetic reading or based upon network settings. The magnetic sensor may include three axes of magnetic sensitive elements and may also be coupled with an accelerometer in the directional sensor 2741.

A LiDAR sensing system 2751 may also be incorporated into Smart Device 2702. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of Smart Device 2702. Aspects relating to capturing data with LiDAR and comparing it to a library of stored data (which may be obtained at multiple angles to improve accuracy) are discussed above.

Physical world and virtual-world based imagery related to the environment of a user may be presented via a user interface that may display on a Smart Device screen or other interactive mechanism, or in some embodiments, be presented in an augmented of virtual environment, such as via a VR or AR headset. The imagery displayed upon these devices may represent a composite of image data reflective of a real-world data stream as well as digitally added/superimposed image data from a virtual or digital source data stream. A user may be presented with a typical image as it would look to the user's eyes physically, upon which digital shapes representing virtual "Tags" may be superimposed to represent the presence of digital information that may be accessed by a user. In other examples, the digital information may be directly displayed as a superposition. In some examples, the real-world and virtual-world environments may be displayed separately on a screen or separately in time.

In some examples, the "physical world image" may also be digitally formed or altered. For example, an imaging device may obtain images where the sensing elements of the imaging device are sensitive to a different frequency of electromagnetic radiation, such as in a non-limiting sense infrared radiation. The associated "real-world image" may be a color scale representation of the images obtained in the infrared spectrum. In still further examples, two different real-world images may be superimposed upon each other with or without additional virtual elements. Thus, a sensor image may have an IR sensor image superimposed over part or all of the image and a digital shape representing a virtual Tag may be superimposed.

In some implementations, a virtual reality headset may be worn by a user to provide an immersive experience from a vantage point such that the user may experience a virtual representation of what it would be like to be located at the vantage point within an environment at a specified point in time. The virtual representation may include a combination of simulated imagery, textual data, animations and the like and may be based on scans, image acquisition and other Sensor inputs, as examples. A virtual representation may therefore include a virtual representation of image data via the visual light spectrum, image data representing image scans obtained via infrared light spectrum, noise, and vibration reenactment. Although some specific types of exemplary sensor data have been described, the descriptions are not meant to be limiting unless specifically claimed as a limitation and it is within the scope of this disclosure to include a virtual representation based upon other types of captured sensor data may also be included in the AVM virtual reality representation.

It should be noted that although a Smart Device is generally operated by a human Agent, some embodiments of the present disclosure include a controller, accelerometer, data storage medium, Image Capture Device, such as a CCD capture device and/or an infrared capture device being available in an Agent that is an unmanned vehicle, including for example an unmanned ground vehicle ("UGV") such as a unit with wheels or tracks for mobility and a radio control unit for communication, or an unmanned aerial vehicle ("UAV") or other automation.

In some embodiments, multiple unmanned vehicles may capture data in a synchronized fashion to add depth to the image capture and/or a three-dimensional and four-dimensional (over time) aspect to the captured data. In some implementations, UAV position may be contained within a perimeter and the perimeter may have multiple reference points to help each UAV (or other unmanned vehicle) determine a position in relation to static features of a building within which it is operating and also in relation to other unmanned vehicles. Still other aspects include unmanned vehicles that may not only capture data, but also function to perform a task, such as paint a wall, drill a hole, cut along a defined path, or other function. As stated throughout this disclosure, the captured data may be incorporated into a virtual model of a space or Structure.

Figure 28A:
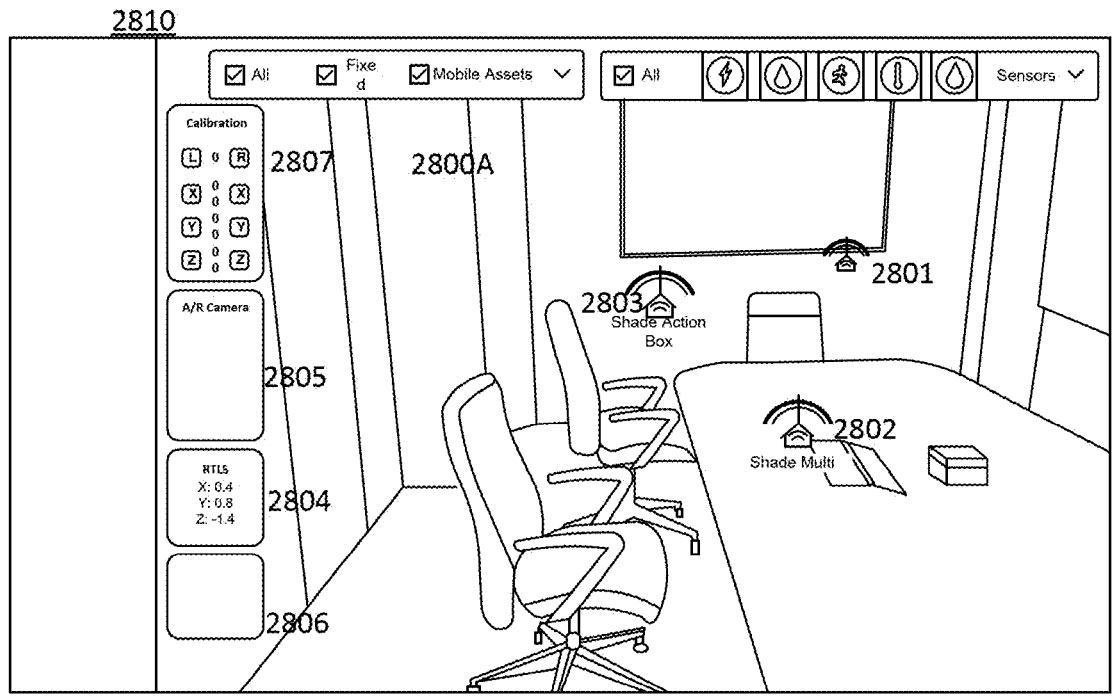
FIGS. 28A-28D illustrate a physical area and an augmented reality interface associated with the physical area.

Referring now to FIG. 28A, an A/R interface 2810 is shown with a physical world environment image 2800A displayed on a smart device screen. The physical world environment image 2800A may be updated on an interval basis, such as at video camera speed, or as a still image. Integrated into the physical world environment image 2800A are user interactive areas, illustrated in FIG. 28A as interactive icons 2801-2803 representing one or both of Virtual Tags (associated with icon 2801), and Physical Tags (associated with icons 2802-2803).

As presented in FIG. 28A, the Virtual Tag icon 2801 is not associated with a physical tag transceiver or other transceiver, and is associated with location coordinates. A Virtual Tag (such as the virtual tag associated with icon 2801) may include one or more of: contain digital content, link to digital content, poll data from an IoT sensor, receiving storage for digital content, and distribution channel for digital content. IoT sensors may include stand-alone sensors or sensors integrated into a device or equipment item. Exemplary sensors those included in a Shade Multi-Sensor aggregation co-located with Physical Tag 2802, and sensors in a Shade Action Sensor aggregation co-located with Physical Tag 2802.

A/R interfaces according to the present invention thereby create a reciprocal relationship of a user or other Agent with its environment, including a real time view of the physical world that is augmented with the power of the cyber world. The power of the cyber world may include one or more of: IoT sensing capabilities that far exceed those of human sensory capabilities; location specific data (or other digital content) storage; location specific data (or other digital content) access; location tracking of Agents and/or equipment items; condition tracking of Agents, structures, or equipment items; location specific ecommerce; and almost any functionality available via a distributed network. Such as the Internet.

Additional non-limiting exemplary aspects of an A/R interface according to the present invention include one or more of: an interactive portion indicating RTLS coordinates of a Tag 2804; RTLS coordinates of an image capture device, such as a CCD camera 2805; bearings of the image capture device (or other environment mapping device, such a laser device, a sonic device etc.) 2806; and calibration controls 2807.

Figure 28B:
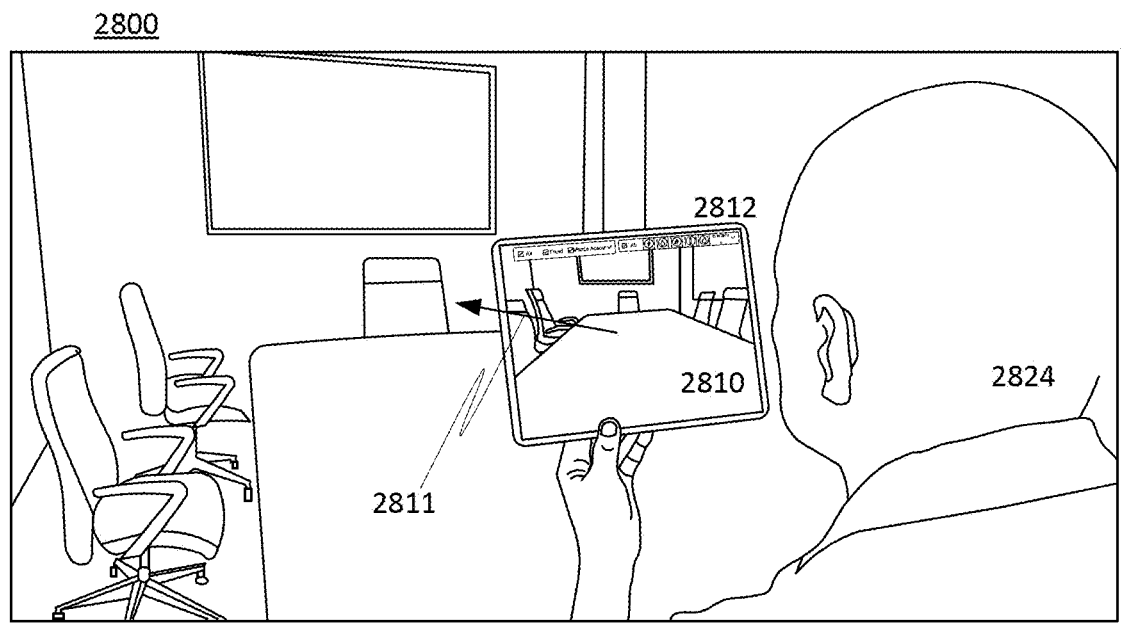

Referring now to FIG. 28B, a smart device 2812 (in this example an Apple iPad) is supported with an image capture device included in the smart device 2812 directed in a direction of interest 2811. The smart device 2812 is positioned in a physical world environment 2800, and includes an A/R interface 2810 which may include an image of the physical world environment 2800A.

According to the present invention, an additional layer of security may be provided by requiring that a user 2824 or other Agent requesting access to digital content accessible via the Virtual Tags (represented by icon 2801) and Physical Tags (represented by icons 2802-2803) must be in a qualified area to access the Tags. An accessible area may include an area from which the icons 2801-2803 associated with the respective Tags may be viewed, or another physical area designated as a qualified access area.

Figure 28C:
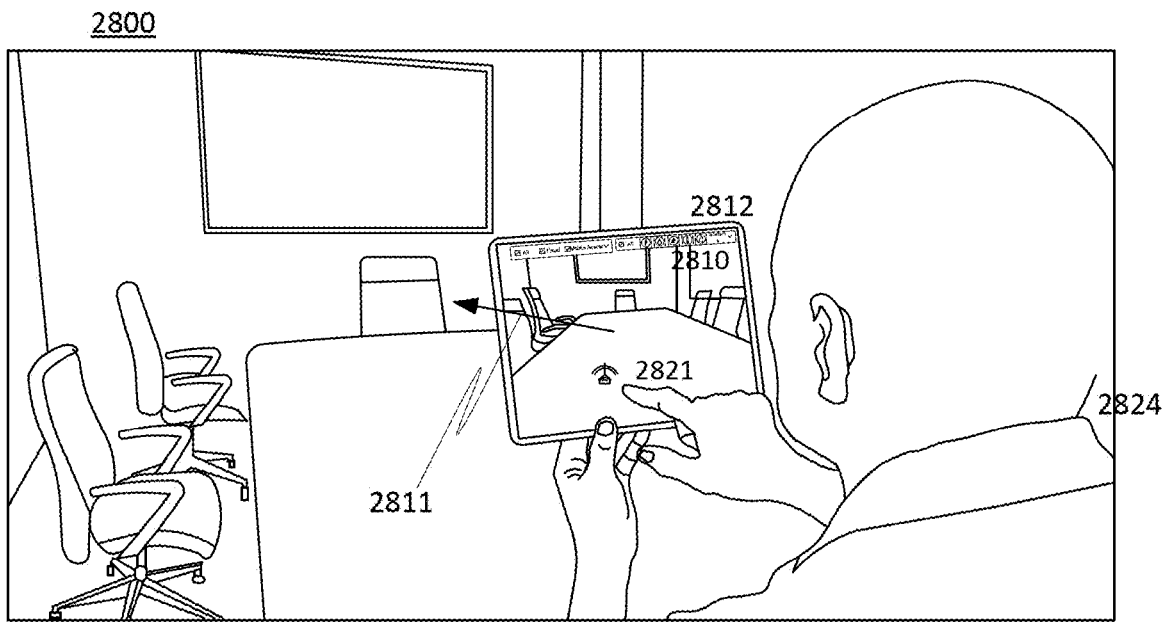

Referring now to FIG. 28C, an interactive icon may be accessed via most forms of user or Agent interaction, such as a touchscreen (illustrated in FIG. 28C) at 2821; voice control; user "click"; user gesture; eye control or other biometric control; keystroke, accelerometer pattern registration; etc.

Figure 28D:
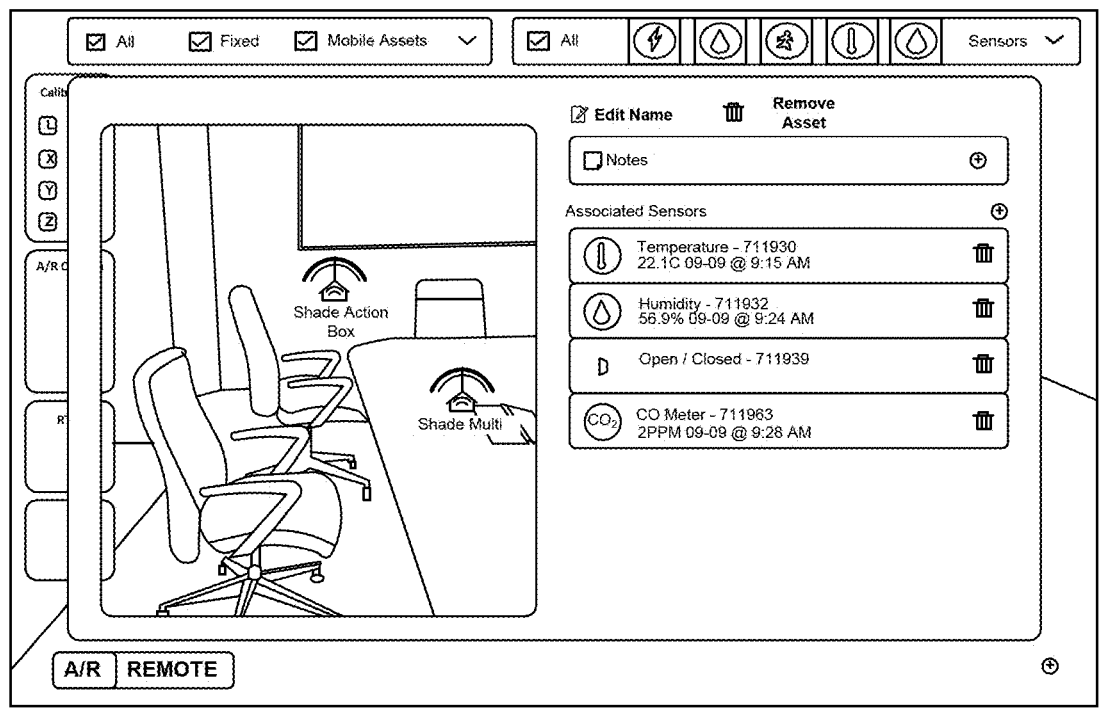

Referring now to FIG. 28D, a Tag (either Virtual Tag or Physical Tag) icon may be activated to provide access to associated digital content. As illustrated in FIG. 28D, digital content may include data, a device control for action, text, documents, video, or other content capable of memorializing and/or communicating information, images, data, concepts, and the like.

A qualified access area may include, by way of non-limiting example, an area around a workstation in an office, an area within a structure (such as an office building, manufacturing facility, distribution warehouse, consulate etc.); an area proximate to or within an infrastructure item (such as a bridge; tunnel; power station; cell tower, etc.); a home office area; on a ship; or other quantifiable area that has been designated as authorized to access designated digital content. The designated digital content may or may not be associated with a Virtual Tag, Physical Tag, and/or an icon in an A/R or VR interface.

Although FIGS. 28A-28D illustrate a smart device 2810 capturing an image of a physical area 2800 as being supported by a user 2824, the present invention also includes a smart device, Node, image capture device, energy capture device for wavelengths other than the visual light bandwidths, or other device capable of generating data for use in an interface that is supported by an Agent, fixture, architectural aspect, vehicle, bot, UGV, UAV or other support item. Remote users can use Tags in a remote area and also interact with those tags through a user interface as if the remote user were on site.

In some embodiments, remote or on site interaction may include, for example, monitoring digital content that is deposited into a Virtual Tag and/or retrieved from a Virtual Tag, and/or deleted from a Virtual Tag.

For example, by way of illustration, an administrator may be able to view cyber activity associated with a remote worker by monitoring work product generated by the remote worker in an authorized remote work area. The remote worker may have an onsite work area within a virtual fence around a company facility and another authorized work area designated as a home office. The two areas may be the only areas from which the worker is able to access protected digital content. A respective Virtual Tag may be associated with each of the onsite work area and the at homework area and work product produced by the worker will be deposited into an appropriate Virtual Tag based upon where the worker is located while working during a specified time period. Virtual Tags may be protected in that they are only visible to the worker and to the worker's administrator.

In this example, an unauthorized person would need to know normal login credentials, and have a Node associated with the worker (the node may be a smart device, employee badge, dongle etc.); and also know what areas are authorized for access to specified digital content and also be at an authorized area, in order to gain access to protected digital content.

Location coordinates may also make up a portion of an enhanced PKI key. In such embodiments, instead of simply having a private key, the private key portion is replaced by a value generated via location coordinates; or a range of values for location coordinates of an Agent position. Still other embodiments include a private key comprising a value generated by an algorithm that processes location coordinates for one or both of location coordinates at a time of request of access to digital content; and a series of values for locations coordinates associated with the user at specified time periods (or instances) prior to the request for access to the digital content. For example, if the user generates location coordinates indicating that they are in their office during a particular hour of the day, and a request for access to protected digital data is received with coordinates indicating that the user is at an authorized home office at the same hour of the day, the VTI may deny access to the digital content until the conflict is resolved. Such embodiments may include a private key portion that is not known to the user and is generated by a smart device or other Node designating the user's position.

Figure 29:
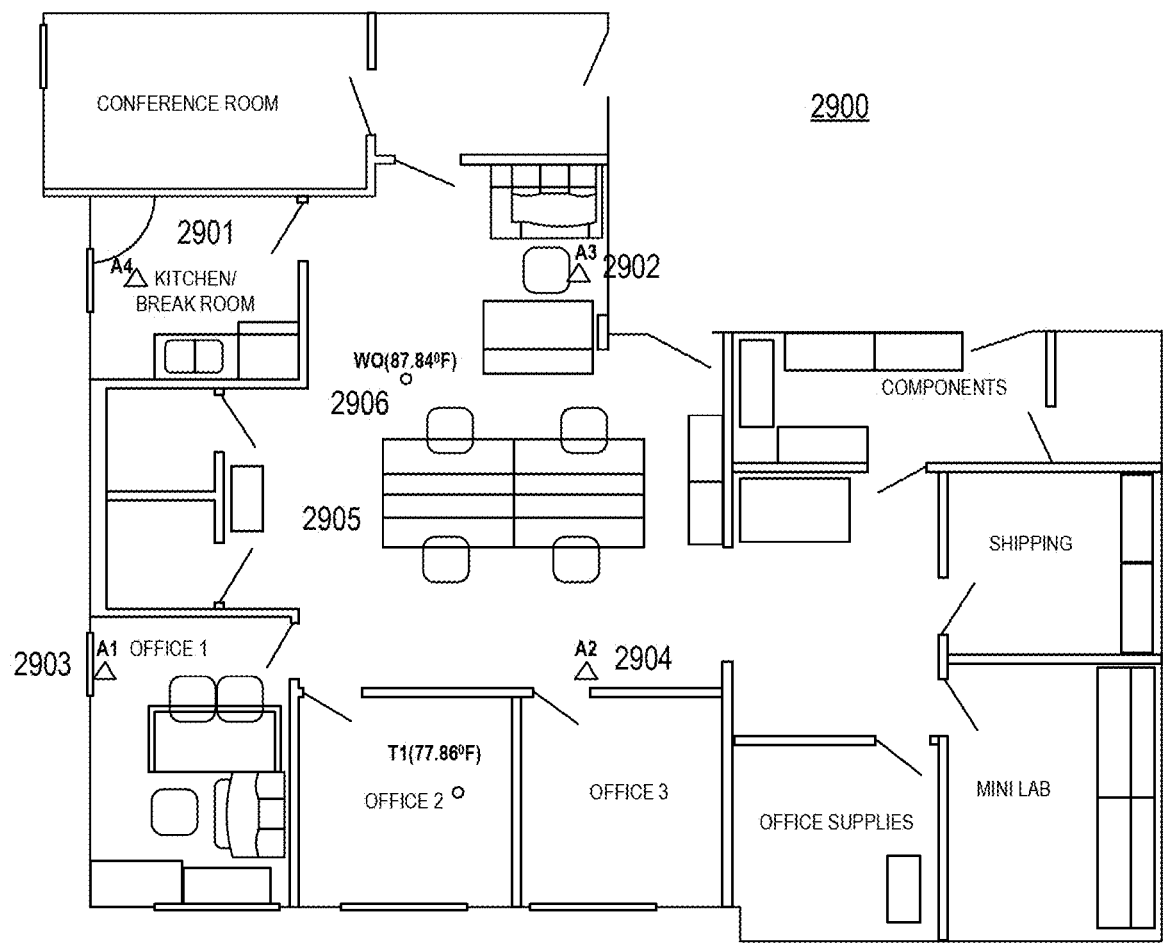
FIG. 29 illustrates a 2D view of an authorized area and Tag location.

Referring now to FIG. 29 a 2D floorplan 2900 may also be used in a user interface to designate an area 2905 for locating a Tag (Virtual Tag, Physical Tag or Hybrid Tag) 2906. The authorized area 2905, may or may not have beacons 2901-2904 for wireless location of the Virtual Tag 2904. In the embodiments illustrated in FIG. 29, a remote user, such as an administrator, may select a Tag 2906 and monitor digital content being stored within the Tag 2906 and/or retrieved from the Tag 2906.

In another aspect of the present invention, a user may retrieve digital content based upon knowledge of where an icon associated with storage of the digital content is located. Users sometimes have difficulty remembering which file folder, or disk drive, or other file storage mechanism holds particular content, however, humans often associate particular knowledge with a particular location which may aid in remembering where to retrieve information.

For example, a family may have a "digital safe" located at a particular position within the home. The digital safe will in essence be a Virtual Tag. The digital safe may contain sensitive documents, passwords, photos, videos, or other personal items that are important and private to the family members. The digital safe will only be accessible from within specified areas, e.g., the room in the house corresponding to the location coordinates of the digital safe. A physical hard drive, SSD or other storage device for the device may be located on site of the home, or remotely, such as in the cloud. If on site, the storage device need not be accessible from any location outside of the home (or other designated location). Access to the digital safe may require an authorized user, with an authorized device, making an access request from an authorized location (location coordinates or area of coordinates), as well as knowledge of the existence of the digital safe (Virtual Tag) which is essentially invisible to unauthorized users.

Figure 30A:
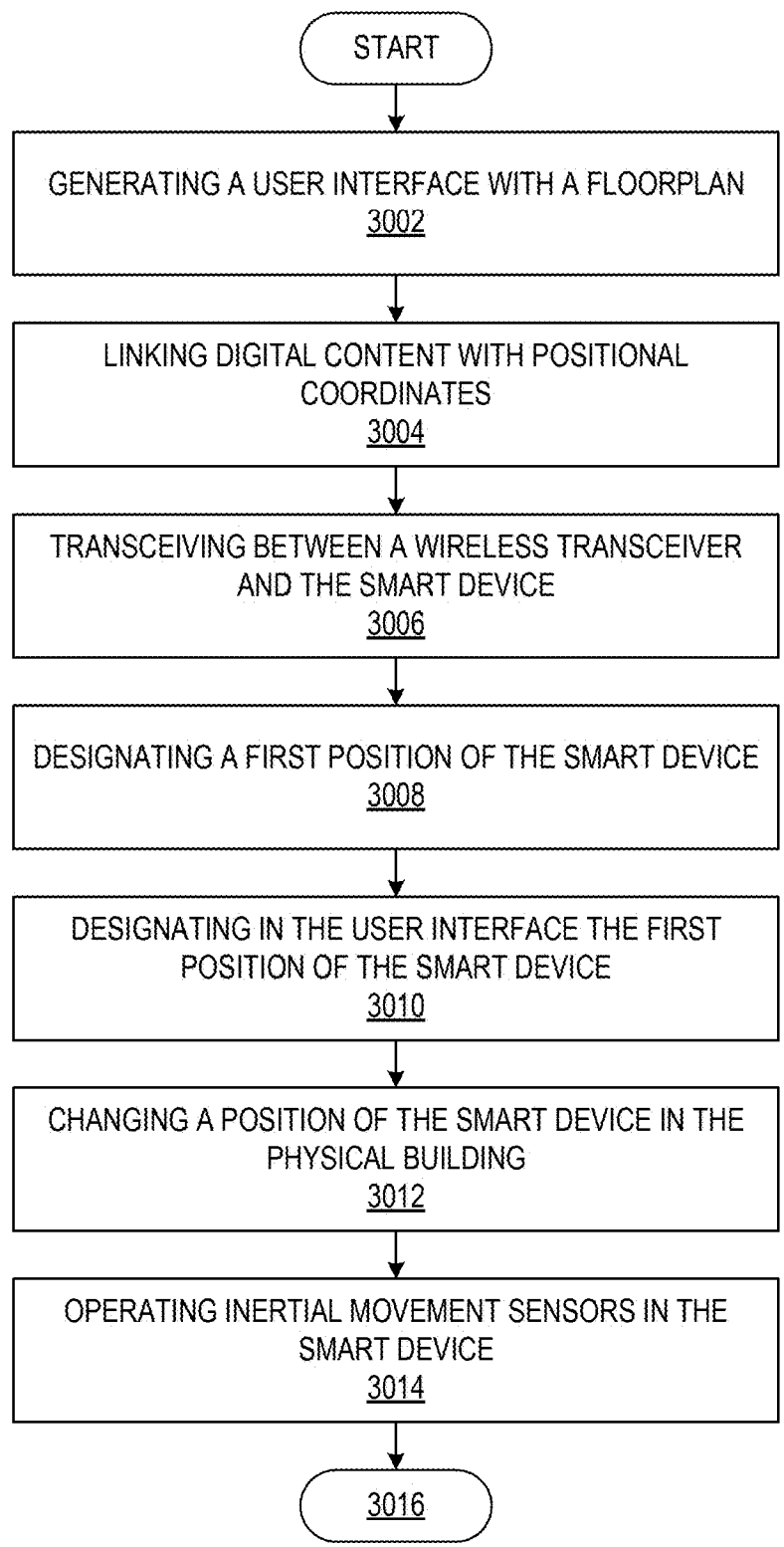
FIGS. 30A-30E illustrate flowcharts of method steps that may be executed to implement some embodiments of the present invention.

Referring now to FIGS. 30A-30E, a flowchart illustrates exemplary method steps that may be implemented in some embodiments of the present invention. In FIG. 30A, at step 3002, the method may include generating a user interface including a representation of a floor plan. The floorplan may include architectural aspects and/or equipment items in the building.

At step 3004, the method may include linking digital content with digital content positional coordinates interior to the building. At step 3006, the method may include transceiving between a first wireless transceiver located interior to the building and a smart device.

At step 3008, the method may include, based upon the transceiving between the first wireless transceiver located interior to the building and the smart device, designating a first position of the smart device interior to the building. At step 3010, the method may include designating in the user interface the first position of the smart device relative to architectural aspects and the equipment.

At step 3012, the method may include changing a position of the smart device in the physical building. At step 3014, the method may include operating inertial movement sensors in the smart device to ascertain a change of position of the smart device from the first position to a second position. At step 3016, the method may include indicating in the user interface the second position of the smart device relative to architectural aspects and/or equipment in the building. Based upon a change of position of the smart device, which may be ascertained by the operation of the inertial movement sensors and/or one or more of: a change in timing parameters involved wireless communication; a change in optical recognition markers, a change in LiDAR readings, or other navigational parameter or modality, at step 3018, the user interface may present one or more user interactive areas associated with the digital content positional coordinates. At step 3020, the method may include, via activation of the user interactive area, accessing the digital content linked to the digital content positional coordinates.

In some embodiments, the first wireless transceiver includes at least one of a Bluetooth transceiver and an Ultra-Wideband transceiver. In some embodiments, the step of designating a first position of the smart device may be accurate with a margin of error of one meter or less.

In various embodiments, method steps of the present invention may additionally include one or more of steps of 3022 to 3028, as described below.

At step 3022, the method may include designating a zone on the user interface, the zone correlating with an area in the physical building. At step 3024, the method may include designating the digital content positional coordinates to be within the zone. At step 3026, the method may include determining that the second position of the smart device may be within the zone.

At step 3028, the method may include displaying digital content associated with a zone on the user interface. At step 3029, the zone may essentially consist of an area in the physical building correlating with a room.

In another aspect, in some embodiments, the present invention may additionally include the step of designating position coordinates for an architectural aspect in the building, such that, at step 3030, she method may include positioning the user interactive area in the user interface based upon the position coordinates for the architectural aspect. Digital content accessed may include information descriptive of an architectural aspect.

At step 3032, the method may also include designating an access area, such that at step 3034, the method may include the step of determining whether a second position is within the access area.

At step 3036, the method may include limiting access to the digital content unless the second position may be within site access area. In some embodiments, the method of Claim 4. In some embodiments, the zone essentially consists of an area in the physical building correlating with a unit designated as an occupant space.

In another aspect, the present invention may include the step of designating position coordinates for an equipment item in the building, such that at step 3038, the method may include positioning the user interactive area in the user interface based upon the position coordinates for the equipment item. In some embodiments, the digital content accessed includes information descriptive of the equipment item.

In still further aspects of the present invention, at step 3040, the method may include designating an access area, such that at step 3042, the method may include determining whether the second position may be within the access area. At step 3044, the method may include limiting access to digital content unless the second position is within a designated access area.

At step 3046, the method may include designating an access area. At step 3048, the method may include determining whether the second position may be within the access area.

At step 3050, the method may include limiting access to the digital content unless the second position may be within the access area.

At step 3052, the method may include transceiving between a second wireless transceiver located interior to the building and a smart device, and at step 3054, the method may include designating a third position of the smart device interior to the building, the third position may be based upon the transceiving between the second wireless transceiver located interior to the building and the smart device. At step 3056, the method may include indicating in the user interface a third position of the smart device relative to the one or both of: architectural aspects and equipment in the building and based upon transceiving with the second wireless transceiver.

In some embodiments, the method may additionally include the step of operating inertial movement sensors in the smart device to ascertain a change of position of the smart device from the third position to a fourth position. At step 3058, the method may include indicating in the user interface the fourth position of the smart device relative to the one or both of architectural aspects and equipment in the building. In some embodiments, the method may additionally include the step of repeating positioning steps multiple times.

At step 3060, the method may include designating authorized areas for accessing digital content. At step 3062, the method may include ascertaining that a position is within an authorized area in order to provide access to digital content, such that at step 3064, the methods of the present invention may include providing access to the digital content linked to the digital content positional coordinates, based upon the ascertaining that the third position may be within an authorized area.

Figure 30B:
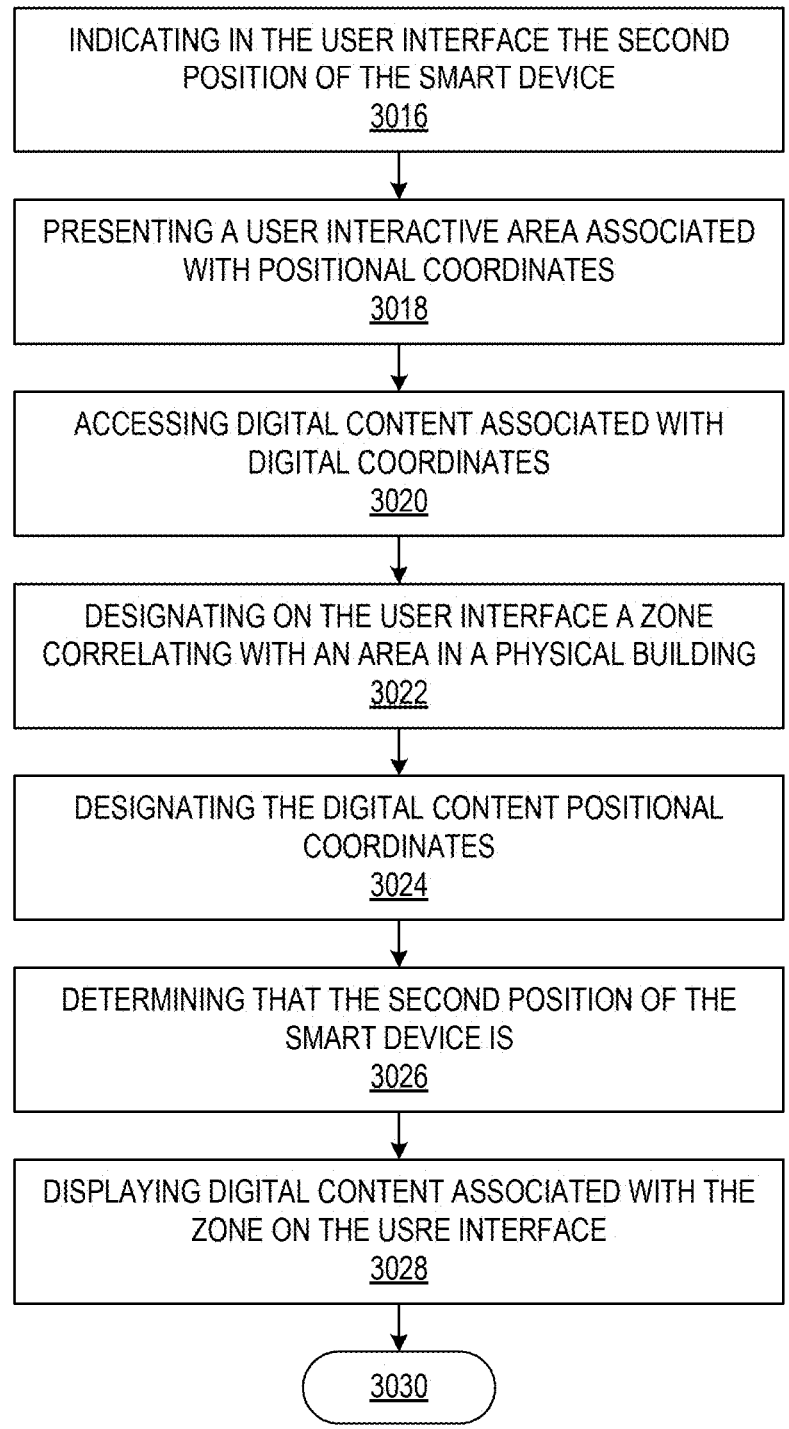
Figure 30C:
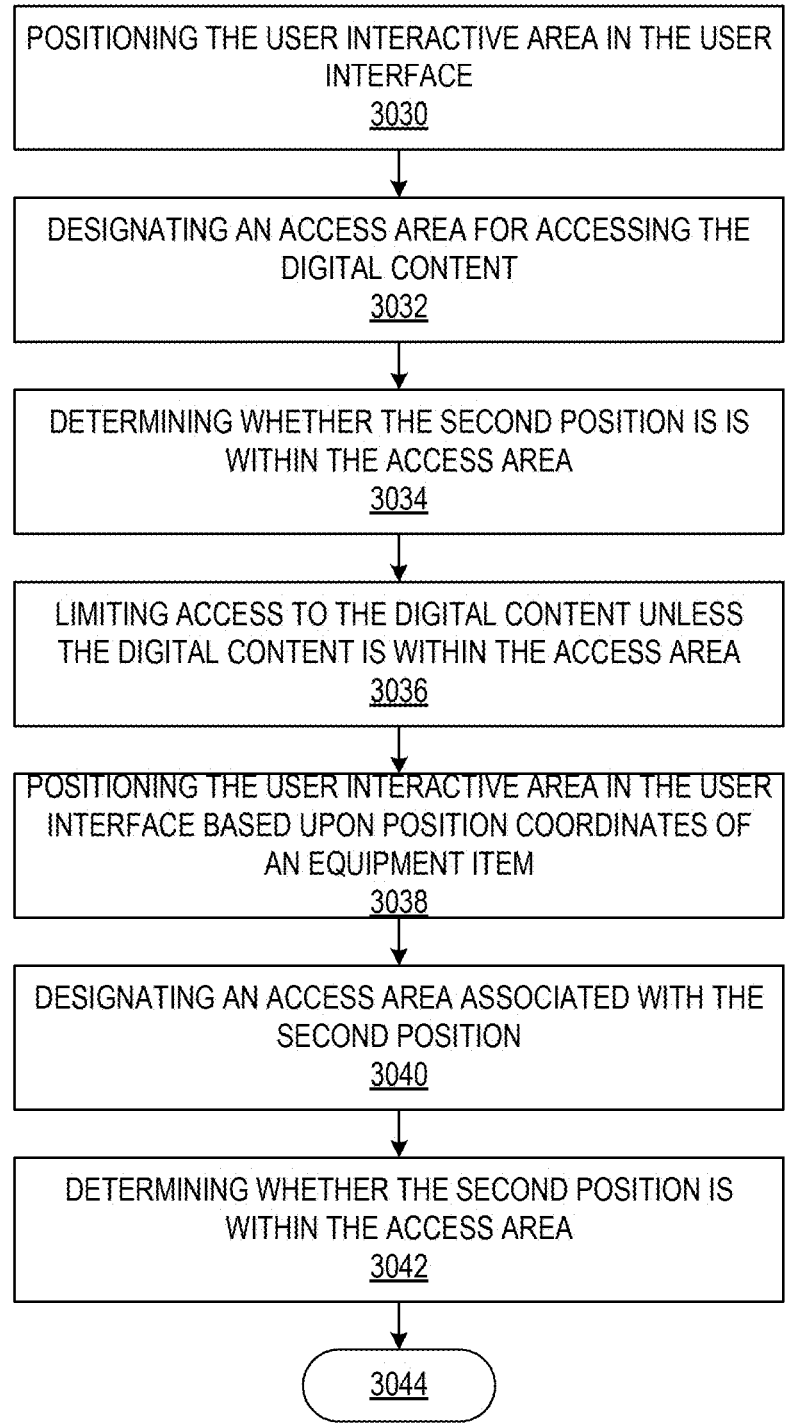
Figure 30D:
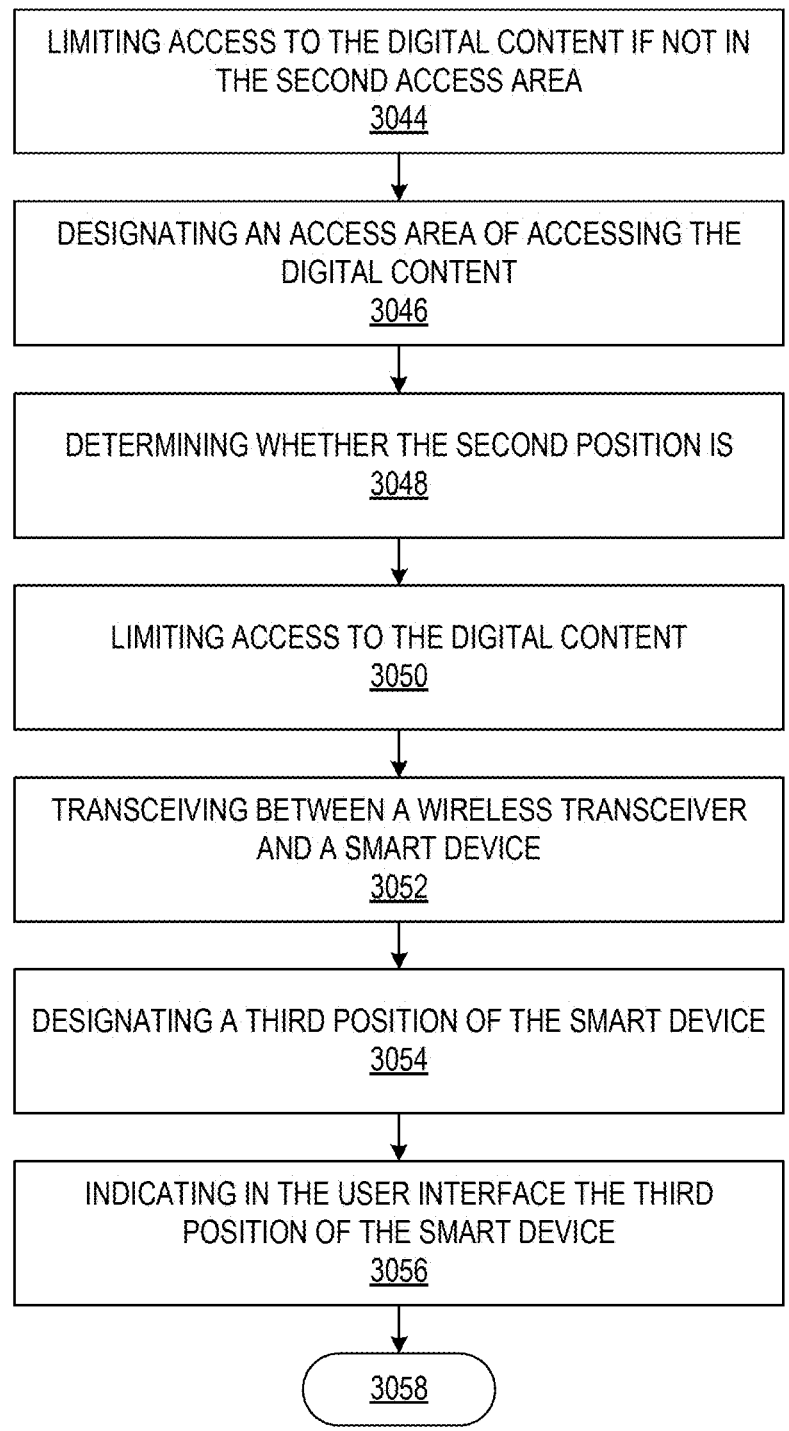
Figure 30E:
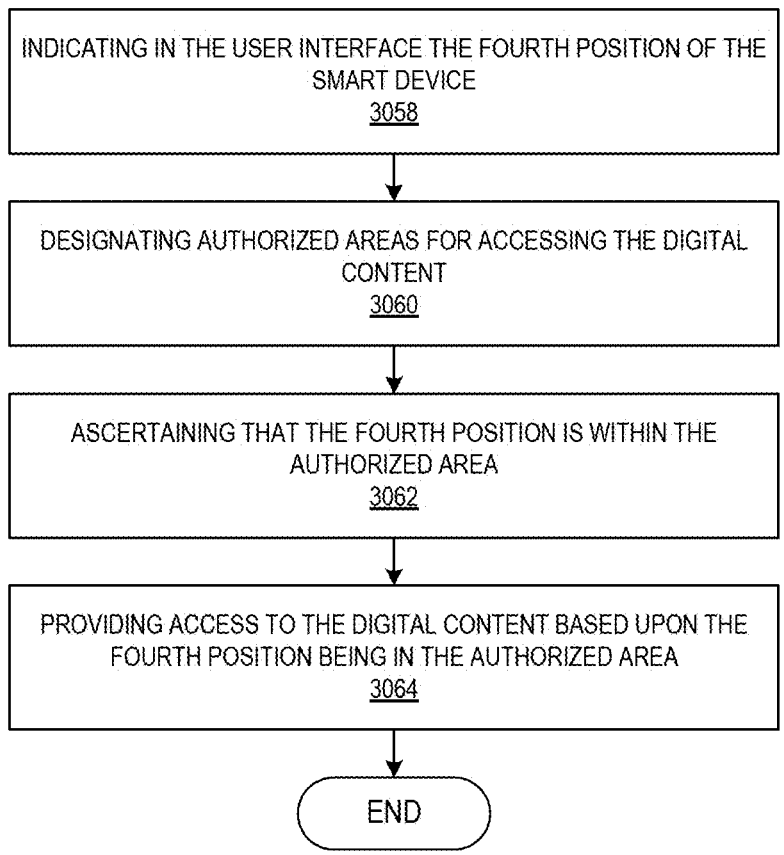

Referring now to FIG. 30B a flowchart illustrates exemplary methods of creating an interactive user interface that includes, at step 3002, generating a user interface including a representation of a floor plan with architectural aspects and/or equipment items in the building. At step 3004, the method may include linking digital content with digital content positional coordinates interior to the building. At step 3006, the method may include transceiving between a first wireless transceiver located interior to the building and a smart device.

At step 3008, the method may include, based upon the transceiving between the first wireless transceiver located interior to the building and the smart device, designating a first position of the smart device interior to the building. At step 3010, the method may include designating in the user interface the first position of the smart device relative to a position of the architectural aspects and/or items of equipment.

At step 3012, the method may include changing a position of the smart device in the physical building, such that at step 3014 inertial movement sensors in the smart device may be operated to ascertain a change of position of the smart device from the first position to a second position.

At step 3016, the method may include indicating in the user interface the second position of the smart device relative to the one or both of the architectural aspects and equipment in the building and based upon the change of position ascertained by the operation of the inertial movement sensors, so that at step 3018, the method may include presenting in the user interface a user interactive area associated with the digital content positional coordinates. At step 3020, the method may include, via activation of the user interactive area, accessing the digital content linked to the digital content positional coordinates.

In some embodiments, a first wireless transceiver includes at least one of a Bluetooth transceiver and a Ultra-Wideband transceiver, and in some embodiments, the step of designating a position of a smart device may be accurate with a margin of error of one meter or less. Other embodiments s include accuracy of two meters or less and still other embodiments include accuracy of within 30 centimeters or less. Still other embodiments include designating a position of the smart device based upon a visual indicator, RFID, SLAM or other method of ascertaining a position.

At step 3022, the method may include designating a zone on the user interface, the zone correlating with an area in the physical building. At step 3024, the method may include designating the digital content positional coordinates to be within the zone. At step 3026, the method may include determining that the second position of the smart device may be within the zone. At step 3028, the method may include displaying digital content associated with a zone on the user interface.

In some embodiments, the zone essentially consists of an area in the physical building correlating with a room. At step 3030, the method may include positioning the user interactive area in the user interface based upon the position coordinates for the architectural aspect.

In some embodiments, the digital content accessed includes information descriptive of the architectural aspect. At step 3032, the method may include designating an access area. At step 3034, the method may include determining whether the second position may be within the access area.

At step 3036, the method may include limiting access to the digital content unless the second position may be within the access area. In some embodiments, the zone essentially consists of an area in the physical building correlating with a unit including an occupant space.

At step 3038, the method may include positioning the user interactive area in the user interface based upon the position coordinates for the equipment item. In some embodiments, the digital content accessed includes information descriptive of the equipment item.

At step 3040, the method may include designating an access area. At Step 3042, the method may include determining whether the second position may be within the access area. At Step 3044, the method may include limiting access to the digital content unless the second position may be within the access area. In some embodiments, the digital content accessed includes information descriptive of the aspect of the construction project prior to commissioning of the building. At step 3046, the method may include designating an access area. At Step 3048, the method may include determining whether the second position may be within the access area.

At step 3050, the method may include limiting access to the digital content unless the second position may be within the access area. In some embodiments, the digital content may include a construction take off including material items to be used in constructing the building. In some embodiments, the method additionally includes the step of designating position coordinates in the user interface associated with items included in the takeoff.

At step 3052, the method may include transceiving between a second wireless transceiver located interior to the building and a smart device.

At step 3054, in some embodiments, the method may include designating a third position of the smart device interior to the building. The third position may be calculated, for example, based upon the transceiving between the second wireless transceiver located interior to the building and the smart device. At step 3056, the method may include indicating in the user interface the third position of the smart device. The position may be relative to the one or both of architectural aspects and equipment in the building and based upon one or both of transceiving with the second wireless transceiver, inertial movement unit calculations, automated image recognition of markets, LiDAR readings, automated vision recognition of environmental surroundings or other techniques.

In some embodiments, inertial movement sensors may be operated in the smart device to ascertain a change of position of the smart device from the third position to a fourth positron. At step 3058, in some embodiments, the method may include indicating in the user interface the fourth position of the smart device relative to the one or both of architectural aspects and equipment in the building.

In some embodiments, the method may include the step of repeating ascertaining a known position and movement multiple times. The method may also include designating authorized areas for accessing the digital content and ascertaining that the third position is within an authorized area. The method may also include providing access to the digital content linked to the digital content positional coordinates, based upon the ascertaining that the third position may be within an authorized area.

In some embodiments, the method may additionally include the step of repeating steps related to ascertaining a known position and movement from the known position, including correcting drift related to IMU variances by realigning with a next known point which may be accomplished via wireless communication, such as a BLE communication within a meter or less from a BLE beacon and the smart device. The method may also include designating authorized areas for accessing the digital content. At step 3062, the method may include ascertaining that the third position may be within an authorized area. At step 3064, the method may include providing access to the digital content linked to the digital content positional coordinates, based upon the ascertaining that the third position may be within an authorized area.

At step 3056, the method may include indicating in the user interface the third position of the smart device relative to the one or both of: architectural aspects and equipment in the building and based upon transceiving with the second wireless transceiver.

In some embodiments, the method may additionally include the step of operating inertial movement sensors in the smart device to ascertain a change of position of the smart device from the third position to a fourth position. At step 3058, the method may include indicating in the user interface the fourth position of the smart device relative to the one or both of: architectural aspects and equipment in the building.

In some embodiments, the method may additionally include, at Step 3060, of designating authorized areas for accessing the digital content. At Step 3062, the method may include ascertaining that the third position may be within an authorized area. At Step 3064, the method may include providing access to the digital content linked to the digital content positional coordinates, based upon the ascertaining that the third position may be within an authorized area.

The present invention provides for methods and apparatus for executing methods that augment a physical area, such as an area designated as a wireless communication area. The method may include the steps of transceiving a wireless communication between a Smart Device and multiple reference point transceivers fixedly located at a position within a wireless communication area; generating positional coordinates for the Smart Device based upon the wireless communication between the Smart Device and the multiple reference transceivers; establishing a radio target area for an energy receiving sensor; receiving energy into the energy receiving sensor from the radio target area; generating a digital representation of the energy received into the energy receiving sensor at an instance in time; generating positional coordinates for a tag at the instance in time, the tag comprising digital content and access rights to the digital content; determining the tag is located within the radio target area based upon the positional coordinates for the tag; generating a user interactive interface comprising static portions based upon the digital representation of the energy received into the energy receiving sensor; generating a dynamic portion of the user interactive interface based upon the positional coordinates for the tag and the positional coordinates for the Smart Device; receiving a user input into the dynamic portion of the user interactive interface; and based upon the user input received into the dynamic portion of the user interactive interface, including the digital content in the user interactive interface.

In some embodiments, multiple disparate energy levels may be received into the energy receiving sensor at the instance in time, each disparate energy level received from a different geospatial location; associating positional coordinates with the disparate energy levels; and indicating the disparate energy levels and relative positions of the disparate energy levels in the user interactive interface. A tag may include a virtual tag with the digital content and a location identified via positional coordinates.

In another aspect, a physical tag may include a transceiver capable of wireless communication with the multiple reference transceivers and the method may include transceiving a wireless communication between a tag and multiple reference point transceivers; and generating positional coordinates for the tag based upon the wireless communication between the tag and the multiple reference transceivers. The wireless communication between the Smart Device and the multiple reference point transceivers may be accomplished by transceiving using an Ultra-Wideband modality; Bluetooth modality or another wireless modality, such as WiFi.

A wireless communication area may be identified as including a radio transmission area of the energy receiving sensor and the wireless communication area may be based upon a communication distance of the Ultra-Wideband modality in an area encompassing the energy receiving sensor.

Transceiving a wireless communication between a tag and multiple reference point transceivers may be accomplished using a wireless modality such as, for example, a UWB or Bluetooth modality; and generating positional coordinates for the tag based upon the wireless communication between the tag and the multiple reference transceivers may be accomplished using the same modalities. Positional coordinates may include one or more of: Cartesian Coordinates, an angle of arrival and an angle of departure and a distance.

In another aspect, access rights to tag content may be required and based upon an identifier of the Smart Device or a user operating the Smart Device. A dynamic portion of the user interactive interface may include an icon indicative of the digital content associated with the tag.

In some embodiments, the present invention combines methods and apparatus for providing multifactor security protection of digital content. Factors in addition to the typical two factor security are based upon location coordinates of Tags (Virtual, Physical or Hybrid) that are associated with specified digital content. For example, a third factor may be based upon knowledge of a location of a Virtual Tag and/or Physical Tag storing the digital content; and a fourth factor may be based upon a physical location of a user or other Agent requesting access to the digital content. A potential fifth factor may include location coordinates of the user's smart device for a time period prior to the request for access to the protected digital content. According to the present invention, knowledge of the location of the Tag may be provided via an Augmented Reality interface with icons specific to a User being presented in the context of an image of a physical environment. Determination of a physical location of the user may be accomplished via wireless communications.

Factors in security authentication according to the present invention may be based upon one or both of: location coordinates for a user's smart device at the time of request for access to the Virtual Tag; and location coordinates of the user's smart device at time intervals prior to the request for access to the Virtual Tag. In some embodiments, an Augmented Reality interface manifests interactive icons that may be selected to provide access to the digital content "in" or otherwise associated with the Virtual Tag. An AR view includes interactive icons incorporated into image data representative of a physical area, such as an image based upon energy levels received into a charged couple device (CCD). Image data may be live "video" type image data or a stilt image.

In some embodiments, sound emanations may also be used as a communication mechanism between a Smart Device and a reference point Node and/or between two Nodes. In various aspects of wireless communication, the Nodes may function to communicate a timing value via their electromagnetic or sonic transmissions or data other than timing signals, such as a digital value representing a condition quantified with an electronic sensor. Accordingly, wireless communications may provide data identifying information unique to the Node, data related to the synchronization of timing at different well located reference points and may also function as general data communication Nodes.

A triangulation calculation and/or a distance and angle indicating a position of a Smart Device, or a Node may result from a system of multiple reference position Nodes communicating timing signals to or from the Smart Device or Node. Methods of calculating positions via wireless communications may include one or more of RTT, RSSI, AoD, AoA, timing signal differential and the like. Triangulation or other mathematical techniques may also be employed in determining a location.

A process is disclosed for determination of a position based upon wireless communication between a Node and/or Smart Device and with reference point transceivers. The process may be accomplished, for example via executable software interacting with the controller, such as, for example via running an app on the Smart Device or as a service on a server accessible via the Internet.

In some embodiments, the location of a Node, may be determined via discernment of a physical artifact, such as, for example, a visually discernable feature, shape, or printed aspect. A pattern on a surface may convey a reference point by a suitable shape such as a cross, Vernier or box structure as non-limiting examples .The printing may also include identification information, bar codes or lists of location coordinates directly. A Smart Device ascertaining a physical reference mark and a distance of the Smart Device to the mark may determine a relative location in space to a coordinate system of the marks. Reference points may be coded via identifiers, such as a UUID (Universally Unique Identifier), or other identification vehicle.

Marks tied to a geospatial coordinate system may be utilized to determine a relative location. A number of methods may be executed to determine a distance from the Smart Device to a mark such as, for example, a sensed reflection of light beams (preferably laser beams), electromagnetic beams of wavelength outside of the visible band such as IR, UV, radio and the like, or sound-based emanations. It may be important that the means of determining the distance can be focused into a relatively small size. It may be important that the means of determining the distance is reflected by the physical mark. For example, a light-source apparatus used to determine a distance may benefit from a mirror surface upon the physical mark. In addition, a reflected signal may emerge significantly towards a user. It may be desirable that physical reference points are placed with high accuracy at specific reference locations, or it may be desirable to be able to measure with high accuracy specific reference locations after placement.

GLOSSARY

"Agent" as used herein refers to a person or automation capable of supporting a Smart Device at a geospatial location relative to a Ground Plane.

"Area of digital content interaction" as used herein refers to an area with multiple addition al sets of positional coordinates that may be used to access digital content with a first set of positional coordinates.

"Augmented Virtual Model" (sometimes referred to herein as "AVM"); as used herein is a digital representation of a real property parcel including one or more three-dimensional representations of physical structures suitable for use and As Built data captured descriptive of the real property parcel. An Augmented Virtual Model includes As Built Features of the structure and may include improvements and features contained within a Processing Facility.

"Bluetooth" as used herein means the Wireless Personal Area Network (WPAN) standards managed and maintained by Bluetooth SIG. Unless otherwise specifically limited to a subset of all Bluetooth standards, the Bluetooth will encompass all Bluetooth standards (e.g., Bluetooth 4.0; 5.0; 5.1 and BLE versions).

"Digital Content" as used herein refers to any artifact that may be quantified in digital form. By way of non-limiting example, digital content may include, one or more of: alphanumeric text; audio files; image data; video data; digital stories and media.

"Directional Query" as used herein refers to a query made to an information source, such as a database and/or a search engine, wherein at least one search criteria includes a direction relative to an identified aspect. Non-limiting examples of identified aspects may include, one or more of: a Smart Device, an Agent, an UAV, and an UGV.

"Energy-Receiving Sensor" as used herein refers to a device capable of receiving energy from a Radio Target Area and quantifying the received energy as a digital value.

"Ground Plane" as used herein refers to horizontal plane from which a direction of interest may be projected.

"Hybrid Tag" as used herein means digital content associated with a location coordinates of a position previously occupied by a Physical Tag. In some embodiments, a Hybrid Tag may include digital content based upon data generated by a sensor co-located with a Physical Tag or while the sensor was within a specified distance of a position described by location coordinates.

"Image Capture Device" or "Scanner" as used herein refers to apparatus for capturing digital or analog image data, an Image capture device may be one or both of: a two-dimensional sensor (sometimes referred to as "2D") or a three-dimensional sensor (sometimes referred to as "3D"). In some examples an Image Capture Device includes a charge-coupled device ("CCD") sensor. "Intelligent Automation" as used herein refers to a logical processing by a device, system, machine, or equipment item (such as data gathering, analysis, artificial intelligence, and functional operation) and communication capabilities.

"IoT Tag" as used herein refers to a Node co-located with art IoT Sensor.

"Multi-Modal" as used herein refers to the ability of a device to communication using multiple protocols and/or band widths. Examples of multimodal may include being capable of communication using two or more of: Ultra-Wideband, Bluetooth; Bluetooth Low Energy; Wi-Fi; Wi-Fi RT; GPS; ultrasonic; infrared protocols and/or mediums.

"Multi-Modal Tag" as used herein refers to a device including multiple wireless transceivers operating in different bandwidths and according to different communication parameters.

"Node" as used herein means a device including at least a processor, a digital storage, and a wireless transceiver.

"Physical Tag" as used here shall mean a physical device with a transceiver capable of wireless communication sufficient to determine a geospatial position of the device. The Physical Tag may also be associated with a data set that is not contingent upon the geospatial location of the physical device.

"Radio Target Area" an area from which an energy-receiving Sensor will receive energy of a type and bandwidth that may be quantified by the energy-receiving Sensor.

"Ray" as used herein refers to a straight line including a starting point and extending indefinitely in a direction.

"Sensor" (sometimes referred to as an IoT sensor) as used herein refers to one or more of a solid state, electro-mechanical, and mechanical device capable of transducing a physical condition or property into an analogue or digital representation and/or metric.

"Smart Device" as used herein includes an electronic device including, or in logical communication with, a processor and digital storage and capable of executing logical commands.

"Smart Receptacle" as used herein includes a case or other receiver of a smart device with components capable of receiving wireless transmissions from multiple wireless positional reference transceivers. In some embodiments, the smart receptacle will include a wireless transmitter and/or a physical connector for creating an electrical path for carrying one or both of electrical power and logic signals between an associated Smart Device and the Smart Receptacle.

"Structure" as used herein refers to a manmade assembly of parts connected in an ordered way. Examples of a Structure in this disclosure include a building; a sub-assembly of a building; a bridge, a roadway, a train track, a train trestle, an aqueduct; a tunnel a dam, and a retainer berm.

"Tag" as used herein refers to digital content and access rights associated with a geospatial position.

"Transceive" as used herein refers to an act of transmitting and receiving data.

"Transceiver" as used herein refers to an electronic device capable of one or both of wirelessly transmitting and receiving data.

"Vector" as used herein refers to a magnitude and a direction as may be represented and/or modeled by a directed line segment with a length that represents the magnitude and an orientation in space that represents the direction.

"Virtual Tag" as used here shall mean digital content associated with a location identified via positional coordinates.

"Wireless Communication Area" (sometimes referred to as "WCA") as used herein means an area through which wireless communication may be completed. A size of a WCA may be dependent upon a specified modality of wireless communication and an environment through which the wireless communication takes place.

In discussion (and as illustrated), a WCA may be portrayed as being spherical in shape, however in a physical environment a shape of a WCA may be amorphous or of changing shape and more resemble a cloud of shinning density around the edges.

A number of embodiments of the present disclosure have been described. While this specification contains many specific implementation details, there should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings and the detailed description thereto are not intended to limit the present disclosure to the form disclosed, but to the contrary, the present disclosure is to cover all modification, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including but not limited to. To facilitate understanding, like reference numerals have been used, where possible, to designate like elements common to the figures.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising", "including", and "having" can be used interchangeably.

Similarly, while method steps may be depicted in the drawings in a particular order, this should not be understood as requiring that such operations be performed in the particular order shown or in a sequential order, or that all illustrated operations be performed, to achieve desirable results.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A method of creating an interactive user interface linked to an architectural drawing, the method comprising the steps of:

a. generating a user interface comprising a representation of the architectural drawing comprising at least one of: an architectural aspect and an equipment item in a building;
b. linking a virtual tag comprising digital content, with virtual tag positional coordinates interior to the building;
c. designating in the user interface, a virtual agent position interior to the building;
d. generating virtual agent positional coordinates descriptive of the virtual agent position;
e. presenting in the user interface, the virtual agent position relative to at least one of: the architectural aspect and the equipment item in the building;
f. presenting in the user interface, graphical artifacts descriptive of items in a designated area in a physical world position relative to the virtual agent position;
g. presenting in the user interface a user interactive area associated with the virtual tag; and
h. via activation of the user interactive area, accessing the digital content included in the virtual tag.

2. The method of claim 1 wherein the designated area comprises a radius around the position of at least one of: the architectural aspect and the equipment item in the building.

3. The method of claim 2 wherein the step of designating the agent position is accurate with a margin of error of one meter or less.

4. The method of claim 3 additionally comprising the steps of: designating a zone on the user interface, the zone correlating with an area in a physical building; designating the virtual tag positional coordinates to be within the zone; and displaying the digital content associated with the virtual tag on the user interface.

5. The method of claim 4 wherein the zone essentially consists of an area in the physical building correlating with a room.

6. The method of claim 5 additionally comprising the step of designating architectural aspect positional coordinates associated with the architectural aspect in the building; and positioning the user interactive area in the user interface based upon the architectural aspect positional coordinates.

7. The method of claim 6 wherein the digital content displayed comprises information descriptive of the architectural aspect.

8. The method of claim 7 additionally comprising the steps of: designating an access area; determining whether the virtual agent position is within the access area; and limiting user access to the digital content unless the virtual agent position is within the access area.

9. The method of claim 4 wherein the zone essentially consists of an area in the physical building correlating with a unit comprising an occupant space.

10. The method of claim 3 additionally comprising the step of designating fourth positional coordinates for the equipment item in the building; and positioning the user interactive area in the user interface based upon the position coordinates for the equipment item in the building.

11. The method of claim 10 wherein the digital content included in the virtual tag comprises information descriptive of the equipment item in the building.

12. The method of claim 11 additionally comprising the steps of: designating an access area; determining whether a user interacting with the user interface is within the access area; and limiting access to the digital content unless the user interacting with the user interface is within the access area.

13. The method of claim 3 additionally comprising the step of designating position coordinates for an aspect of a construction project related to the building and positioning the user interactive area in the user interface based upon the position coordinates for the aspect of the construction project.

14. The method of claim 13 wherein the digital content accessed comprises information descriptive of the aspect of the construction project prior to commissioning of the building.

15. The method of claim 14 wherein the digital content comprises items of material to be used in constructing the building; and the method additionally comprising the step of designating position coordinates in the user interface associated with the items of material.

16. The method of claim 3 wherein a first position of an Agent is within one meter of a doorway indicated on the user interface.

17. The method of claim 16 additionally comprising displaying a travel path of the Agent supporting a smart device, the travel path comprising the first position of the Agent and a second position of the Agent within a margin of error.

18. The method of claim 17 additionally comprising the step of adjusting the travel path to maintain a distance of at least about 20 centimeters away from the architectural aspect and the equipment item in the building.

19. The method of claim 3 wherein the user interface comprises a representation of an equipment item to be installed in the building, but not yet installed, and the digital content comprises information descriptive of the equipment item.

20. The method of claim 3 additionally comprising the steps of: transceiving between a wireless transceiver located interior to the building and a smart device; based upon the transceiving between the wireless transceiver located interior to the building and the smart device, designating a position of the smart device interior to the building; and indicating in the user interface the position of the smart device relative to the one or both of: the architectural aspect and the equipment item in the building.

* * * * *